US011800785B2

(12) United States Patent
Hatakeyama et al.

(10) Patent No.: US 11,800,785 B2
(45) Date of Patent: Oct. 24, 2023

(54) MATERIAL FOR ORGANIC DEVICE AND ORGANIC ELECTROLUMINESCENT DEVICE USING THE SAME

(71) Applicants: KWANSEI GAKUIN EDUCATIONAL FOUNDATION, Hyogo (JP); JNC CORPORATION, Tokyo (JP)

(72) Inventors: Takuji Hatakeyama, Hyogo (JP); Kazushi Shiren, Chiba (JP); Yuko Yamaga, Chiba (JP); Guofang Wang, Chiba (JP); Yasuyuki Sasada, Chiba (JP)

(73) Assignees: KWANSEI GAKUIN EDUCATIONAL FOUNDATION, Hyogo (JP); SK MATERIALS JNC CO., LTD., Gyeonggi-Do (KR)

( * ) Notice: Subject to any disclaimer, the term of this patent is extended or adjusted under 35 U.S.C. 154(b) by 290 days.

(21) Appl. No.: 16/766,378

(22) PCT Filed: Nov. 16, 2018

(86) PCT No.: PCT/JP2018/042412
§ 371 (c)(1),
(2) Date: May 22, 2020

(87) PCT Pub. No.: WO2019/102936
PCT Pub. Date: May 31, 2019

(65) Prior Publication Data

US 2022/0006012 A1 Jan. 6, 2022

(30) Foreign Application Priority Data

Nov. 24, 2017 (JP) ................................ 2017-225857
Aug. 21, 2018 (JP) ................................ 2018-154597

(51) Int. Cl.
*H10K 85/30* (2023.01)
*C07F 5/02* (2006.01)
(Continued)

(52) U.S. Cl.
CPC ........... *H10K 85/322* (2023.02); *C07F 5/027* (2013.01); *C09K 11/06* (2013.01);
(Continued)

(58) Field of Classification Search
None
See application file for complete search history.

(56) References Cited

U.S. PATENT DOCUMENTS

2004/0131881 A1 7/2004 Zheng et al.
2007/0106103 A1 5/2007 Ikeda et al.
(Continued)

FOREIGN PATENT DOCUMENTS

CN 104641483 5/2015
CN 105431439 3/2016
(Continued)

OTHER PUBLICATIONS

International Search Report (ISR) dated Feb. 19, 2019 in International (PCT) Application No. PCT/JP2018/042412.
(Continued)

*Primary Examiner* — Gregory D Clark
(74) *Attorney, Agent, or Firm* — Wenderoth, Lind & Ponack, L.L.P.

(57) ABSTRACT

A polycyclic aromatic compound represented by general formula (1) described below and having a bulky substituent in a molecule is used as a material for an organic device, whereby, for example, an organic EL device excellent in quantum efficiency can be provided. In particular, concentration quenching can be suppressed even if a use concen-
(Continued)

tration is comparatively high, and therefore the present art is advantageous in a device production process.

Formula 199

(1)

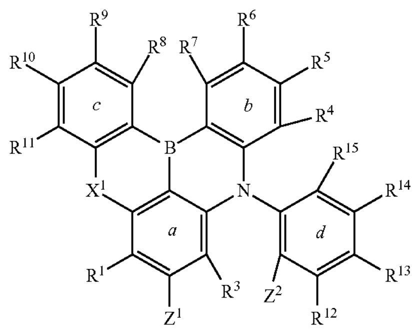

In formula (1) described above, $R^1$, $R^3$, $R^4$ to $R^7$, $R^8$ to $R^{11}$ and $R^{12}$ to $R^{15}$ are independently hydrogen, aryl or the like, $X^1$ is —O— or >N—R (R is aryl or the like), $Z^1$ and $Z^2$ are a bulky substituent such as aryl, and at least one hydrogen in the compound represented by formula (1) may be replaced by halogen or deuterium.

20 Claims, 1 Drawing Sheet

(51) Int. Cl.

| | |
|---|---|
| ***C09K 11/06*** | (2006.01) |
| *H10K 10/46* | (2023.01) |
| *H10K 30/00* | (2023.01) |
| *H10K 50/11* | (2023.01) |

(52) U.S. Cl.

CPC ................ *C09K 2211/1007* (2013.01); *C09K 2211/1011* (2013.01); *C09K 2211/1014* (2013.01); *H10K 10/484* (2023.02); *H10K 30/00* (2023.02); *H10K 50/11* (2023.02)

(56) References Cited

U.S. PATENT DOCUMENTS

| | | | | |
|---|---|---|---|---|
| 2012/0319052 | A1 | 12/2012 | Brocke et al. | |
| 2014/0058099 | A1 | 2/2014 | Wakamiya et al. | |
| 2015/0097162 | A1 | 4/2015 | Ono et al. | |
| 2015/0236274 | A1* | 8/2015 | Hatakeyama ............. | C07F 5/02 548/405 |
| 2018/0094000 | A1 | 4/2018 | Hatakeyama et al. | |
| 2018/0301629 | A1 | 10/2018 | Hatakeyama et al. | |
| 2019/0058124 | A1* | 2/2019 | Hatakeyama .......... | C09K 11/06 |

FOREIGN PATENT DOCUMENTS

| | | |
|---|---|---|
| CN | 106905367 | 6/2017 |
| EP | 3 109 253 | 12/2016 |
| JP | 2001-172232 | 6/2001 |
| JP | 2005-170911 | 6/2005 |
| TW | 201739751 | 11/2017 |
| WO | 2004/061047 | 7/2004 |
| WO | 2010/098119 | 9/2010 |
| WO | 2011/107186 | 9/2011 |
| WO | 2012/118164 | 9/2012 |
| WO | 2015/102118 | 7/2015 |
| WO | 2016/152418 | 9/2016 |
| WO | 2016/152544 | 9/2016 |
| WO | 2017/138526 | 8/2017 |
| WO | 2018/181188 | 10/2018 |

OTHER PUBLICATIONS

Office Action dated May 10, 2022 in Japanese Patent Application No. 2019-555285, with English-language translation.

Office Action dated Nov. 9, 2022 in corresponding Chinese Patent Application No. 201880073800.2, with English language translation.

Decision to Grant a Patent dated Jan. 10, 2023 in corresponding Japanese Patent Application No. 2019-555285, with English language translation.

Decision to Grant dated May 10, 2023 in corresponding Chinese Patent Application No. 201880073800.2,with English Translation.

* cited by examiner

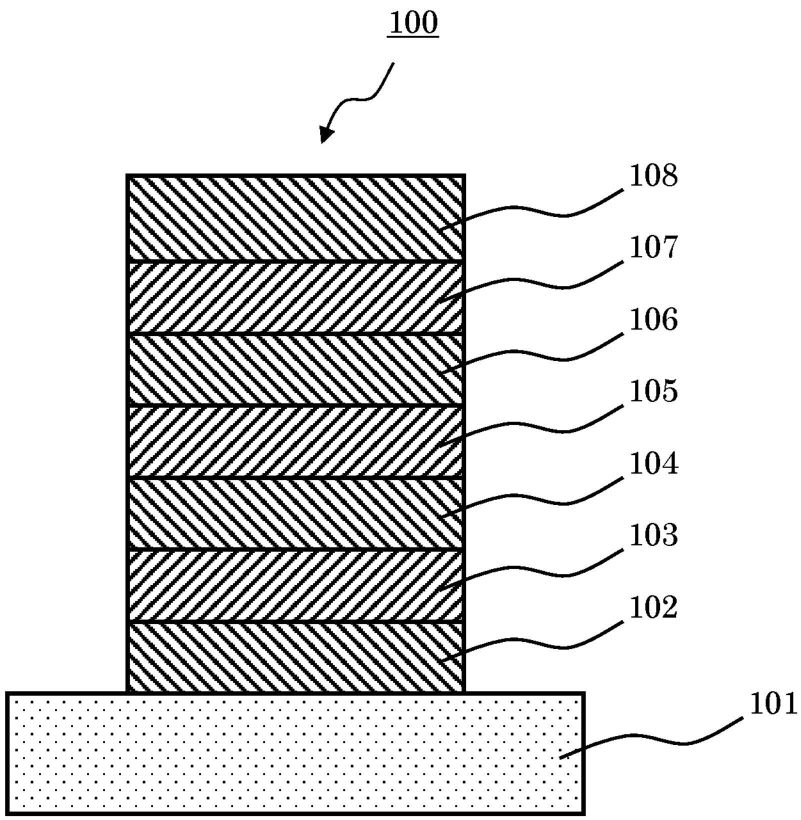
100
108
107
106
105
104
103
102
101

MATERIAL FOR ORGANIC DEVICE AND ORGANIC ELECTROLUMINESCENT DEVICE USING THE SAME

TECHNICAL FIELD

The invention relates to a material for an organic device, having excellent device properties derived from a particular structure; and an organic electroluminescent device, an organic field effect transistor and an organic thin film photovoltaic cell, using the same.

BACKGROUND ART

A display unit using a luminescent device that causes electroluminescence has been so far researched in various manners because power saving and thickness reduction can be achieved, and further an organic electroluminescent device formed of an organic material has been actively studied because weight reduction and size increase can be easily achieved. In particular, development of an organic material having luminescent properties of blue as one of three primary colors of light, or the like, and development of an organic material having charge transport ability of a positive hole, an electron or the like (having possibility of serving as a semiconductor and a superconductor) have been so far actively researched, regardless of a high-molecular-weight compound and a low-molecular-weight compound.

The organic EL device has a structure including: a pair of electrodes formed of an anode and a cathode; and one layer or a plurality of layers which are arranged between the electrodes and contain an organic compound. The layer containing the organic compound includes a luminescent layer, and a charge transport-injection layer for transporting or injecting a charge such as a positive hole and an electron, and various organic materials suitable for the layers have been developed.

As a material for a luminescent layer, for example, a benzofluorene-based compound or the like has been developed (WO 2004/061047 A). Moreover, as a positive hole transport material, for example, a triphenylamine-based compound or the like has been developed (JP 2001-172232 A). Moreover, as an electron transport material, for example, an anthracene-based compound or the like has been developed (JP 2005-170911 A).

Moreover, in recent years, as a material used in the organic EL device or an organic thin film photovoltaic cell, a material in which a triphenylamine derivative is improved has also been reported (WO 2012/118164 A). The material has features of improved flatness thereof by linking aromatic rings composing triphenylamine to each other with reference to N,N'-diphenyl-N,N'-bis(3-methylphenyl)-1,1'-biphenyl-4,4'-diamine (TPD) that has been already put into practical use. In the literature, for example, charge transport properties of an NO link-based compound (compound 1 on page 63) are evaluated. However, nothing is described on a method for producing a material other than the NO link-based compound. If an element to be linked is different, an electronic state of the whole compound is different, and therefore properties obtained from the material other than the NO link-based compound have not been known, yet, either. An example of such a compound is found also in other literature (WO 2011/107186 A, WO 2015/102118 A). For example, a compound having a conjugate structure in which energy (T1) of a triplet exciton is large can cause phosphorescence having a shorter wavelength, and therefore is useful as the material for the luminescent layer of blue. Moreover, a compound having a new conjugate structure with large T1 is required also as the electron transport material and the positive hole transport material that interposes the luminescent layer.

CITATION LIST

Patent Literature

Patent literature No. 1: WO 2004/061047 A.

Patent literature No. 2: JP 2001-172232 A.

Patent literature No. 3: JP 2005-170911 A.

Patent literature No. 4: WO 2012/118164 A.

Patent literature No. 5: WO 2011/107186 A.

Patent literature No. 6: WO 2015/102118 A.

SUMMARY OF INVENTION

Technical Problem

As described above, various materials for an organic EL device are developed, and in order to increase options of the materials for an organic EL device, development of a material formed of a compound different from a conventional art is desired. In particular, organic EL properties obtained from the material other than the NO link-based compound reported in Patent literature Nos. 1 to 4, and a production method thereof have not been known yet.

Patent literature No. 6 reports a polycyclic aromatic compound containing boron, and an organic EL device using the same. However, such a polycyclic aromatic compound has high planarity of molecules, and therefore when the compound is used with a high concentration as a luminescent dopant in a luminescent layer, reduction of luminous efficiency due to concentration quenching is more remarkable in many cases. On the other hand, in order to produce the organic EL device by decreasing a concentration of the luminescent dopant, a more precise control of a dopant concentration is required, and therefore a problem of reduction of a process margin in a device production process has remained.

Solution to Problem

The present inventors have diligently continued to conduct study for solving the problem, and as a result, have considered that intermolecular aggregation can be suppressed by introducing a bulky substituent into a polycyclic aromatic compound containing boron to suppress concentration quenching, and have found that the problem is solved. An organic device using the compound of the invention in the present application can provide high device efficiency also in a high dopant concentration advantageous for a device production process.

Item 1. A material for an organic device, comprising a polycyclic aromatic compound represented by general formula (1) described below:

Formula 6

(1)

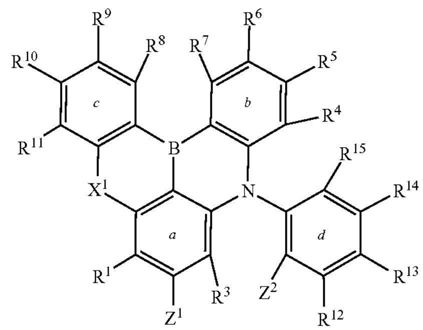

wherein, in formula (1) described above, $R^1$, $R^3$, $R^4$ to $R^7$, $R^8$ to $R^{11}$ and $R^{12}$ to $R^{15}$ are independently hydrogen, aryl, heteroaryl, diarylamino, diheteroarylamino, arylheteroarylamino, alkyl, cycloalkyl, alkoxy or aryloxy, and at least one hydrogen therein may be replaced by aryl, heteroaryl, alkyl or cycloalkyl, and adjacent groups of $R^4$ to $R^7$, $R^8$ to $R^{11}$ and $R^{12}$ to $R^{15}$ may be bonded to each other to form an aryl ring or a heteroaryl ring together with a b ring, a c ring or a d ring, and at least one hydrogen in the ring formed may be replaced by aryl, heteroaryl, diarylamino, diheteroarylamino, arylheteroarylamino, alkyl, cycloalkyl, alkoxy or aryloxy, and at least one hydrogen therein may be replaced by aryl, heteroaryl, alkyl or cycloalkyl, $X^1$ is —O— or >N—R, R of the >N—R is aryl having 6 to 12 carbons, heteroaryl having 2 to 15 carbons, alkyl having 1 to 6 carbons or cycloalkyl having 3 to 14 carbons, and at least one hydrogen therein may be replaced by aryl having 6 to 12 carbons, heteroaryl having 2 to 15 carbons, alkyl having 1 to 6 carbons or cycloalkyl having 3 to 14 carbons, and R of the >N—R may be bonded to the a ring and/or the c ring by —O—, —S—, $—C(—R)_2—$ or a single bond, and R of the $—C(—R)_2—$ is alkyl having 1 to 6 carbons or cycloalkyl having 3 to 14 carbons, $Z^1$ and $Z^2$ are independently aryl, heteroaryl, diarylamino, aryloxy, aryl-substituted alkyl, hydrogen, alkyl, cycloalkyl or alkoxy, and at least one hydrogen therein may be replaced by aryl, alkyl or cycloalkyl, when $Z^1$ is phenyl in which replacement may be made by alkyl or cycloalkyl, m-biphenylyl in which replacement may be made by alkyl or cycloalkyl, p-biphenylyl in which replacement may be made by alkyl or cycloalkyl, monocyclic heteroaryl in which replacement may be made by alkyl or cycloalkyl, diphenylamino in which replacement may be made by alkyl or cycloalkyl, hydrogen, alkyl, cycloalkyl having 3 to 8 carbons, adamantyl or alkoxy, and a case where $Z^2$ is hydrogen, alkyl or alkoxy is excluded, and at least one hydrogen in a compound represented by formula (1) may be replaced by halogen or deuterium.

Item 2. The material for the organic device according to item 1, wherein $R^1$, $R^3$, $R^4$ to $R^7$, $R^8$ to $R^{11}$ and $R^{12}$ to $R^{15}$ are independently hydrogen, aryl having 6 to 30 carbons, heteroaryl having 2 to 30 carbons, diarylamino (in which aryl is aryl having 6 to 12 carbons), alkyl having 1 to 6 carbons, cycloalkyl having 3 to 14 carbons, alkoxy having 1 to 6 carbons or aryloxy having 6 to 12 carbons, and at least one hydrogen therein may be replaced by aryl having 6 to 12 carbons, alkyl having 1 to 6 carbons or cycloalkyl having 3 to 14 carbons, and adjacent groups of $R^4$ to $R^7$, $R^8$ to $R^{11}$ and $R^{12}$ to $R^{15}$ may be bonded to each other to form an aryl ring having 9 to 16 carbons or a heteroaryl ring having 6 to 15 carbons together with a b ring, a c ring or a d ring, and at least one hydrogen in the ring formed may be replaced by aryl having 6 to 30 carbons, heteroaryl having 2 to 30 carbons, diarylamino (in which aryl is aryl having 6 to 12 carbons), alkyl having 1 to 6 carbons, cycloalkyl having 3 to 14 carbons, alkoxy having 1 to 6 carbons or aryloxy having 6 to 12 carbons, $X^1$ is —O— or >N—R, R of the >N—R is aryl having 6 to 12 carbons, alkyl having 1 to 6 carbons or cycloalkyl having 3 to 14 carbons, and at least one hydrogen therein may be replaced by aryl having 6 to 12 carbons, alkyl having 1 to 6 carbons or cycloalkyl having 3 to 14 carbons, $Z^1$ and $Z^2$ are independently aryl having 6 to 30 carbons, diarylamino (in which aryl is aryl having 6 to 16 carbon), aryloxy having 6 to 30 carbons, alkyl having 1 to 6 carbons in which replacement is made by aryl having 6 to 12 carbons, hydrogen, alkyl having 1 to 6 carbons or cycloalkyl having 3 to 14 carbons, and at least one hydrogen therein may be replaced by aryl having 6 to 16 carbons, alkyl having 1 to 6 carbons or cycloalkyl having 3 to 14 carbons, when $Z^1$ is phenyl in which replacement may be made by alkyl having 1 to 6 carbons or cycloalkyl having 3 to 14 carbons, m-biphenylyl in which replacement may be made by alkyl having 1 to 6 carbons or cycloalkyl having 3 to 14 carbons, p-biphenylyl in which replacement may be made by alkyl having 1 to 6 carbons or cycloalkyl having 3 to 14 carbons, diphenylamino in which replacement may be made by alkyl having 1 to 6 carbons or cycloalkyl having 3 to 14 carbons, hydrogen, alkyl having 1 to 6 carbons, cycloalkyl having 3 to 8 carbons or adamantyl, and a case where $Z^2$ is hydrogen or alkyl having 1 to 6 carbons is excluded, and at least one hydrogen in a compound represented by formula (1) may be replaced by halogen or deuterium.

Item 3. The material for the organic device according to item 1, wherein $R^1$, $R^3$, $R^4$ to $R^7$, $R^8$ to $R^{11}$ and $R^{12}$ to $R^{15}$ are independently hydrogen, aryl having 6 to 16 carbons, heteroaryl having 2 to 20 carbons, diarylamino (in which aryl is aryl having 6 to 12 carbons), alkyl having 1 to 6 carbons, cycloalkyl having 3 to 14 carbons, alkoxy having 1 to 6 carbons or aryloxy having 6 to 12 carbons, and adjacent groups of $R^4$ to $R^7$, $R^8$ to $R^{11}$ and $R^{12}$ to $R^{15}$ may be bonded to each other to form an aryl ring having 9 to 16 carbons or a heteroaryl ring having 6 to 15 carbons together with a b ring, a c ring or a d ring, and at least one hydrogen in the ring formed may be replaced by aryl having 6 to 16 carbons, heteroaryl having 2 to 20 carbons, diarylamino (in which aryl is aryl having 6 to 12 carbons), alkyl having 1 to 6 carbons, cycloalkyl having 3 to 14 carbons, alkoxy having 1 to 6 carbons or aryloxy having 6 to 12 carbons, $X^1$ is —O— or >N—R, and R of the >N—R is aryl having 6 to 12 carbons, alkyl having 1 to 6 carbons, cycloalkyl having 3 to 14 carbons, or aryl having 6 to 12 carbons in which replacement is made by alkyl having 1 to 6 carbons or cycloalkyl having 3 to 14 carbons, $Z^1$ and $Z^2$ are independently aryl having 6 to 16 carbons, diarylamino (in which aryl is aryl having 6 to 16 carbon), aryloxy having 6 to 16 carbons, alkyl having 1 to 6 carbons in which replacement is made by aryl having 6 to 12 carbons, hydrogen, alkyl having 1 to 6 carbons or cycloalkyl having 3 to 14 carbons, and at least one hydrogen therein may be replaced by aryl having 6 to 16 carbons, alkyl having 1 to 6 carbons or cycloalkyl having 3 to 14 carbons, when $Z^1$ is phenyl in which replacement may be made by alkyl having 1 to 6 carbons or cycloalkyl having 3 to 14 carbons, m-biphenylyl in which replacement may be made by alkyl having 1 to 6 carbons or cycloalkyl having 3 to 14 carbons, p-biphenylyl in which replacement may be made by alkyl having 1 to 6 carbons or cycloalkyl having 3 to 14 carbons, diphenylamino in which replacement may be made by alkyl having 1 to 6 carbons or cycloalkyl having 3 to 14 carbons, hydrogen, alkyl having 1 to 6 carbons, cycloalkyl having 3 to 8 carbons or adamantyl, and a case where $Z^2$ is hydrogen or alkyl having 1 to 6 carbons is excluded, and at least one hydrogen in a compound represented by formula (1) may be replaced by halogen or deuterium.

Item 4. The material for the organic device according to item 1, wherein $R^1$, $R^3$, $R^4$ to $R^7$, $R^8$ to $R^{11}$ and $R^{12}$ to $R^{15}$ are independently hydrogen, aryl having 6 to 16 carbons, heteroaryl having 2 to 20 carbons, diarylamino (in which aryl is aryl having 6 to 12 carbons), alkyl having 1 to 6 carbons, cycloalkyl having 3 to 14 carbons, alkoxy having 1 to 6 carbons or aryloxy having 6 to 12 carbons, and adjacent groups of $R^4$ to $R^7$, $R^8$ to $R^{11}$ and $R^{12}$ to $R^{15}$ may be bonded to each other to form a naphthalene ring, a fluorene ring or a carbazole ring together with a b ring, a c ring or a d ring, and at least one hydrogen in the ring formed may be replaced by aryl having 6 to 16 carbons, heteroaryl having 2 to 20 carbons, diarylamino (in which aryl is aryl having 6 to 12 carbons), alkyl having 1 to 6 carbons, cycloalkyl having 3 to 14 carbons, alkoxy having 1 to 6 carbons or aryloxy having 6 to 12 carbons, $X^1$ is —O— or >N—R, and R of the >N—R is aryl having 6 to 12 carbons, alkyl having 1 to 6 carbons, cycloalkyl having 3 to 14 carbons, or aryl having 6 to 12 carbons in which replacement is made by alkyl having 1 to 6 carbons or cycloalkyl having 3 to 14 carbons, $Z^1$ and $Z^2$ are independently aryl having 6 to 10 carbons, diarylamino (in which aryl is aryl having 6 to 12 carbon), aryloxy having 6 to 10 carbons, alkyl having 1 to 4 carbons in which replacement is made by one to three aryl having 6 to 10 carbons, hydrogen, alkyl having 1 to 4 carbons or cycloalkyl having 5 to 10 carbons, and at least one hydrogen therein may be replaced by aryl having 6 to 12 carbons, alkyl having 1 to 4 carbons or cycloalkyl having 5 to 10 carbons, when $Z^1$ is phenyl in which replacement may be made by alkyl having 1 to 4 carbons or cycloalkyl having 5 to 10 carbons, m-biphenylyl in which replacement may be made by alkyl having 1 to 4 carbons or cycloalkyl having 5 to 10 carbons, p-biphenylyl in which replacement may be made by alkyl having 1 to 4 carbons or cycloalkyl having 5 to 10 carbons, diphenylamino in which replacement may be made by alkyl having 1 to 4 carbons or cycloalkyl having 5 to 10 carbons, hydrogen, alkyl having 1 to 4 carbons, cycloalkyl having 3 to 8 carbons or adamantyl, and a case where $Z^2$ is hydrogen or alkyl having 1 to 4 carbons is excluded, and at least one hydrogen in a compound represented by formula (1) may be replaced by halogen or deuterium.

Item 5. The material for the organic device according to any one of items 1 to 4, wherein $Z^1$ is diarylamino, aryloxy, triaryl-substituted alkyl having 1 to 4 carbons, hydrogen, alkyl having 1 to 4 carbons or cycloalkyl having 5 to 10 carbons, and aryl therein is independently phenyl, biphenylyl or naphthyl in which replacement may be made by alkyl having 1 to 4 carbons or phenyl, $Z^2$ is phenyl, biphenylyl or naphthyl in which replacement may be made by alkyl having 1 to 4 carbons or cycloalkyl having 5 to 10 carbons, or hydrogen, alkyl having 1 to 4 carbons or cycloalkyl having 5 to 10 carbons, and when $Z^1$ is diphenylamino in which replacement may be made by alkyl having 1 to 4 carbons or cycloalkyl having 5 to 10 carbons, hydrogen, alkyl having 1 to 4 carbons, cycloalkyl having 5 to 10 carbons or adamantyl, and a case where $Z^2$ is hydrogen or alkyl having 1 to 4 carbons is excluded.

Item 6. The material for the organic device according to item 1, wherein the polycyclic aromatic compound represented by formula (1) described above is a compound represented by any one of structural formulas described below.

Formula 7

(1-50)

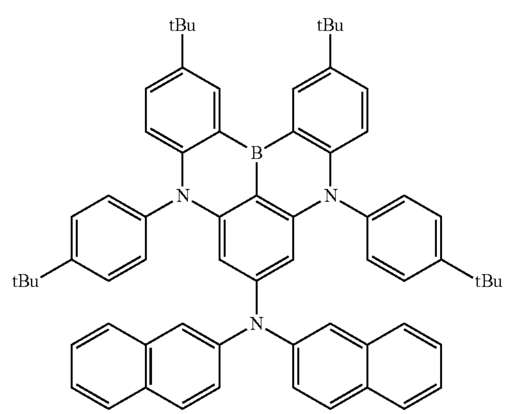

(1-66)

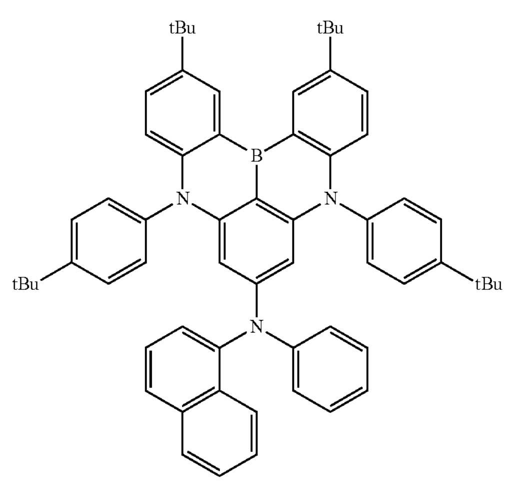

-continued
(1-124)
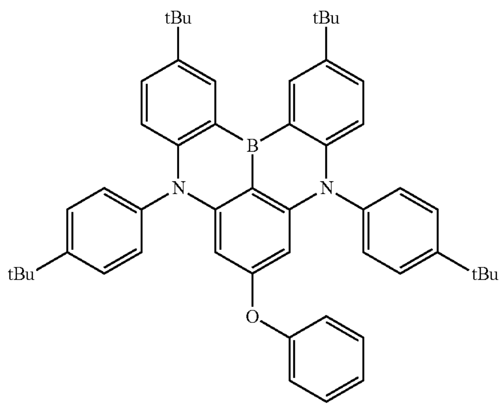
(1-128)
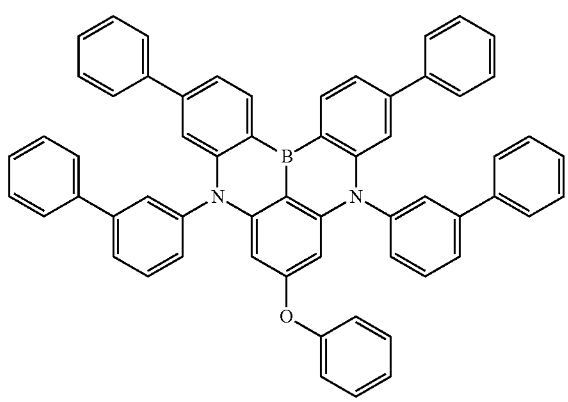
(1-132)
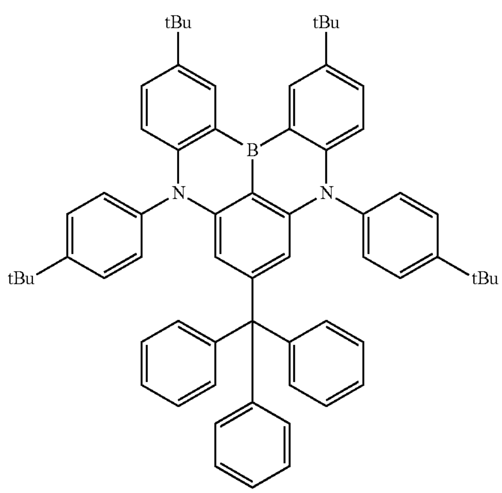
-continued
(1-136)
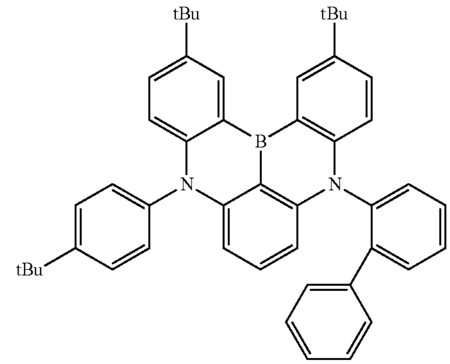
Formula 8
(1-166)
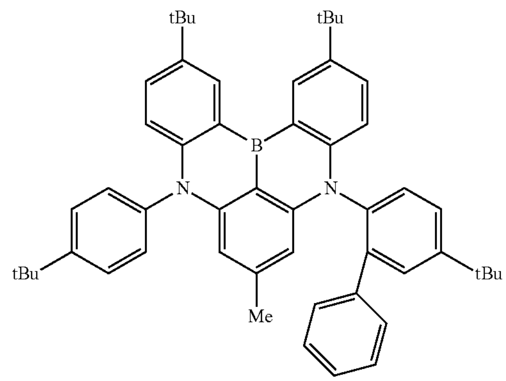
(1-170)
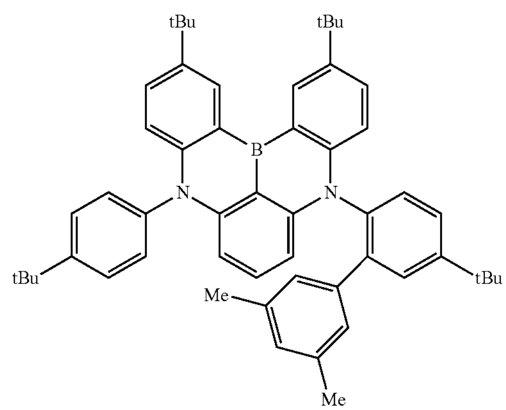
(1-180)
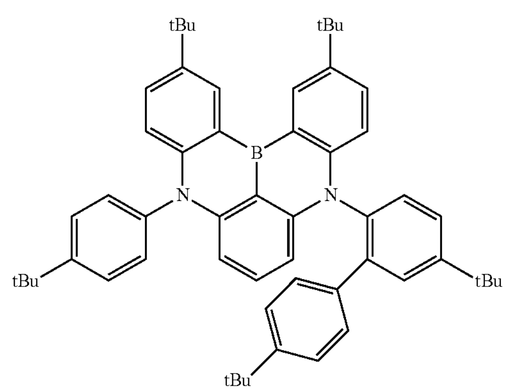

(1-200)
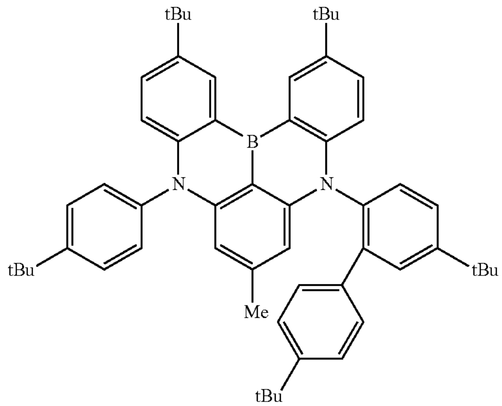
(1-208)
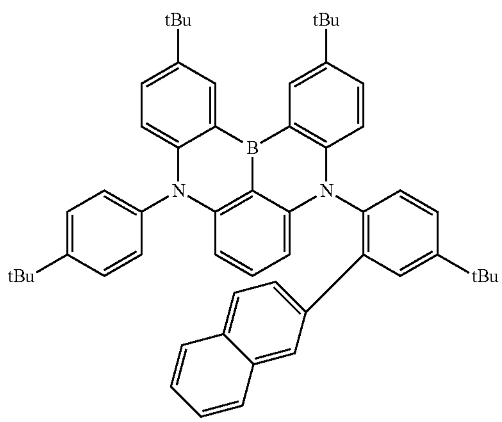
(1-216)
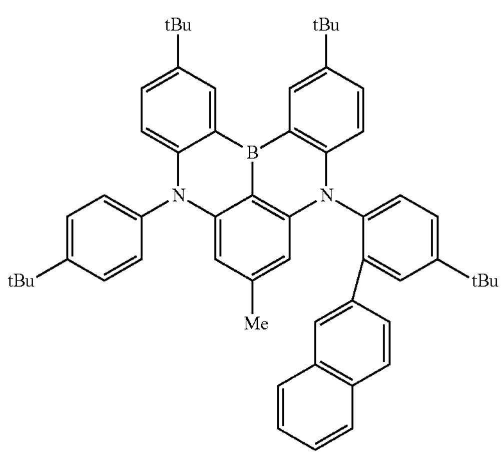
Formula 9
(1-240)
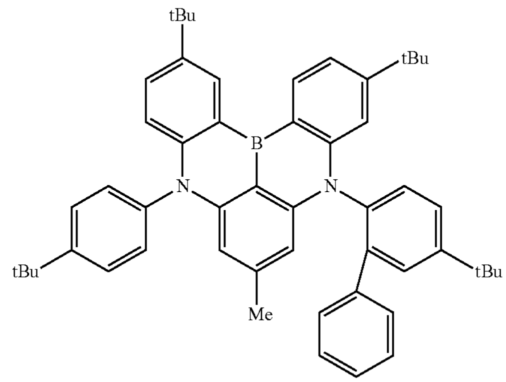
(1-244)
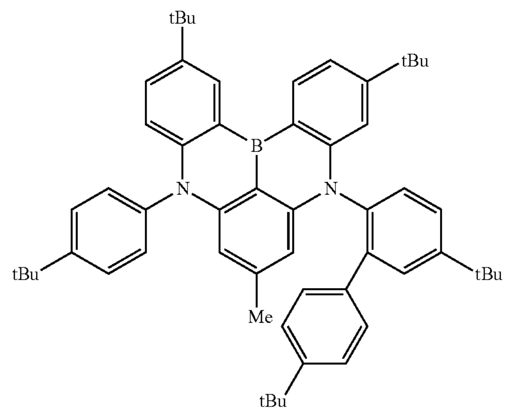
(1-252)
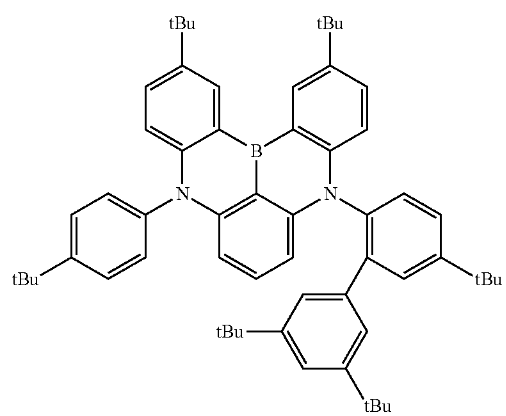
(1-296)
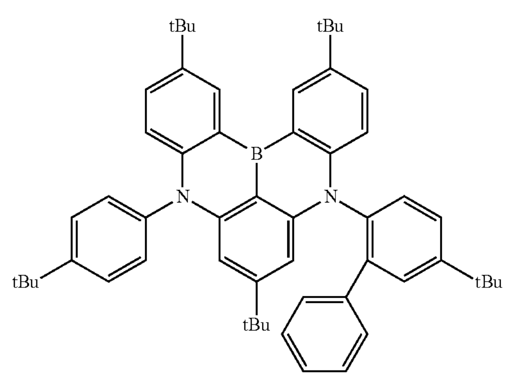

-continued

Formula 10

(1-300)

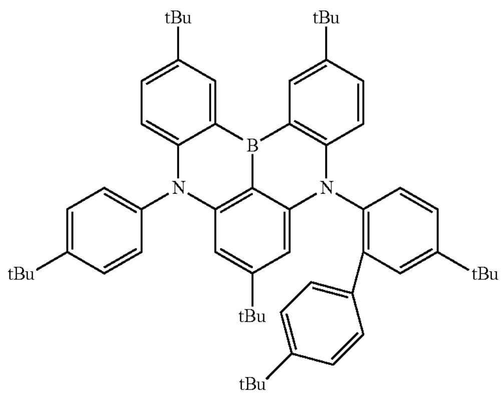

(1-715)

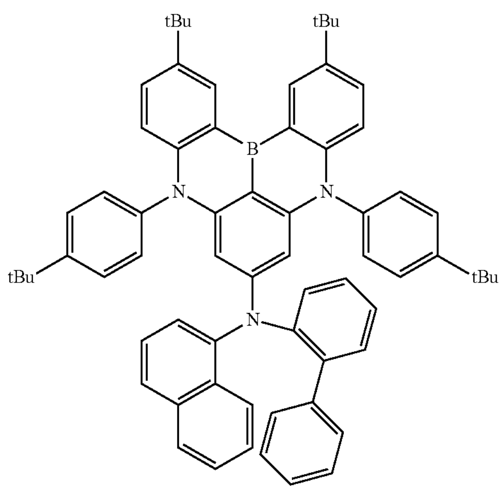

(1-730)

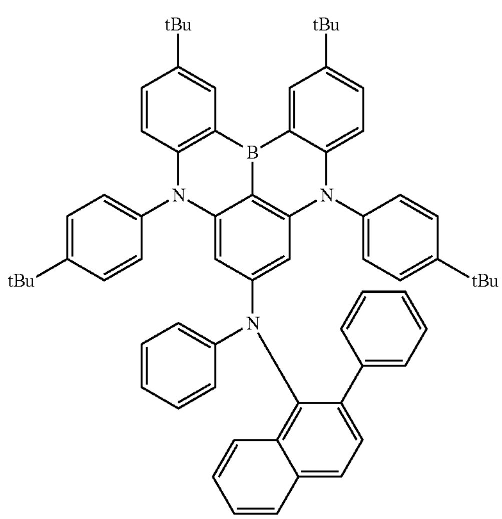

-continued (1-733)

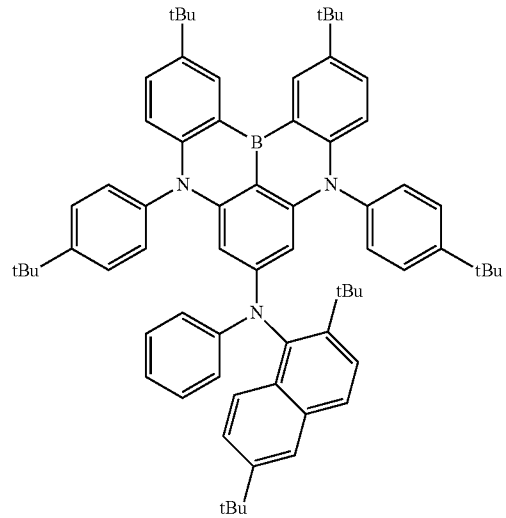

Item 7. The material for the organic device according to any one of items 1 to 6, wherein specific examples of the material for the organic device comprise a material for an organic electroluminescent device, a material for an organic field effect transistor or a material for an organic thin film photovoltaic cell.

Item 8. An organic electroluminescent device, having a pair of electrodes formed of an anode and a cathode, and a luminescent layer arranged between the electrodes, wherein the luminescent layer contains the material for the organic device according to any one of items 1 to 6.

Item 9. The organic electroluminescent device according to item 8, wherein the luminescent layer contains a host and the material for the organic device as a dopant.

Item 10. The organic electroluminescent device according to item 9, wherein the host is an anthracene-based compound, a dibenzochrysene-based compound or a fluorene-based compound.

Item 11. The organic electroluminescent device according to any one of items 8 to 10, having an electron transport layer and/or an electron injection layer which are arranged between the cathode and the luminescent layer, wherein at least one of the electron transport layer and the electron injection layer contains at least one selected from the group of a borane derivative, a pyridine derivative, a fluoranthene derivative, a BO-based derivative, an anthracene derivative, a benzofluorene derivative, a phosphine oxide derivative, a pyrimidine derivative, a carbazole derivative, a triazine derivative, a benzimidazole derivative, a phenanthroline derivative and a quinolinol-based metal complex.

Item 12. The organic electroluminescent device according to item 11, wherein the electron transport layer and/or the electron injection layer further contain at least one selected from the group of alkali metal, alkaline earth metal, rare earth metal, oxide of alkali metal, halide of alkali metal, oxide of alkaline earth metal, halide of alkaline earth metal, oxide of rare earth metal, halide of rare earth metal, an organic complex of alkali metal, an organic complex of alkaline earth metal and an organic complex of rare earth metal.

Item 13. A display unit or a lighting unit, comprising the organic electroluminescent device according to any one of items 8 to 12.

Advantageous Effects of Invention

According to a preferred aspect of the invention, a polycyclic aromatic compound represented by general formula (1) described above and having a bulky substituent in a molecule is used as a material for an organic device, whereby, for example, an organic EL device excellent in quantum efficiency can be provided. In particular, concentration quenching can be suppressed even if a use concentration is comparatively high, and therefore the present art is advantageous for a device production process.

Moreover, in the compound of the invention, a cycloalkyl group is introduced thereinto. Thus, reduction of a melting point and sublimation temperature can be expected, which means that, in substantially essential sublimation purification as a purification method of a material for an organic device such as an organic EL device in which high purity is required, the material can be purified at comparatively low temperature, and therefore thermal decomposition of the material, or the like can be avoided. Moreover, the advantage is also similar to a vacuum deposition process as a powerful means for preparation of the organic device such as the organic EL device, and the process can be performed at comparatively low temperature, and therefore thermal decomposition of the material can be avoided, resulting in being able to obtain high-performance organic device use. Moreover, solubility in an organic solvent is improved by introducing the cycloalkyl group, and therefore the compound of the invention can be applied also to device preparation utilizing a coating process. However, the invention is not particularly limited to the above principles.

BRIEF DESCRIPTION OF DRAWINGS

FIG. 1 is a schematic cross-sectional view showing an organic EL device according to the present embodiment.

DESCRIPTION OF EMBODIMENTS

1. Material for Organic Device, Containing Polycyclic Aromatic Compound

The invention discloses a material for an organic device, containing a polycyclic aromatic compound represented by general formula (1) described below. Specific examples of the material for the organic device include a material for an organic electroluminescent device, a material for an organic field effect transistor or a material for an organic thin film photovoltaic cell. For example, when the material for the organic device is used in the organic EL device, the material can be used as a dopant material in a luminescent layer arranged between a pair of electrodes formed of an anode and a cathode.

Formula 11

(1)

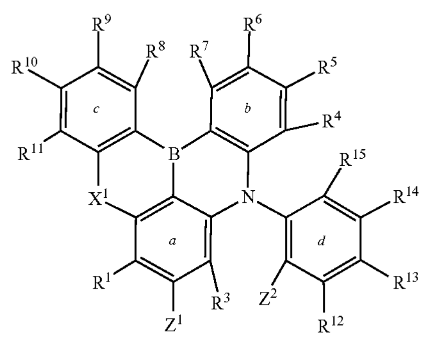

In formula (1) described above, $R^1$, $R^3$, $R^4$ to $R^7$, $R^8$ to $R^{11}$ and $R^{12}$ to $R^{15}$ are independently hydrogen, aryl, heteroaryl, diarylamino, diheteroarylamino, arylheteroarylamino, alkyl, cycloalkyl, alkoxy or aryloxy, and at least one hydrogen therein may be replaced by aryl, heteroaryl, alkyl or cycloalkyl, $X^1$ is —O— or >N—R, R of the >N—R is aryl having 6 to 12 carbons, heteroaryl having 2 to 15 carbons, alkyl having 1 to 6 carbons or cycloalkyl having 3 to 14 carbons, and at least one hydrogen therein may be replaced by aryl having 6 to 12 carbons, heteroaryl having 2 to 15 carbons, alkyl having 1 to 6 carbons or cycloalkyl having 3 to 14 carbons, $Z^1$ and $Z^2$ are independently aryl, heteroaryl, diarylamino, aryloxy, aryl-substituted alkyl, hydrogen, alkyl, cycloalkyl or alkoxy, and at least one hydrogen therein may be replaced by aryl, alkyl or cycloalkyl, when $Z^1$ is phenyl in which replacement may be made by alkyl or cycloalkyl, m-biphenylyl in which replacement may be made by alkyl or cycloalkyl, p-biphenylyl in which replacement may be made by alkyl or cycloalkyl, monocyclic heteroaryl in which replacement may be made by alkyl or cycloalkyl, diphenylamino in which replacement may be made by alkyl or cycloalkyl, hydrogen, alkyl, cycloalkyl having 3 to 8 carbons, adamantyl or alkoxy, a case where $Z^2$ is hydrogen, alkyl or alkoxy is excluded, and at least one hydrogen in a compound represented by formula (1) may be replaced by halogen or deuterium.

In general formula (1), adjacent groups of substituents $R^4$ to $R^7$, $R^8$ to $R^{11}$ and $R^{12}$ to $R^{15}$ of a b ring, a c ring and a d ring may be bonded to each other to form an aryl ring or a heteroaryl ring together with the b ring, the c ring or the d ring, and at least one hydrogen in the ring formed may be replaced by aryl, heteroaryl, diarylamino, diheteroarylamino, arylheteroarylamino, alkyl, cycloalkyl, alkoxy or aryloxy, and at least one hydrogen therein may be replaced by aryl, heteroaryl, alkyl or cycloalkyl. Accordingly, in the polycyclic aromatic compound represented by general formula (1), as shown in formula (1-1) and formula (1-2) described below, a ring structure constituting the compound changes depending on a mutual bonding form of substituents in the b ring, the c ring and the d ring. In addition, a definition of each sign in formula (1-1) and formula (1-2) is identical to a definition thereof in formula (1) described above.

Formula 12

(1-1)

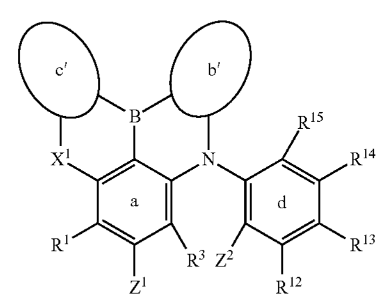

-continued (1-2)

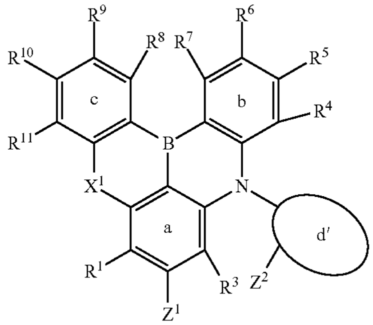

A b' ring, a c' ring and a d' ring in formula (1-1) and formula (1-2) described above show an aryl ring or a heteroaryl ring formed by bonding of adjacent groups of substituents $R^4$ to $R^7$, $R^8$ to $R^{11}$ and $R^{12}$ to $R^{15}$ to each other together with the b ring, the c ring and the d ring, respectively (or also referred to as the fused ring formed by fusing of any other ring structure to the b ring, the c ring or the d ring). In addition, although not shown in the formulas, a compound in which all of the b ring, the c ring and d ring are changed into the b' ring, the c' ring and the d' ring is also present. Moreover, as shown in formula (1-1) and formula (1-2) described above, for example, $R^7$ of the b ring and $R^8$ of the c ring, $R^4$ of the b ring and $R^{15}$ of the d ring and the like do not fall under "adjacent groups to each other" and are never bonded to each other. More specifically, the term "adjacent groups" means adjacent groups on an identical ring.

The compound represented by formula (1-1) or formula (1-2) described above is a compound having the b' ring (or the c' ring or the d' ring) formed by fusing of a benzene ring, an indole ring, a pyrrole ring, a benzofuran ring or a benzothiophene ring to the benzene ring as the b ring (or the c ring or the d ring), for example, and a fused ring b' (or a fused ring c' or a fused ring d') formed and produced each is a naphthalene ring, a carbazole ring, an indole ring, a dibenzofuran ring or a dibenzothiophene ring.

$X^1$ in general formula (1) is —O— or >N—R. R of the >N—R may be bonded to the a ring and/or the c ring by —O—, —S—, —C(—R)$_2$— or a single bond, and R of the —C(—R)$_2$— is alkyl having 1 to 6 carbons or cycloalkyl having 3 to 14 carbons.

Here, the specification "R of >N—R is bonded to the a ring and/or the c ring by —O—, —S—, —C(—R)$_2$— or the single bond" in general formula (1) can be expressed by a compound represented by formula (1-3-1) described below and having a ring structure in which $X^1$ is incorporated into the fused ring c'. More specifically, the compound has the c' ring formed by fusing of any other ring to the benzene ring as the c ring in general formula (1) so as to incorporate $X^1$ thereinto. Moreover, the specification described above can also be expressed by a compound represented by formula (1-3-2) described below and having a ring structure in which $X^1$ is incorporated into a fused ring a'. More specifically, the compound has an a' ring formed by fusing of any other ring to the benzene ring as the a ring in general formula (1) so as to incorporate $X^1$ thereinto. In addition, a definition of each sign in formula (1-3-1) and formula (1-3-2) is identical to the definition in formula (1) described above.

Formula 13

(1-3-1)

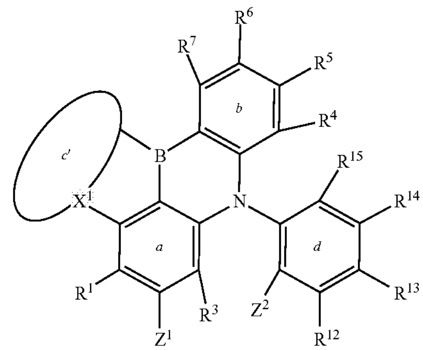

(1-3-2)

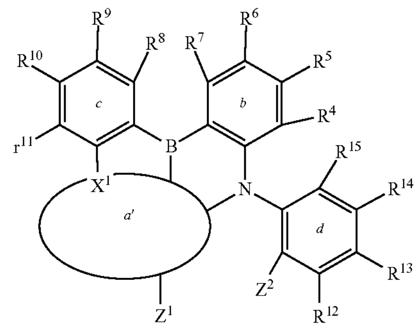

Specific examples of "aryl" (first substituent) of $R^1$, $R^3$, $R^4$ to $R^7$, $R^8$ to $R^{11}$ and $R^{12}$ to $R^{15}$ include aryl having 6 to 30 carbons, and aryl having 6 to 16 carbons is preferred, aryl having 6 to 12 carbons is further preferred, and aryl having 6 to 10 carbons is particularly preferred.

Specific examples of "aryl" include: phenyl which is monocyclic; biphenylyl which is bicyclic; naphthyl (1-naphthyl or 2-naphthyl) which is fused bicyclic; terphenylyl (m-terphenylyl, o-terphenylyl or p-terphenylyl) which is tricyclic;

acenaphthylenyl, fluorenyl, phenalenyl or phenanthrenyl which is fused tricyclic; triphenylenyl, pyrenyl or naphthacenyl which is fused tetracyclic; and perylenyl or pentacenyl which is fused pentacyclic.

Specific examples of "heteroaryl" (first substituent) of $R^1$, $R^3$, $R^4$ to $R^7$, $R^8$ to $R^{11}$ and $R^{12}$ to $R^{15}$ include heteroaryl having 2 to 30 carbons, and heteroaryl having 2 to 25 carbons is preferred, heteroaryl having 2 to 20 carbons is further preferred, heteroaryl having 2 to 15 carbons is still further preferred, and heteroaryl having 2 to 10 carbons is particularly preferred. Moreover, specific examples of "heteroaryl" include a heterocyclic ring containing one to five hetero atoms selected from oxygen, sulfur and nitrogen other than carbon as a ring-constituting atom.

Specific examples of "heteroaryl" include pyrrolyl, oxazolyl, isoxazolyl, triazolyl, isothiazolyl, imidazolyl, oxadiazolyl, thiadiazolyl, triazolyl, tetrazolyl, pyrazolyl, pyridinyl, pyrimidinyl, pyridazinyl, pyrazinyl, triadinyl, indolyl, isoindolyl, 1H-indazolyl, benzoimidazolyl, benzoxazolyl, benzothiazolyl, 1H-benzotriazolyl, quinolinyl, isoquinolinyl, cinnolinyl, quinazolinyl, quinoxalinyl, phthalazinyl, naphthyridinyl, purinyl, buteridinyl, carbazolyl, acridinyl, phenoxathiinyl, phenoxazinyl, phenothiazinyl, phenazinyl, indridinyl, furanyl, benzofuranyl, isobenzofuranyl, dibenzofuranyl, naphthobenzofuranyl, thiophenyl, benzothiophenyl, isobenzothiophenyl, dibenzothiophenyl, naphthobenzothiophenyl, furazanyl and thianthrenyl.

"Alkyl" (first substituent) of $R^1$, $R^3$, $R^4$ to $R^7$, $R^8$ to $R^{11}$ and $R^{12}$ to $R^{15}$ may be any of straight-chain alkyl and branched-chain alkyl, and specific examples thereof include straight-chain alkyl having 1 to 24 carbons or branched-chain alkyl having 3 to 24 carbons. Alkyl having 1 to 18 carbons (branched-chain alkyl having 3 to 18 carbons) is preferred, alkyl having 1 to 12 carbons (branched-chain alkyl having 3 to 12 carbons) is further preferred, alkyl having 1 to 6 carbons (branched-chain alkyl having 3 to 6 carbons) is still further preferred, and alkyl having 1 to 4 carbons (branched-chain alkyl having 3 to 4 carbons) is particularly preferred.

Specific examples of "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl and n-eicosyl.

Specific examples of "cycloalkyl" (first substituent) of $R^1$, $R^3$, $R^4$ to $R^7$, $R^8$ to $R^{11}$ and $R^{12}$ to $R^{15}$ include cycloalkyl having 3 to 24 carbons, cycloalkyl having 3 to 20 carbons, cycloalkyl having 3 to 16 carbons, cycloalkyl having 3 to 14 carbons, cycloalkyl having 5 to 10 carbons, cycloalkyl having 5 to 8 carbons, cycloalkyl having 5 to 6 carbons and cycloalkyl having 5 carbons.

Specific examples of "cycloalkyl" include cyclopropyl (C3), cyclobutyl (C4), cyclopentyl (C5), cyclohexyl (C6), cycloheptyl (C7), cyclooctyl (C8), cyclononyl (C9), cyclodecyl (C10), and a substitution product of alkyl having 1 to 4 carbons (particularly methyl), or bicyclo[1.0.1]butyl (C4), bicyclo[1.1.1]pentyl (C5), bicyclo[2.0.1]pentyl (C5), bicyclo[1.2.1]hexyl (C6), bicyclo[3.0.1]hexyl (C6), bicyclo [2.1.2]heptyl (C7), bicyclo[2.2.2]octyl (C8), adamantyl (C10), diamanthyl (C14), decahydronaphthalenyl (C10) and decahydroazulenyl (C10).

Specific examples of "alkoxy" (first substituent) of $R^1$, $R^3$, $R^4$ to $R^7$, $R^8$ to $R^{11}$ and $R^{12}$ to $R^{15}$ include straight-chain alkoxy having 1 to 24 carbons or branched-chain alkoxy having 3 to 24 carbons. Alkoxy having 1 to 18 carbons (branched-chain alkoxy having 3 to 18 carbons) is preferred, alkoxy having 1 to 12 carbons (branched-chain alkoxy having 3 to 12 carbons) is further preferred, alkoxy having 1 to 6 carbons (branched-chain alkoxy having 3 to 6 carbons) is still further preferred, and alkoxy having 1 to 4 carbons (branched-chain alkoxy having 3 to 4 carbons) is particularly preferred.

Specific examples of "alkoxy" include methoxy, ethoxy, propoxy, isopropoxy, butoxy, isobutoxy, s-butoxy, t-butoxy, pentyloxy, hexyloxy, heptyloxy and octyloxy.

With regard to a detail of "aryl" or "heteroaryl" in "diarylamino" (first substituent), "diheteroarylamino" (first substituent), "arylheteroarylamino" (first substituent) and "aryloxy" (first substituent) of $R^1$, $R^3$, $R^4$ to $R^7$, $R^8$ to $R^{11}$ and $R^{12}$ to $R^{15}$, the description of "aryl" or "heteroaryl" described above can be cited.

At least one hydrogen in the first substituent described above may be replaced by "aryl," "heteroaryl," "alkyl" or "cycloalkyl" as a second substituent, and with regard to a detail thereof, the description of "aryl," "heteroaryl," "alkyl" or "cycloalkyl" as the first substituent described above can be cited. Moreover, in "aryl" or "heteroaryl" as the second substituent, a group in which at least one hydrogen therein is replaced by aryl (specific example is the group described above) such as phenyl, alkyl (specific example is the group described above) such as methyl or cycloalkyl (specific example is the group described above) such as cyclohexyl is also included in aryl or heteroaryl as the second substituent. As one example thereof, when the second substituent is a carbazolyl group, a carbazolyl group in which hydrogen at position 9 is replaced by aryl such as phenyl, alkyl such as methyl or cycloalkyl such as cyclohexyl is also included in heteroaryl as the second substituent.

With regard to a detail of an aryl ring or a heteroaryl ring formed by bonding of adjacent groups of $R^4$ to $R^7$, $R^8$ to $R^{11}$ and $R^{12}$ to $R^{15}$ to each other, the description of "aryl" or "heteroaryl" as the first substituent as described above can be cited as a non-valent ring structure.

At least one hydrogen in the ring formed may be replaced by "aryl," "heteroaryl," "diarylamino," "diheteroarylamino," "arylheteroarylamino," "alkyl," "cycloalkyl," "alkoxy" or "aryloxy," and at least one hydrogen therein may be replaced by "aryl," "heteroaryl," "alkyl" or "cycloalkyl," and with regard to a detail thereof, the description of the first substituent and the second substituent described above can be cited.

With regard to a detail of "aryl having 6 to 12 carbons," "heteroaryl having 2 to 15 carbons," "alkyl having 1 to 6 carbons" or "cycloalkyl having 3 to 14 carbons" in R of >N—R as $X^1$ and "aryl having 6 to 12 carbons," "heteroaryl having 2 to 15 carbons," "alkyl having 1 to 6 carbons" or "cycloalkyl having 3 to 14 carbons" by which replacement can be made, the description of the first substituent and the second substituent described above can be cited. Moreover, with regard to a detail of "alkyl having 1 to 6 carbons" or "cycloalkyl having 3 to 14 carbons" of R in "$—C(—R)_2—$," the description of the first substituent described above can be cited. In particular, alkyl having 1 to 4 carbons (for example, methyl and ethyl) and cycloalkyl having 3 to 14 carbons (for example, bicyclooctyl and adamantyl) are preferred.

With regard to a detail of "aryl," "heteroaryl," "diarylamino," "aryloxy," and "aryl" and "alkyl" in "aryl-substituted alkyl," "alkyl," "cycloalkyl" or "alkoxy" in $Z^1$ and $Z^2$, and "aryl," "alkyl" or "cycloalkyl" by which replacement can be made, the description of the first substituent and the second substituent as described above can be cited.

$Z^1$ and $Z^2$ are preferably independently aryl having 6 to 10 carbons, diarylamino (in which aryl is aryl having 6 to 12 carbons), aryloxy having 6 to 10 carbons, alkyl having 1 to 4 carbons in which replacement is made by one to three pieces of aryl having 6 to 10 carbons, hydrogen, alkyl having 1 to 4 carbons or cycloalkyl having 3 to 14 carbons, and at least one hydrogen therein may be replaced by alkyl having 1 to 4 carbons or cycloalkyl having 3 to 14 carbons.

$Z^1$ is further preferably diarylamino, aryloxy, triaryl-substituted alkyl having 1 to 4 carbons, hydrogen, alkyl having 1 to 4 carbons or cycloalkyl having 3 to 14 carbons, and aryl therein is independently phenyl, biphenylyl or naphthyl in which replacement may be made by alkyl having 1 to 4 carbons or cycloalkyl having 3 to 14 carbons. $Z^1$ is still further preferably diarylamino, hydrogen, alkyl having 1 to 4 carbons or cycloalkyl having 3 to 14 carbons, and aryl in diarylamino is phenyl, biphenylyl or naphthyl in which replacement may be made by alkyl having 1 to 4 carbons or cycloalkyl having 3 to 14 carbons.

$Z^2$ is further preferably phenyl, biphenylyl or naphthyl in which replacement may be made by alkyl having 1 to 4 carbons or cycloalkyl having 3 to 14 carbons, or hydrogen, alkyl having 1 to 4 carbons or cycloalkyl having 3 to 14 carbons.

However, even if a phenyl group is selected at a position of $Z^1$, a bulky substituent is not formed. A position of $Z^2$ is an ortho position in a >N-phenyl group in which peripheral space is limited, and therefore even the phenyl group which is not formed into the bulky substituent as $Z^1$ has a role of the bulky substituent at the position of $Z^2$.

Specific examples of the group in which an effect of bulkiness is thus different depending on the position (group having no function as the bulky substituent at the position of $Z^1$) include, in addition to a phenyl group, a m-biphenylyl group, a p-biphenylyl group, a monocyclic heteroaryl group (heteroaryl group constituted of one ring, such as a pyridyl group), a diphenylamino group and a particular cycloalkyl group (for example, cycloalkyl having 3 to 8 carbons and adamantyl). Moreover, hydrogen, an alkyl group and an alkoxy group are not formed into the bulky substituent as $Z^1$ and as $Z^2$.

More specifically, as $Z^1$, a phenyl group, a m-biphenylyl group and a p-biphenylyl group in aryl, a monocyclic heteroaryl group (heteroaryl group constituted of one ring, such as a pyridyl group) in heteroaryl, a diphenylamino group in diarylamino, a particular cycloalkyl group (for example, cycloalkyl having 3 to 8 carbons and adamantyl) in cycloalkyl, hydrogen, an alkyl group and an alkoxy group, and a group in which at least one hydrogen in the groups is replaced by alkyl alone have no role as the bulky substituent in the present application, and therefore the substituent $Z^2$ is required to be formed to be bulky. As $Z^2$, hydrogen, an alkyl group, an alkoxy group, and a group in which at least one hydrogen in the groups is replaced by alkyl are not bulky, and therefore a combination of $Z^1$ and $Z^2$ thereof is eliminated from the present application.

$Z^1$ is preferably an o-biphenylyl group, an o-naphthylphenyl group (group in which replacement is made by a 1- or 2-naphthyl group in an ortho position of a phenyl group), a phenylnaphthylamino group, a dinaphthylamino group, a phenyloxy group, a triphenylmethyl group (trityl group), and a group in which replacement in at least one of the groups is made by alkyl (for example, methyl, ethyl, i-propyl or t-butyl, preferably methyl or t-butyl, and further preferably t-butyl) or cycloalkyl (for example, cyclohexyl or adamantyl).

$Z^2$ is preferably a phenyl group, a 1- or 2-naphthyl group, and a group in which replacement in at least one of the groups is made by alkyl (for example, methyl, ethyl, i-propyl or t-butyl, preferably methyl or t-butyl, and further preferably t-butyl) or cycloalkyl (for example, cyclohexyl or adamantyl).

Moreover, at least one hydrogen in the compound represented by general formula (1) may be replaced by halogen or deuterium. Halogen is fluorine, chlorine, bromine or iodine, preferably fluorine, chlorine or bromine, and further preferably fluorine.

Specific examples of the polycyclic aromatic compound represented by general formula (1) include a compound described below. In addition, in a structural formula, "Me" represents a methyl group, and "tBu" represents a t-butyl group.

Formula 14

(1-50)

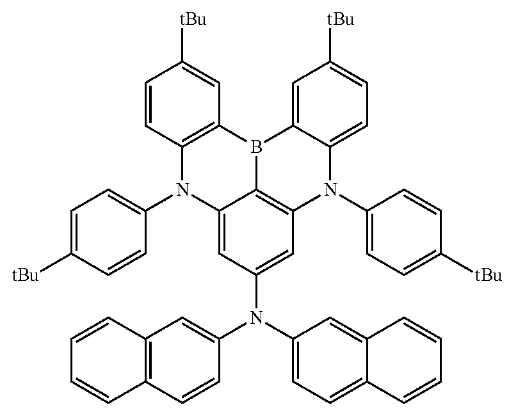

(1-51)

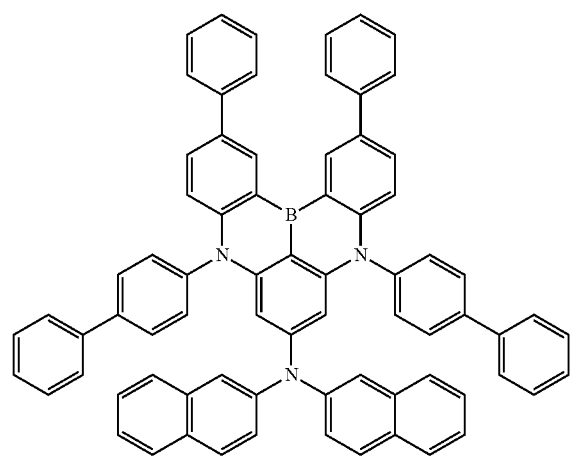

(1-52)

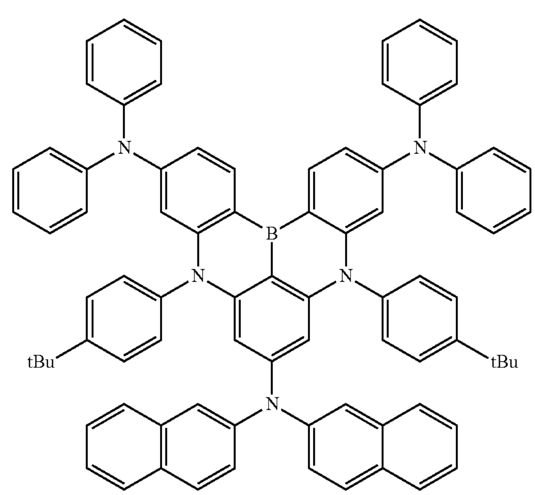

-continued
(1-53)
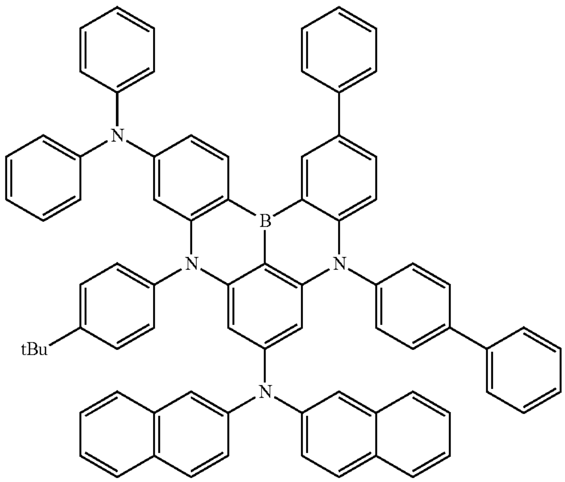
(1-54)
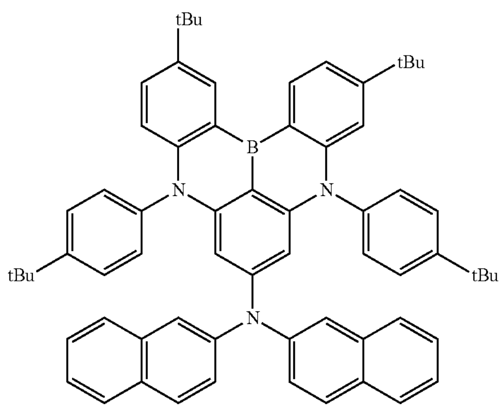
(1-55)
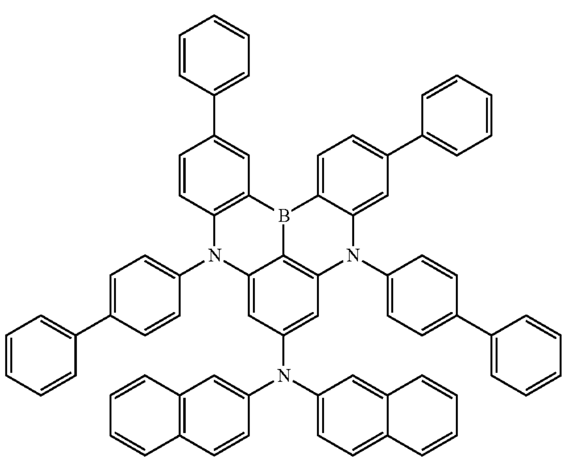
-continued
(1-56)
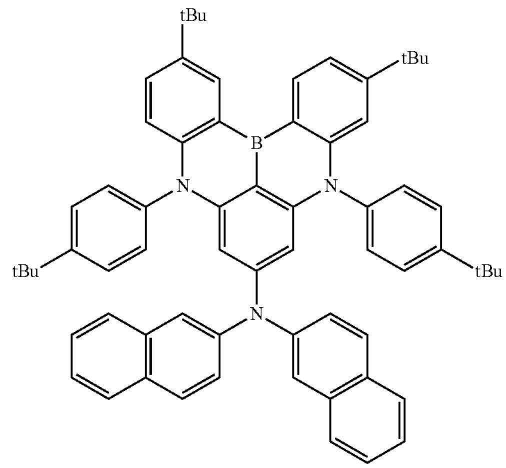
(1-57)
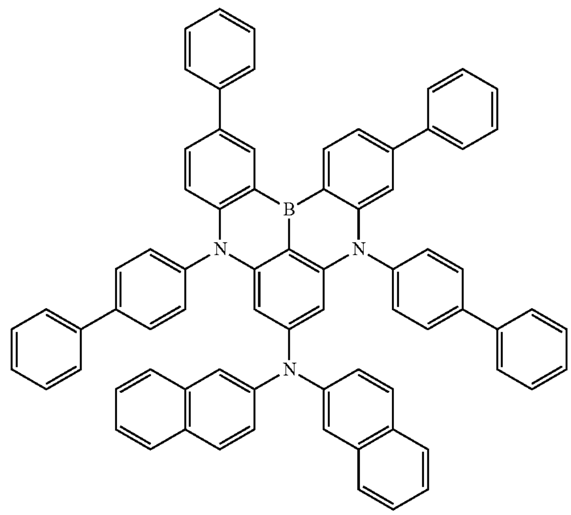
(1-58)
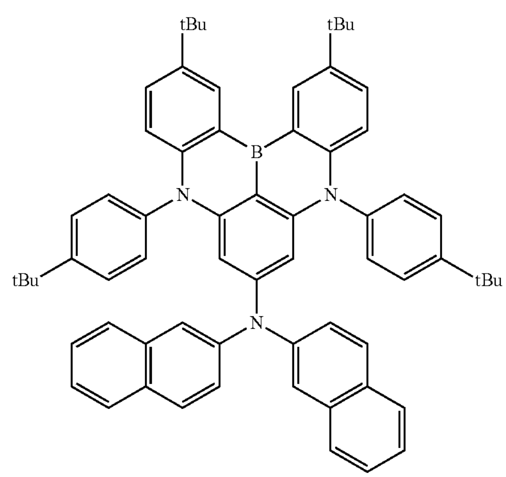

-continued
(1-59)
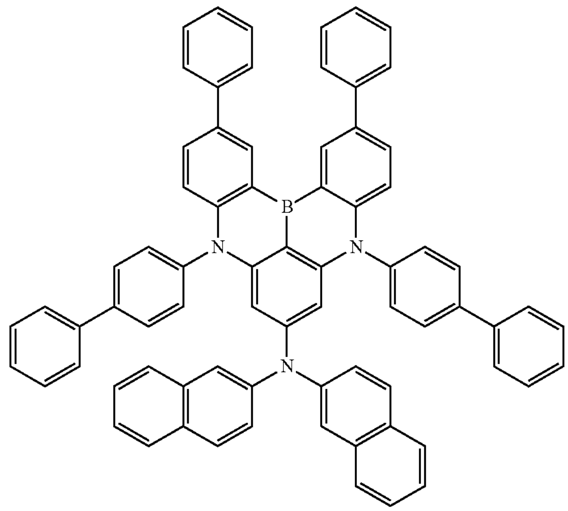
Formula 15
(1-60)
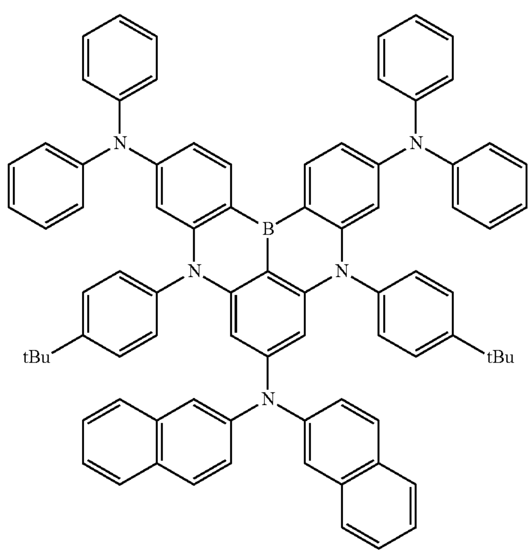
-continued
(1-61)
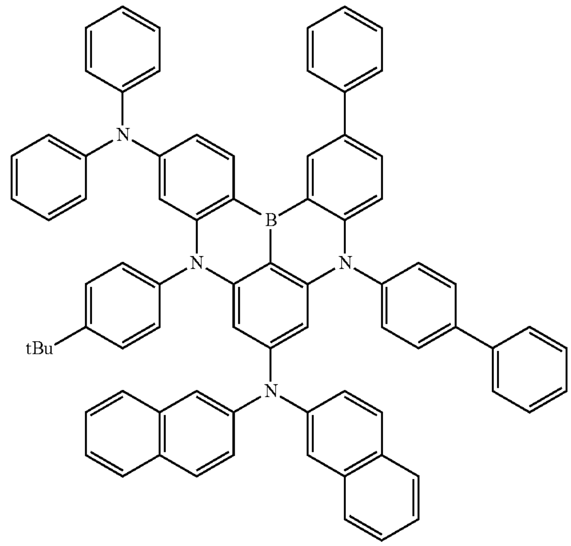
(1-62)
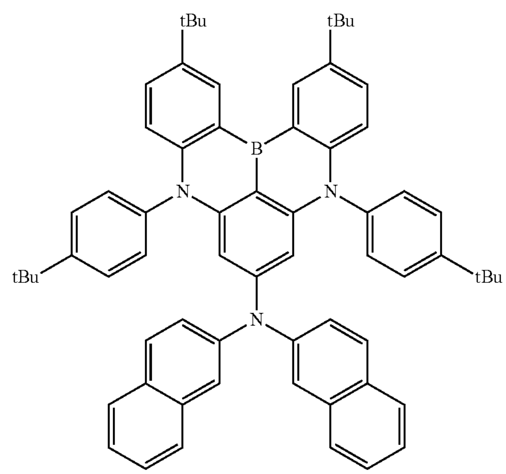
(1-63)
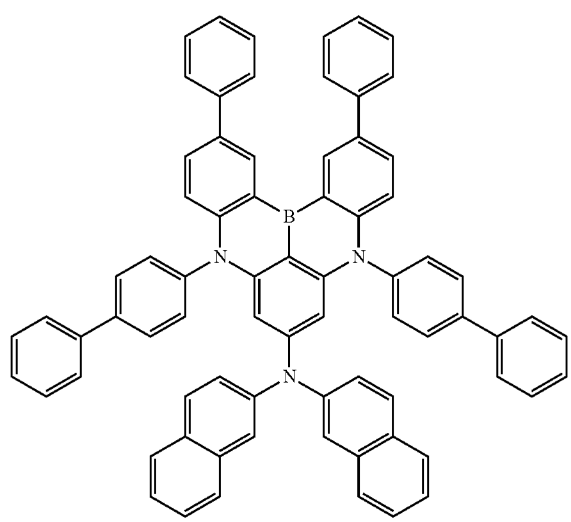

-continued
(1-64)
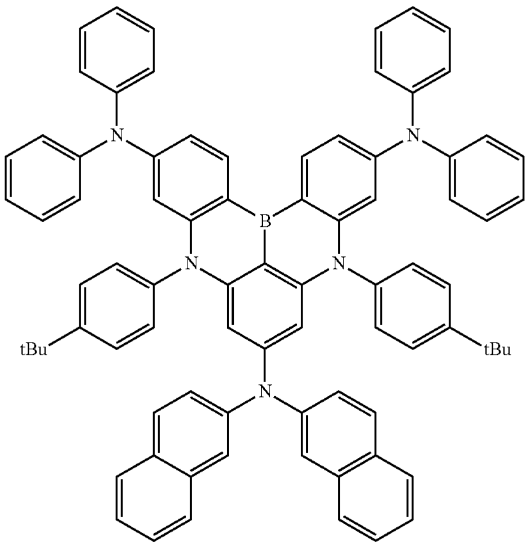
(1-65)
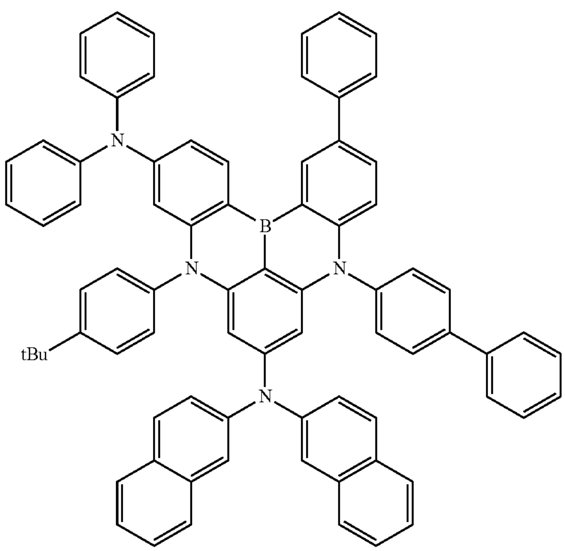
(1-66)
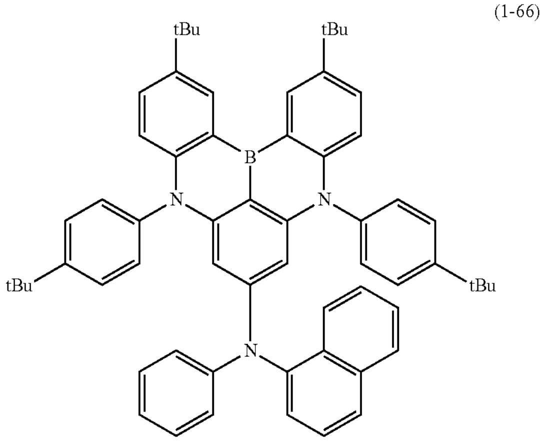
-continued
(1-67)
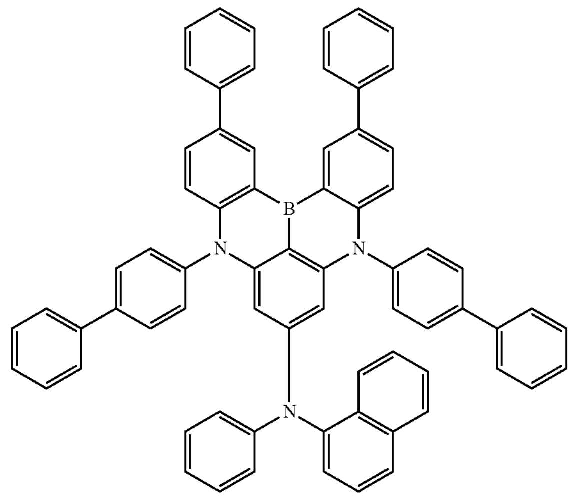
(1-68)
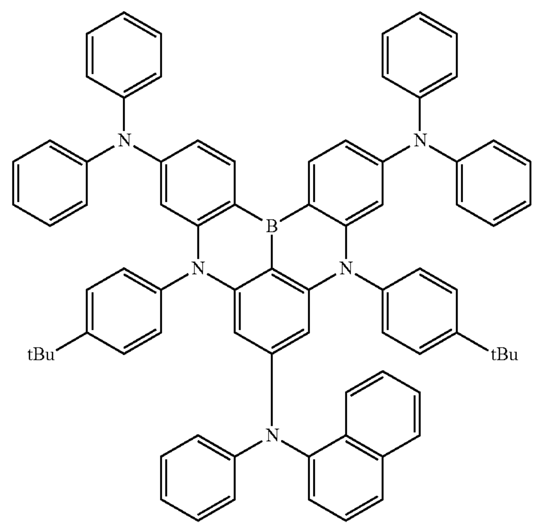
(1-69)
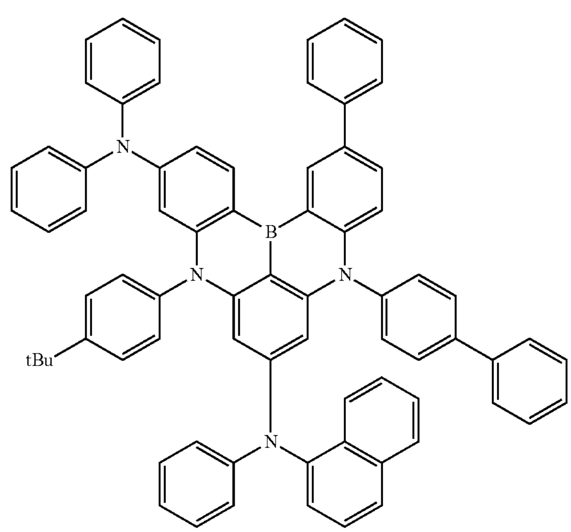

-continued
Formula 16
(1-120)
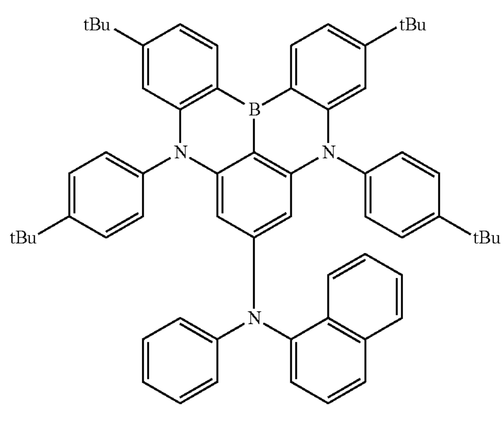
(1-121)
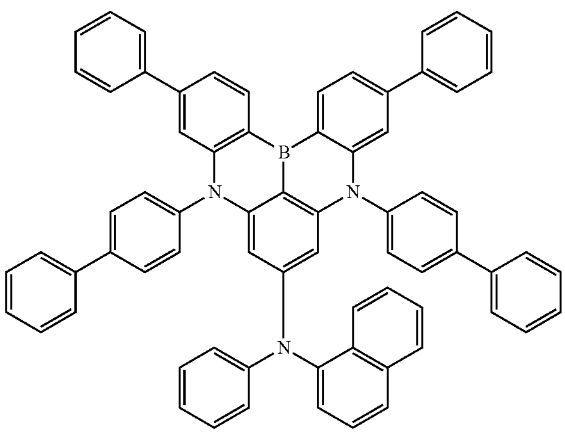
(1-122)
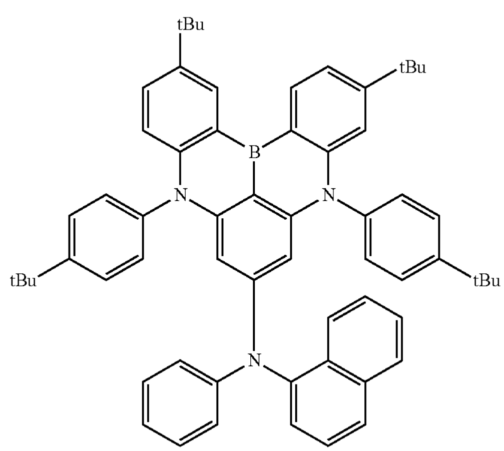
-continued
(1-123)
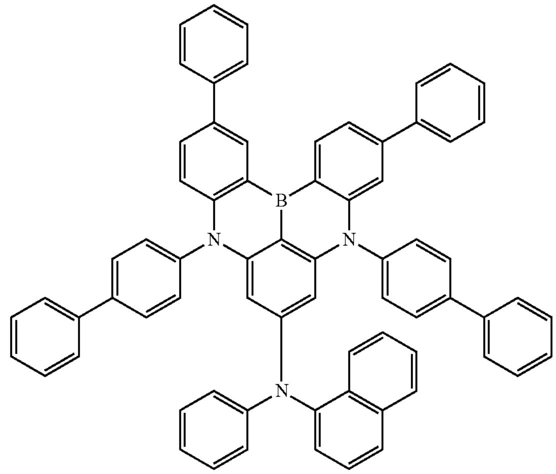
(1-124)
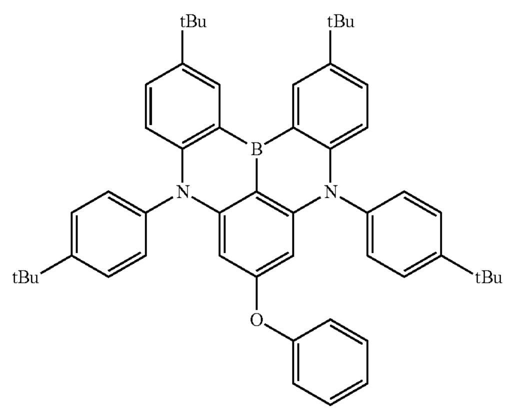
(1-125)
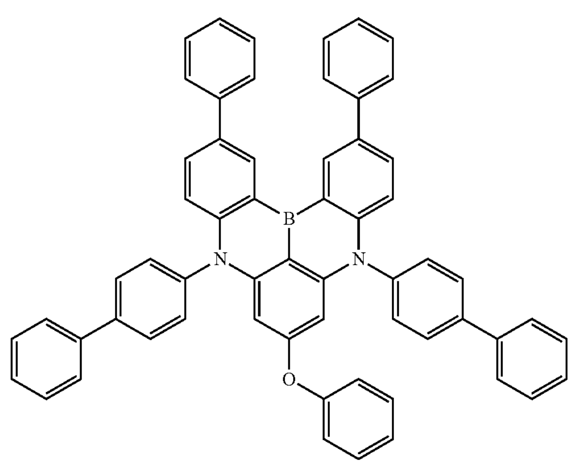

-continued
(1-126)
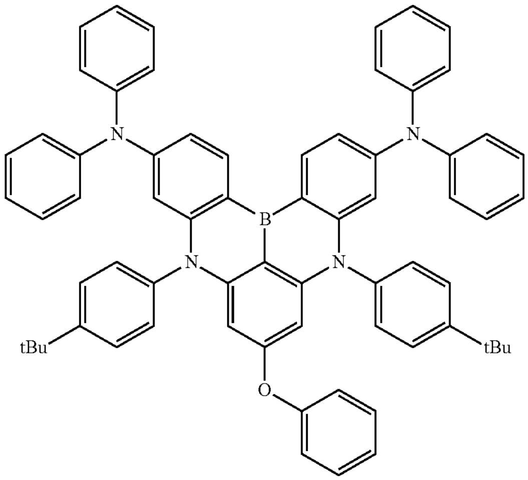
(1-127)
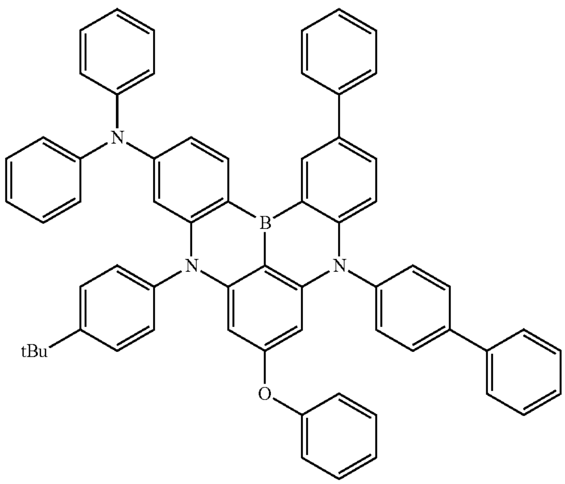
(1-128)
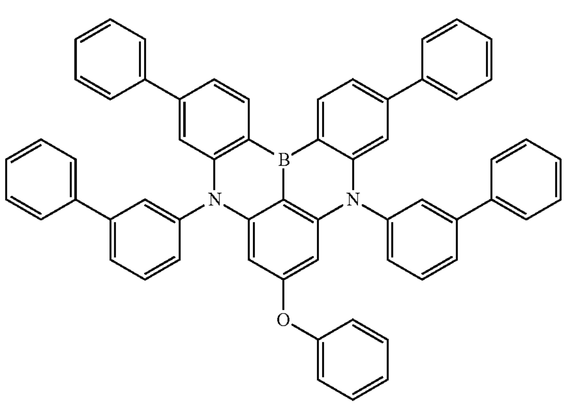
-continued
(1-129)
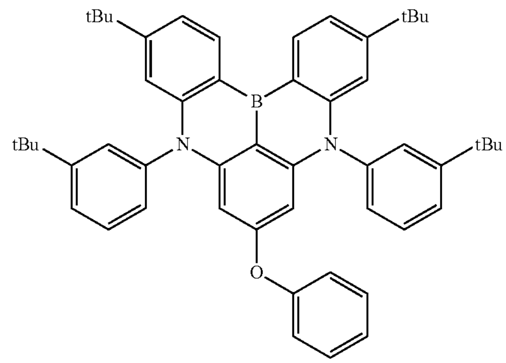
(1-130)
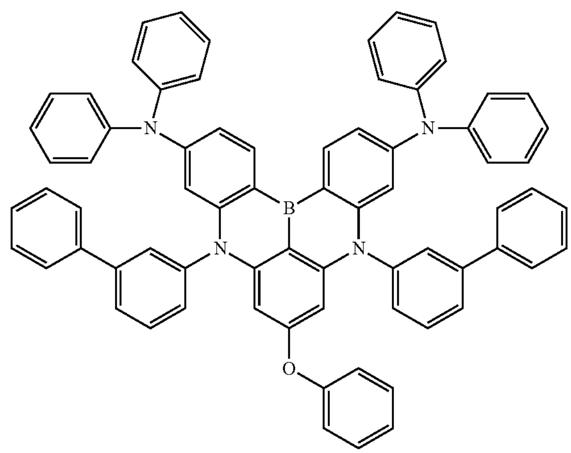
(1-131)
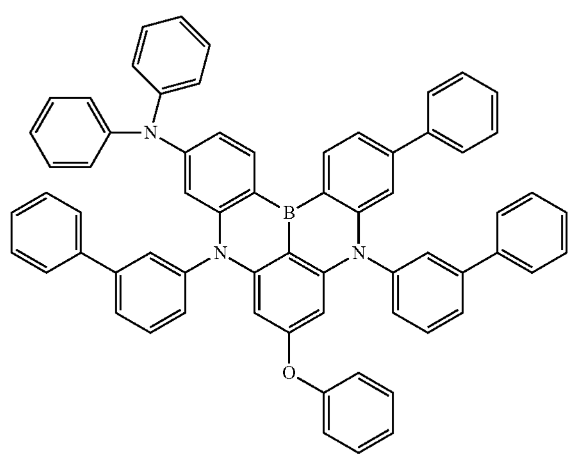

-continued
Formula 17
(1-132)
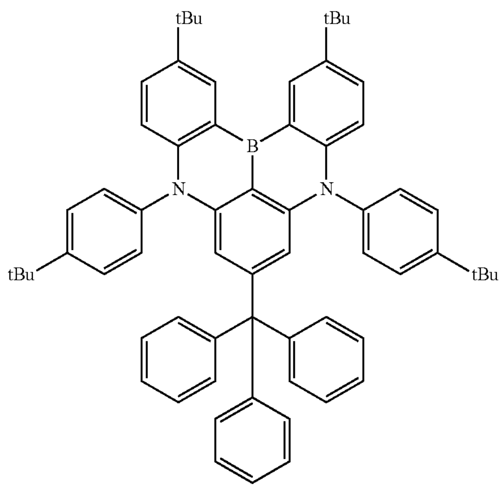
(1-133)
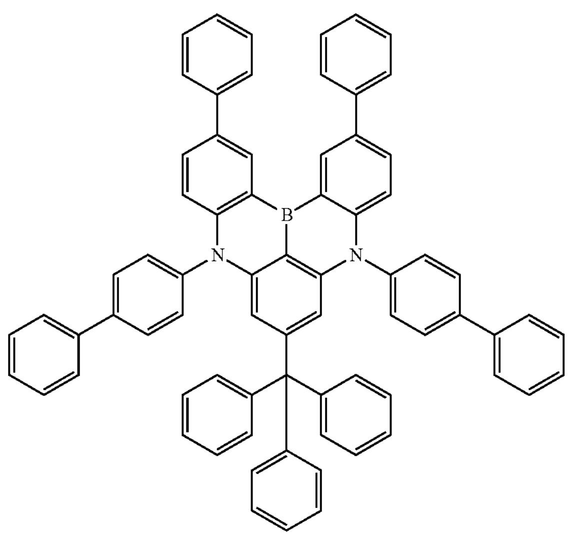
(1-134)
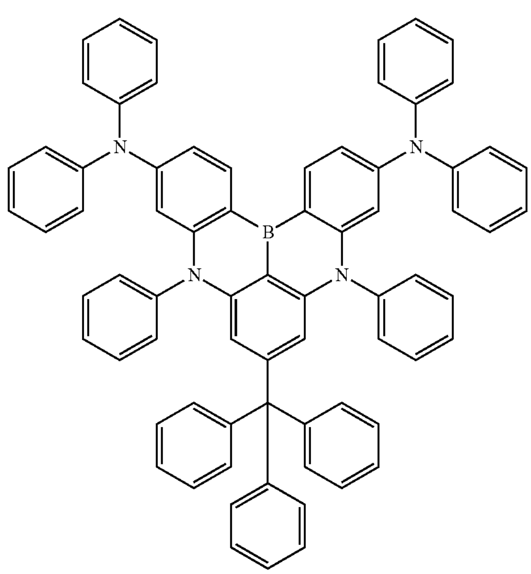
-continued
(1-135)
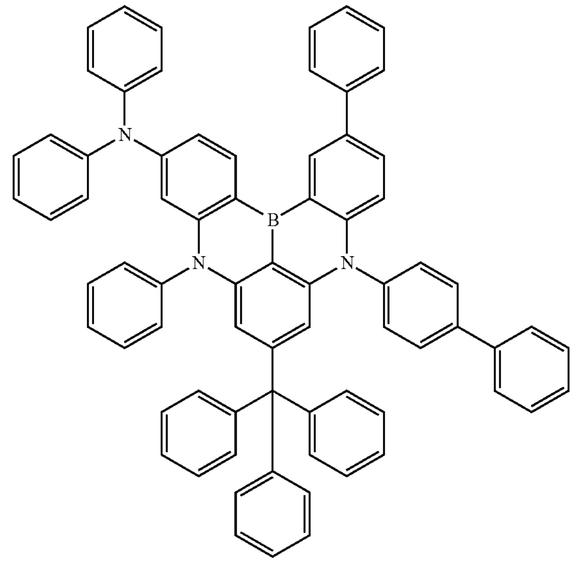
(1-136)
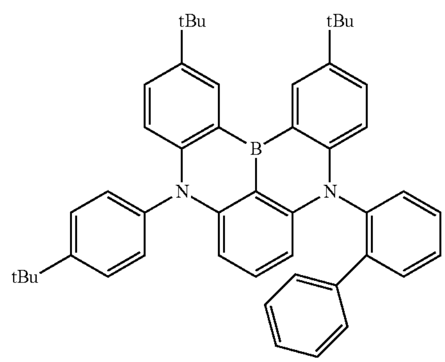
(1-137)
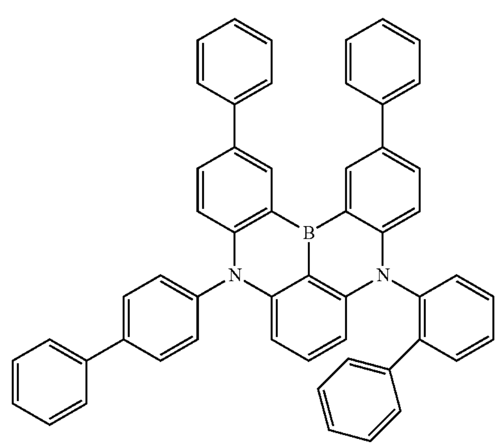

-continued
(1-138)
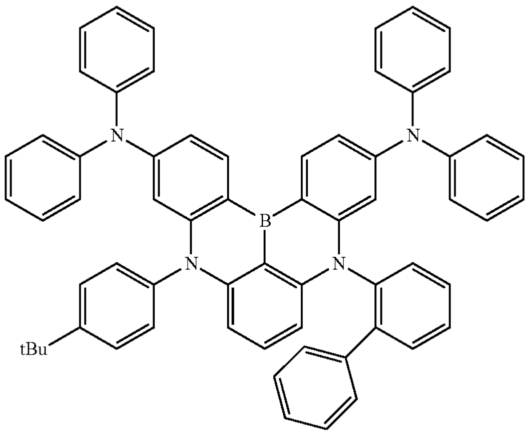
(1-139)
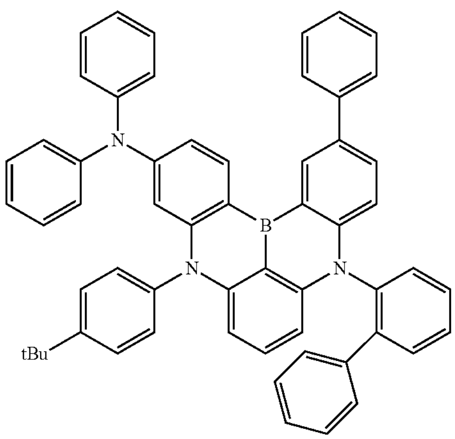
(1-140)
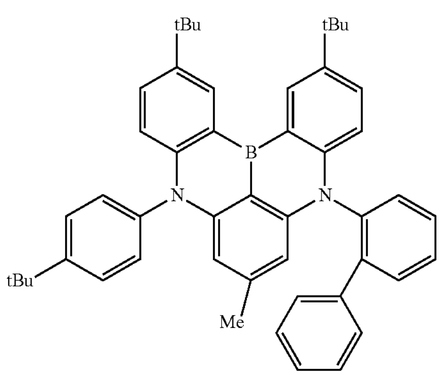
-continued
(1-141)
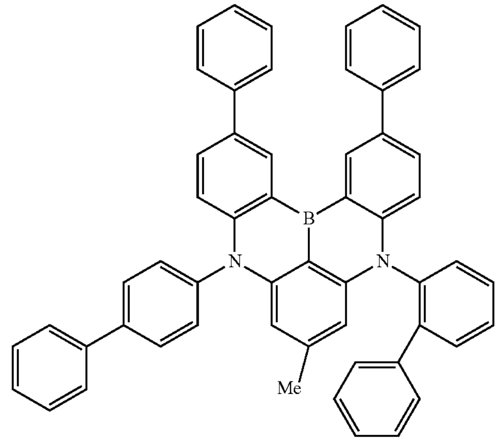
(1-142)
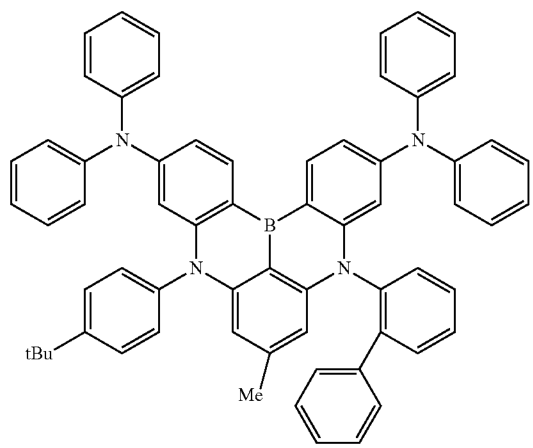
(1-143)
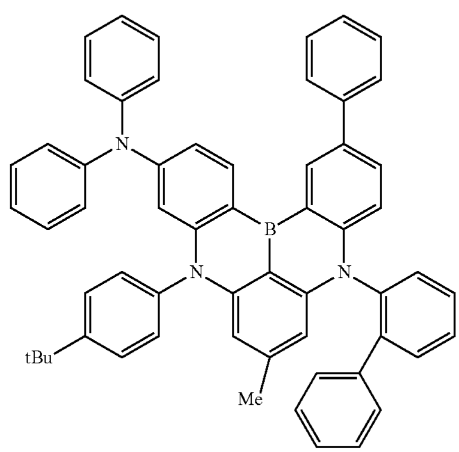

-continued
Formula 18
(1-160)
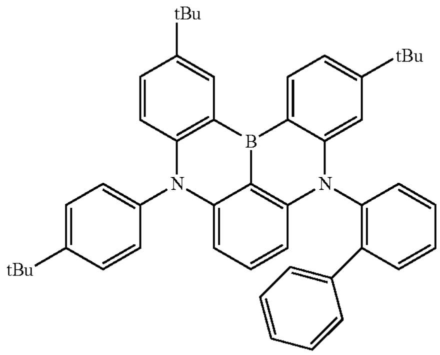
(1-161)
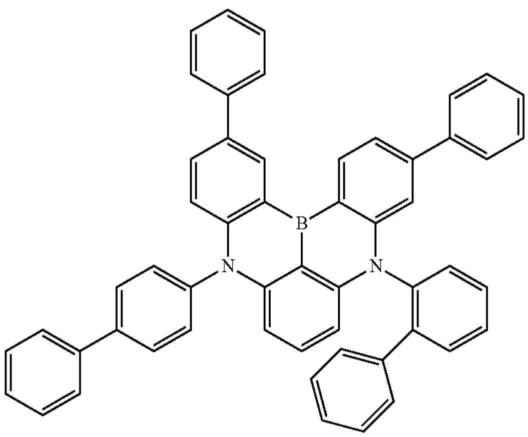
(1-162)
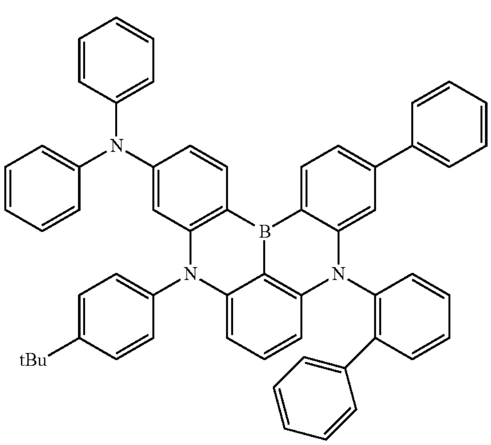
-continued
(1-163)
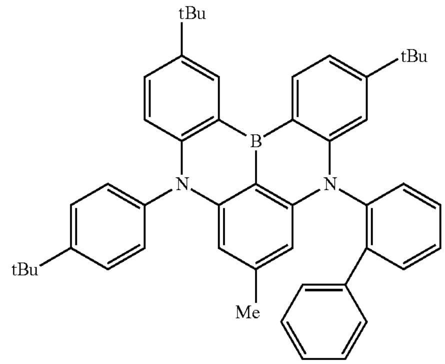
(1-164)
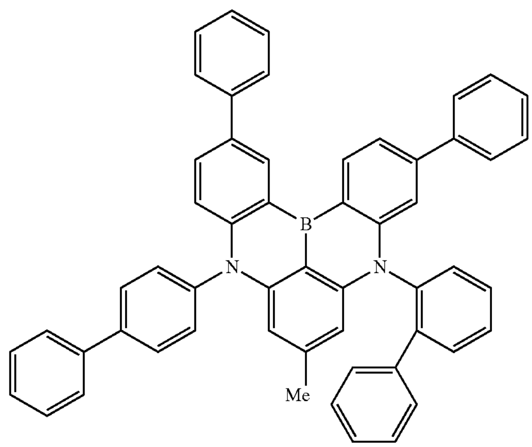
(1-165)
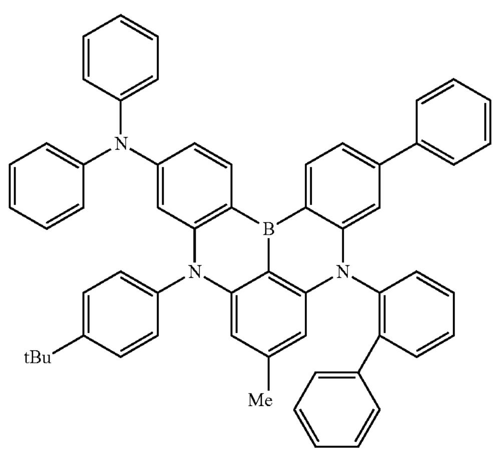

-continued
(1-166)
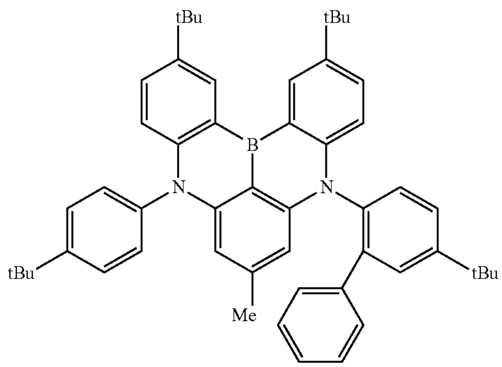
(1-167)
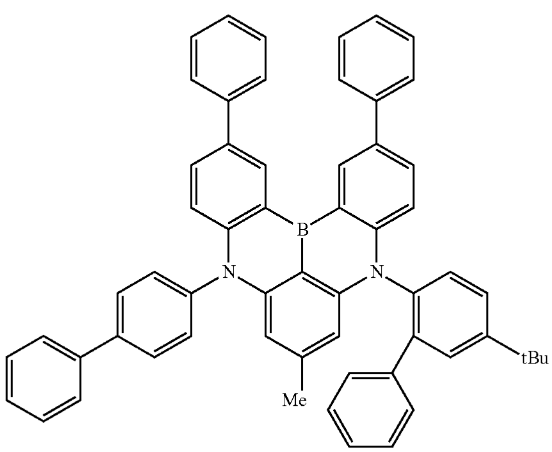
(1-168)
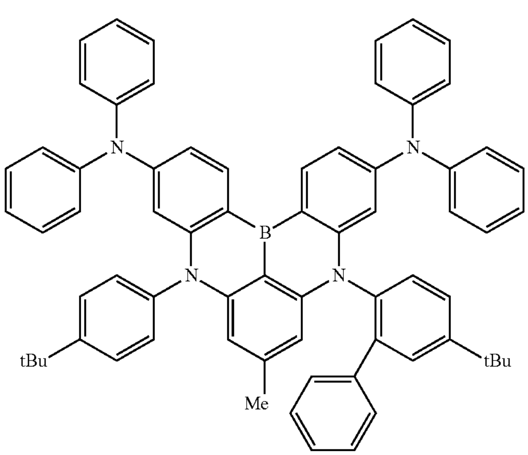
-continued
(1-169)
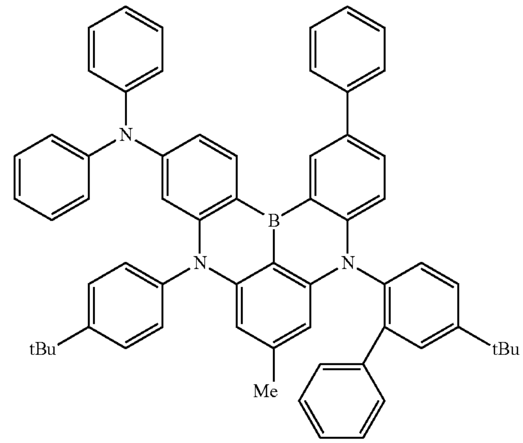
(1-170)
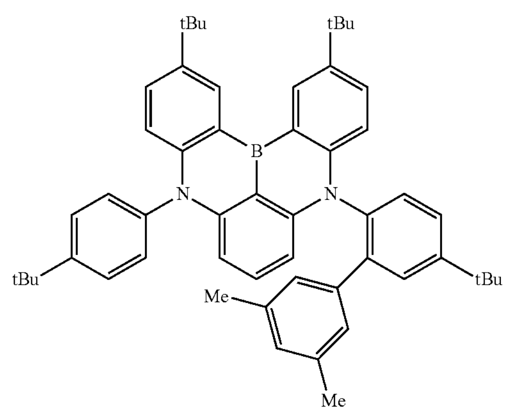
(1-171)
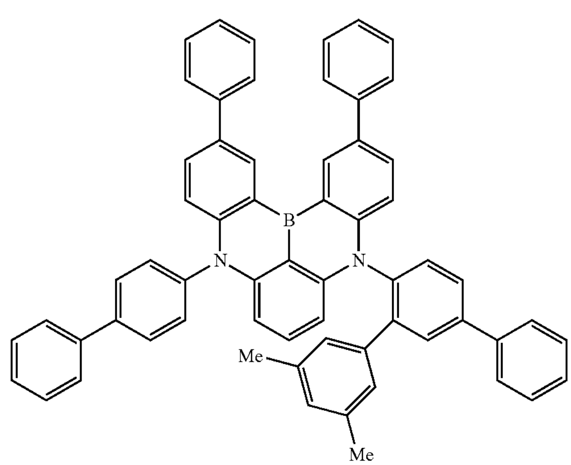

-continued
Formula 19
(1-172)
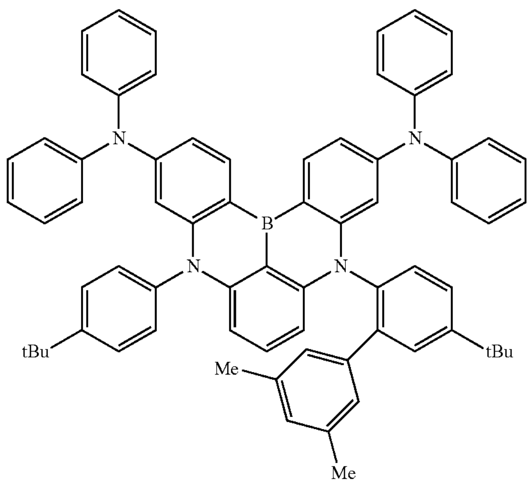
(1-173)
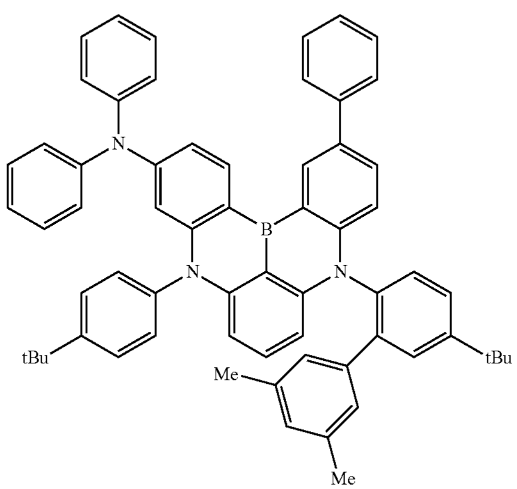
(1-174)
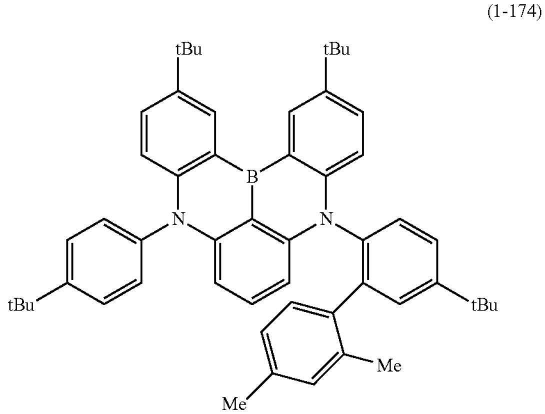
-continued
(1-175)
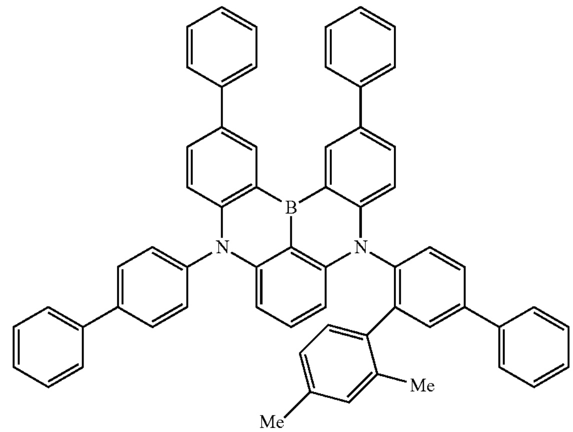
(1-176)
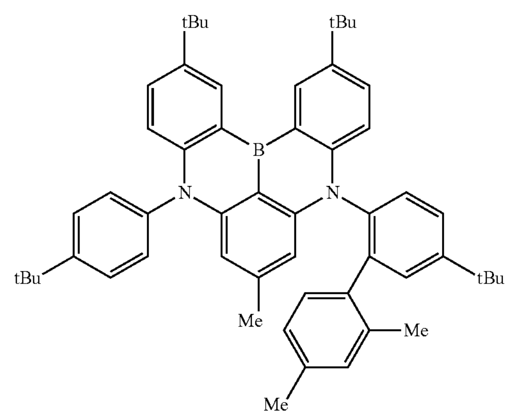
(1-177)
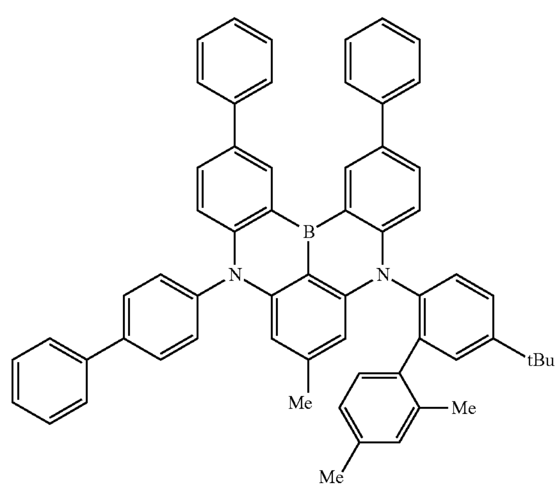

-continued
(1-178)
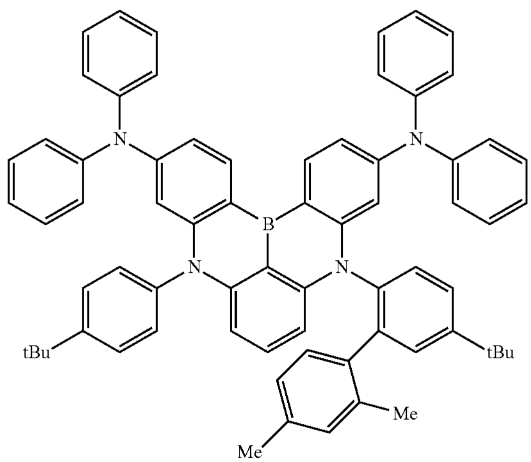
(1-179)
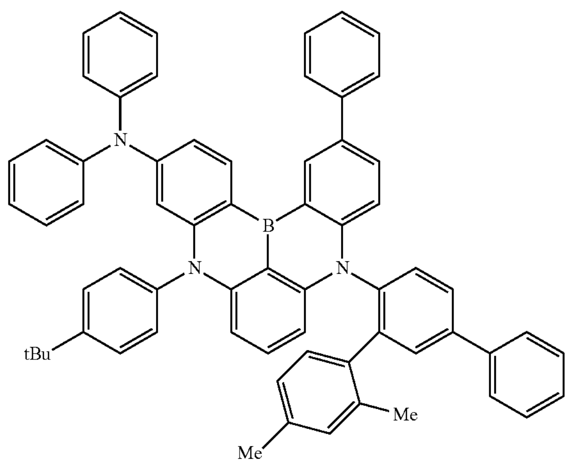
(1-180)
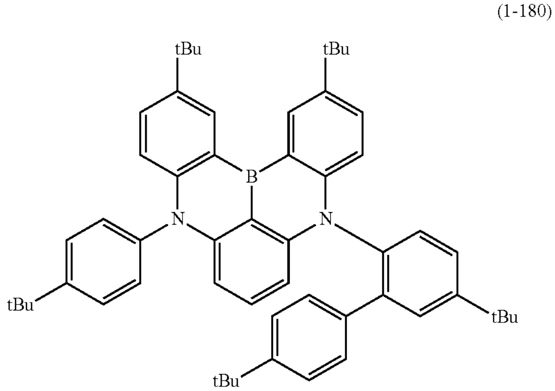
-continued
(1-181)
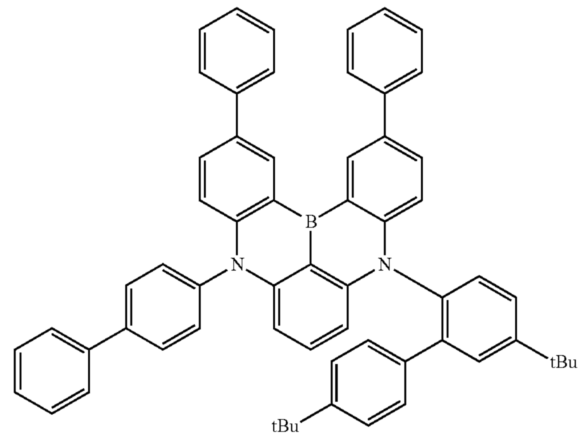
(1-182)
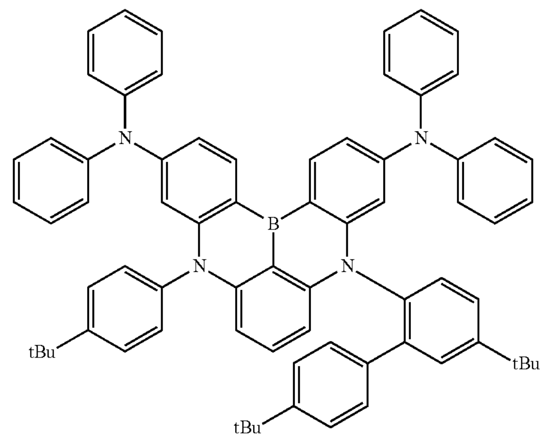
(1-183)
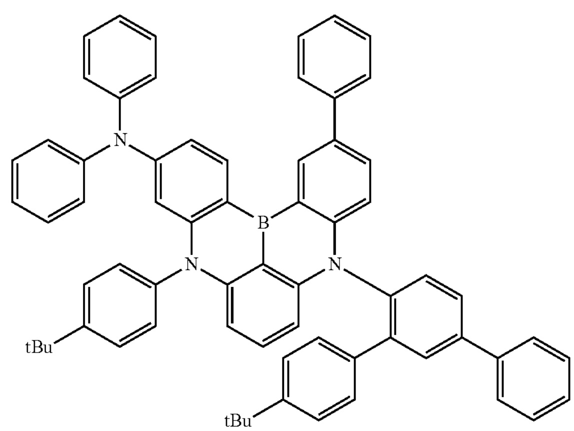

-continued
Formula 20
(1-200)
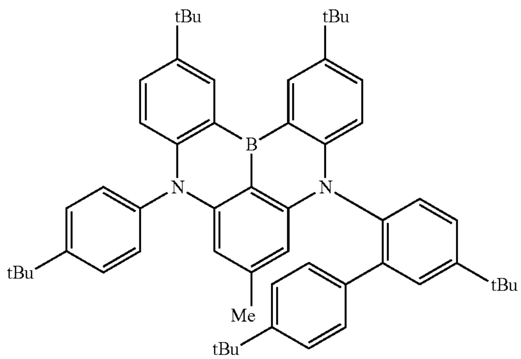
(1-201)
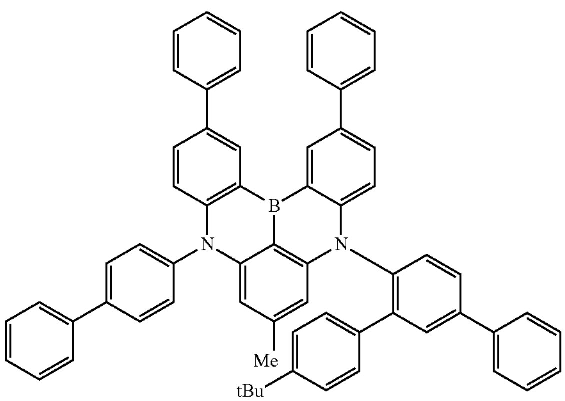
(1-202)
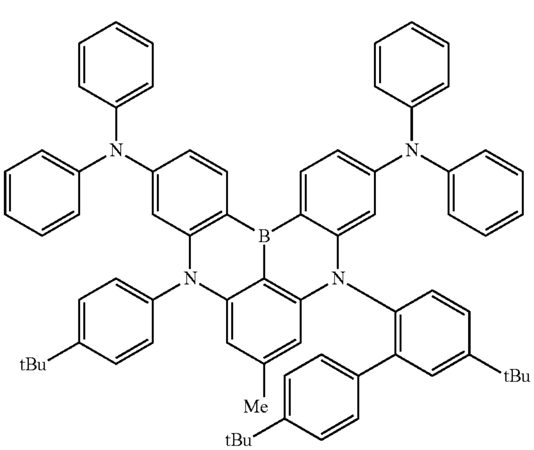
-continued
(1-203)
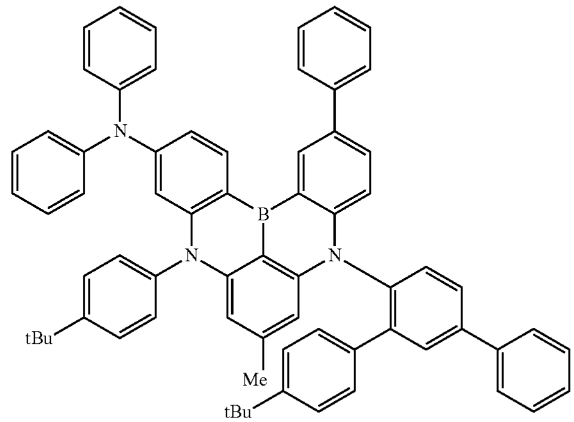
(1-204)
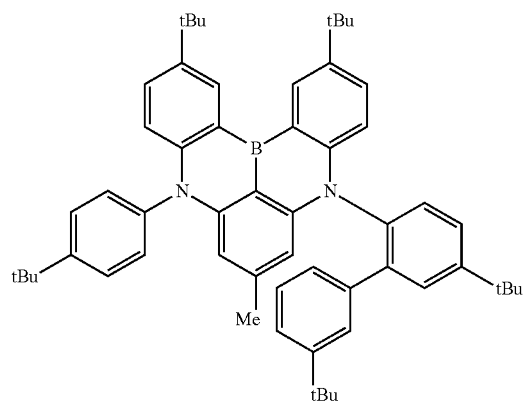
(1-205)
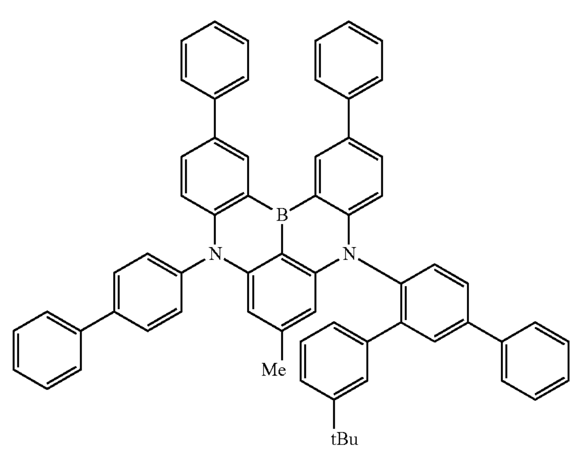

-continued
(1-206)
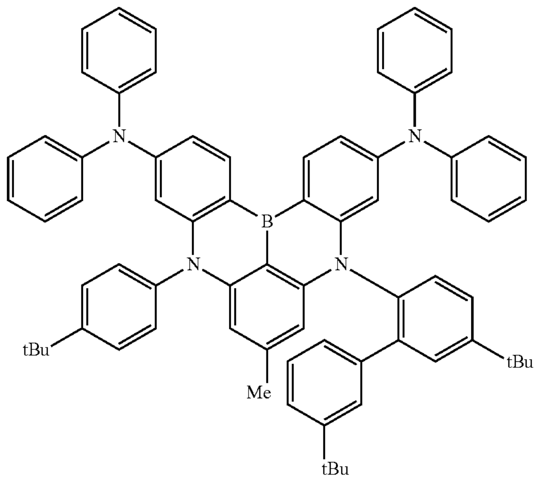
(1-207)
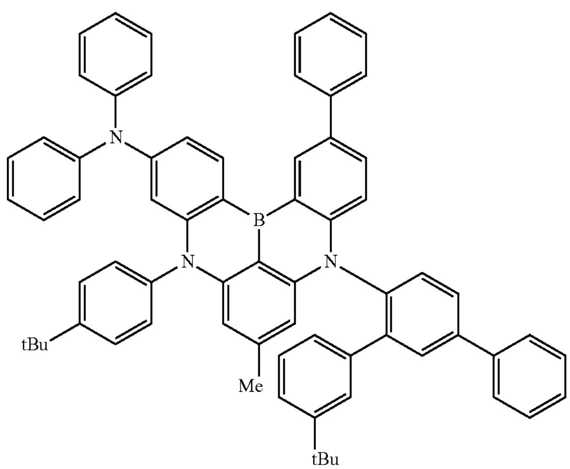
(1-208)
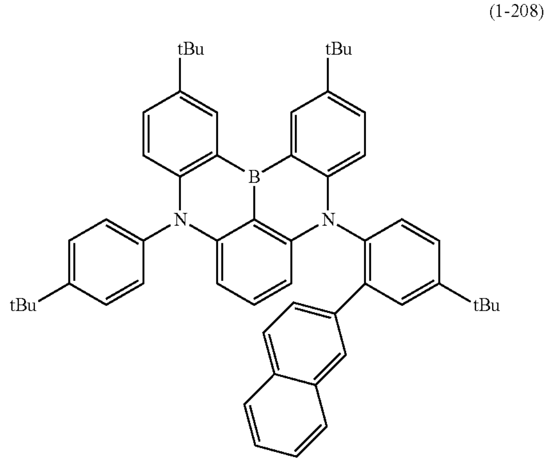
-continued
(1-209)
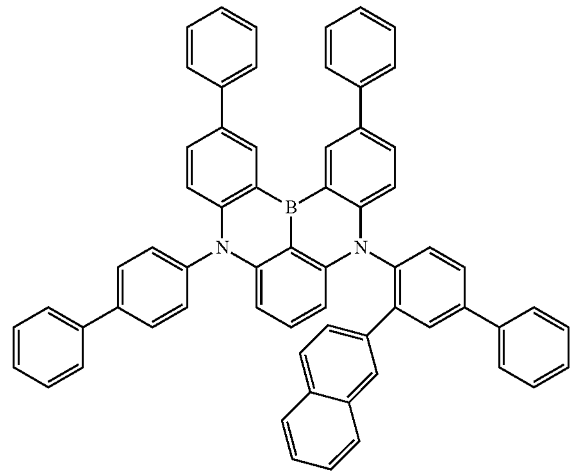
(1-210)
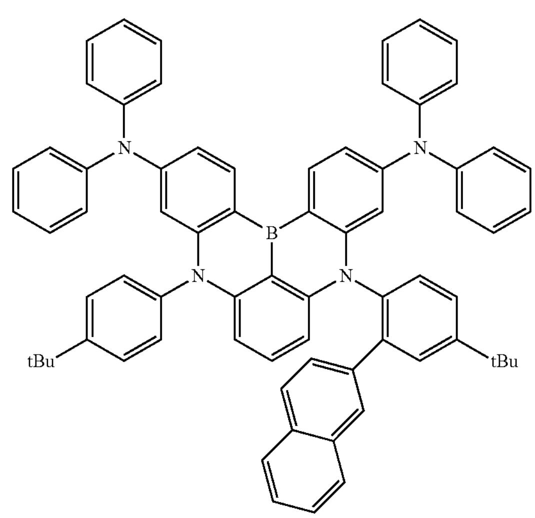

-continued
(1-211)
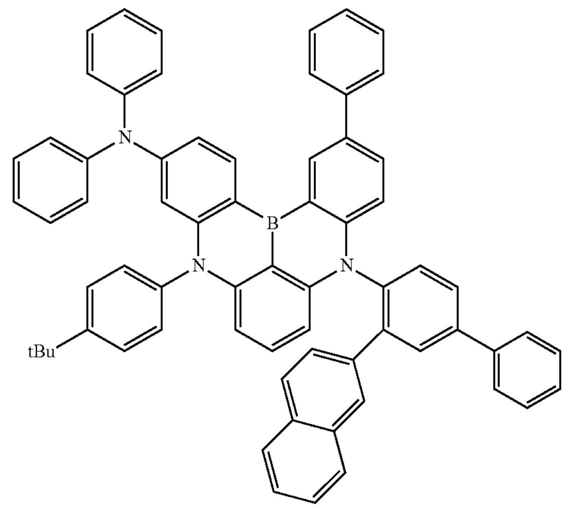
Formula 21
(1-212)
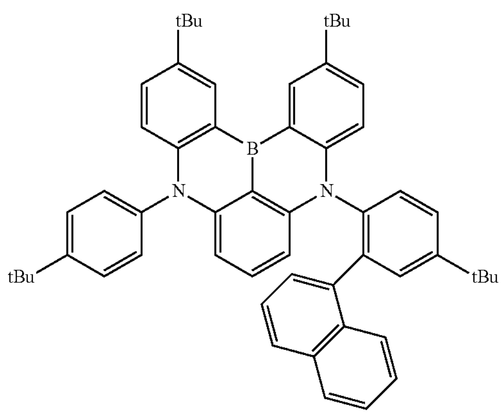
(1-213)
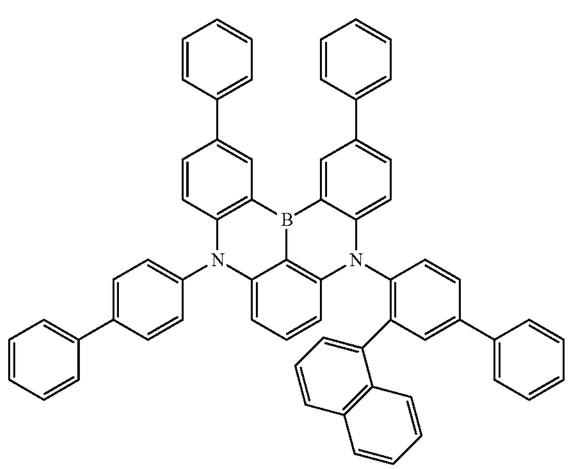
-continued
(1-214)
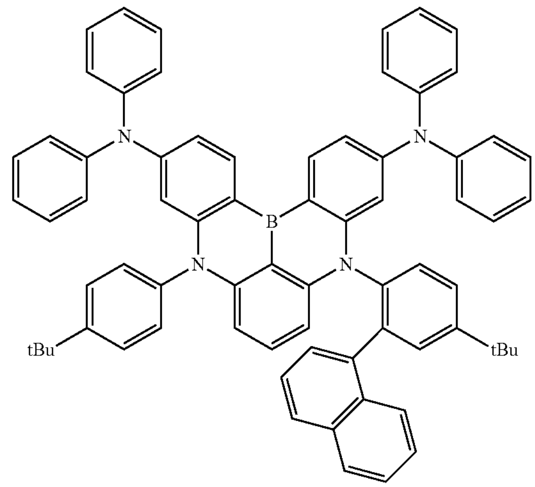
(1-215)
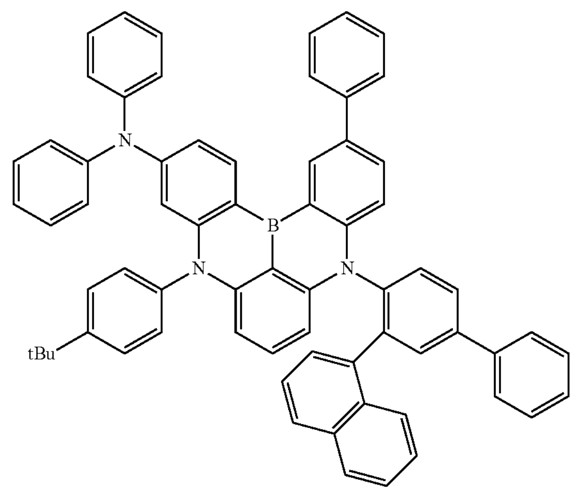
(1-216)
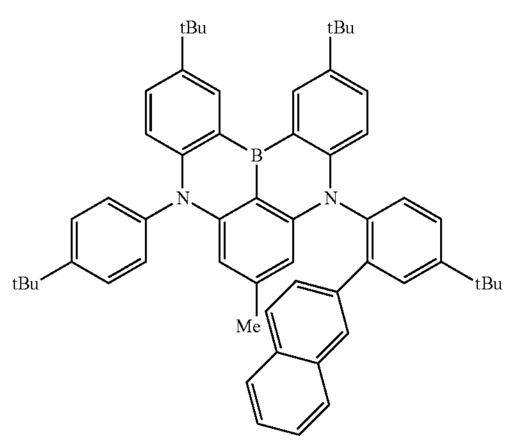

-continued
(1-217)
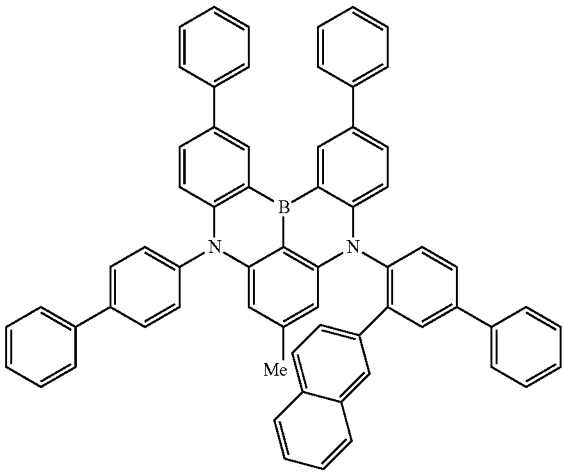
(1-218)
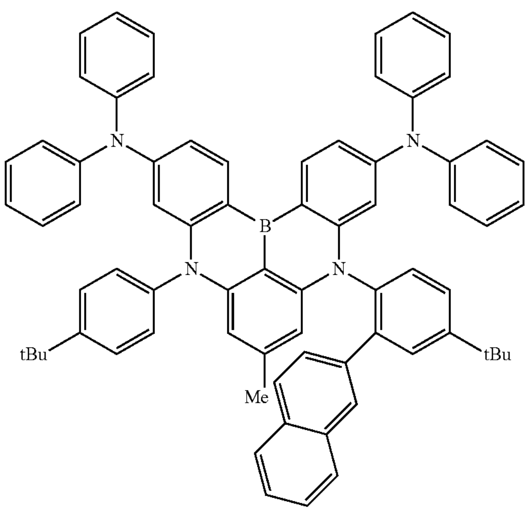
(1-219)
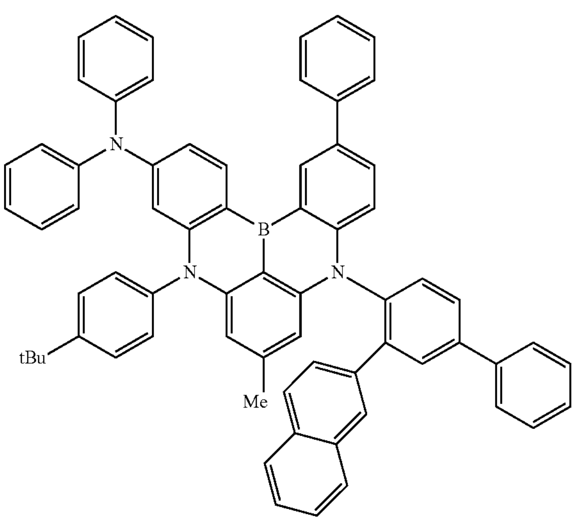
-continued
(1-220)
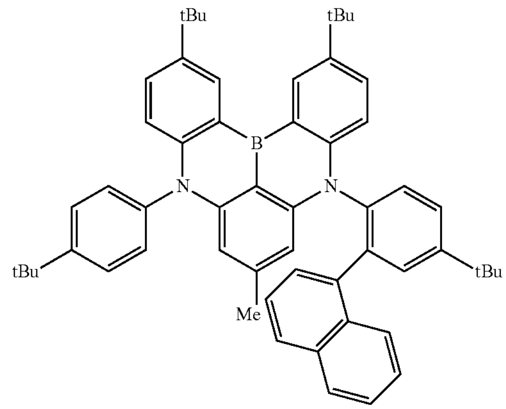
(1-221)
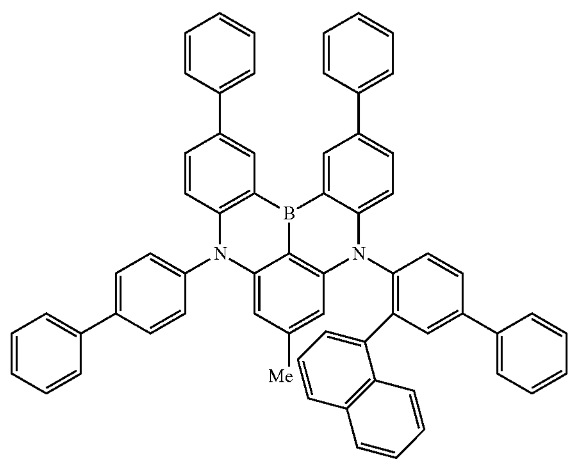
(1-222)
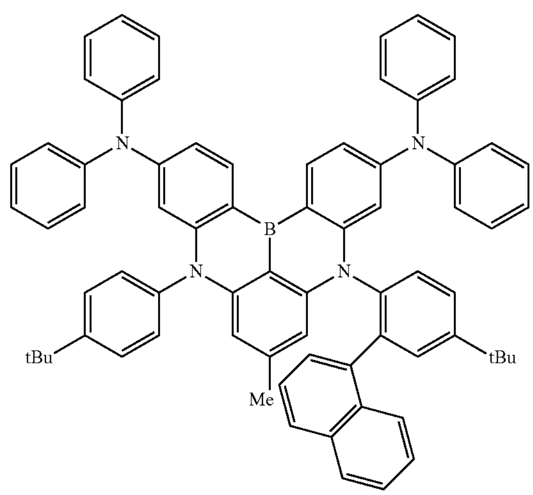

-continued
(1-223)
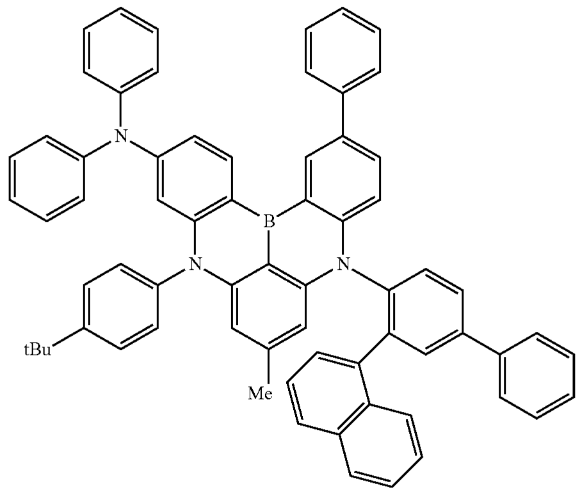
Formula 22
(1-240)
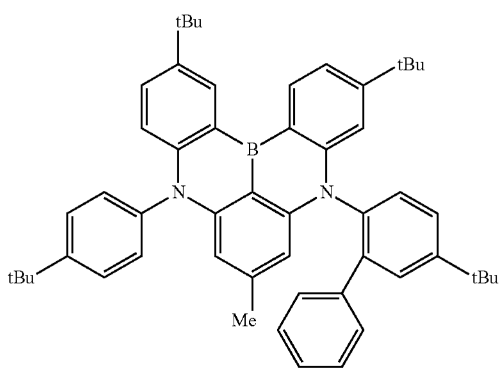
(1-241)
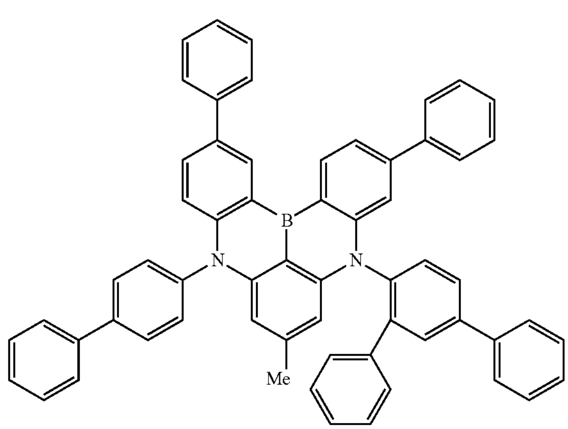
-continued
(1-242)
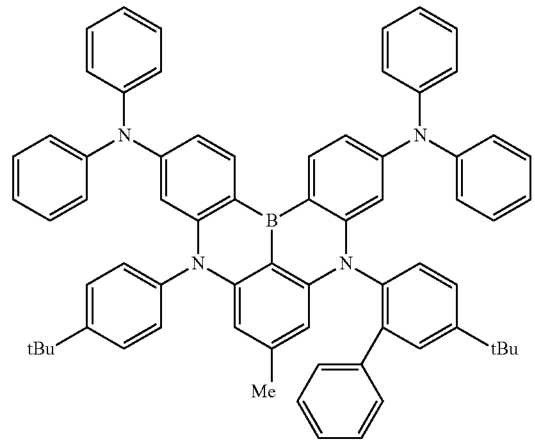
(1-243)
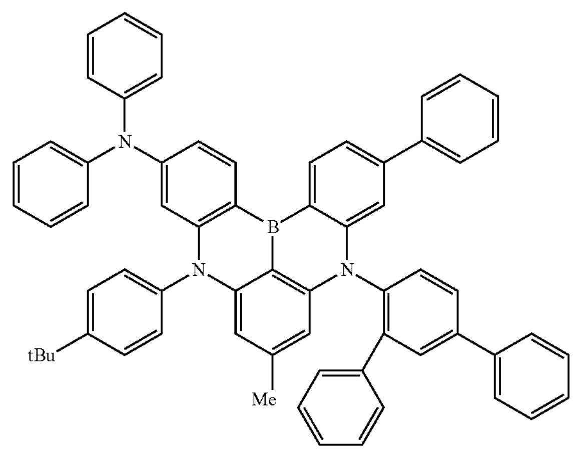
(1-244)
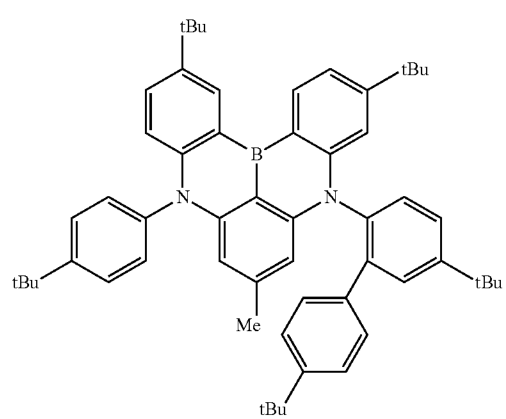

-continued
(1-245)
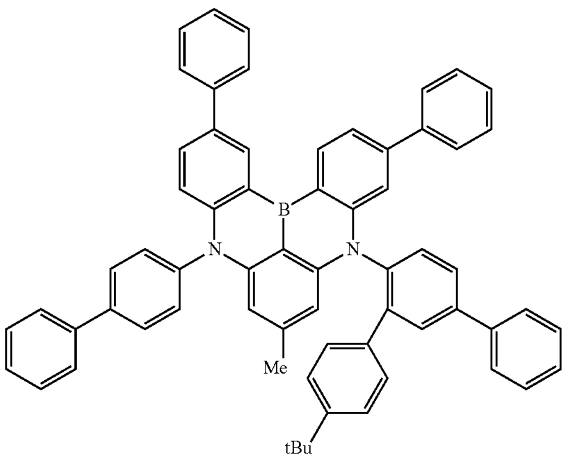
(1-246)
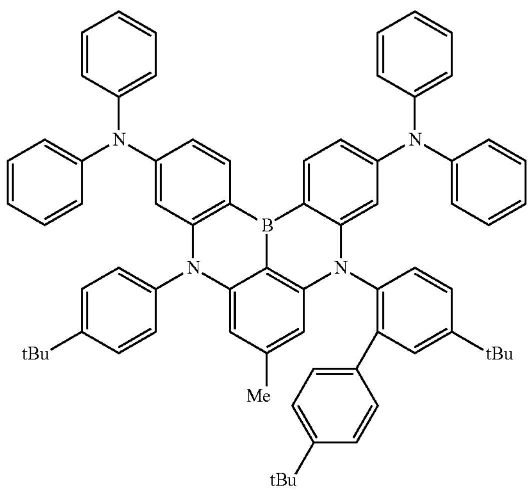
(1-247)
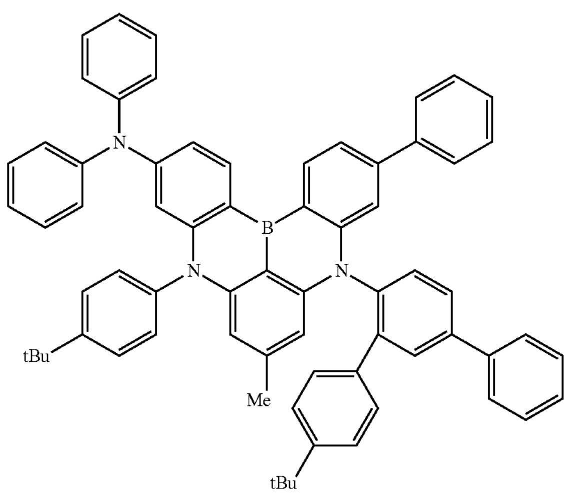
-continued
(1-248)
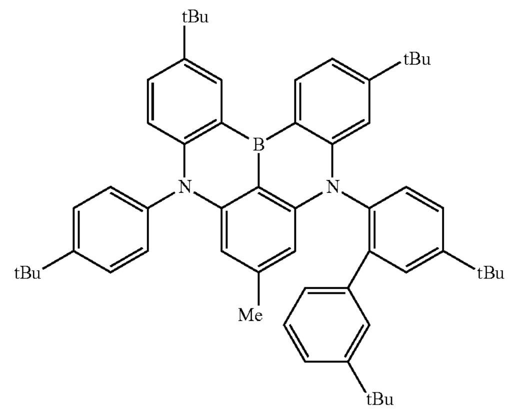
(1-249)
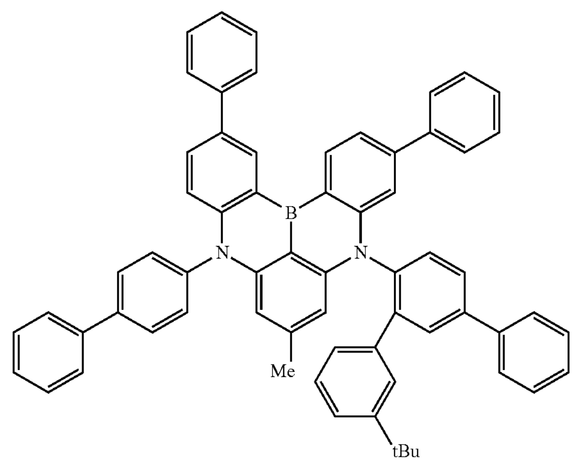
(1-250)
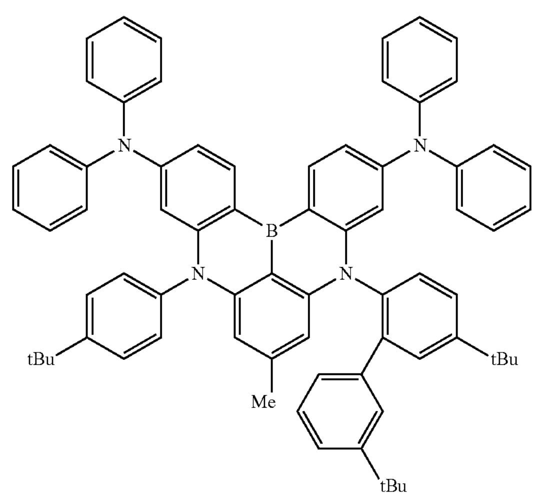

-continued
(1-251)
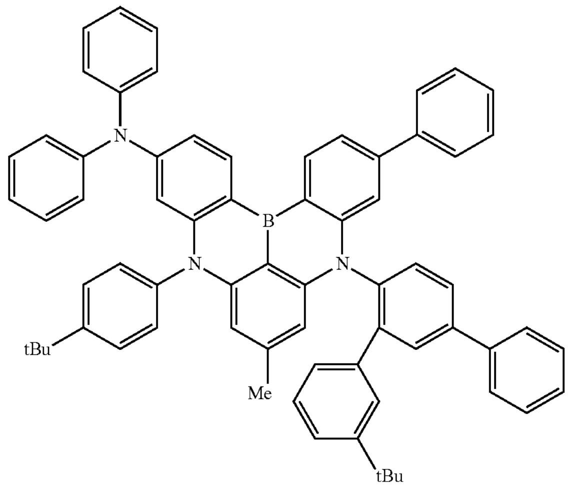
Formula 23
(1-252)
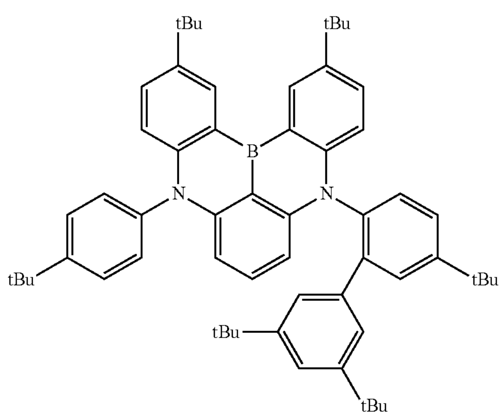
(1-253)
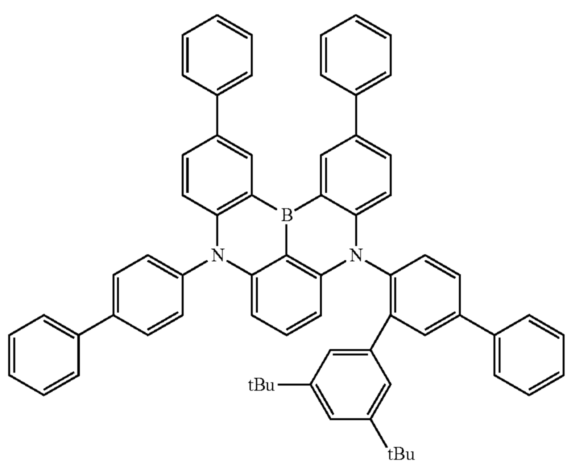
-continued
(1-254)
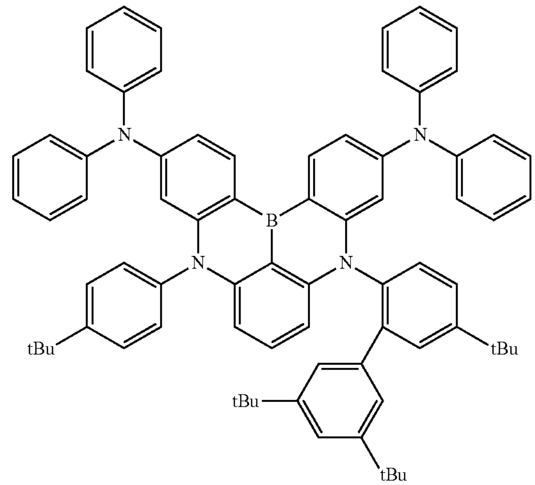
(1-255)
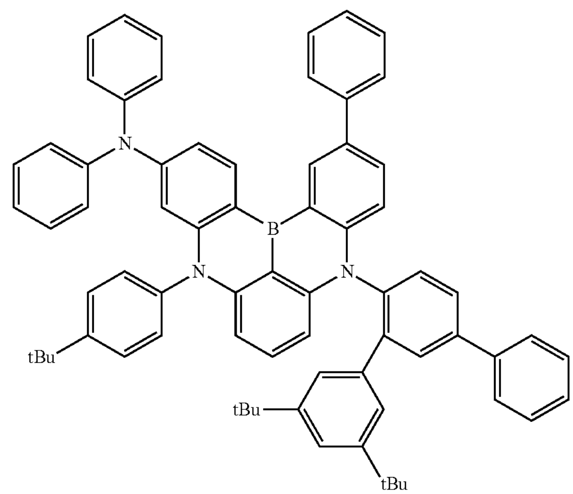
(1-256)
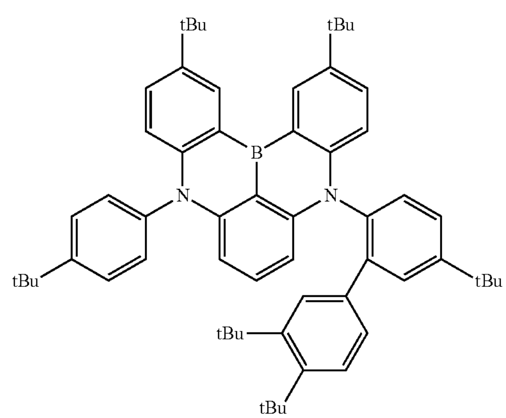

-continued
(1-257)
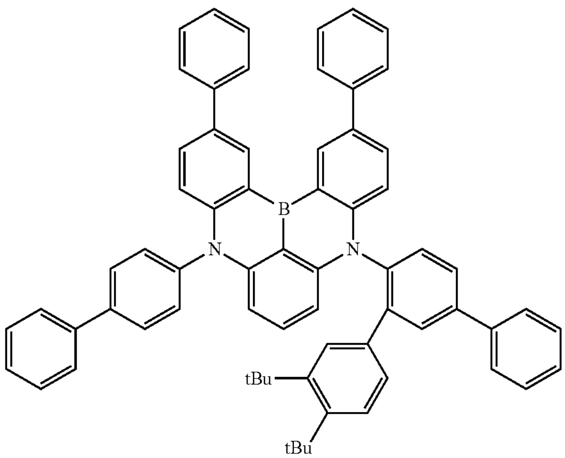
(1-258)
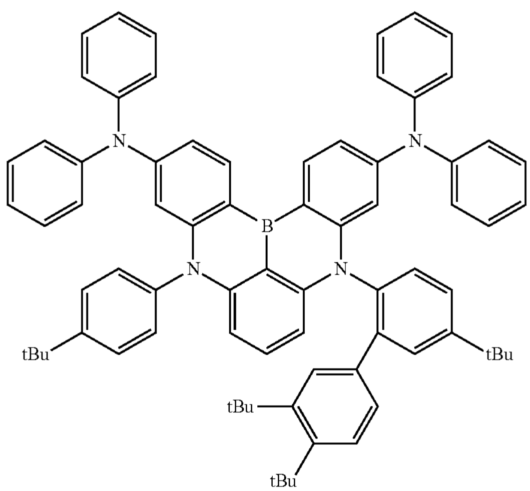
(1-259)
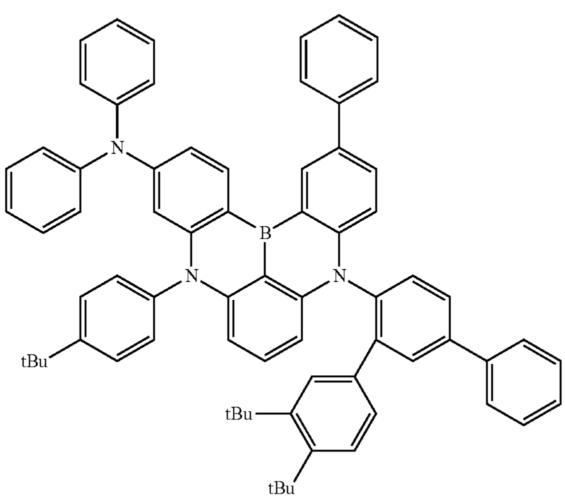
-continued
(1-260)
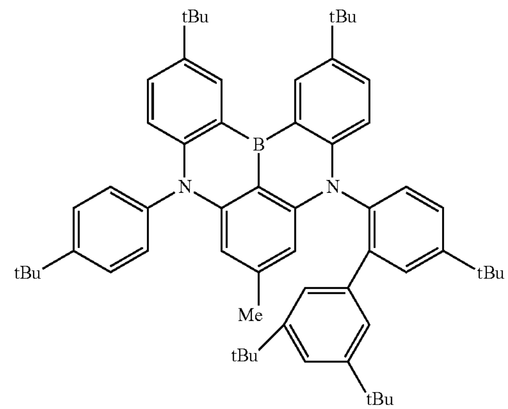
(1-261)
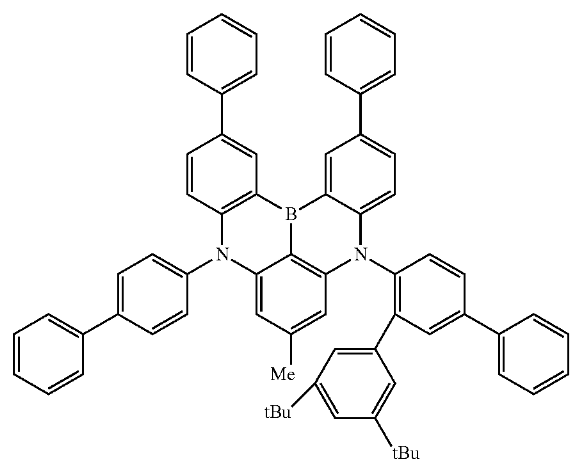
(1-262)
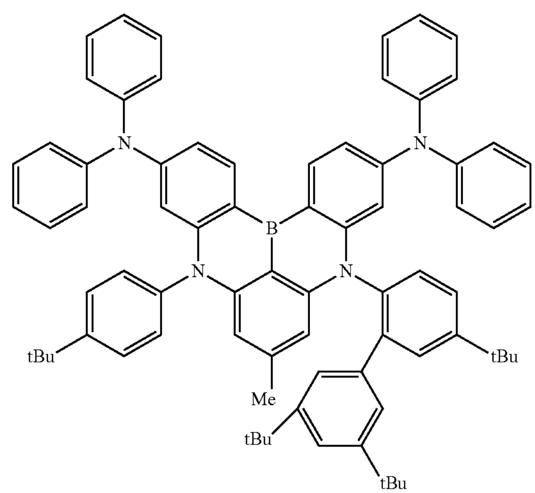

-continued
(1-263)
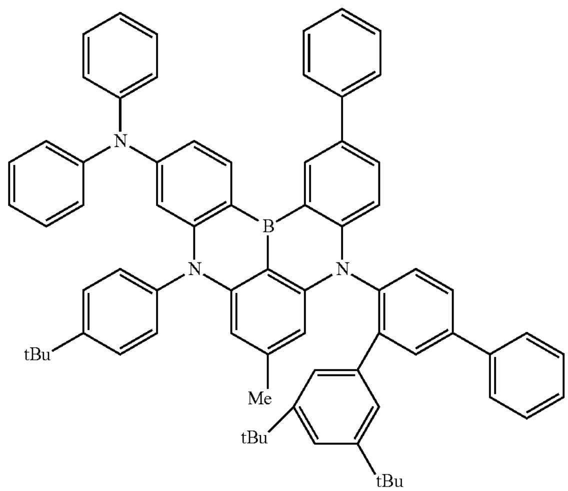
Formula 24
(1-280)
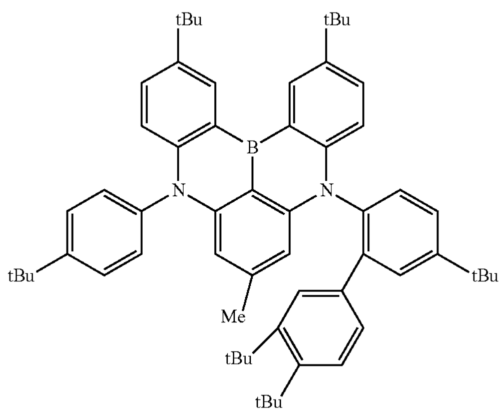
(1-281)
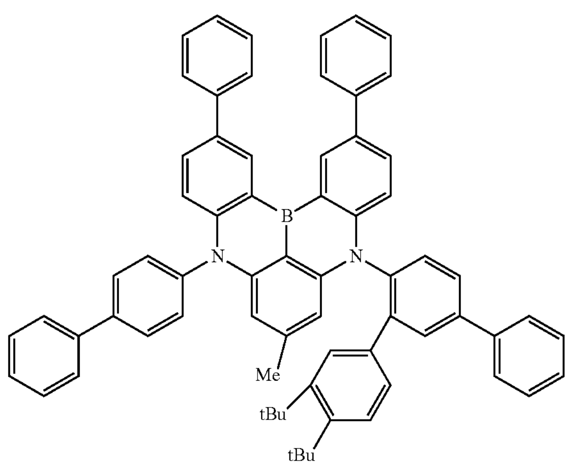
-continued
(1-282)
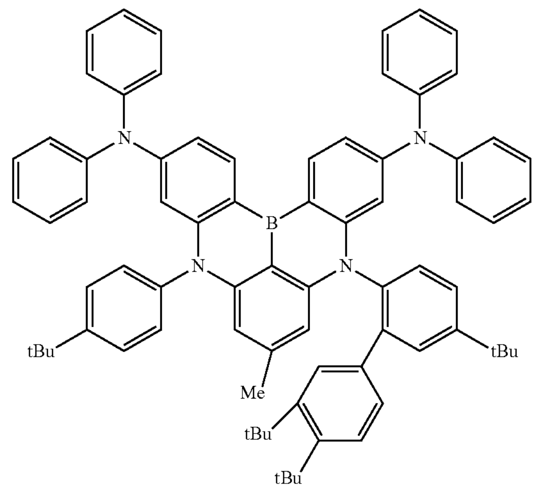
(1-283)
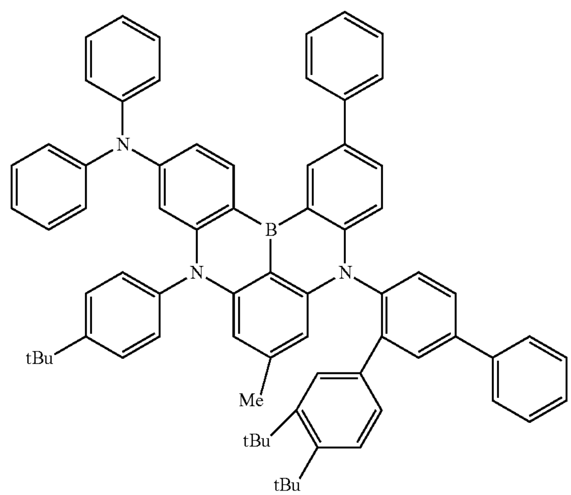
(1-284)
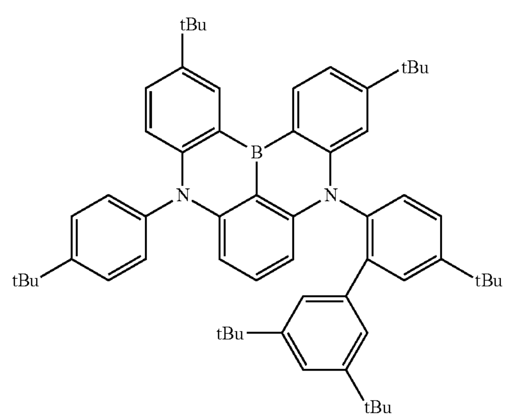

-continued
(1-285)
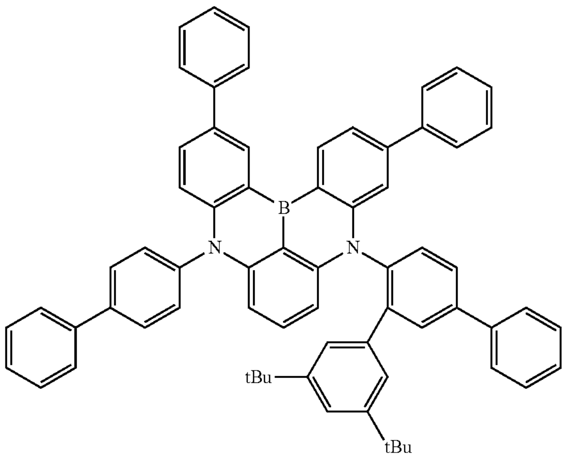
(1-286)
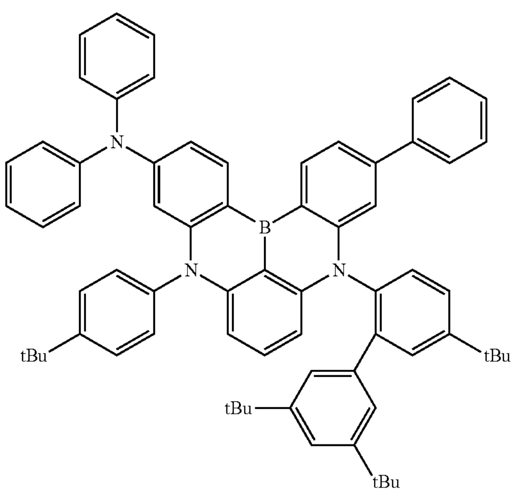
(1-287)
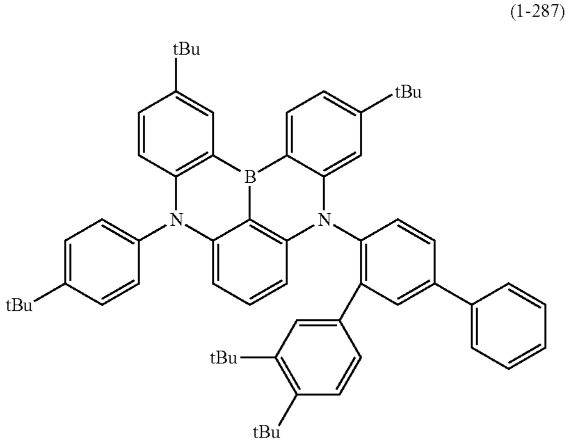
-continued
(1-288)
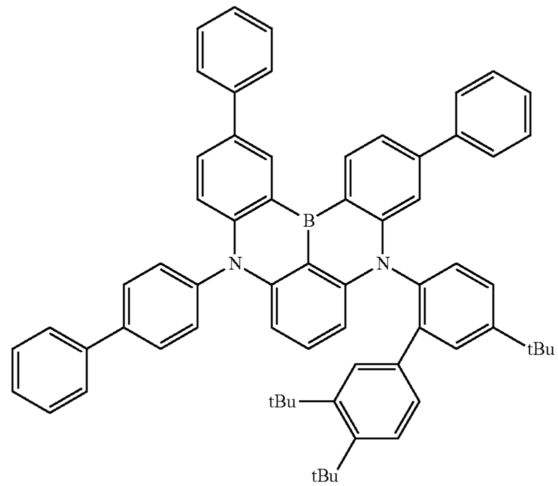
(1-289)
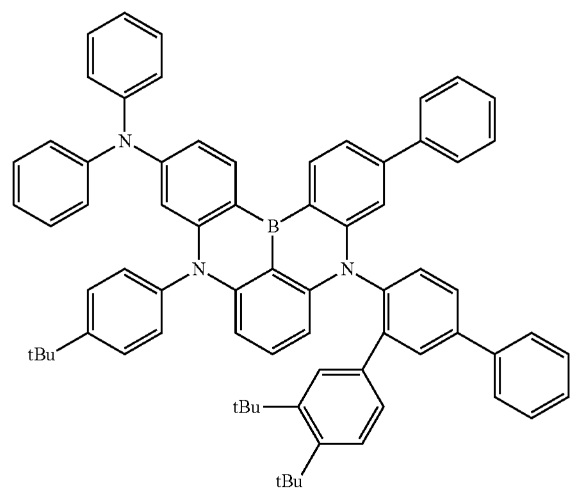
(1-290)
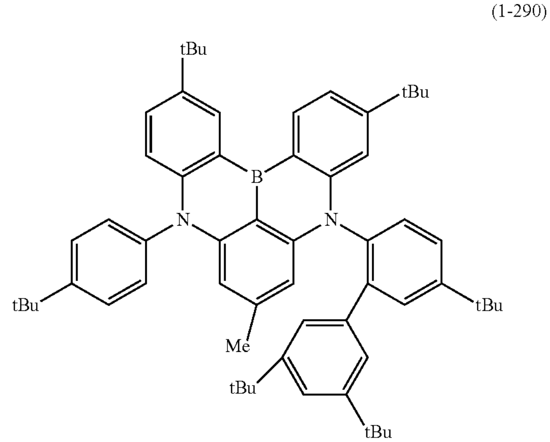

-continued
(1-291)
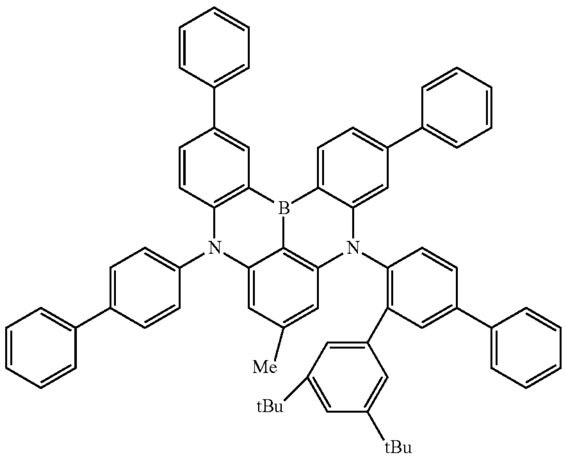
Formula 25
(1-292)
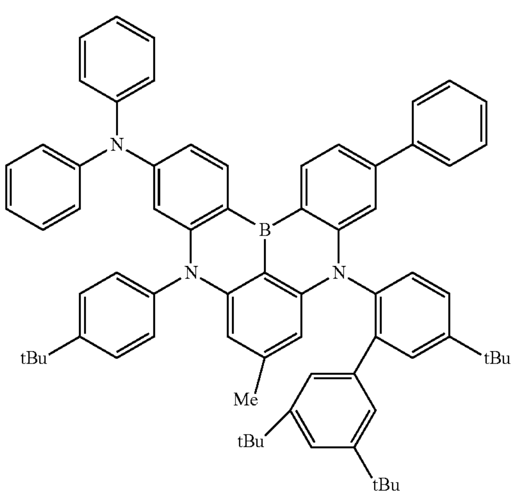
(1-293)
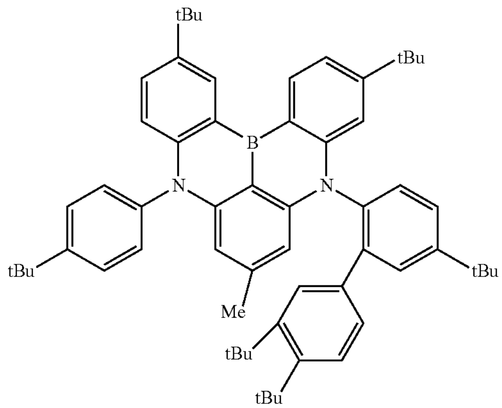
-continued
(1-294)
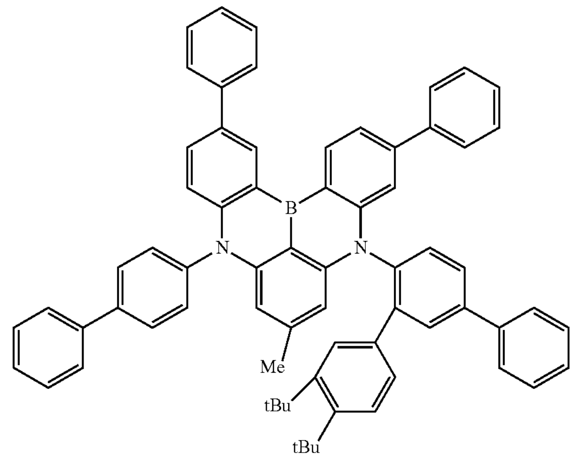
(1-295)
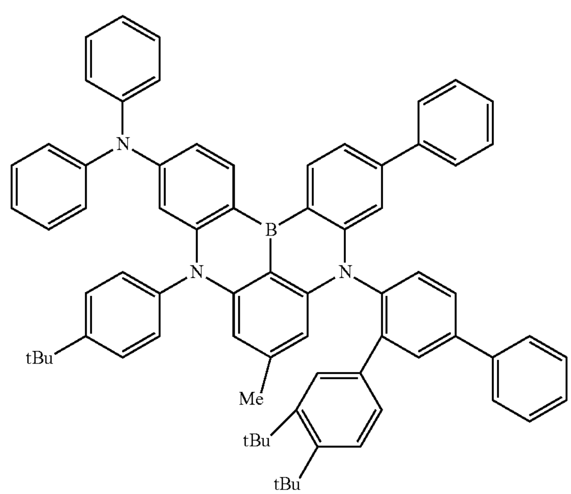
(1-296)
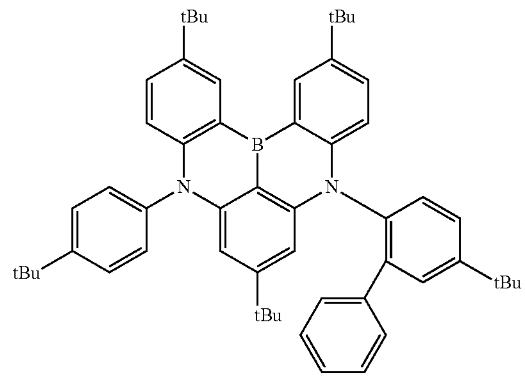

-continued
(1-297)
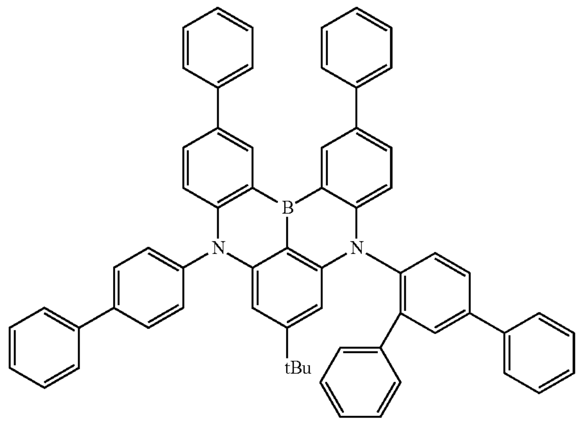
Formula 26
(1-298)
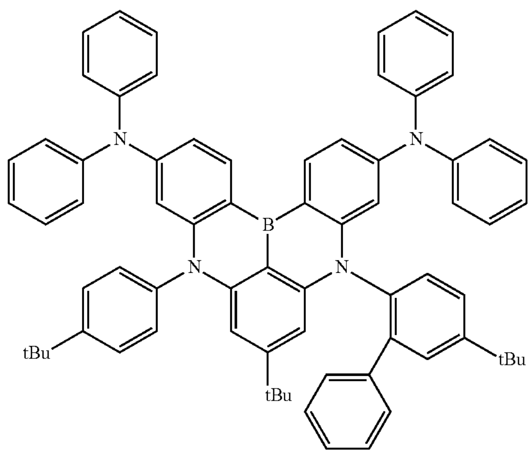
(1-299)
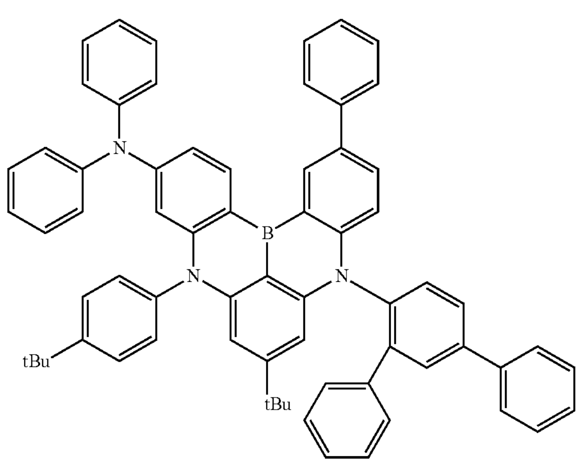
-continued
(1-300)
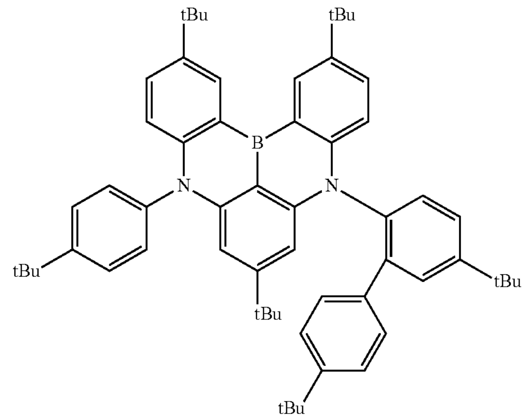
(1-450)
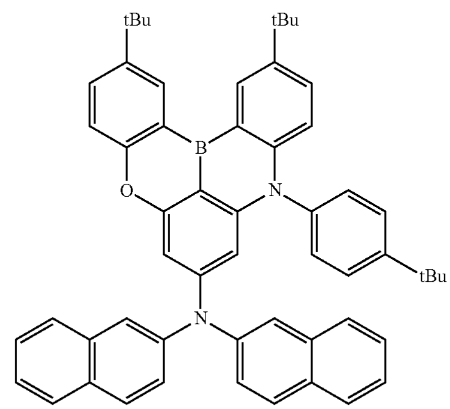
(1-451)
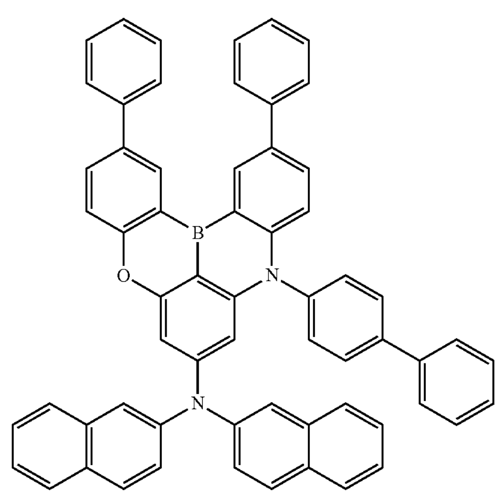

-continued
(1-452)
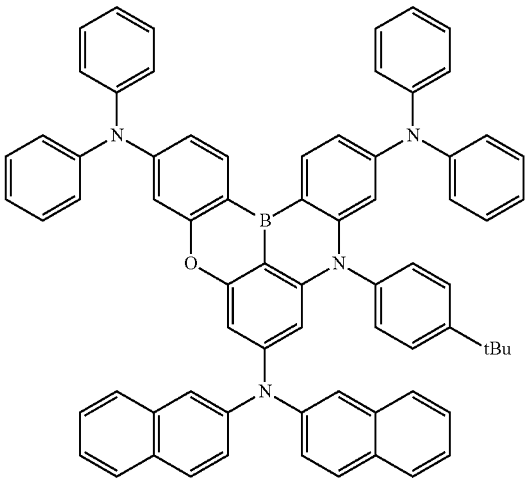
(1-453)
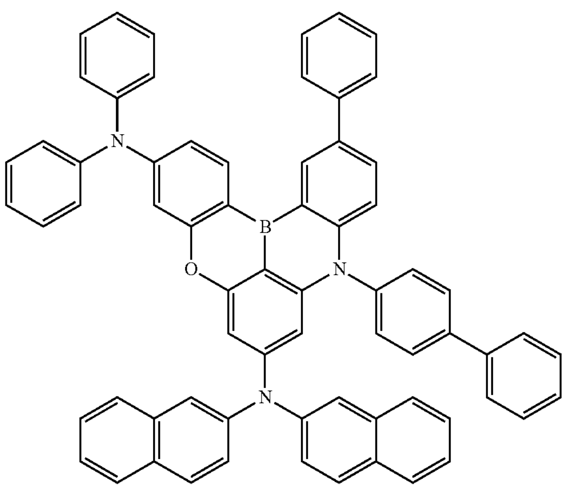
(1-454)
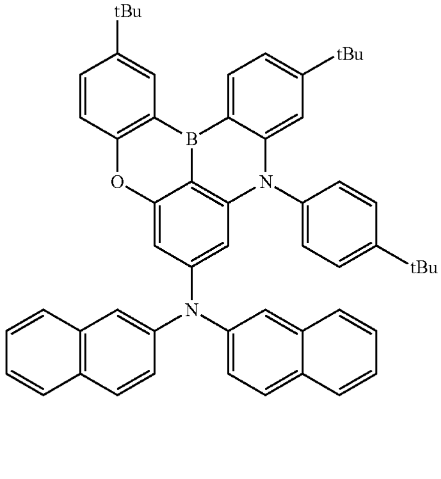
-continued
(1-455)
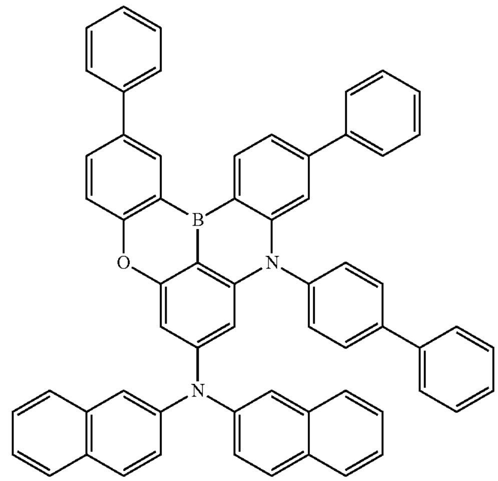
(1-456)
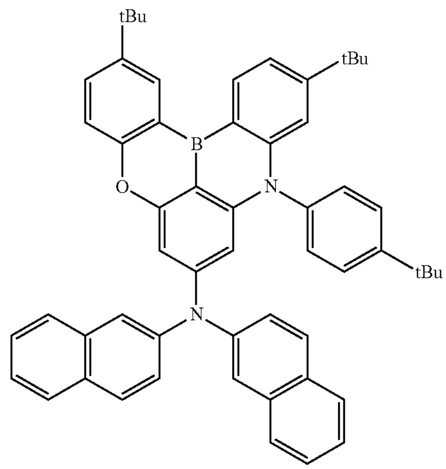
(1-457)
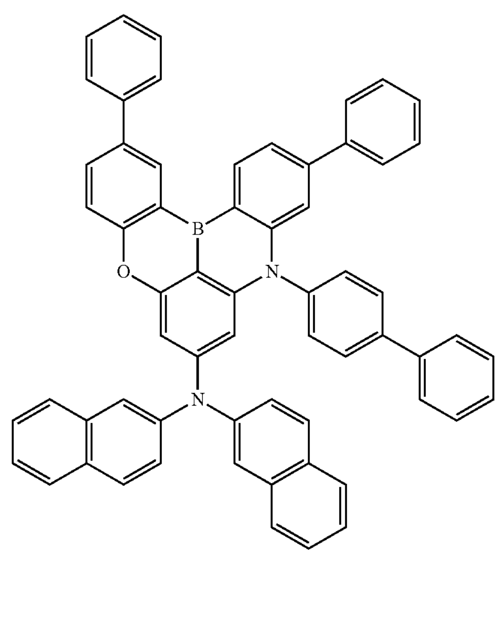

-continued
(1-458)
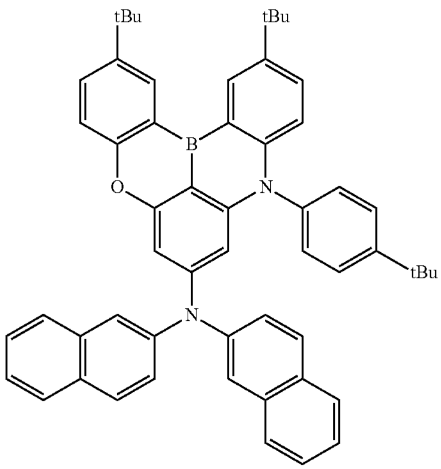
(1-459)
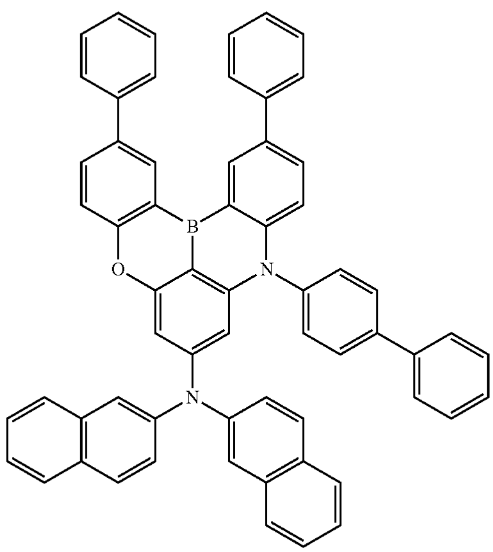
(1-460)
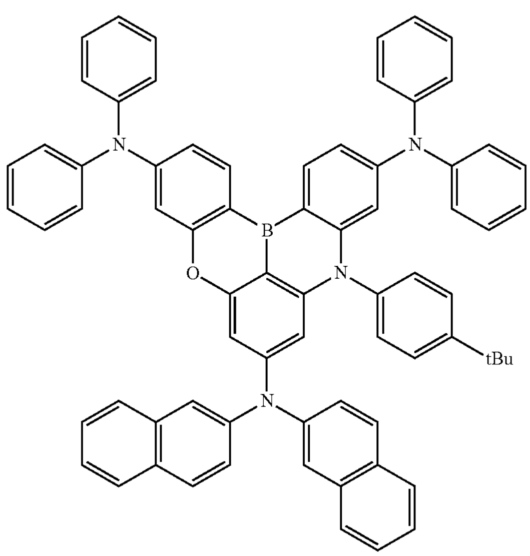
-continued
(1-461)
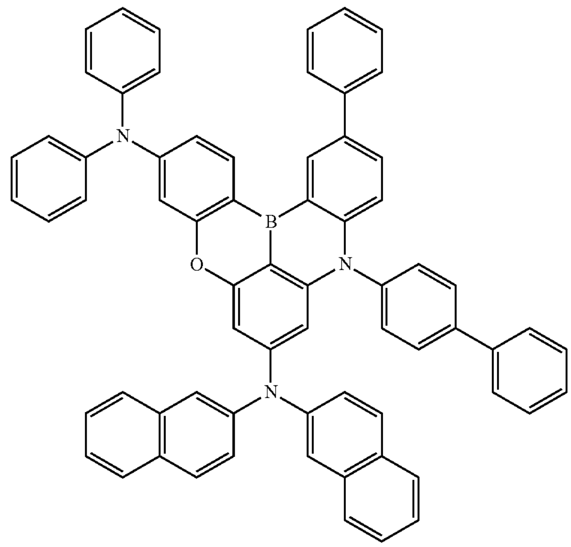
Formula 27
(1-462)
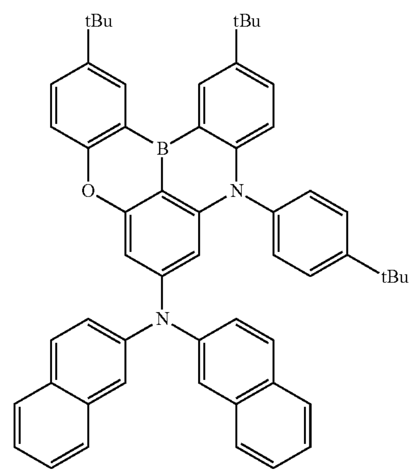
(1-463)
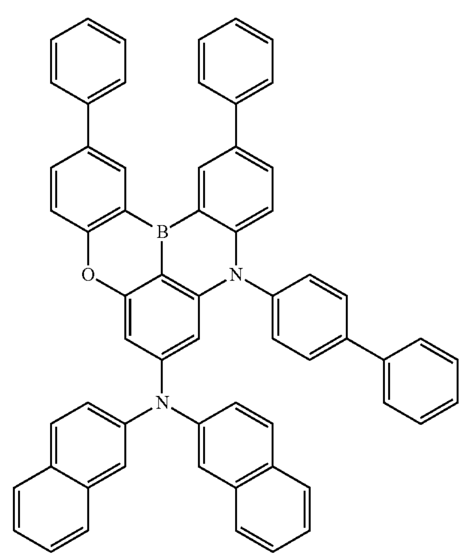

(1-464)
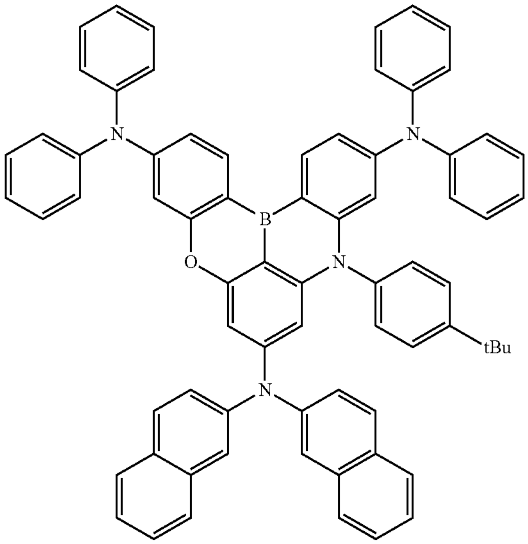
(1-465)
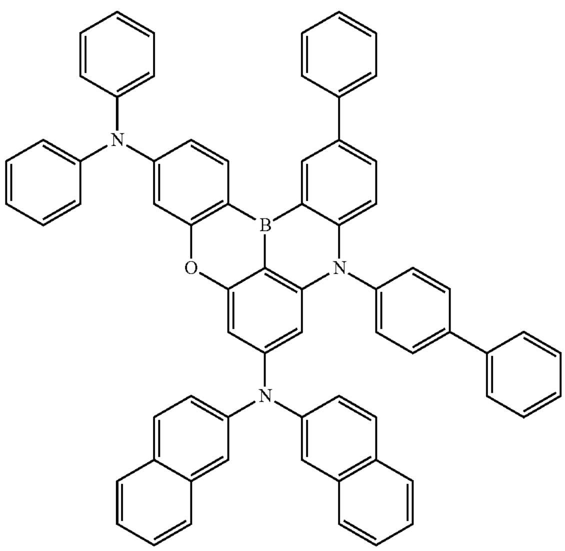
(1-466)
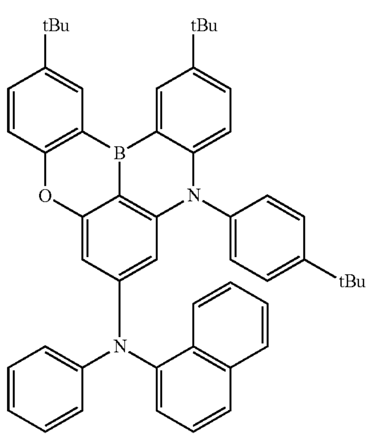
(1-467)
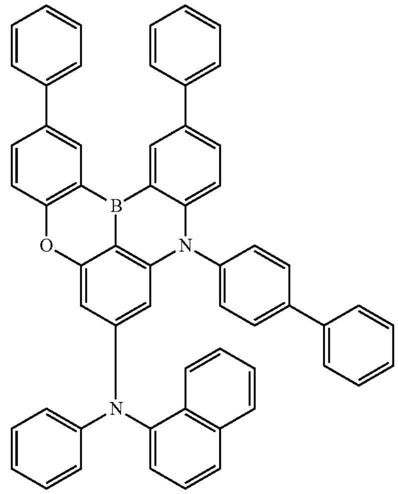
(1-468)
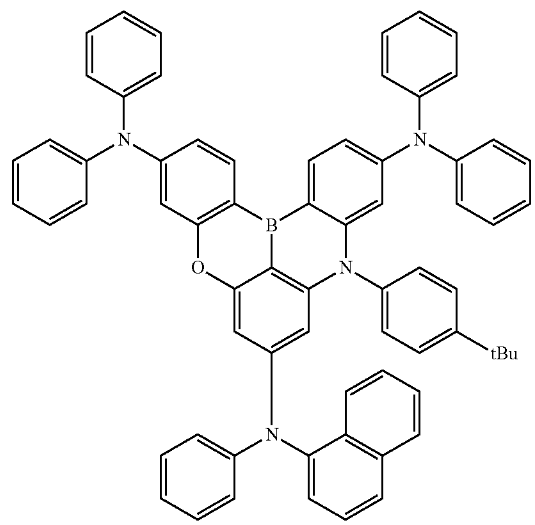
(1-469)
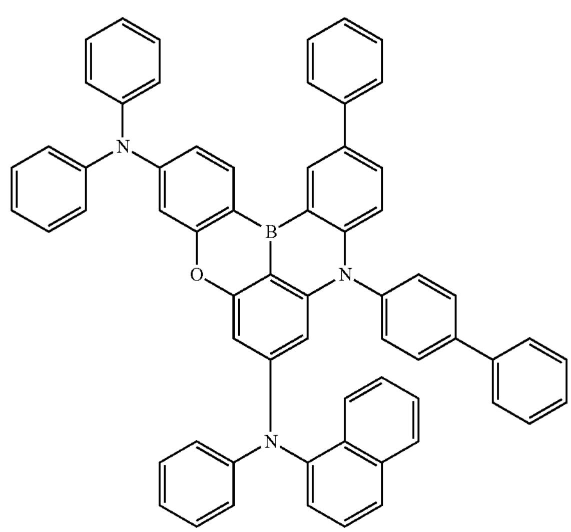

-continued
Formula 28
(1-520)
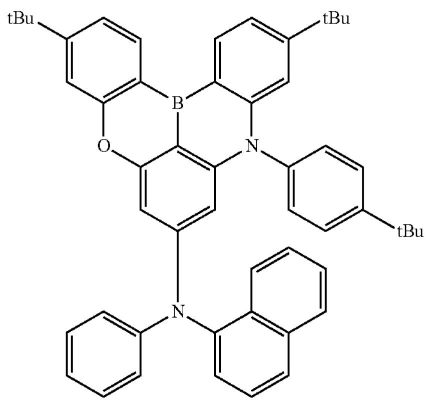
(1-521)
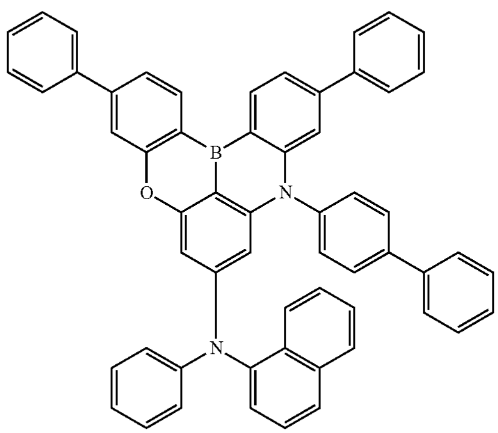
(1-522)
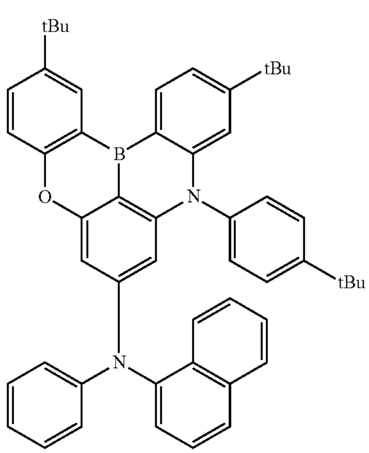
-continued
(1-523)
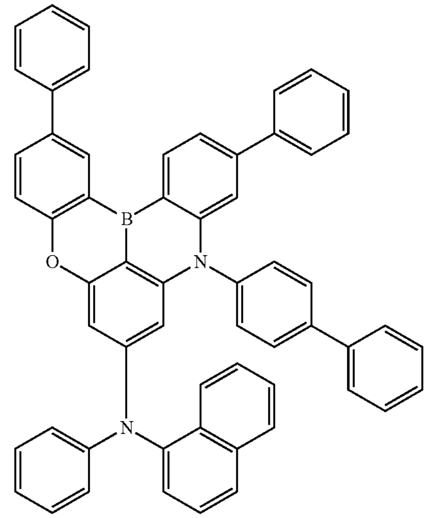
(1-524)
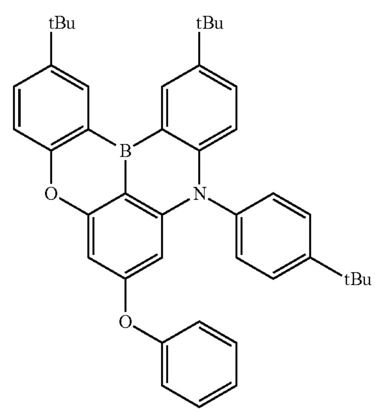
(1-525)
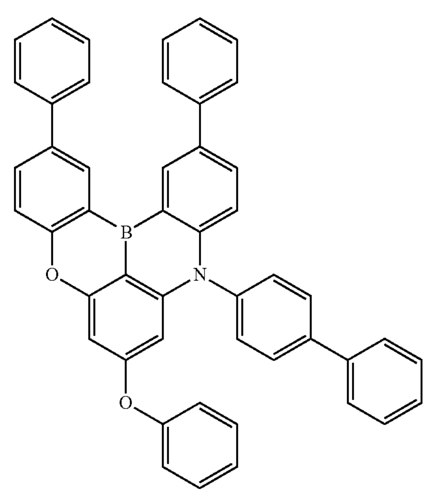

-continued
(1-526)
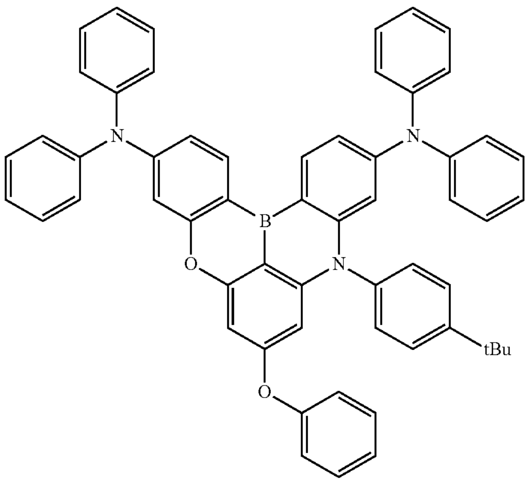
(1-527)
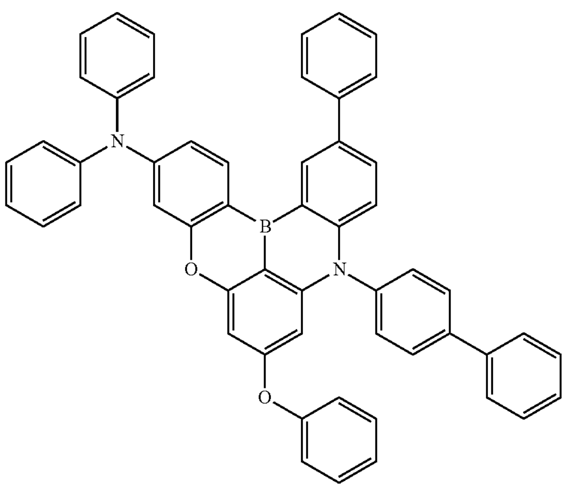
(1-528)
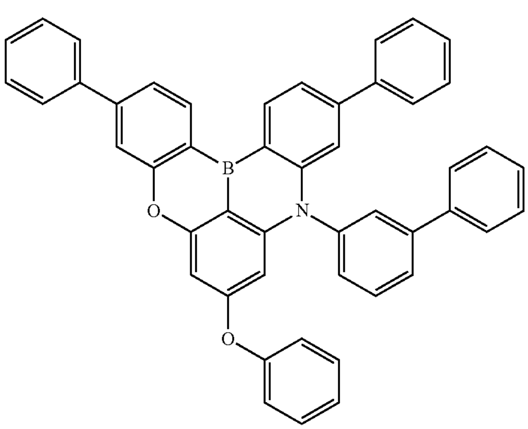
-continued
(1-529)
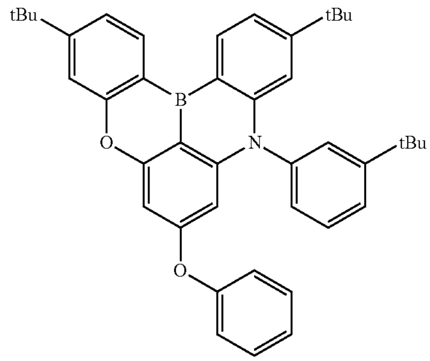
(1-530)
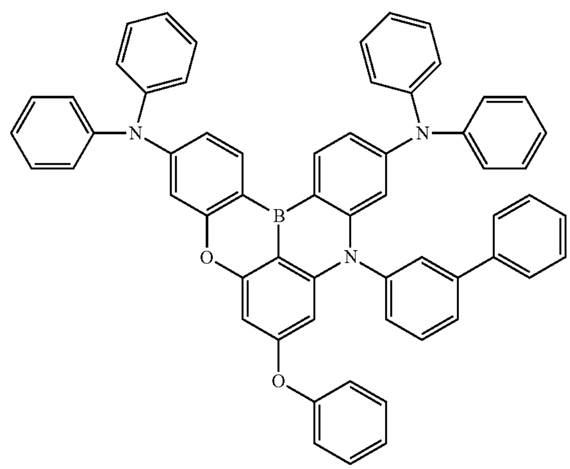
(1-531)
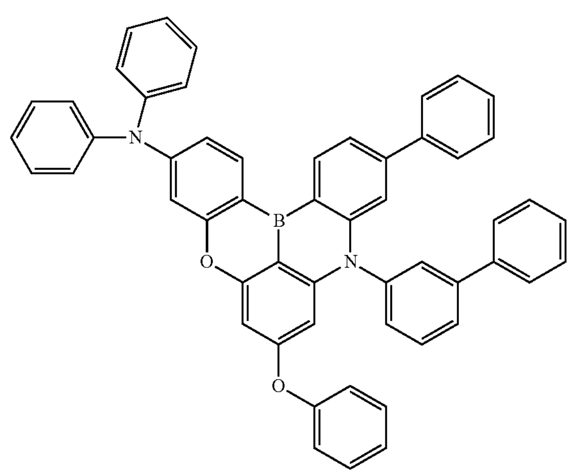

-continued
Formula 29
(1-532)
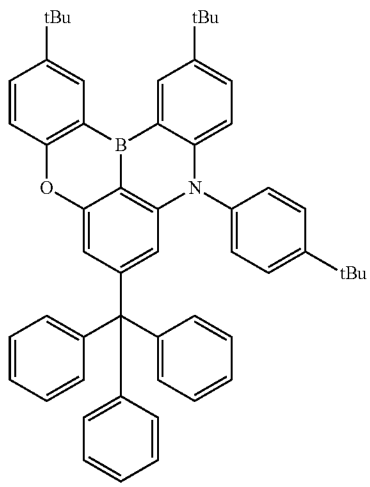
(1-533)
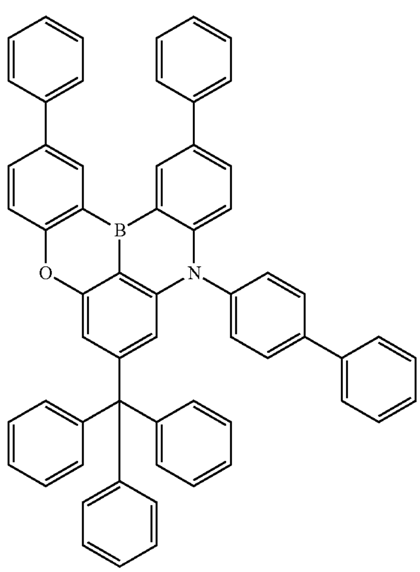
-continued
(1-534)
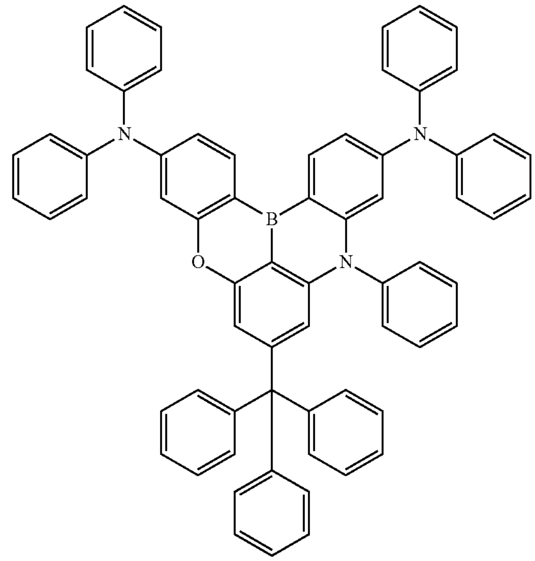
(1-535)
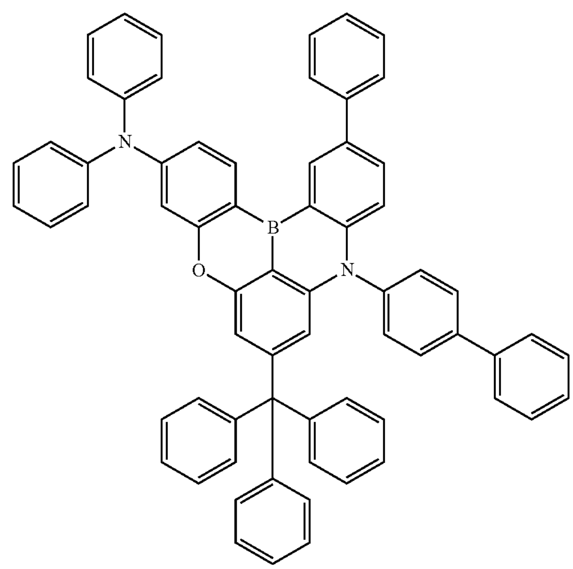
(1-536)
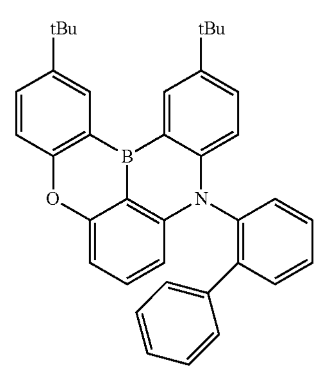

-continued
(1-537)
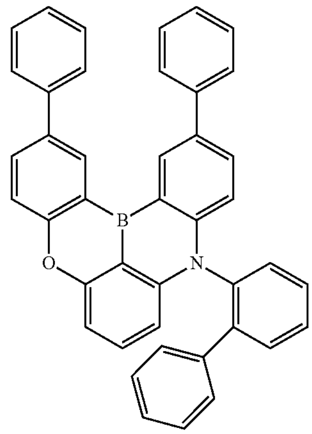
(1-538)
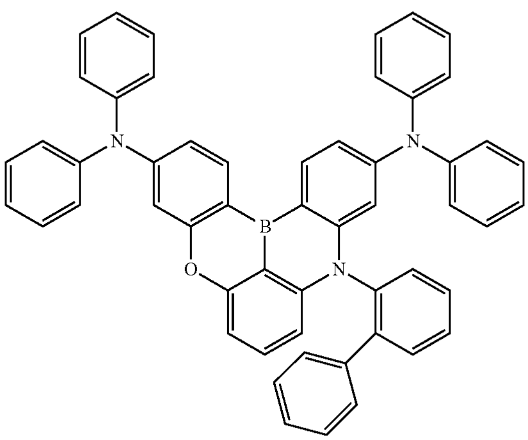
(1-539)
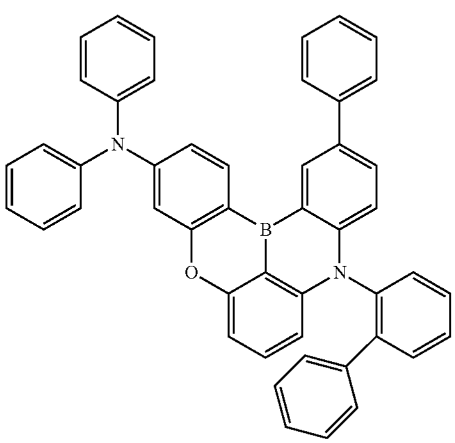
-continued
(1-540)
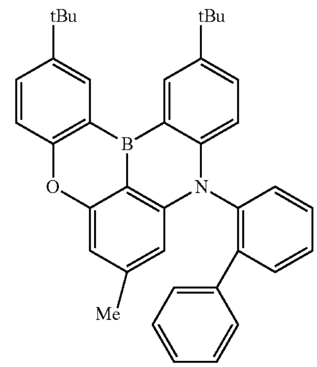
(1-541)
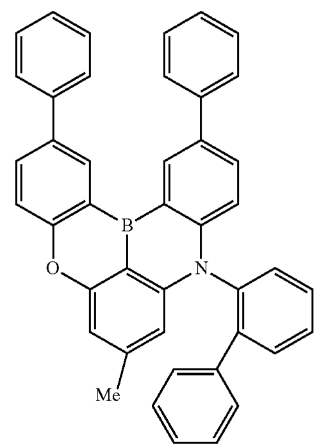
(1-542)
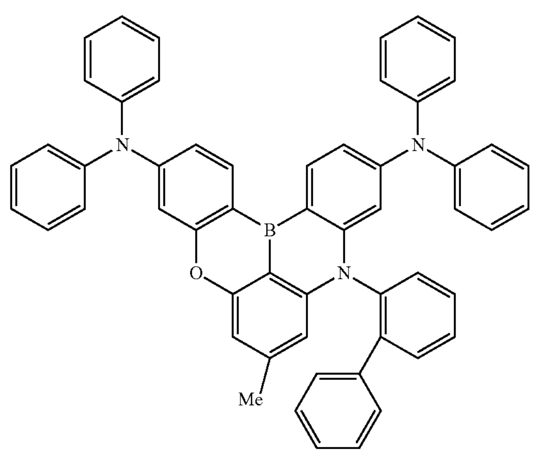

-continued
(1-543)
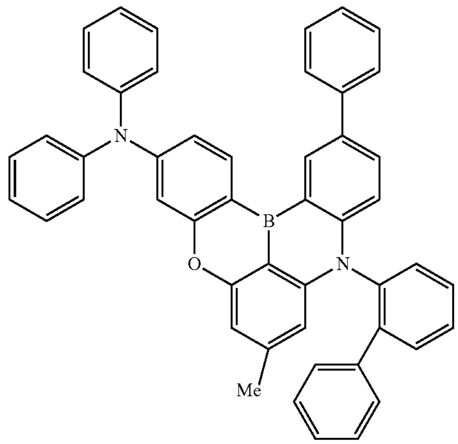
Formula 30
(1-560)
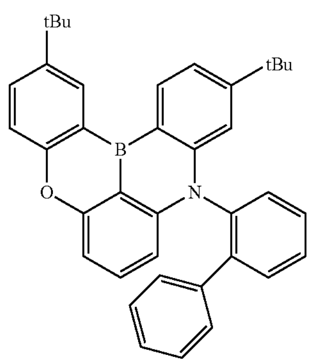
(1-561)
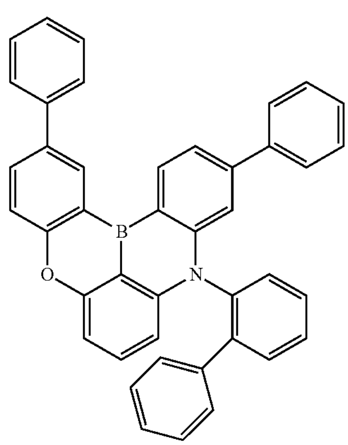
-continued
(1-562)
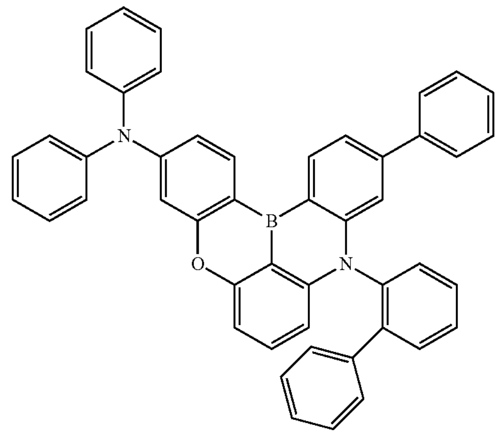
(1-563)
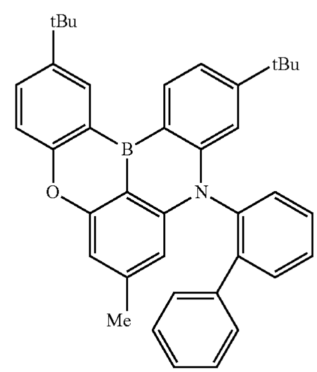
(1-564)
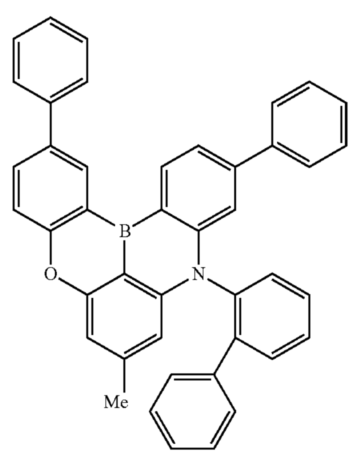

-continued
(1-565)
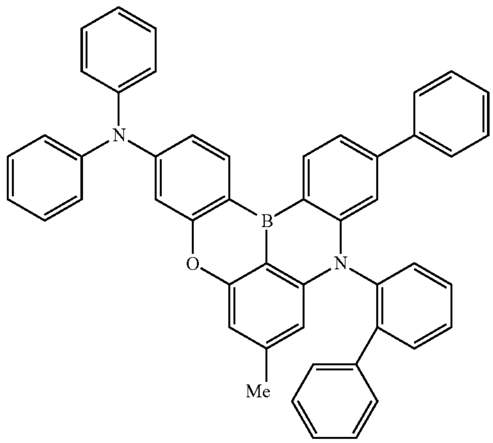
(1-566)
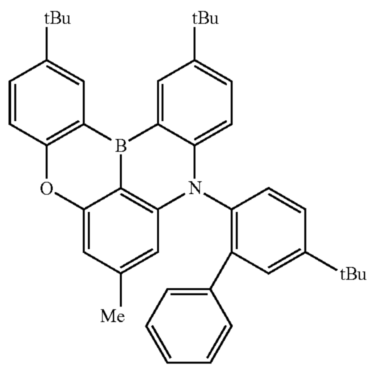
(1-567)
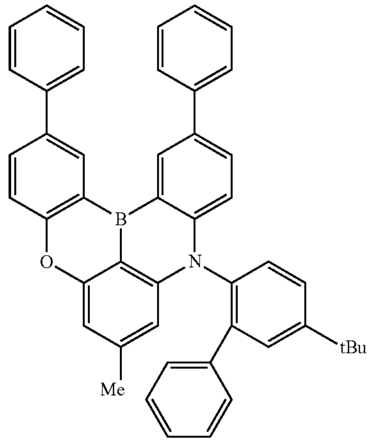
-continued
(1-568)
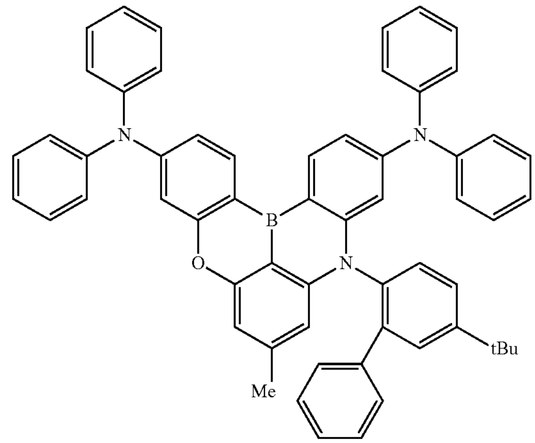
(1-569)
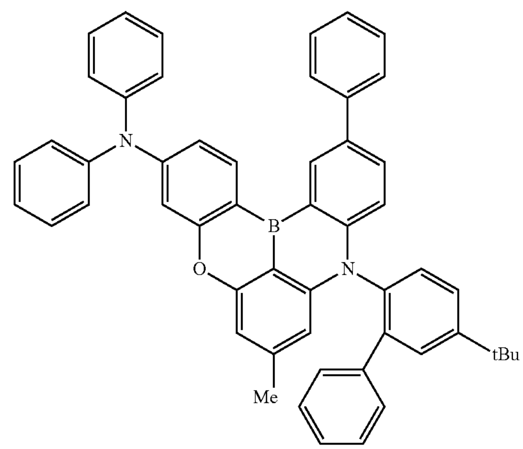
(1-570)
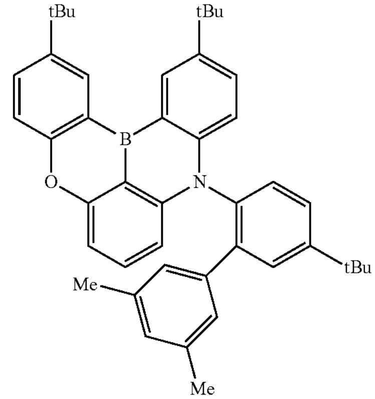

-continued
(1-571)
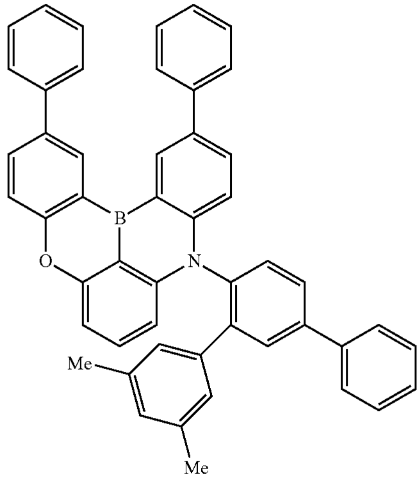
Formula 31
(1-572)
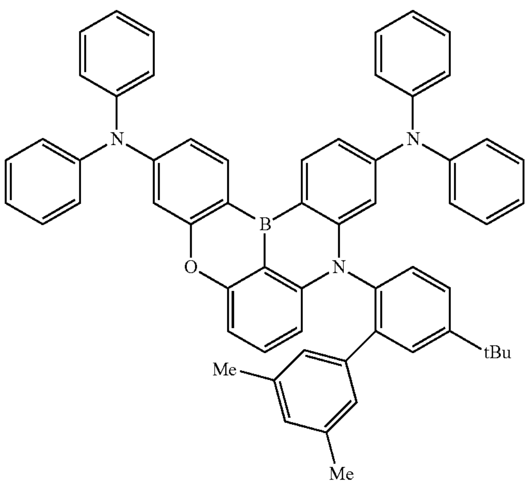
(1-573)
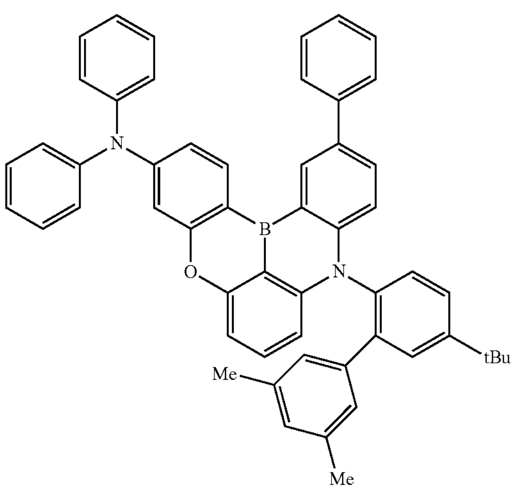
-continued
(1-574)
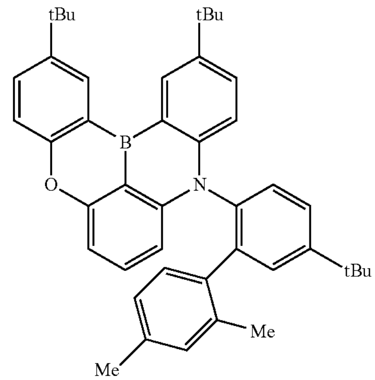
(1-575)
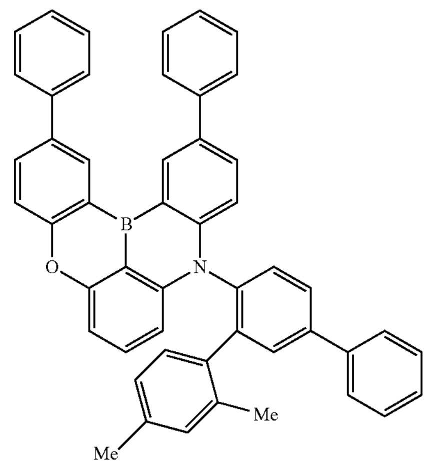
(1-576)
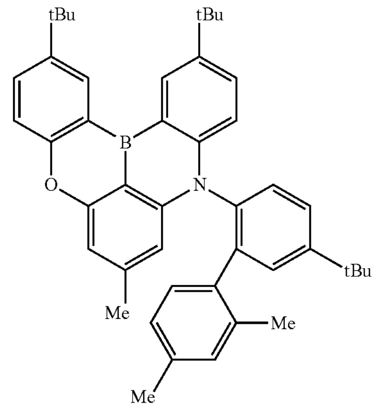

(1-577)
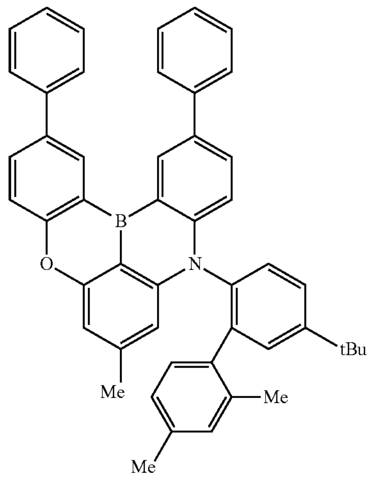
(1-578)
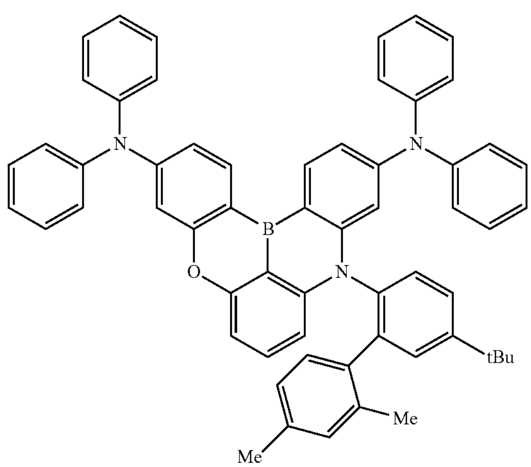
(1-579)
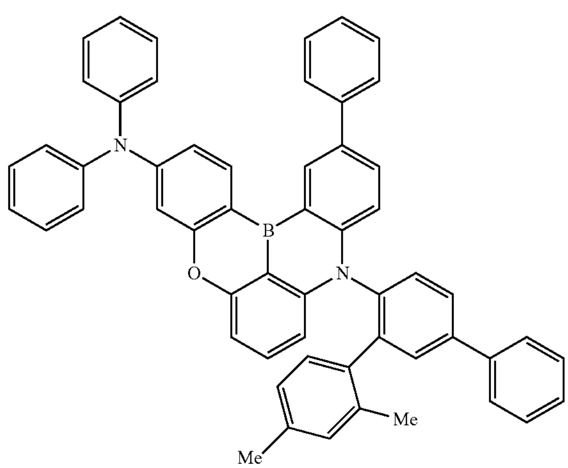
(1-580)
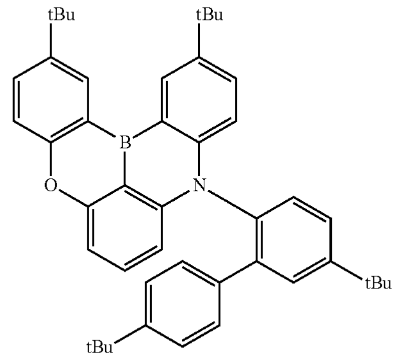
(1-581)
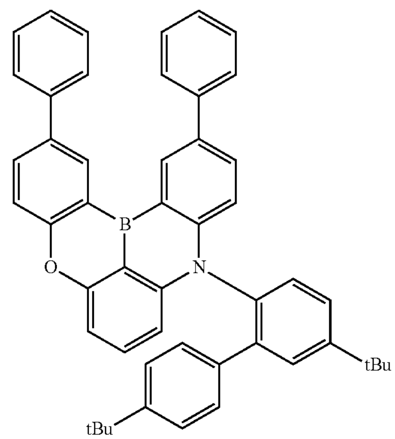
(1-582)
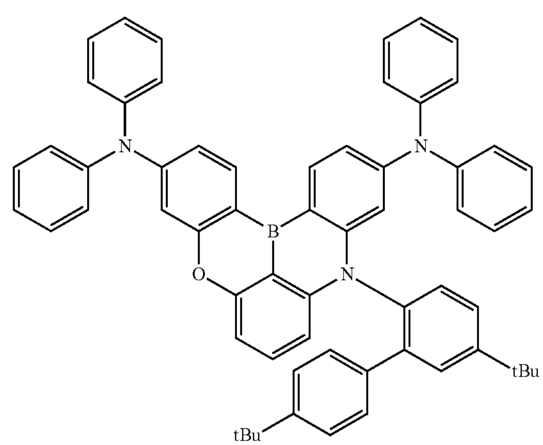

-continued
(1-583)
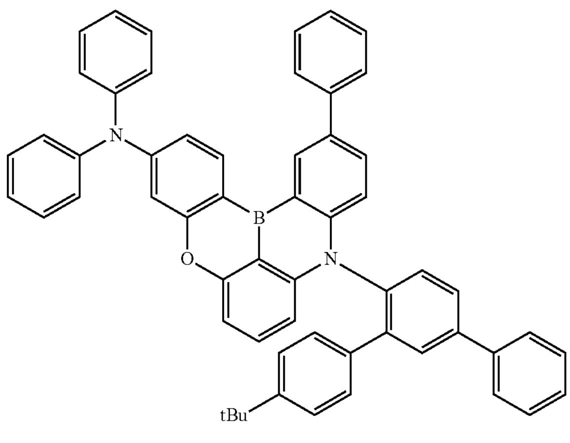
Formula 32
(1-600)
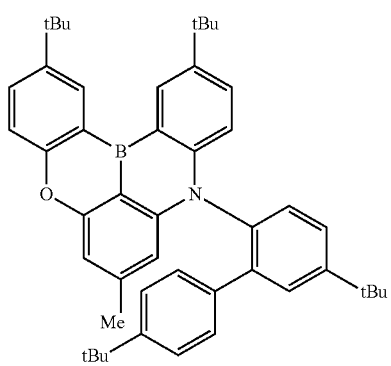
(1-601)
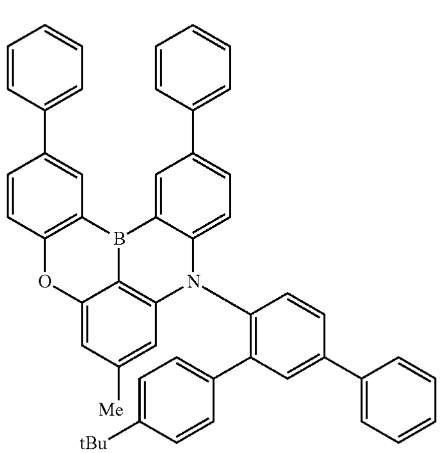
-continued
(1-602)
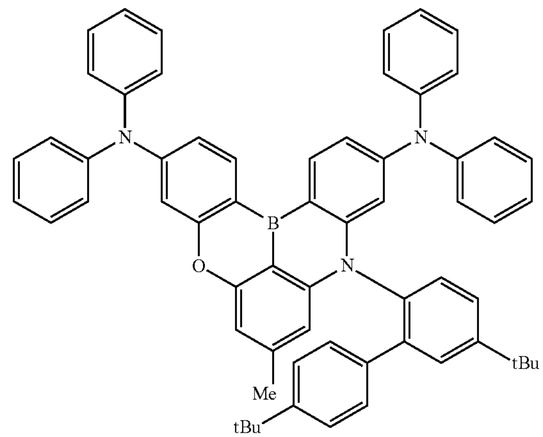
(1-603)
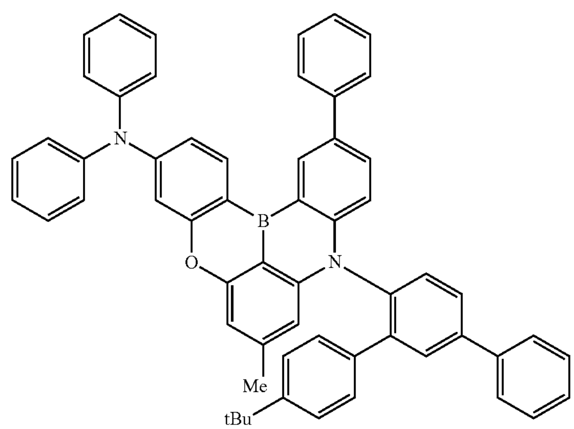
(1-604)
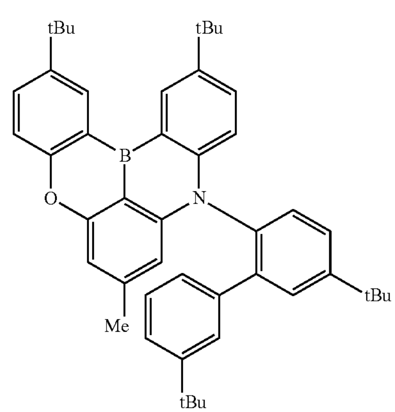

-continued
(1-605)
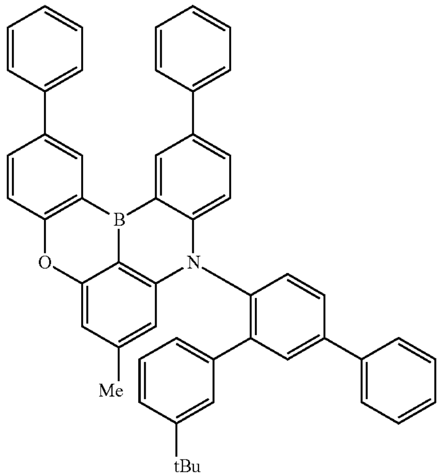
(1-606)
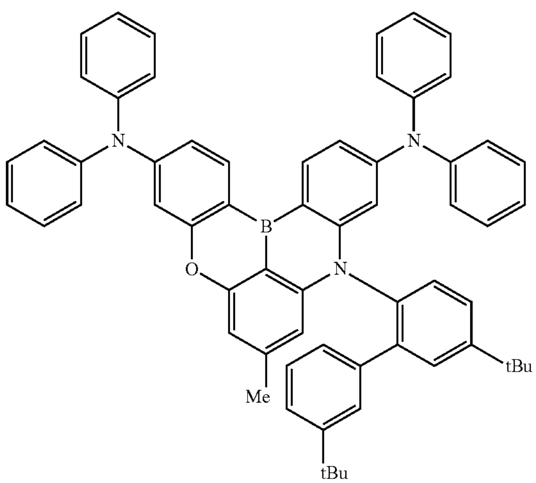
(1-607)
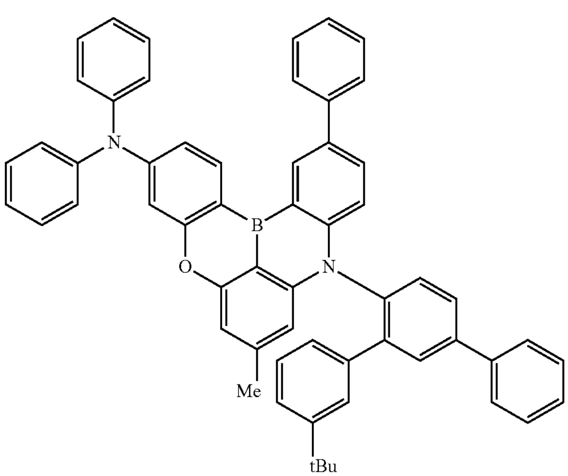
-continued
(1-608)
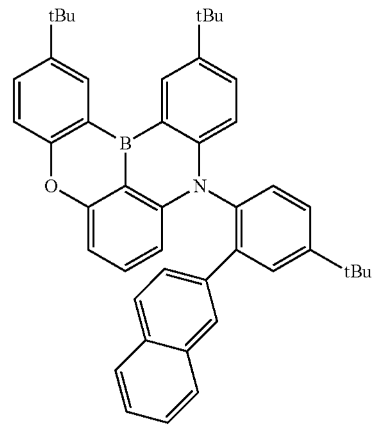
(1-609)
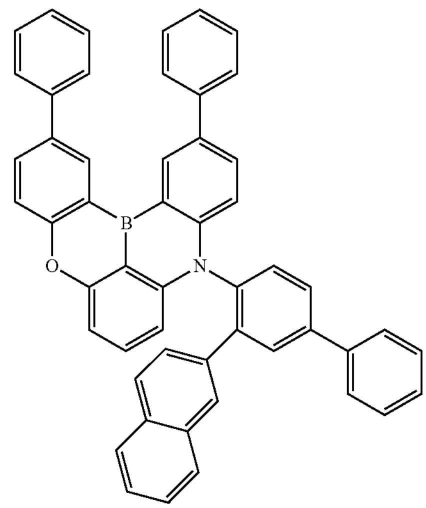
(1-610)
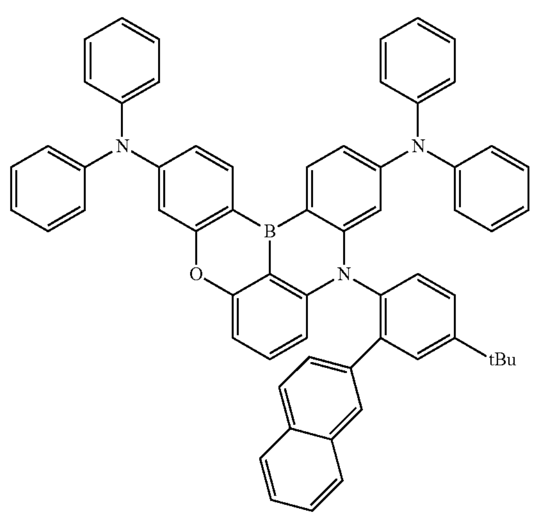

-continued
(1-611)
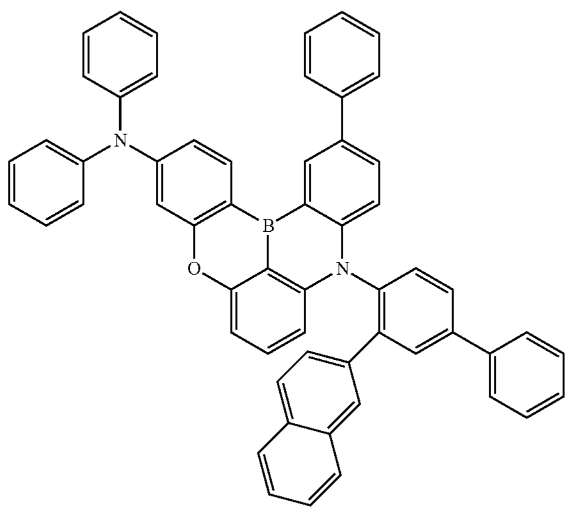
Formula 33
(1-612)
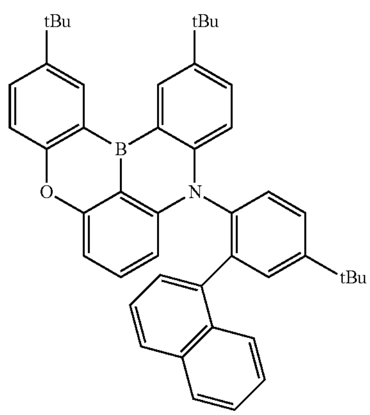
(1-613)
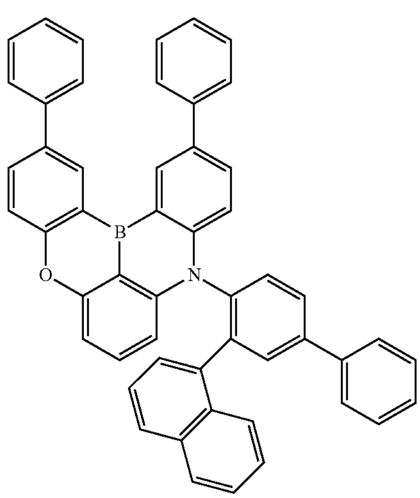
-continued
(1-614)
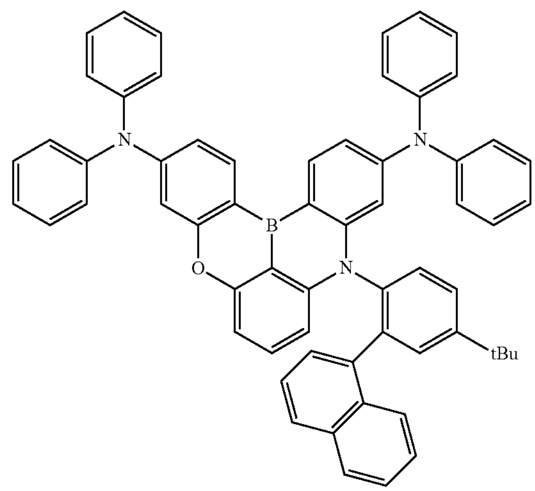
(1-615)
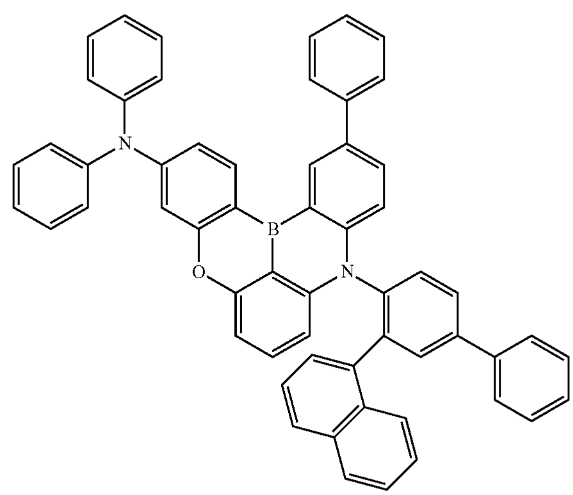
(1-616)
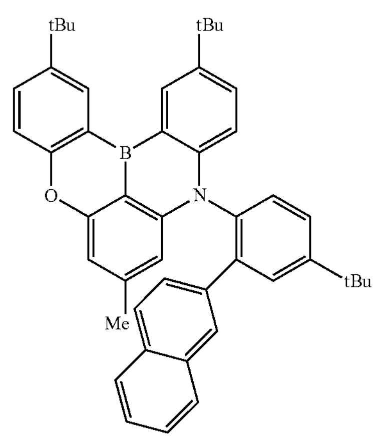

(1-617)
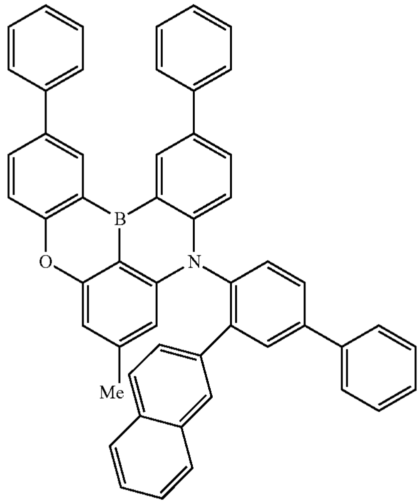
(1-618)
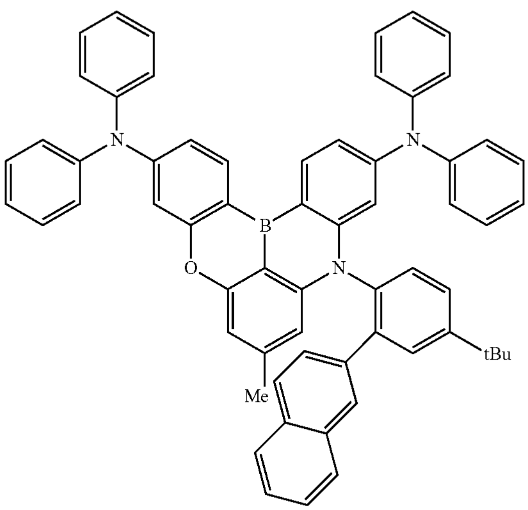
(1-619)
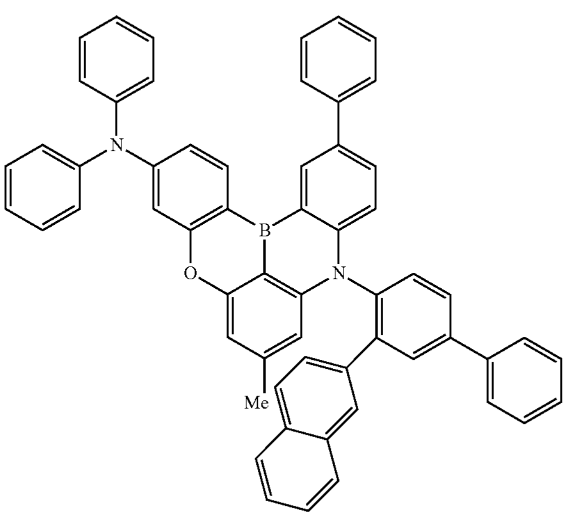
(1-620)
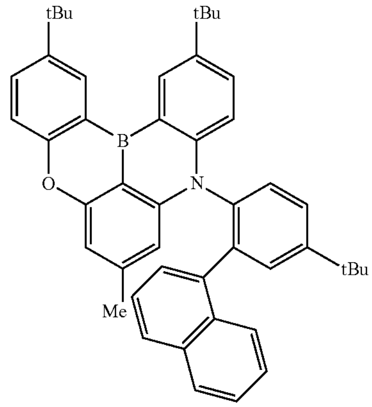
(1-621)
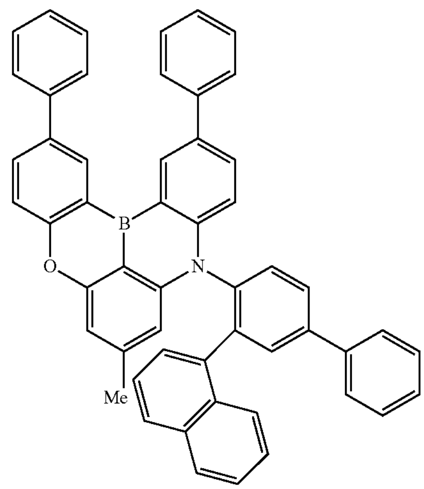
(1-622)
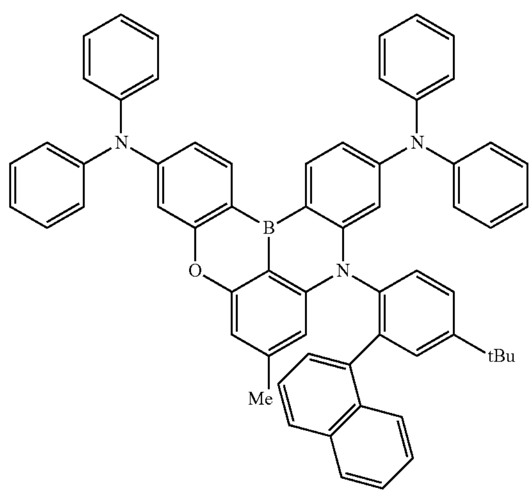

-continued
(1-623)
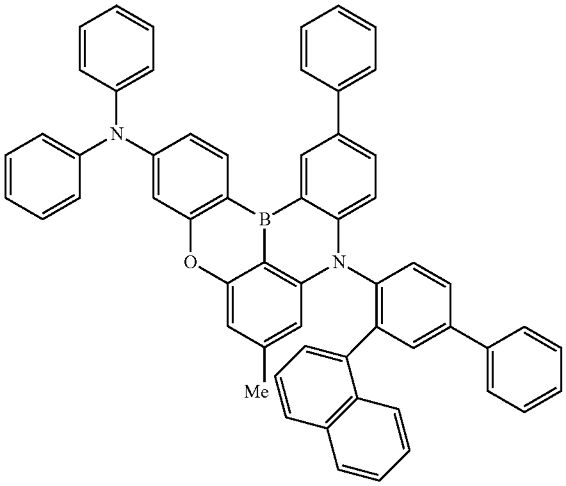
Formula 34
(1-640)
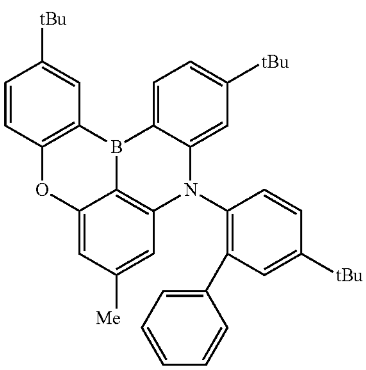
(1-641)
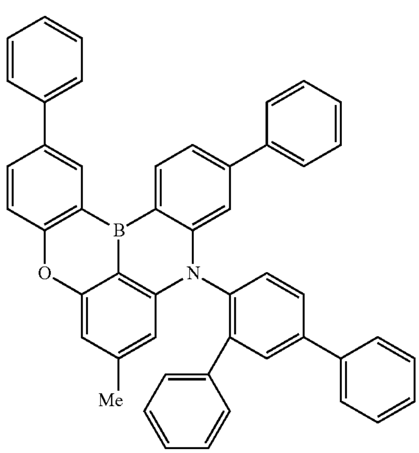
-continued
(1-642)
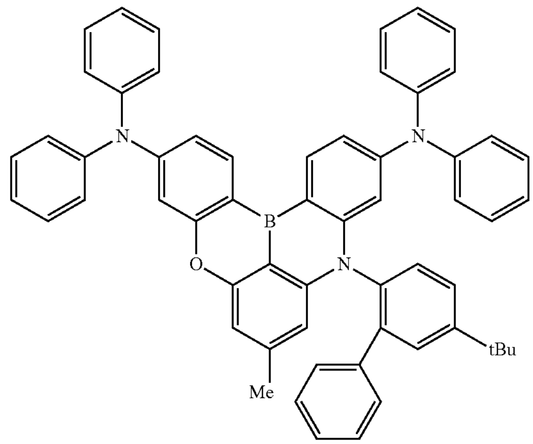
(1-643)
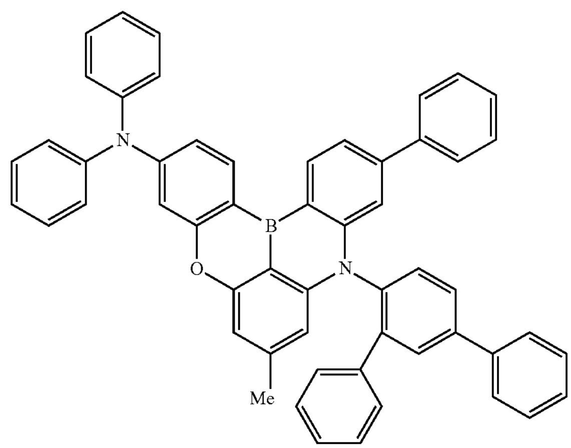
(1-644)
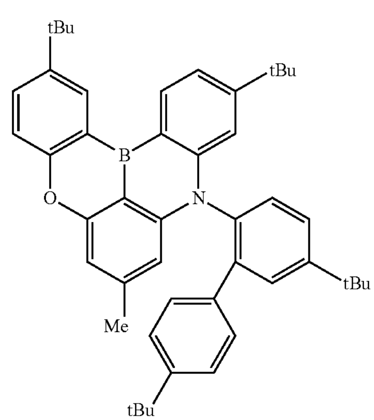

-continued
(1-645)
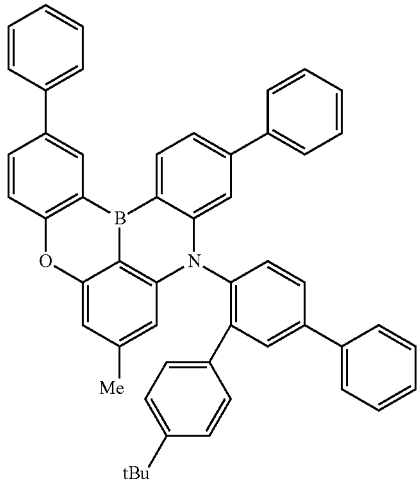
(1-646)
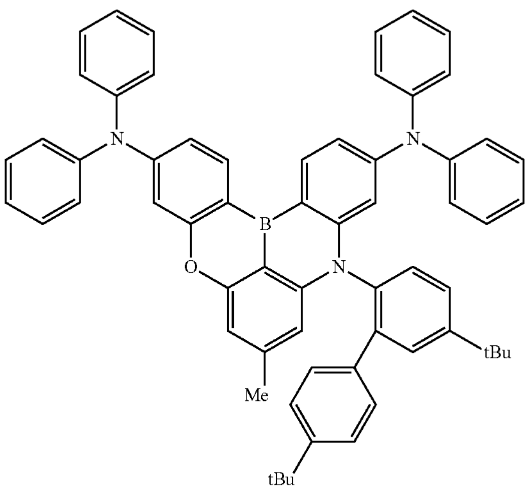
(1-647)
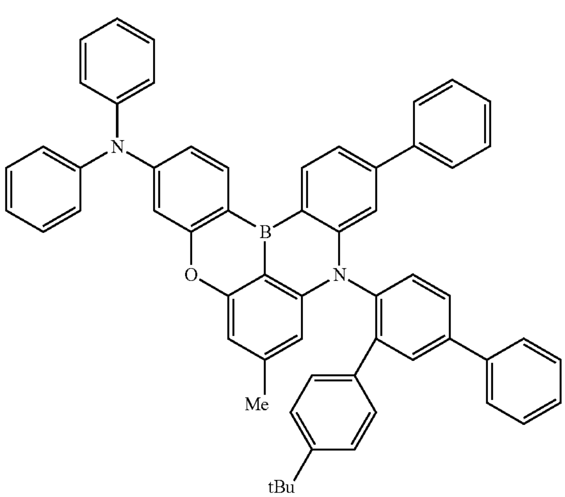
-continued
(1-648)
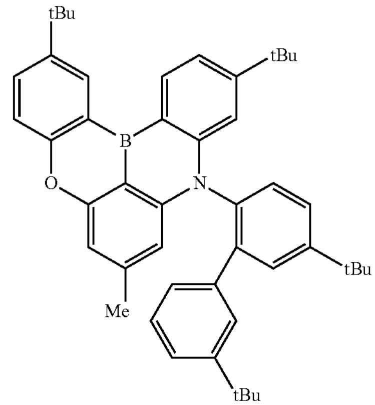
(1-649)
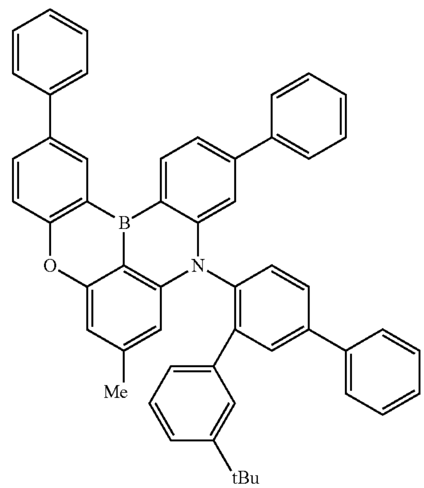
(1-650)
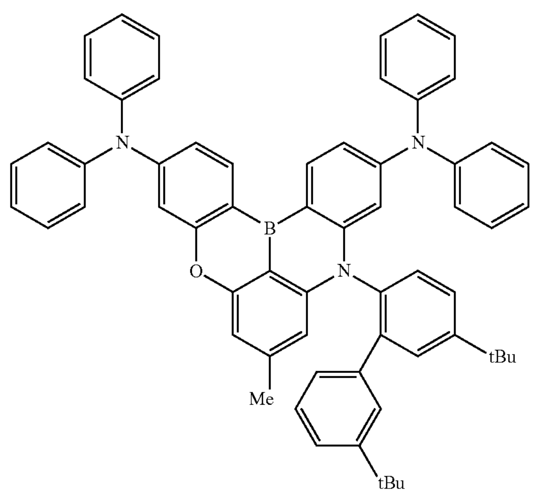

-continued
(1-651)
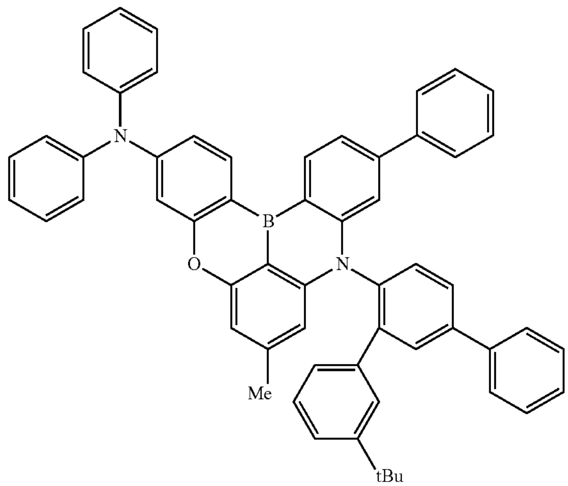
Formula 35
(1-652)
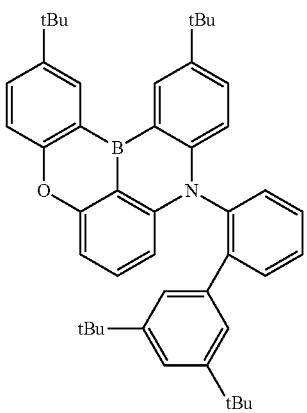
(1-653)
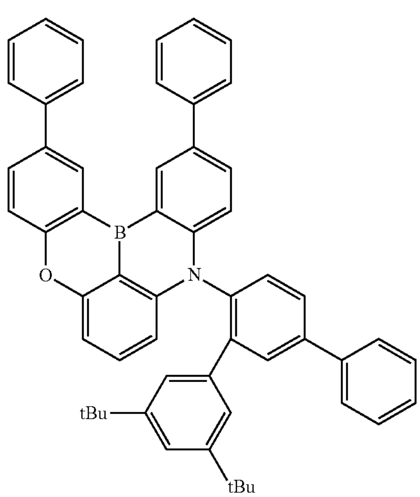
-continued
(1-654)
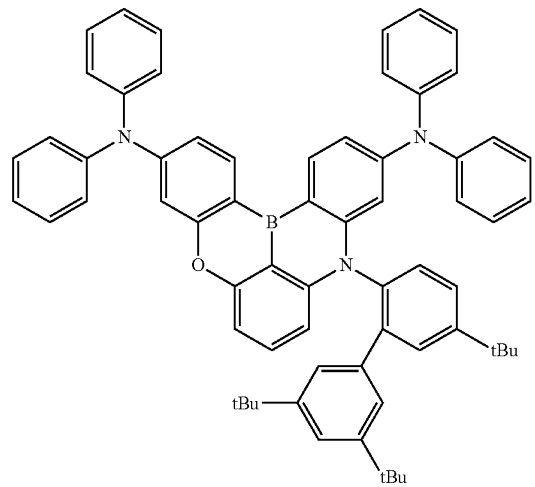
(1-655)
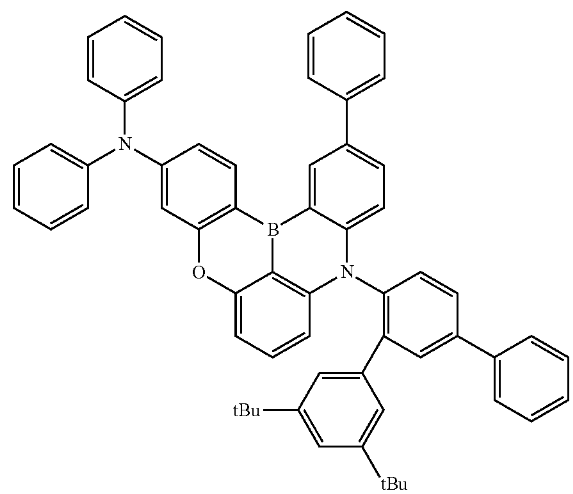
(1-656)
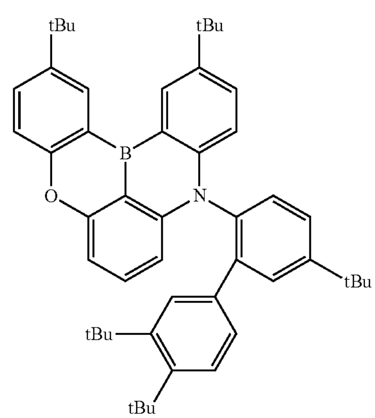

(1-657)
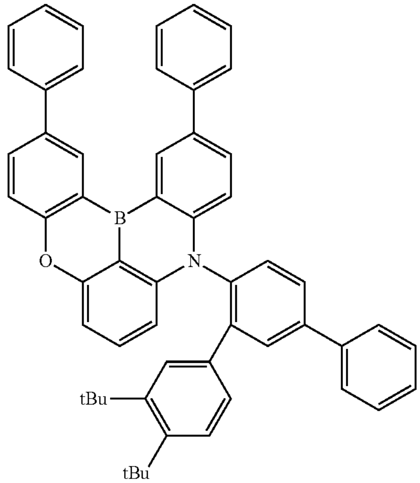
(1-658)
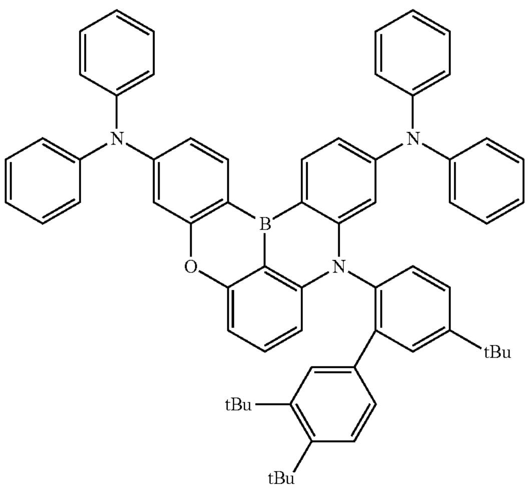
(1-659)
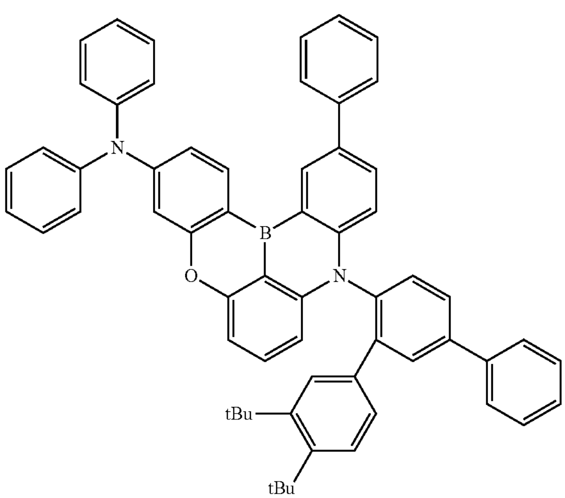
(1-660)
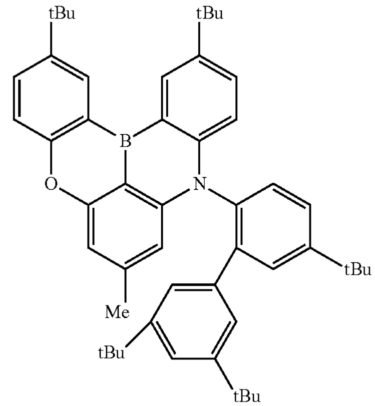
(1-661)
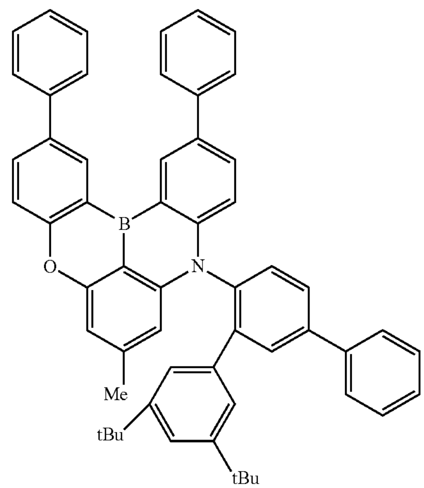
(1-662)
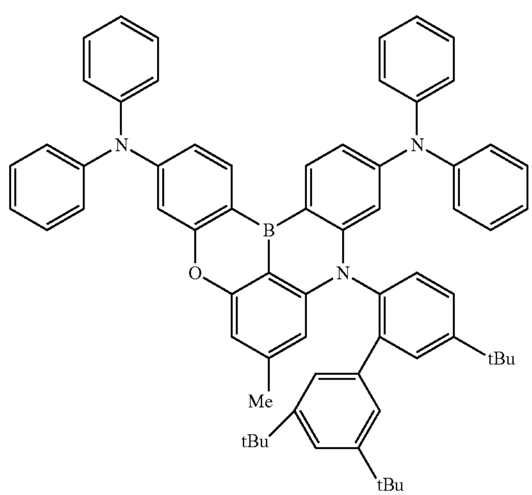

-continued
(1-663)
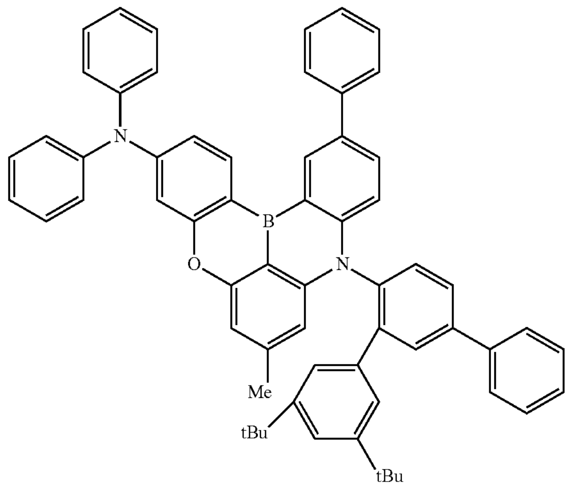
Formula 36
(1-680)
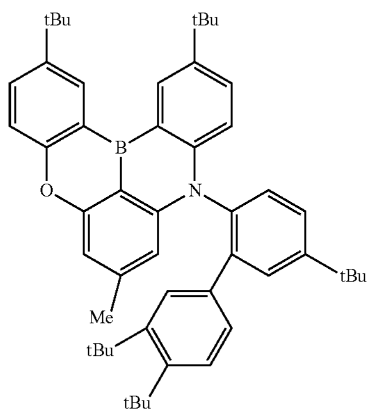
(1-681)
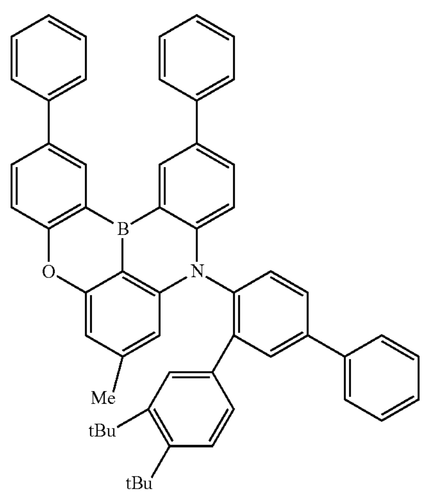
-continued
(1-682)
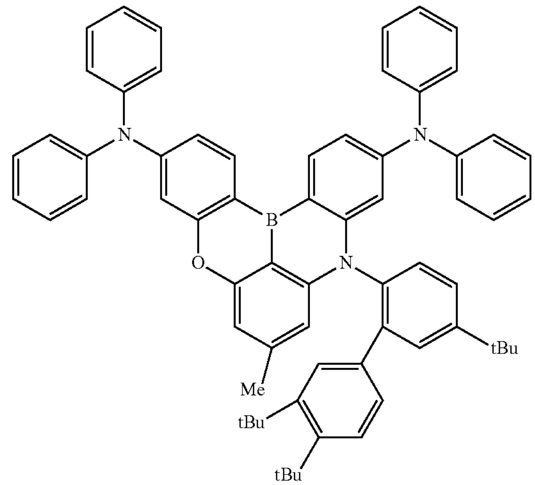
(1-683)
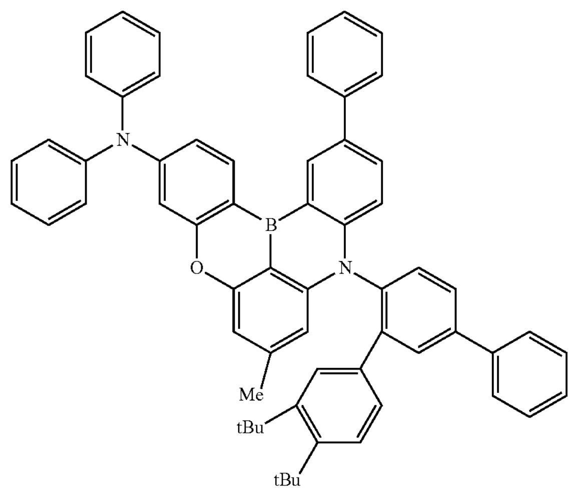
(1-684)
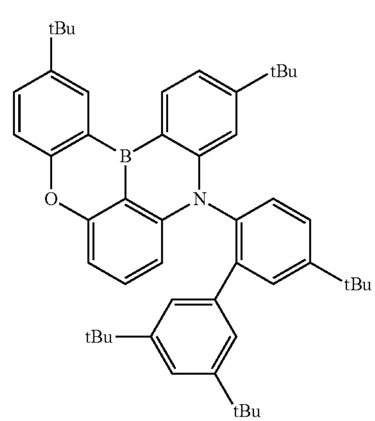

-continued
(1-685)
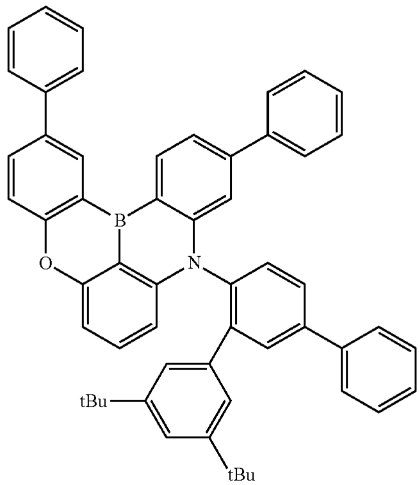
(1-686)
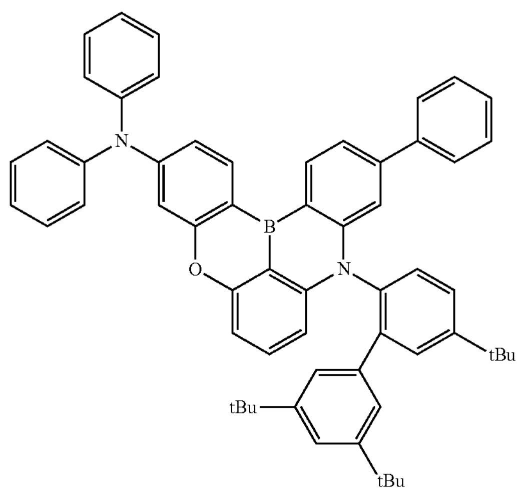
(1-687)
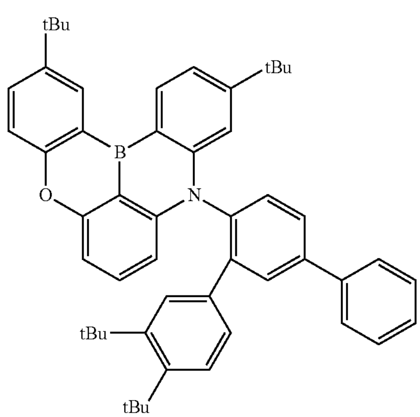
-continued
(1-688)
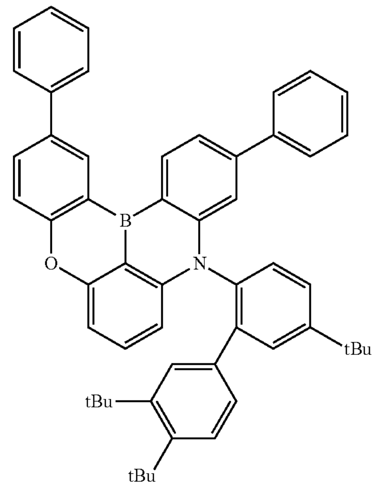
(1-689)
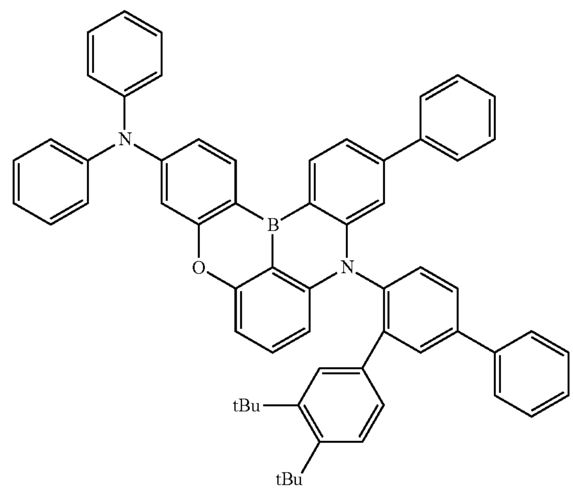
(1-690)
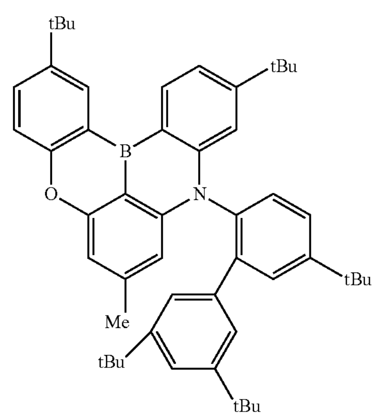

-continued
(1-691)
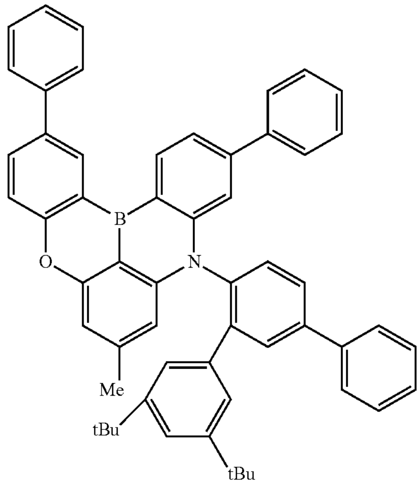
Formula 37
(1-692)
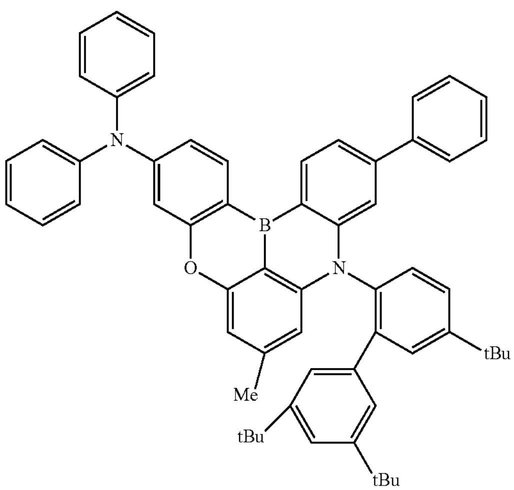
(1-693)
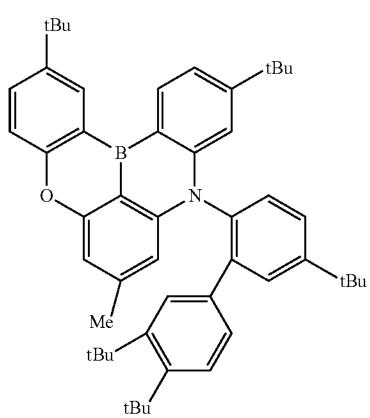
-continued
(1-694)
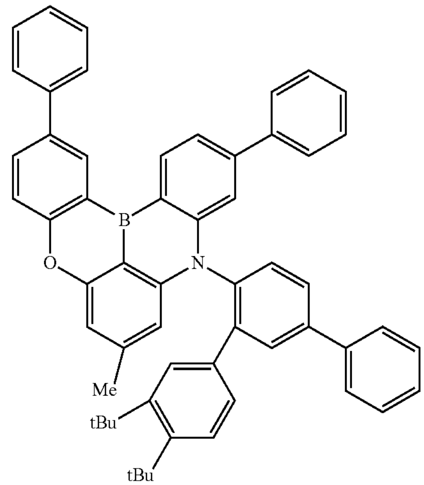
(1-695)
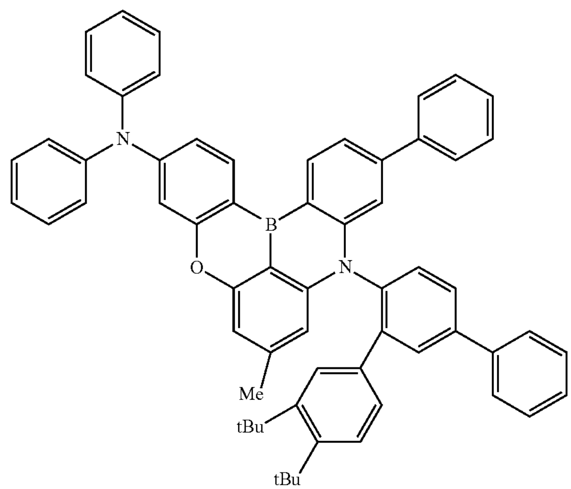
(1-696)
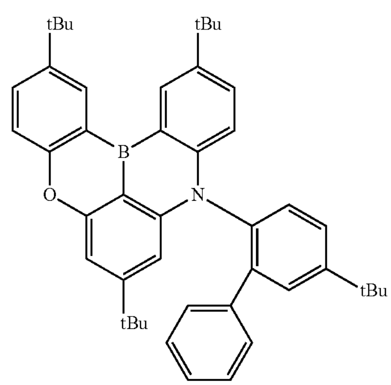

-continued
(1-697)
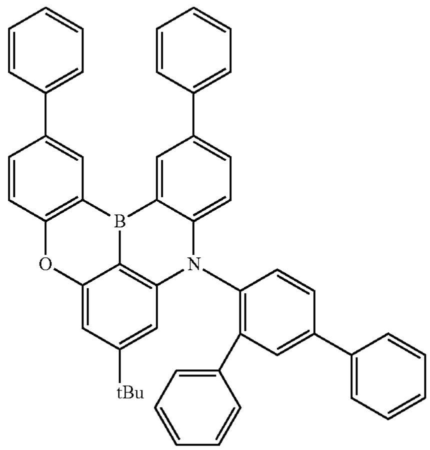
(1-698)
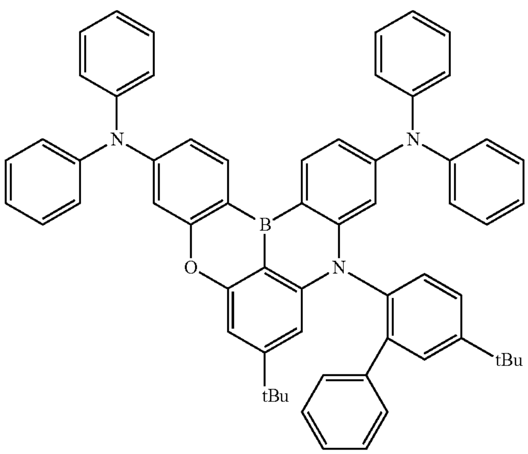
(1-699)
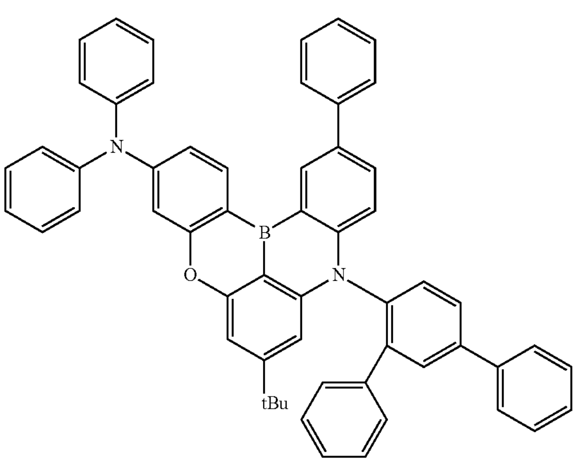
-continued
Formula 38
(1-700)
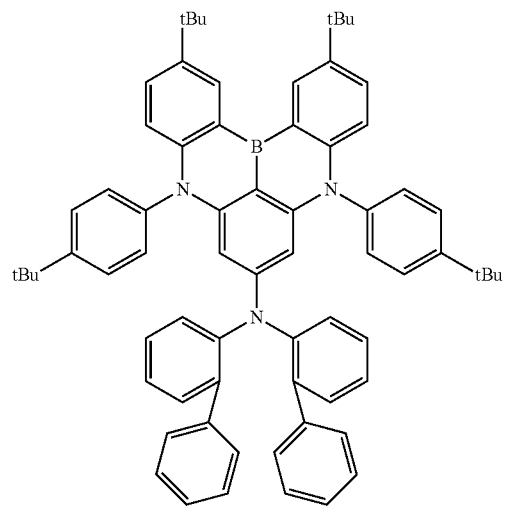
(1-701)
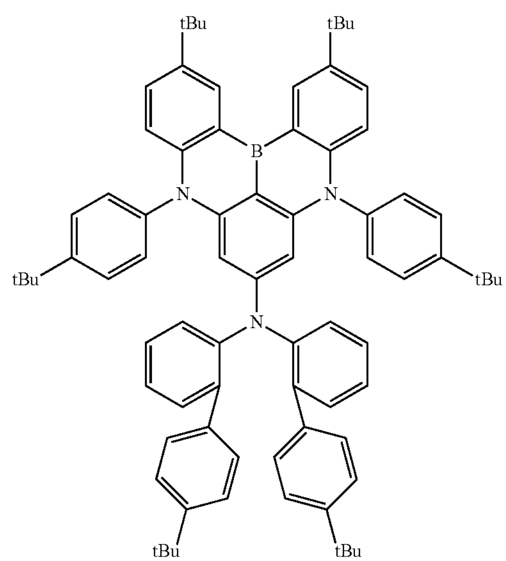

-continued
(1-702)
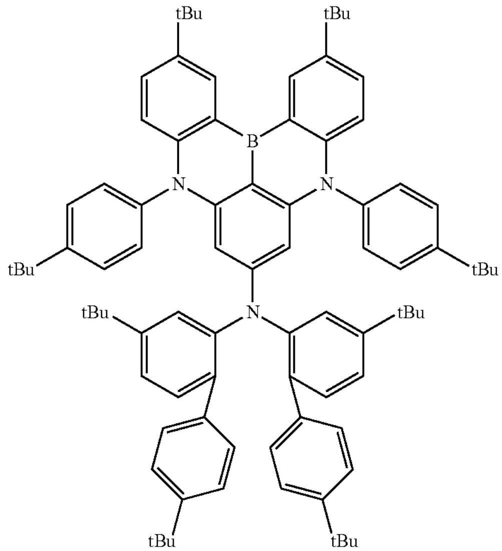
(1-703)
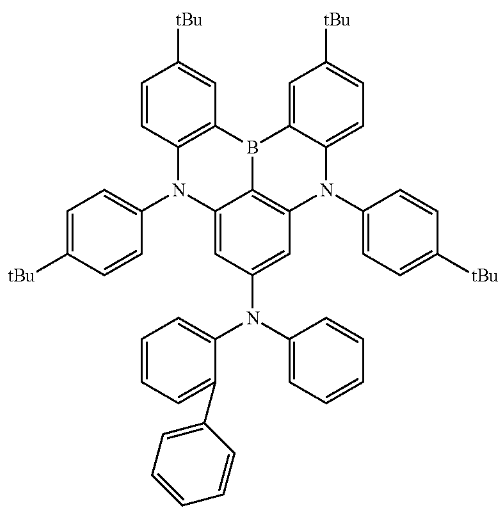
(1-704)
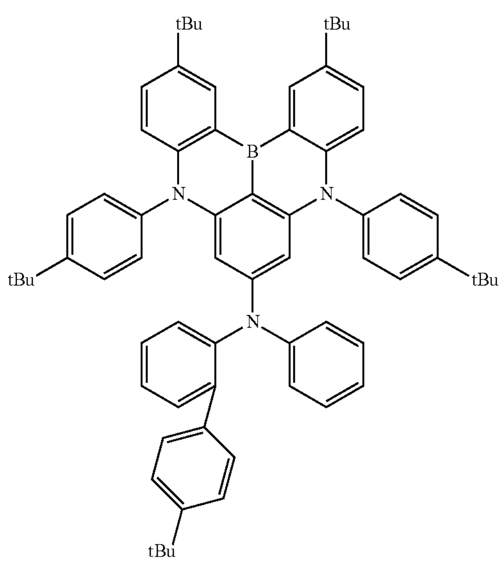
-continued
(1-705)
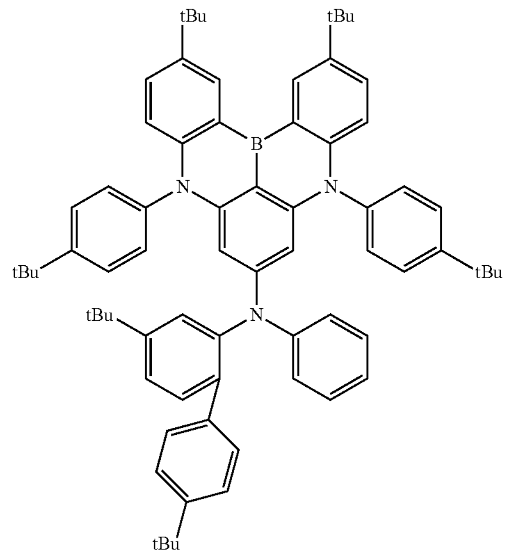
(1-706)
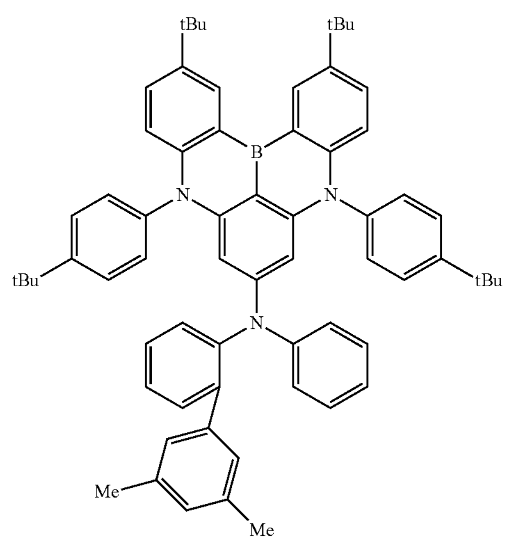

-continued
(1-707)
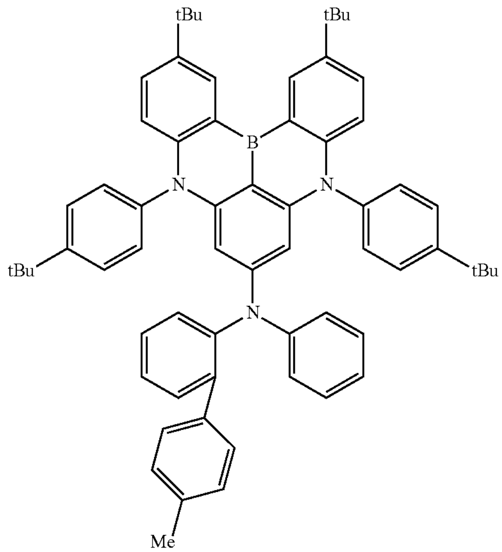
(1-708)
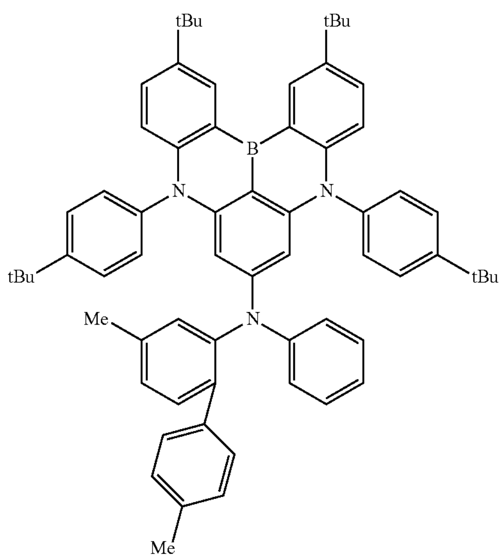
(1-709)
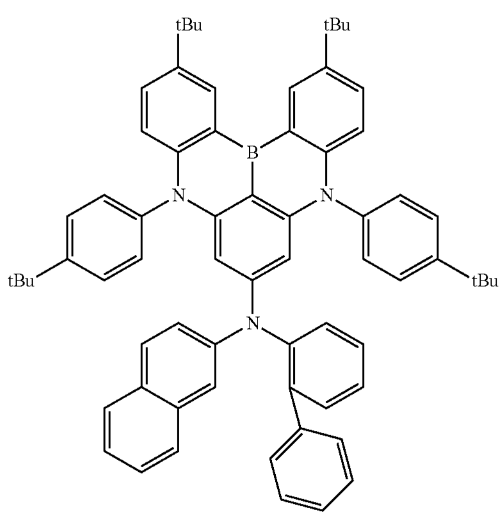
-continued
(1-710)
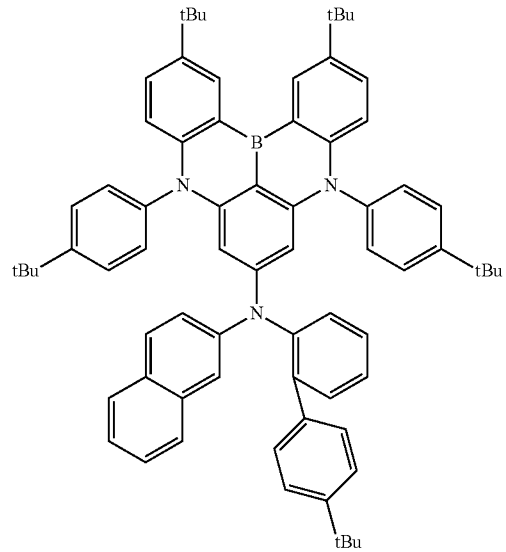
(1-711)
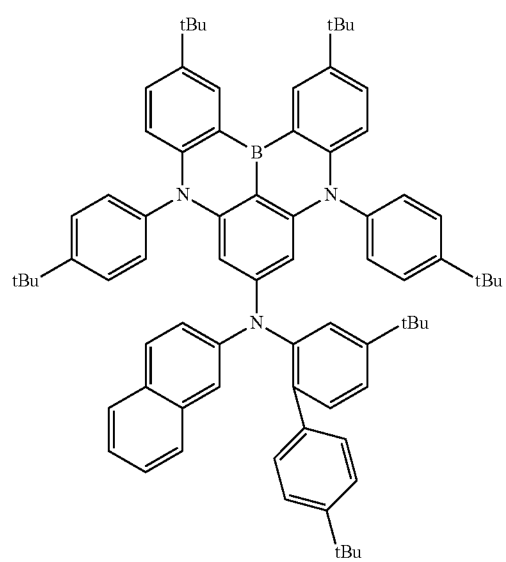

-continued
Formula 39
(1-712)
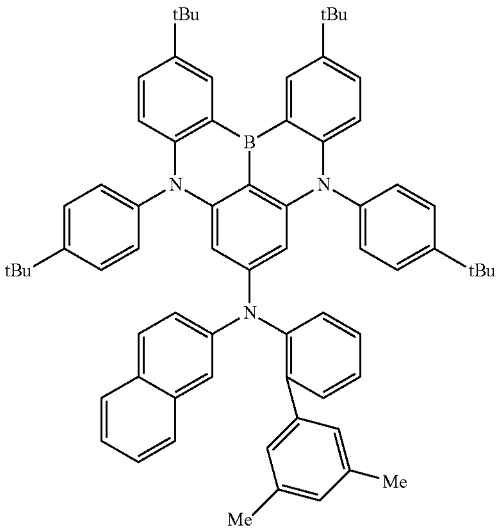
(1-713)
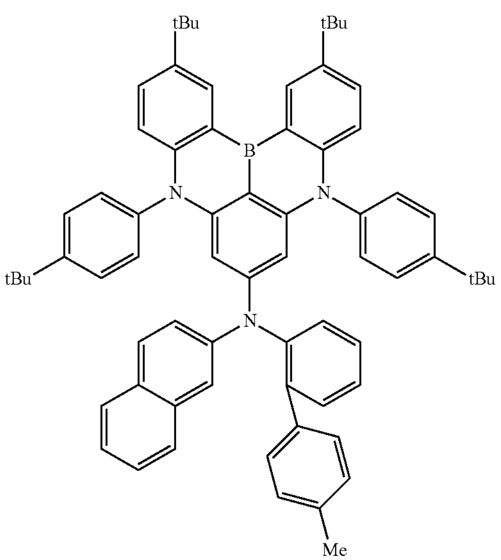
-continued
(1-714)
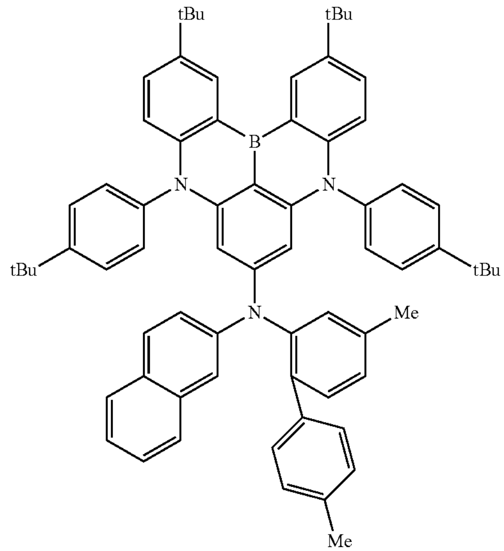
(1-715)
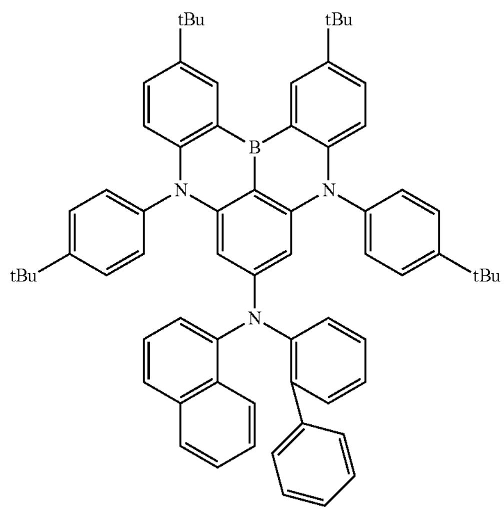
(1-716)
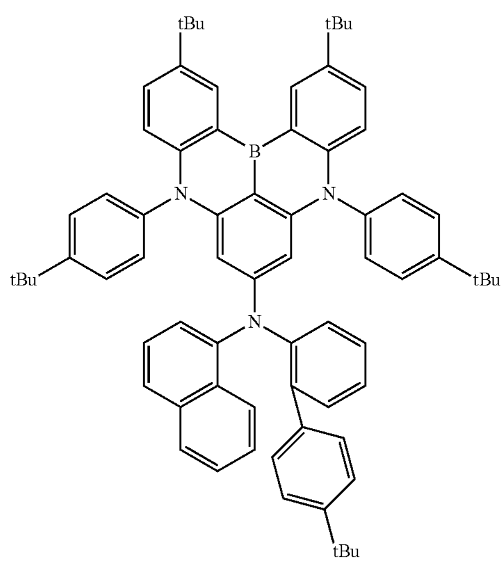

-continued
(1-717)
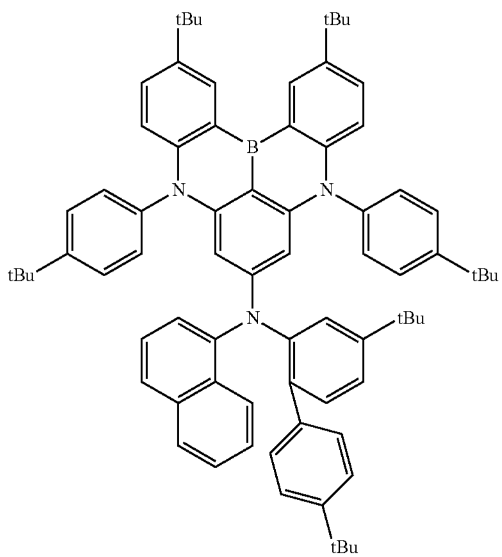
(1-718)
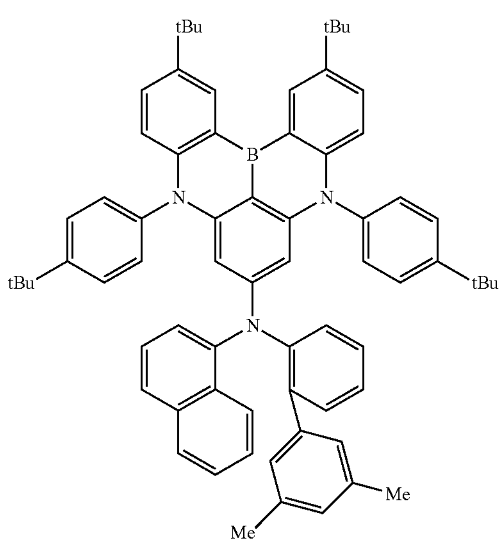
-continued
(1-719)
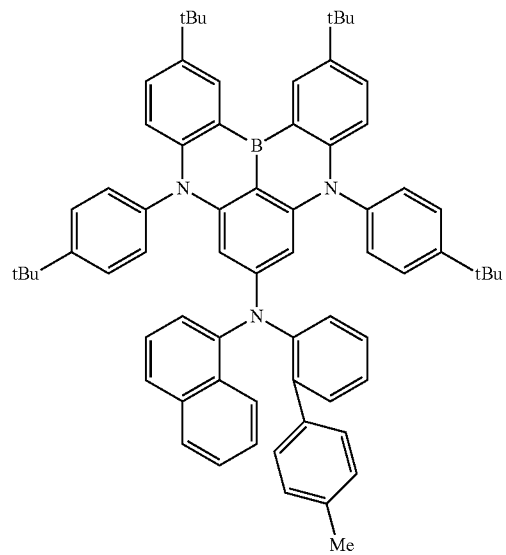
(1-720)
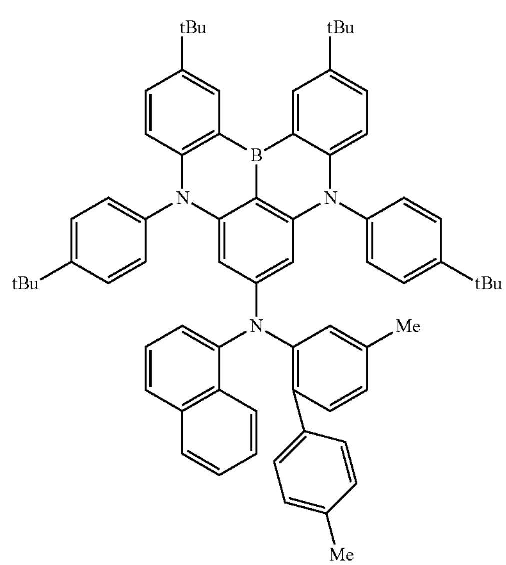

-continued
Formula 40
(1-730)
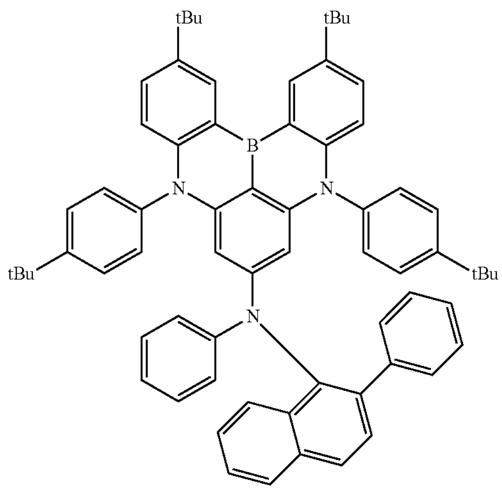
(1-731)
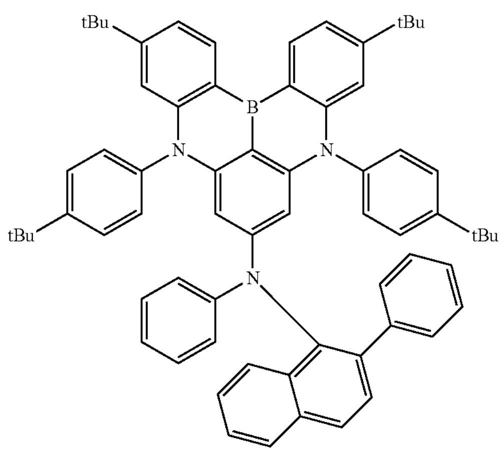
(1-732)
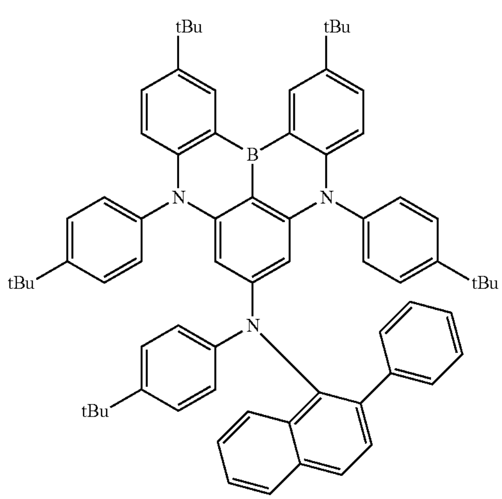
-continued
(1-733)
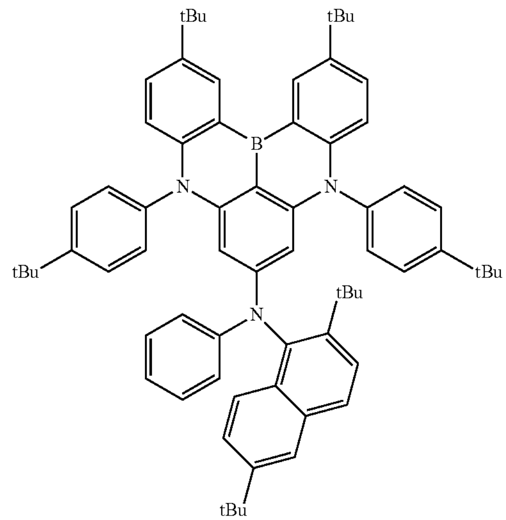
(1-734)
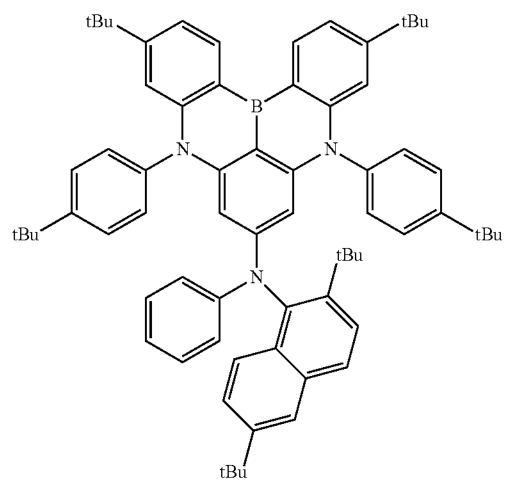
(1-735)
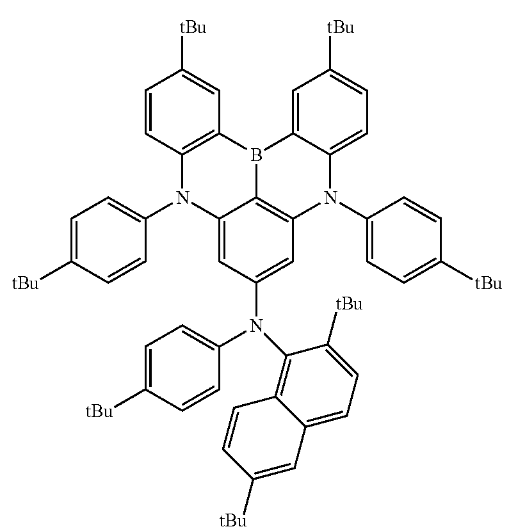

-continued (1-736)

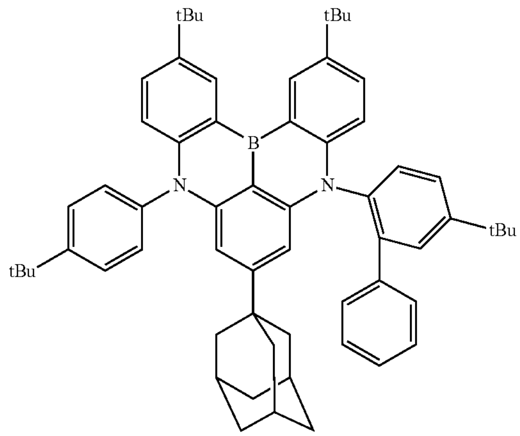

(1-737)

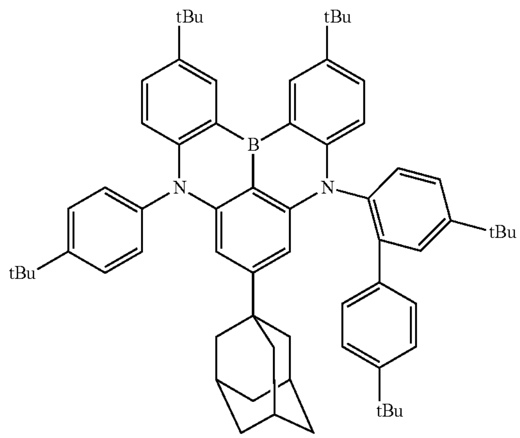

(1-738)

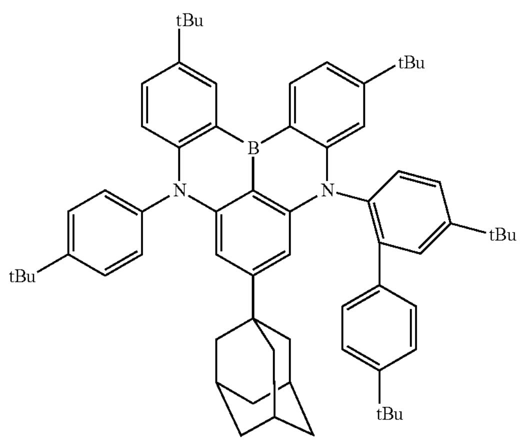

2. Method for Producing Polycyclic Aromatic Compound

A polycyclic aromatic compound represented by general formula (1) and having a bulky substituent ($Z^1$ and $Z^2$) can be prepared by applying the method disclosed in WO 2015/102118 A, for example. More specifically, as in scheme (1) described below, an intermediate having a $Z^1$ group and/or a $Z^2$ group is prepared, and the resulting intermediate is cyclized, and thus a polycyclic aromatic compound having a desired bulky substituent can be prepared.

Scheme (1)

Formula 41

(1)

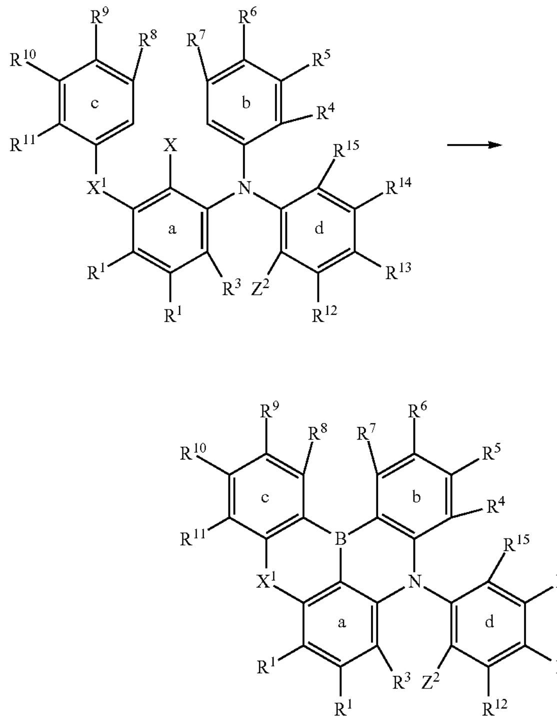

In scheme (1), X represents halogen or hydrogen, and a definition of any other sign is identical to the definition thereof described above.

The intermediate before cyclization in scheme (1) can also be prepared similarly according to the method disclosed in WO 2015/102118 A or the like. More specifically, a Buchwald-Hartwig reaction and a Suzuki coupling reaction, or a nucleophilic substitution reaction and an etherification reaction by an Ullmann reaction or the like are appropriately combined, and thus an intermediate having a desired substituent can be prepared. In the reactions, as a raw material serving as a precursor of the bulky substituent ($Z^1$ and $Z^2$), a commercially available raw material can also be utilized.

Moreover, a compound in which $Z^1$ in general formula (1) is particularly a triphenylmethyl group can also be prepared by the method as described below. More specifically, halogen such as bromine is introduced into a position adjacent to an amino group by performing a halogenation reaction (for example, bromination) to commercially available 4-tritylaniline, and then the amino group is converted into diazonium, and further the amino group can be converted into halogen by utilizing a Sandmeyer reaction (scheme (2)). Moreover, for example, the amino group can be converted into halogen also by utilizing an analogous reaction of the Sandmeyer reaction in which t-butyl nitrite and copper salt are combined (scheme (3)). The reaction described above is performed by using a halogen compound thus obtained as a raw material, and thus the intermediate before cyclization in which replacement is made by the triphenylmethyl group as $Z^1$ can be prepared. The reactions can also be applied to a compound having any other substituent.

Scheme (2)

Formula 42

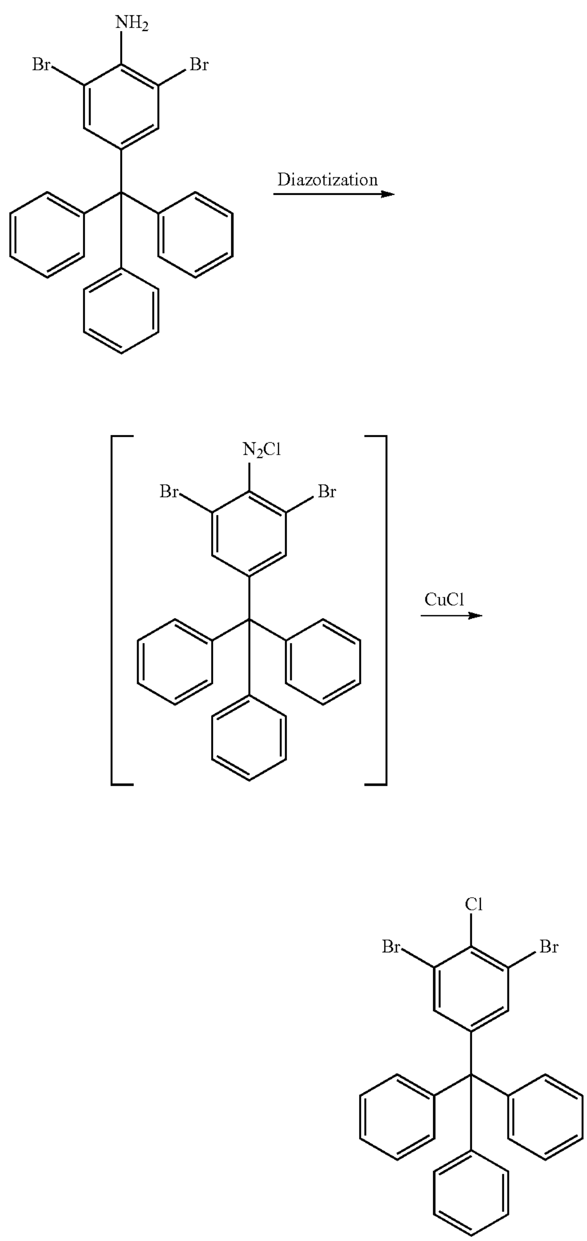

Scheme (3)

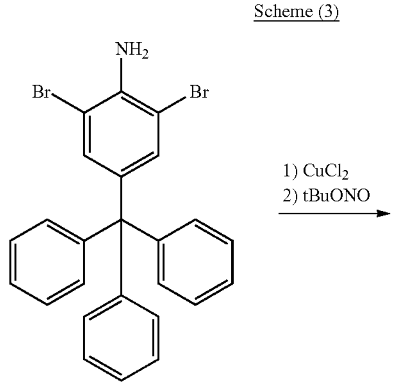

-continued

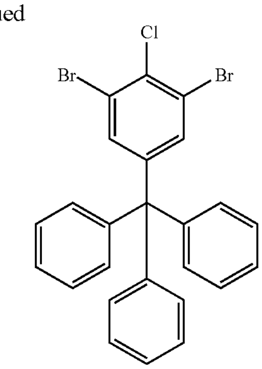

Moreover, the polycyclic aromatic compound also includes a compound in which at least one hydrogen is replaced by halogen or deuterium, and such a compound can be prepared using the same method as in the above by using a raw material in which a desired place is subjected to halogenation (fluorination, chlorination or the like) or deuteration.

3. Organic Device

The polycyclic aromatic compound according to the invention can be used as the material for the organic device. Specific examples of the organic device include an organic electroluminescent device, an organic field effect transistor or an organic thin film photovoltaic cell.

3-1. Organic Electroluminescent Device

The organic EL device according to the present embodiment will be described below in detail based on a drawing. FIG. 1 is a schematic cross-sectional view showing the organic EL device according to the present embodiment.

Structure of Organic Electroluminescent Device

Organic EL device 100 shown in FIG. 1 has substrate 101, anode 102 provided on substrate 101, hole injection layer 103 provided on anode 102, hole transport layer 104 provided on hole injection layer 103, luminescent layer 105 provided on hole transport layer 104, electron transport layer 106 provided on luminescent layer 105, electron injection layer 107 provided on electron transport layer 106, and cathode 108 provided on electron injection layer 107.

In addition, preparation order may be reversed, and for example, organic EL device 100 may be formed into a configuration having substrate 101, cathode 108 provided on substrate 101, electron injection layer 107 provided on cathode 108, electron transport layer 106 provided on electron injection layer 107, luminescent layer 105 provided on electron transport layer 106, hole transport layer 104 provided on luminescent layer 105, hole injection layer 103 provided on hole transport layer 104, and anode 102 provided on hole injection layer 103.

Each of all the layers described above is not necessarily essential, and a minimum configuration unit is taken as a configuration formed of anode 102, luminescent layer 105 and cathode 108, and hole injection layer 103, hole transport layer 104, electron transport layer 106 and electron injection layer 107 are a layer arbitrarily provided. Moreover, each of layers described above may be formed of a single layer, or a plurality of layers.

An aspect of the layer configuring the organic EL layer may have a configuration aspect, in addition to a configuration aspect of "substrate/anode/hole injection layer/hole transport layer/luminescent layer/electron transport layer/electron injection layer/cathode" described above, including "substrate/anode/hole transport layer/luminescent layer/ electron transport layer/electron injection layer/cathode," "substrate/anode/hole injection layer/luminescent layer/electron transport layer/electron injection layer/cathode," "substrate/anode/hole injection layer/hole transport layer/luminescent layer/electron injection layer/cathode," "substrate/anode/hole injection layer/hole transport layer/luminescent layer/electron transport layer/cathode," "substrate/anode/luminescent layer/electron transport layer/electron injection layer/cathode," "substrate/anode/hole transport layer/luminescent layer/electron injection layer/cathode," "substrate/anode/hole transport layer/luminescent layer/electron transport layer/cathode," "substrate/anode/hole injection layer/luminescent layer/electron injection layer/cathode," "substrate/anode/hole injection layer/luminescent layer/electron transport layer/cathode," "substrate/anode/luminescent layer/electron transport layer/cathode," and "substrate/anode/luminescent layer/electron injection layer/cathode."

Substrate in Organic Electroluminescent Device

Substrate 101 is a support of organic EL device 100, and quartz, glass, metal, plastic or the like is ordinarily used therein. Substrate 101 is formed in a plate form, a film form or a sheet form according to the purpose, and for example, a glass plate, a metal plate, metal foil, a plastic film, a plastic sheet or the like is used. Above all, a glass plate, and a plate made of a transparent synthetic resin such as polyester, polymethacrylate, polycarbonate and polysulfone are preferred. If a glass substrate is applied as the substrate, soda lime glass, alkali-free glass or the like is used, and as a thickness, only a thickness enough to maintain mechanical strength is sufficient, and therefore only a thickness of 0.2 millimeter or more is sufficient, for example. An upper limit of the thickness is 2 millimeters or less, for example, and preferably 1 millimeter or less. In quality of material of glass, a less amount of elution ions from glass is preferred, and therefore alkali-free glass is preferred. However, soda lime glass subjected to barrier coat with $SiO_2$ or the like is also commercially available, and therefore can be used. Moreover, in substrate 101, a gas barrier film such as a dense silicon oxide film may be provided on at least one surface for improving gas barrier properties, and particularly when a plate made of a synthetic resin, a film or a sheet with low gas barrier properties is used as substrate 101, the gas barrier film is preferably provided.

Anode in Organic Electroluminescent Device

Anode 102 plays a role of injecting a positive hole into luminescent layer 105. In addition, when hole injection layer 103 and/or hole transport layer 104 are provided between anode 102 and luminescent layer 105, the positive hole is injected into luminescent layer 105 therethrough.

Examples of a material that forms anode 102 include an inorganic compound and an organic compound. Specific examples of the inorganic compound include metal (aluminum, gold, silver, nickel, palladium, chromium and the like), metal oxide (oxide of indium, oxide of tin, indium-tin oxide (ITO), indium-zinc oxide (IZO) and the like), metal halide (copper iodide and the like), copper sulfide, carbon black, ITO glass and Nesa glass. Specific examples of the organic compound include polythiophene such as poly(3-methylthiophene), and a conductive polymer such as polypyrrole and polyaniline. In addition thereto, a substance appropriately selected from the substances used as the anode of the organic EL device can be used.

Resistance of a transparent electrode is not limited because electric current enough to cause luminescence of a luminescent device can be supplied, and the resistance is desirably low from a viewpoint of power consumption of the luminescent device. For example, an ITO substrate of 300Ω/□ or less functions as a substrate electrode. A substrate of about 10Ω/□ can also be currently supplied. Thus, for example, use of a low-resistance article of 100 to 5Ω/□ and preferably 50 to 5Ω/□ is particularly desirable. A thickness of ITO can be arbitrarily selected according to a value of the resistance, and is ordinarily used in the range of 50 to 300 nanometers in many cases.

Hole Injection Layer and Hole Transport Layer in Organic Electroluminescent Device Hole injection layer 103 plays a role of efficiently injecting the positive hole moved from anode 102 into luminescent layer 105 or hole transport layer 104. Hole transport layer 104 plays a role of efficiently transporting the positive hole injected from anode 102 or the positive hole injected from anode 102 through hole injection layer 103, to luminescent layer 105. Hole injection layer 103 and hole transport layer 104 each are formed by laminating and mixing one or two or more kinds of hole injection-transport materials, or by using a mixture of the hole injection-transport material and a polymer binder. Moreover, a layer may be formed by adding inorganic salt such as iron(III) chloride to the hole injection-transport material.

As a hole injection-transport substance, the positive hole from a positive electrode is required to be efficiently injected and transported between electrodes to which an electric field is given, and high hole injection efficiency and efficient transport of the injected positive hole are desirable. For the purpose thereof, the substance is preferably a substance in which ionization potential is small, and furthermore hole mobility is large, stability is excellent, and impurities serving as a trap is hard to be caused during production and use.

As the material that forms hole injection layer 103 and hole transport layer 104, an arbitrary compound can be selected and used from a compound that has so far been commonly used as a charge transport material of the positive hole in a photoconductive material, and a publicly-known compound that has been used in a hole injection layer and a hole transport layer of a p-type semiconductor and an organic EL device. Specific examples thereof include a carbazole derivative (N-phenylcarbazole, polyvinylcarbazole and the like), a biscarbazole derivative such as bis(N-arylcarbazole) or bis(N-alkylcarbazole), a triarylamine derivative (a polymer having aromatic tertiary amino in a main chain or a side chain, 1,1-bis(4-di-p-tolylaminophenyl)cyclohexane, N,N'-diphenyl-N,N'-di(3-methylphenyl)-4,4'-diaminobiphenyl, N,N'-diphenyl-N,N'-dinaphthyl-4,4'-diaminobiphenyl, N,N'-diphenyl-N,N'-di(3-methylphenyl)-4,4'-diphenyl-1,1'-diamine, N,N'-dinaphthyl-N,N'-diphenyl-4,4'-diphenyl-1,1'-diamine, $N^4,N^{4'}$-diphenyl (9-phenyl-9H-carbazole-3-yl)-[1,1'-biphenyl]-4,4'-diamine, $N^4,N^4,N^{4'},N^{4'}$-tetra[1,1'-biphenyl]-4-yl)-[1,1'-biphenyl]-4,4'-diamine, a triphenylamine derivative such as 4,4',4"-tris(3-methylphenyl(phenyl)amino)triphenylamine, a starburst amine derivative and the like), a stilbene derivative, a phthalocyanine derivative (non-metal, copper phthalocyanine and the like), a pyrazoline derivative, a hydrazine-based compound, a benzofuran derivative, a thiophene derivative, an oxadiazole derivative, a quinoxaline derivative (for example, 1,4,5,8,9,12-hexaazatriphenylene-2,3,6,7,10,11-hexacarbonitrile), a heterocyclic compound such as a porphyrin derivative, and polysilane. As a polymer type, polycarbonate having the monomer in a side chain, a styrene derivative, polyvinylcarbazole, polysilane and the like are preferred, but if the compound forms a thin film required for preparation of a luminescent device and can inject the positive hole from the anode and further transport the positive hole, the compound is not particularly limited.

Moreover, conductivity of an organic semiconductor is also known to be strongly influenced by doping thereof. Such an organic semiconductor matrix substance is composed of a compound having good electron-donating properties or a compound having good electron-accepting properties. For doping of an electron-donating substance, a strong electron acceptor such as tetracyanoquinodimethane (TCNQ) or 2,3,5,6-tetrafluorotetracyano-1,4-benzoquinonedimethane (F4TCNQ) is known (for example, refer to literature "M. Pfeiffer, A. Beyer, T. Fritz, K. Leo, Appl. Phys. Lett., 73(22), 3202-3204 (1998)" and literature "J. Blochwitz, M. Pheiffer, T. Fritz, K. Leo, Appl. Phys. Lett., 73(6), 729-731 (1998)"). These substances produce a so-called positive hole by an electron transfer process in an electron-donating base substance (hole transport substance). Conductivity of the base substance is significantly changed according to the number and mobility of the positive hole. As a matrix substance having hole transport properties, for example, a benzidine derivative (TPD or the like), a starburst amine derivative (TDATA or the like), or particular metal phthalocyanine (particularly zinc phthalocyanine (ZnPc) or the like) is known (JP 2005-167175 A).

Luminescent Layer in Organic Electroluminescent Device

Luminescent layer 105 is a layer in which the positive hole injected from anode 102 and the electron injected from cathode 108 are recombined between electrodes to which the electric field is given to cause luminescence. A material that forms luminescent layer 105 only needs to be a compound (luminescent compound) that is excited by recombination of the positive hole and the electron to cause luminescence, and is preferably a compound that can form a stable thin-film form and exhibits strong luminescence (fluorescence) efficiency in a solid state. In the invention, as a material for the luminescent layer, a host material, and the polycyclic aromatic compound represented by general formula (1) described above as a dopant material can be used.

The luminescent layer may be formed of any of a single layer and a plurality of layers, and each is formed of the material for the luminescent layer (host material, dopant material). The host material and the dopant material each may be in any of one kind and a combination of a plurality of kinds. The dopant material may be contained in the host material in any form, wholly or partly. As a doping method, the luminescent layer can be formed by a codeposition method with the host material, and the dopant material may be mixed with the host material in advance, and then the resulting mixture may be simultaneously vapor-deposited.

An amount of use of the host material is different depending on a kind of the host material, and only needs to be determined according to properties of the host material. A measure of the amount of use of the host material is preferably 50 to 99.999% by weight, further preferably 80 to 99.95% by weight, and still further preferably 90 to 99.9% by weight, based on a total of the material for the luminescent layer.

An amount of use of the dopant material is different depending on a kind of the dopant material, and only needs to be determined according to properties of the dopant material. A measure of the amount of use of the dopant material is preferably 0.001 to 50% by weight, further preferably 0.05 to 20% by weight, and still further preferably 0.1 to 10% by weight, based on a total of the material for the luminescent layer. If the amount is within the range described above, such a case is preferred in view of being capable of preventing a concentration quenching phenomenon, for example.

Specific examples of the host material include a fused ring derivative such as anthracene, pyrene, dibenzochrysene or fluorene, a bisstyryl derivative such as a bisstyrylanthracene derivative or a distyrylbenzene derivative, a tetraphenylbutadiene derivative, and a cyclopentadiene derivative, all of which have already been known as a luminous element. In particular, a dibenzochrysene-based compound, an anthracene-based compound or a fluorene-based compound is preferred.

Dibenzochrysene-Based Compound

The dibenzochrysene-based compound as a host is a compound represented by general formula (2), for example.

Formula 43

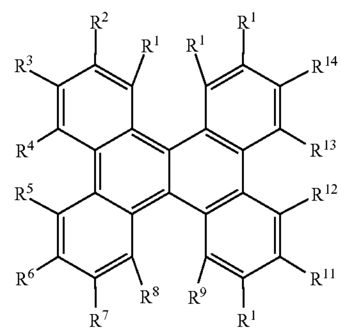

(2)

In formula (2) described above, $R^1$ to $R^{16}$ are independently hydrogen, aryl, heteroaryl (the heteroaryl may be bonded to a dibenzochrysene skeleton in formula (2) described above through a connecting group), diarylamino, diheteroarylamino, arylheteroarylamino, alkyl, cycloalkyl, alkenyl, alkoxy or aryloxy, and at least one hydrogen therein may be replaced by aryl, heteroaryl, alkyl or cycloalkyl, adjacent groups of $R^1$ to $R^{16}$ may be bonded to each other to form a fused ring, and at least one hydrogen in the ring formed may be replaced by aryl, heteroaryl (the heteroaryl may be bonded to the ring formed through a connecting group), diarylamino, diheteroarylamino, arylheteroarylamino, alkyl, cycloalkyl, alkenyl, alkoxy or aryloxy, and at least one hydrogen therein may be replaced by aryl, heteroaryl, alkyl or cycloalkyl, and at least one hydrogen in the compound represented by formula (2) may be replaced by halogen, cyano or deuterium.

With regard to a detail of each group in a definition of formula (2) described above, the description in the polycyclic aromatic compound of formula (1) described above can be cited.

Specific examples of alkenyl in the definition of formula (2) described above include alkenyl having 2 to 30 carbons, and alkenyl having 2 to 20 carbons is preferred, alkenyl having 2 to 10 carbons is further preferred, alkenyl having 2 to 6 carbons is still further preferred, and alkenyl having 2 to 4 carbons is particularly preferred. Preferred alkenyl is vinyl, 1-propenyl, 2-propenyl, 1-butenyl, 2-butenyl, 3-butenyl, 1-pentenyl, 2-pentenyl, 3-pentenyl, 4-pentenyl, 1-hexenyl, 2-hexenyl, 3-hexenyl, 4-hexenyl or 5-hexenyl.

In addition, specific examples of heteroaryl also include a monovalent group having a structure of formula (2-Ar1), formula (2-Ar2), formula (2-Ar3), formula (2-Ar4) or formula (2-Ar5) described below.

Formula 44

(2-Ar1)

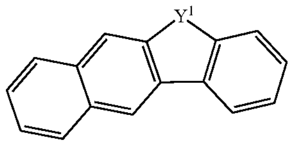

(2-Ar2)

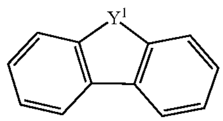

(2-Ar3)

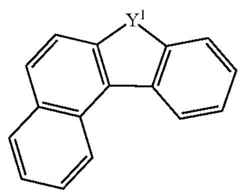

(2-Ar4)

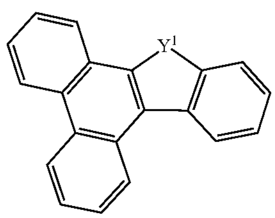

(2-Ar5)

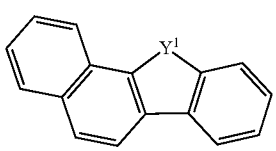

In formula (2-Ar1) to formula (2-Ar5), $Y^1$ is independently O, S or N—R, R is phenyl, biphenylyl, naphthyl, anthracenyl or hydrogen, and at least one hydrogen in the structure of formula (2-Ar1) to formula (2-Ar5) described above may be replaced by phenyl, biphenylyl, naphthyl, anthracenyl, phenanthrenyl, methyl, ethyl, propyl or butyl.

The heteroaryl may be bonded to the dibenzochrysene skeleton in formula (2) described above through a connecting group. More specifically, the dibenzochrysene skeleton in formula (2) and the heteroaryl described above are directly bonded to each other, and also may be bonded to each other through the connecting group therebetween. Specific examples of the connecting group include phenylene, biphenylene, naphthylene, anthracenylene, methylene, ethylene, —$OCH_2CH_2$—, —$CH_2CH_2O$— or —$OCH_2CH_2O$—.

In the compound represented by general formula (2), $R^1$, $R^4$, $R^5$, $R^8$, $R^9$, $R^{12}$, $R^{13}$ and $R^{16}$ are preferably hydrogen. In this case, $R^2$, $R^3$, $R^6$, $R^7$, $R^{10}$, $R^{11}$, $R^{14}$ and $R^{15}$ in formula (2) are preferably independently hydrogen, phenyl, biphenylyl, naphthyl, anthracenyl, phenanthrenyl, a monovalent group having a structure of formula (2-Ar1), formula (2-Ar2), formula (2-Ar3), formula (2-Ar4) or formula (2-Ar5) described above (the monovalent group having the structure may be bonded to the dibenzochrysene skeleton in formula (2) described above through phenylene, biphenylene, naphthylene, anthracenylene, methylene, ethylene, —$OCH_2CH_2$—, —$CH_2CH_2O$— or —$OCH_2CH_2O$—), methyl, ethyl, propyl or butyl.

In the compound represented by general formula (2), $R^1$, $R^2$, $R^4$, $R^5$, $R^7$, $R^8$, $R^9$, $R^{10}$, $R^{15}$ and $R^{16}$ are further preferably hydrogen. In this case, at least one of $R^3$, $R^6$, $R^{11}$ and $R^{14}$ in formula (2) (preferably, one or two, and further preferably, one) is a monovalent group having a structure of formula (2-Ar1), formula (2-Ar2), formula (2-Ar3), formula (2-Ar4) or formula (2-Ar5) described above through a single bond, phenylene, biphenylene, naphthylene, anthracenylene, methylene, ethylene, —$OCH_2CH_2$—, —$CH_2CH_2O$— or —$OCH_2CH_2O$—, a substance other than at least one described above (namely, a substance other than a position in which replacement is made by the monovalent group having the structure) is hydrogen, phenyl, biphenylyl, naphthyl, anthracenyl, methyl, ethyl, propyl or butyl, and at least one hydrogen therein may be replaced by phenyl, biphenylyl, naphthyl, anthracenyl, methyl, ethyl, propyl or butyl.

Moreover, when the monovalent group having the structure represented by formula (2-Ar1) to formula (2-Ar5) described above is selected as $R^2$, $R^3$, $R^6$, $R^7$, $R^{10}$, $R^{11}$, $R^{14}$ and $R^{15}$ in formula (2), at least one hydrogen in the structure may be bonded to any one of $R^1$ to $R^{16}$ of formula (2) to form a single bond.

Anthracene-Based Compound

The anthracene-based compound as the host is a compound represented by general formula (3) described below, for example.

Formula 45

(3)

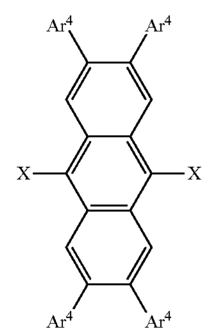

(3-X1)

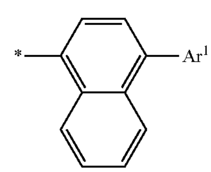

(3-X2)

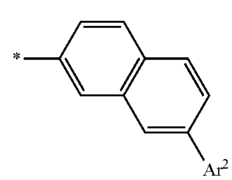

(3-X3)

$*—Ar^3$

-continued (A)

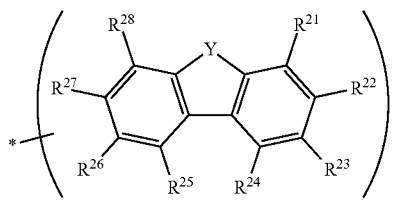

Moreover, as in an anthracene compound represented by formula (3') described below, the anthracene-based compound may be a dimer compound in which two structures represented by formula (3) are bonded. A definition of X and $Ar^4$ in formula (3') is identical to a definition thereof in formula (3), and examples of connecting group Y include a single bond, arylene (for example, phenylene, naphthylene and the like) or heteroarylene (for example, a divalent group of a structure of formula (A-1) to formula (A-11) described later, and specifically, a divalent group of carbazole, dibenzofuran or dibenzothiophene). Specific examples thereof include a compound represented by formula (BH-61) to formula (BH-72) described later.

Formula 46

(3')

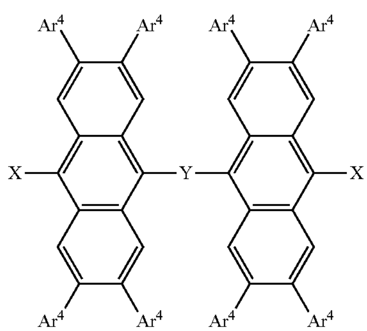

In general formula (3), X is independently a group represented by formula (3-X1), formula (3-X2) or formula (3-X3) described above, and the group represented by formula (3-X1), formula (3-X2) or formula (3-X3) is bonded to an anthracene ring of formula (3) at an asterisk *. A case where two pieces of X are simultaneously formed into the group represented by formula (3-X3) is preferably excluded. A case where two pieces of X are simultaneously formed into the group represented by formula (3-X2) is further preferably excluded.

A naphthylene moiety in formula (3-X1) and formula (3-X2) may be fused with one benzene ring. A thus fused structure is as described below.

Formula 47

(3-X1-1)

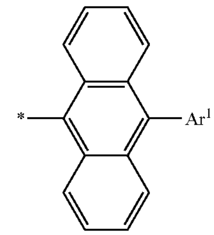

(3-X1-2)

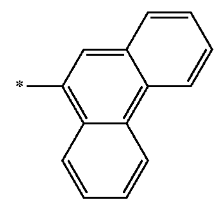

(3-X1-3)

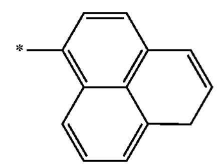

(3-X1-4)

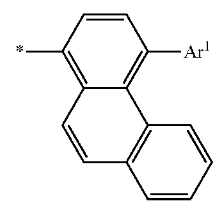

(3-X1-5)

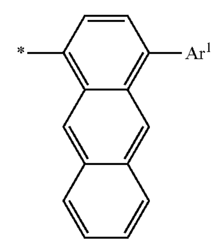

(3-X1-6)

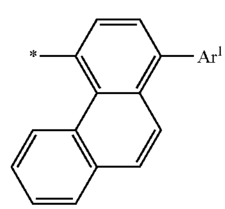

(3-X2-1)

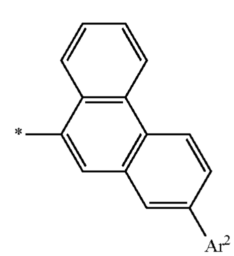

-continued (3-X2-2)

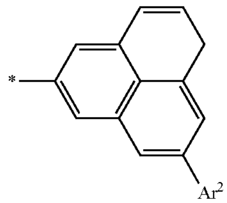

(3-X2-3)

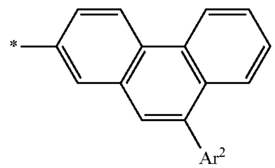

(3-X2-4)

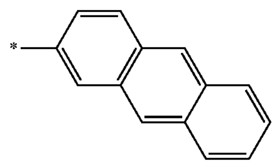

(3-X2-5)

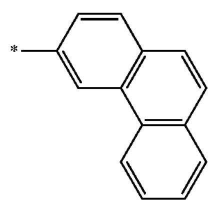

(3-X2-6)

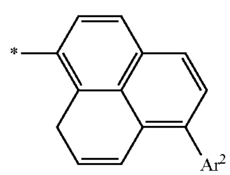

$Ar^1$ and $Ar^2$ are independently hydrogen, phenyl, biphenylyl, terphenylyl, quaterphenylyl, naphthyl, phenanthryl, fluorenyl, benzofluorenyl, chrysenyl, triphenylenyl, pyrenylyl, or a group represented by formula (A) described above (also including a carbazolyl group, a benzocarbazolyl group and a phenyl-substituted carbazolyl group). In addition, when $Ar^1$ or $Ar^2$ is the group represented by formula (A), the group represented by formula (A) is bonded to a naphthalene ring in formula (3-X1) or formula (3-X2) at an asterisk * thereof.

$Ar^3$ is phenyl, biphenylyl, terphenylyl, quaterphenylyl, naphthyl, phenanthryl, fluorenyl, benzofluorenyl, chrysenyl, triphenylenyl, pyrenylyl, or a group represented by formula (A) described above (also including a carbazolyl group, a benzocarbazolyl group and a phenyl-substituted carbazolyl group). In addition, when $Ar^3$ is the group represented by formula (A), the group represented by formula (A) is bonded to a single bond represented by a straight line in formula (3-X3) at an asterisk * thereof. More specifically, the anthracene ring of formula (3) and the group represented by formula (A) are directly bonded to each other.

Moreover, $Ar^3$ may have a substituent, and at least one hydrogen in $Ar^3$ may be further replaced by phenyl, biphenylyl, terphenylyl, naphthyl, phenanthryl, fluorenyl, chrysenyl, triphenylenyl, pyrenylyl, or a group represented by formula (A) described above (also including a carbazolyl group and a phenyl-substituted carbazolyl group). In addition, when the substituent of $Ar^3$ is the group represented by formula (A), the group represented by formula (A) is bonded to $Ar^3$ in formula (3-X3) at an asterisk * thereof.

$Ar^4$ is independently hydrogen, phenyl, biphenylyl, terphenylyl, naphthyl, or silyl replaced by alkyl having 1 to 4 carbons (methyl, ethyl, t-butyl or the like) or cycloalkyl having 5 to 10 carbons.

Moreover, hydrogen in a chemical structure of the anthracene-based compound represented by general formula (3) may be replaced by a group represented by formula (A) described above. When the hydrogen is replaced by the group represented by formula (A), at least one hydrogen in the compound represented by formula (3) is replaced by the group represented by formula (A) at an asterisk * thereof.

In formula (A) described above, Y is —O—, —S— or >N—$R^{29}$, $R^{21}$ to $R^{28}$ are independently hydrogen, alkyl which may be substituted, cycloalkyl which may be substituted, aryl which may be substituted, heteroaryl which may be substituted, alkoxy which may be substituted, aryloxy which may be substituted, arylthio which may be substituted, trialkylsilyl, tricycloalkylsilyl, amino which may be substituted, halogen, hydroxy or cyano, adjacent groups of $R^{21}$ to $R^{28}$ may be bonded to each other to form a hydrocarbon ring, an aryl ring or a heteroaryl ring, and $R^{29}$ is hydrogen or aryl which may be substituted.

Adjacent groups of $R^{21}$ to $R^{28}$ may be bonded to each other to form a hydrocarbon ring, an aryl ring or a heteroaryl ring. A case where a ring is not formed shows a group represented by formula (A-1) described below, and specific examples of a case where a ring is formed include a group represented by formula (A-2) to formula (A-11) described below. In addition, at least one hydrogen in a group represented by any one of formula (A-1) to formula (A-11) may be replaced by alkyl, cycloalkyl, aryl, heteroaryl, alkoxy, aryloxy, arylthio, trialkylsilyl, tricycloalkylsilyl, diaryl-substituted amino, diheteroaryl-substituted amino, arylheteroaryl-substituted amino, halogen, hydroxy or cyano.

Formula 48

(A-1)

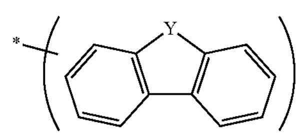

(A-2)

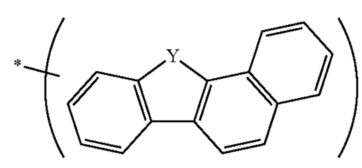

(A-3)

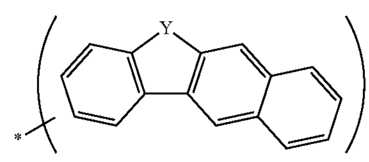

(A-4)

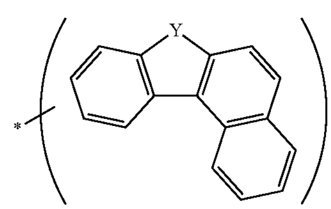

-continued
(A-5)
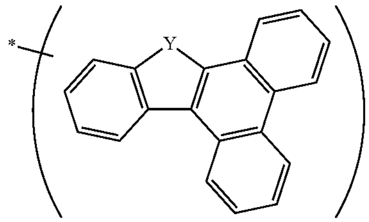
(A-6)
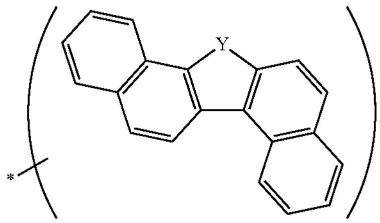
(A-7)
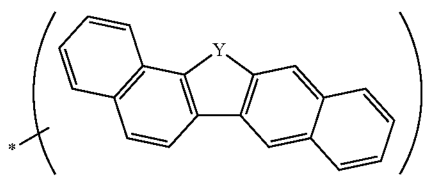
(A-8)
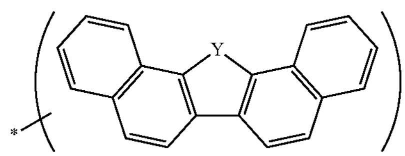
(A-9)
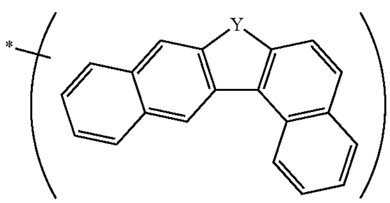
(A-10)
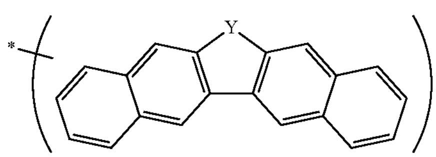
(A-11)
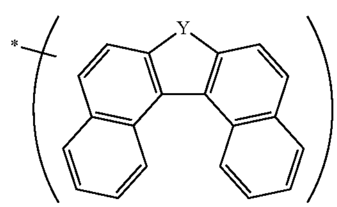
Moreover, hydrogen in the chemical structure of the anthracene-based compound represented by general formula (3) may be wholly or partly deuterium.
Specific examples of the anthracene-based compound include a compound described below.
Formula 49
(BH-1)
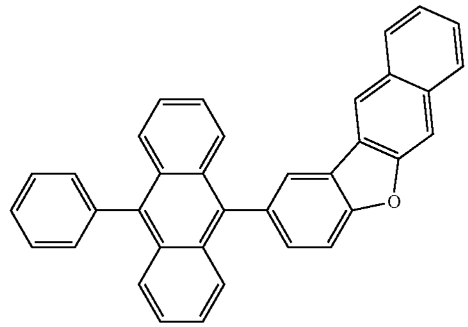
(BH-2)
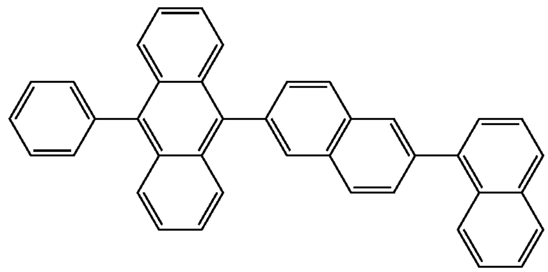
(BH-3)
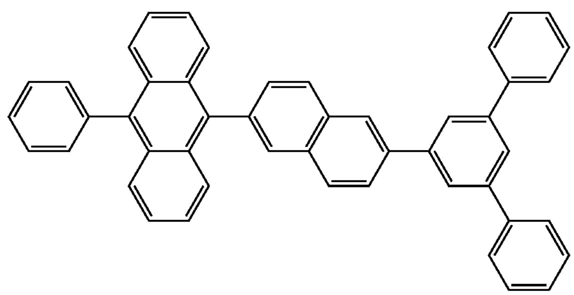
(BH-4)
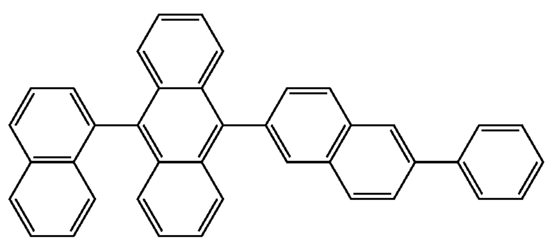
(BH-5)
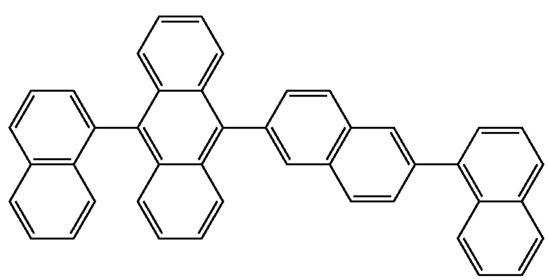

-continued
(BH-6)
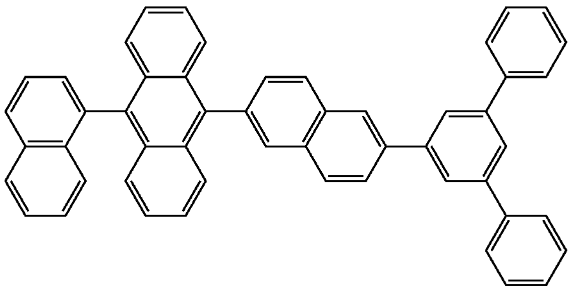
(BH-7)
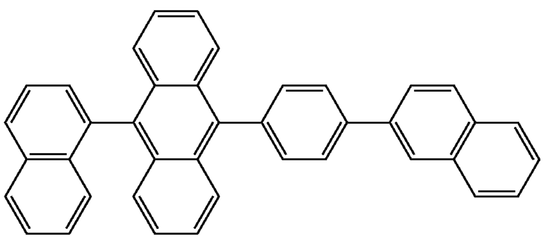
(BH-8)
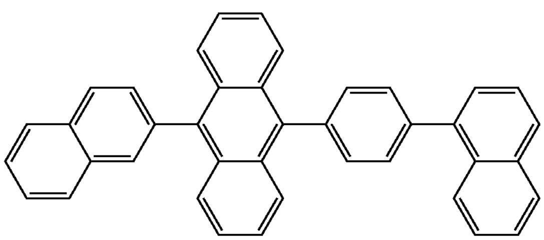
(BH-9)
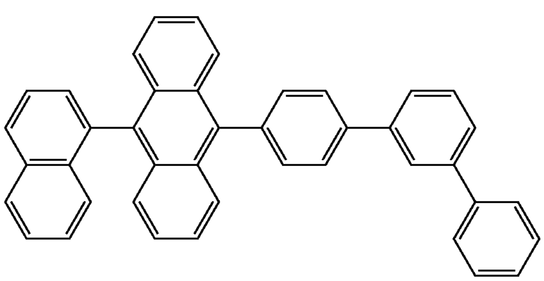
(BH-10)
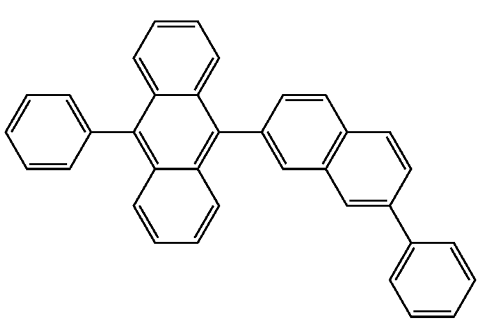
-continued
(BH-11)
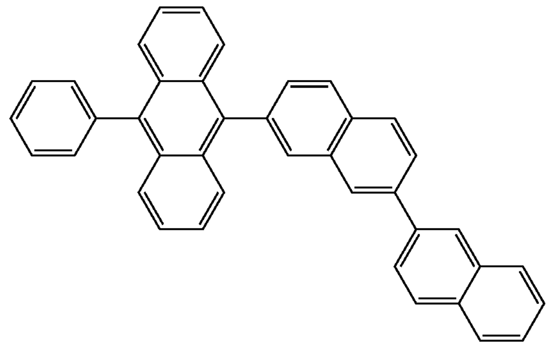
(BH-12)
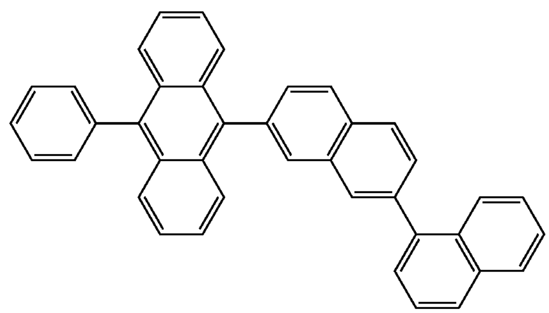
(BH-13)
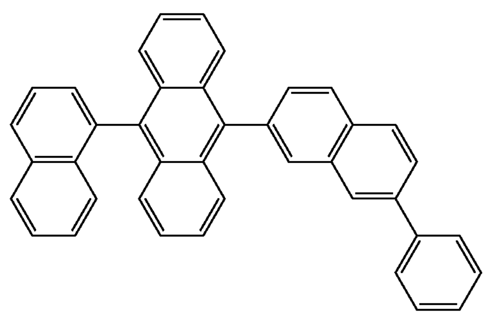
(BH-14)
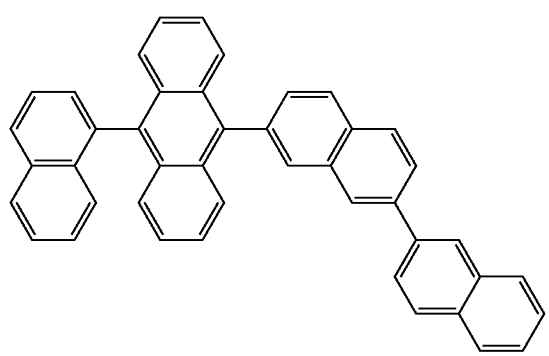

(BH-15)
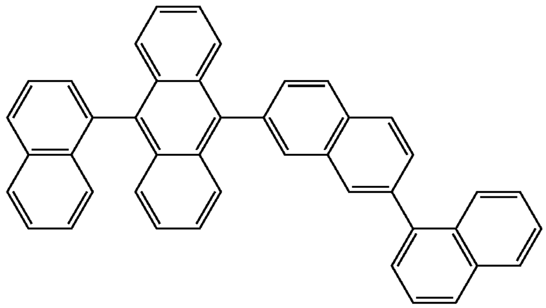
(BH-16)
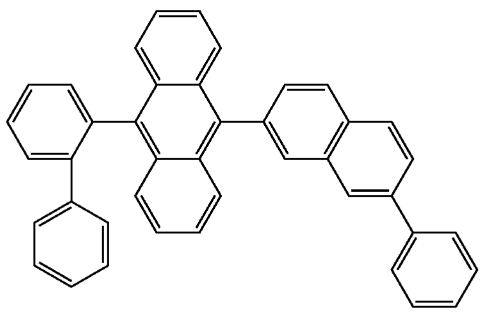
(BH-17)
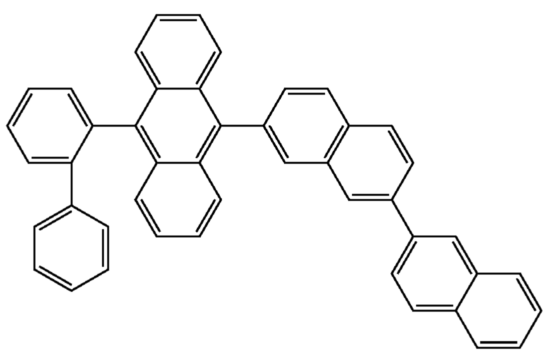
(BH-18)
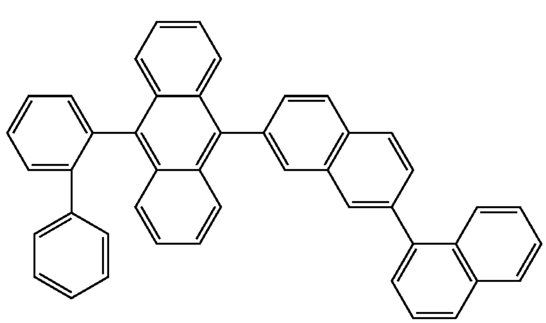
Formula 50
(BH-21)
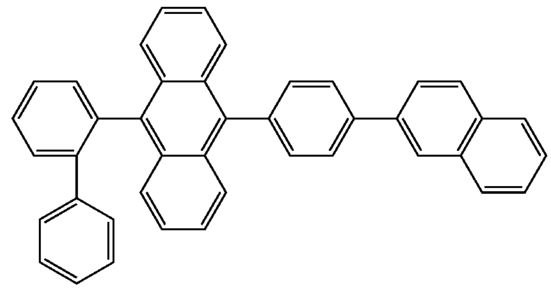
(BH-22)
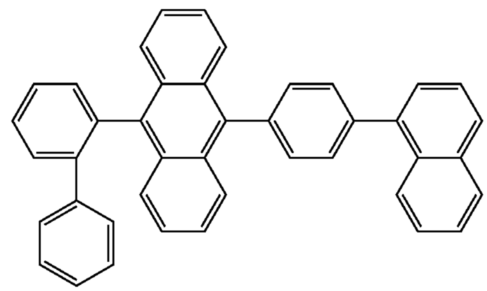
(BH-23)
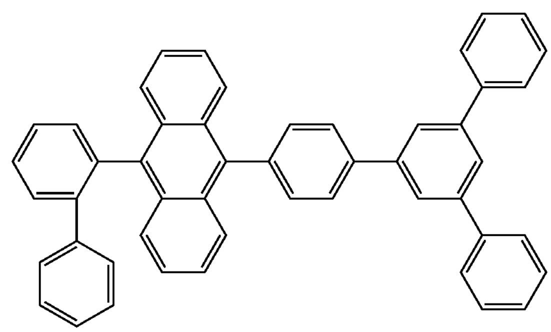
(BH-24)
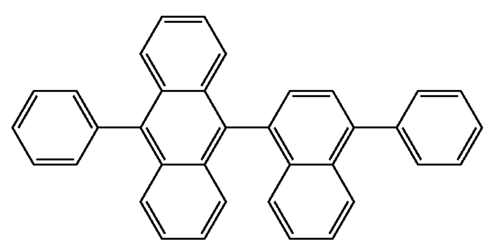
(BH-25)
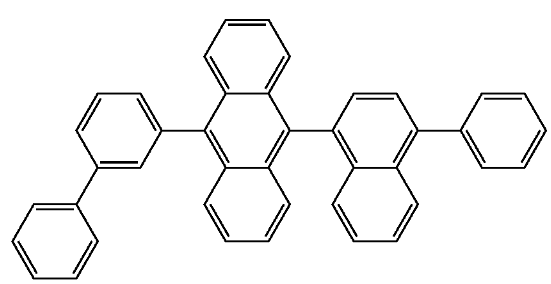

-continued
(BH-26)
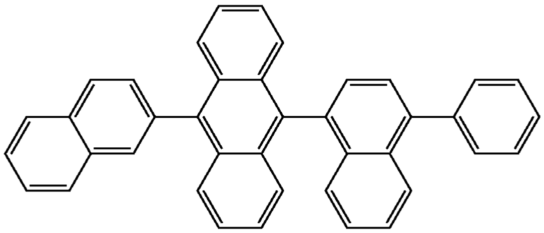
(BH-27)
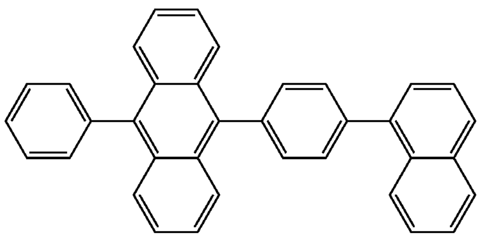
(BH-28)
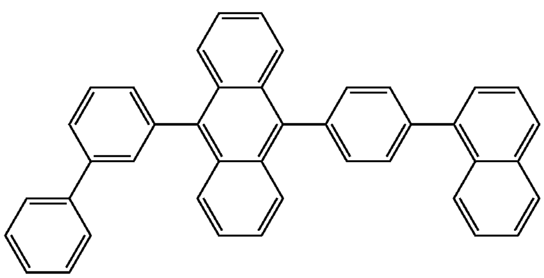
(BH-29)
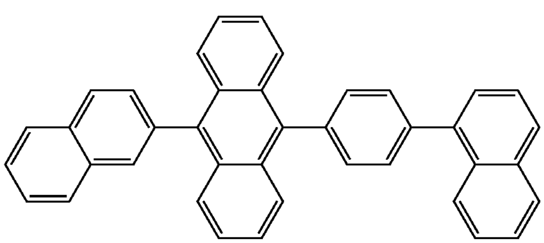
(BH-30)
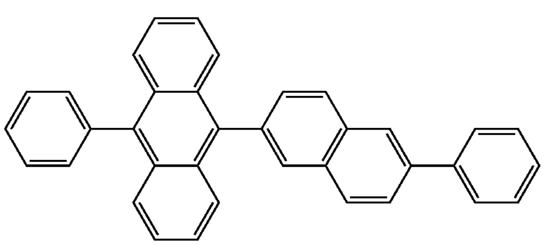
-continued
(BH-31)
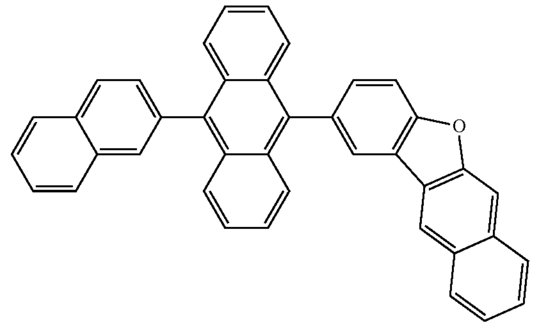
(BH-32)
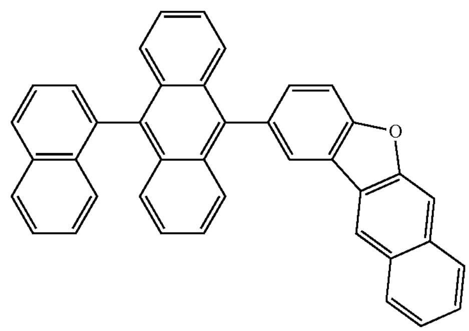
(BH-33)
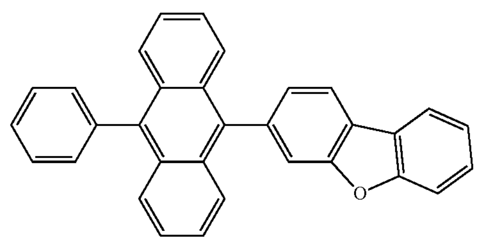
(BH-34)
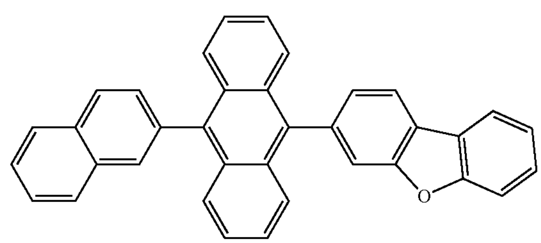
(BH-35)
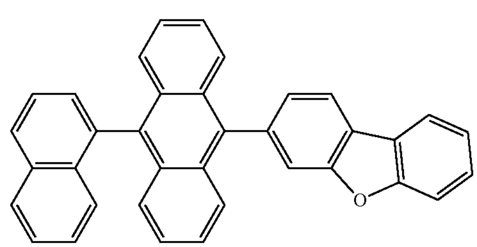

-continued
(BH-36)
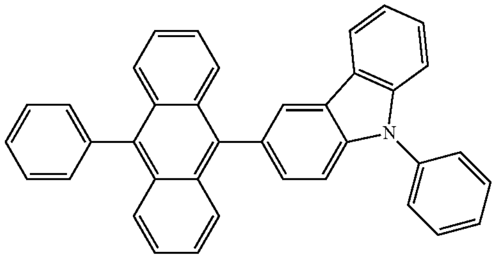
(BH-37)
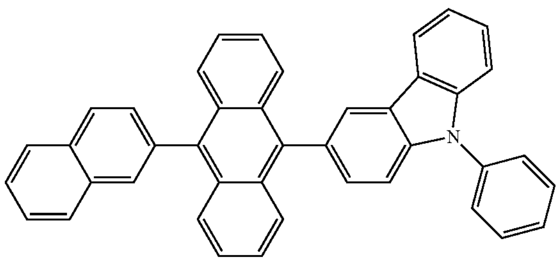
(BH-38)
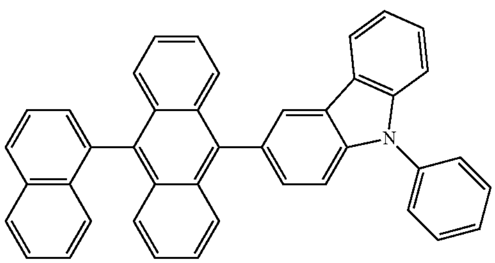
Formula 51
(BH-41)
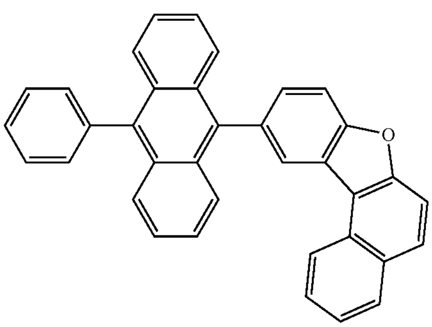
(BH-42)
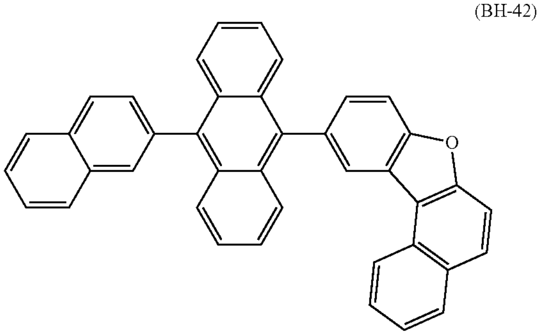
-continued
(BH-43)
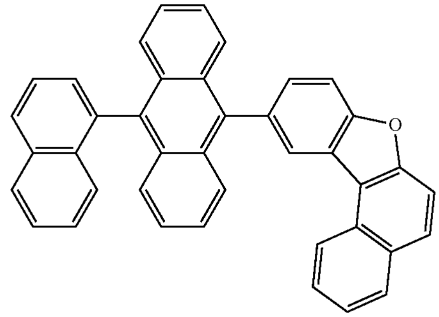
(BH-44)
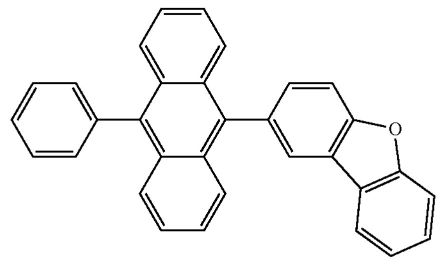
(BH-45)
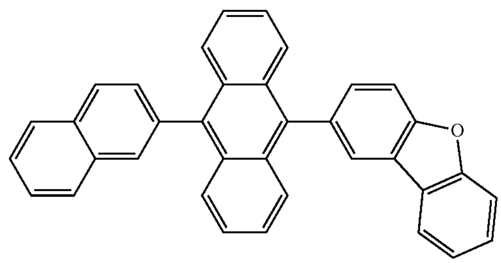
(BH-46)
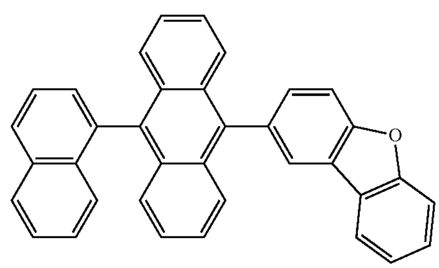
(BH-47)
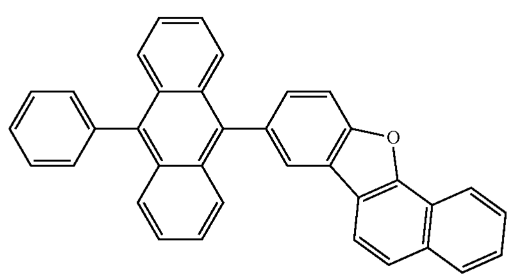

(BH-48)
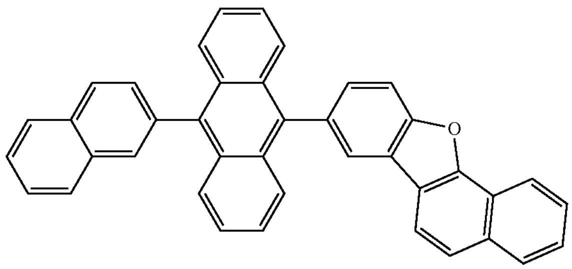
(BH-49)
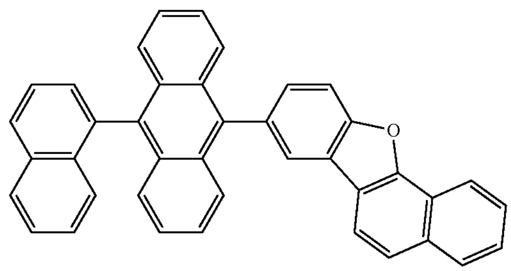
(BH-50)
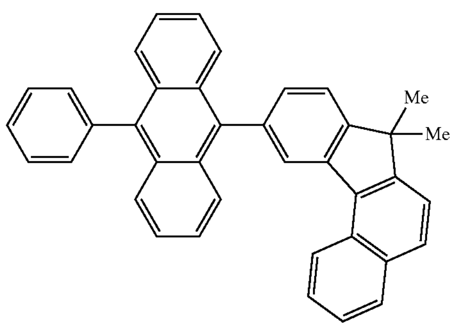
(BH-51)
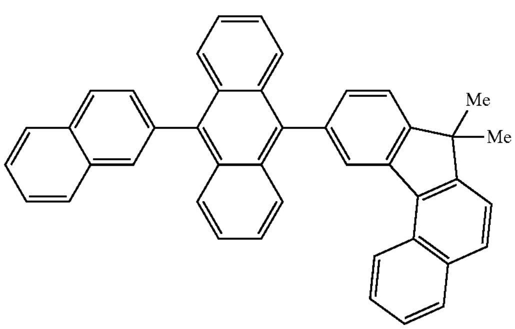
(BH-52)
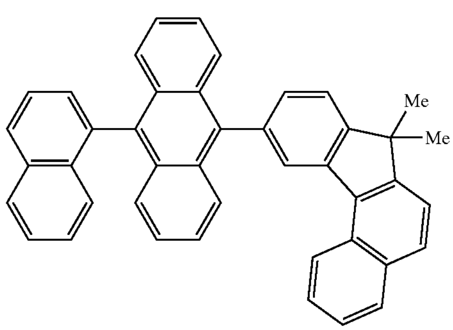
(BH-53)
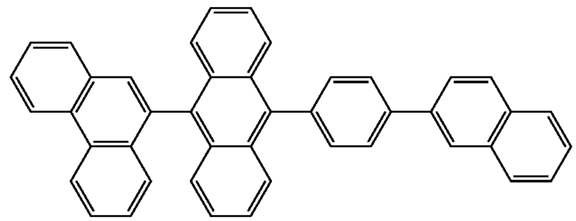
(BH-54)
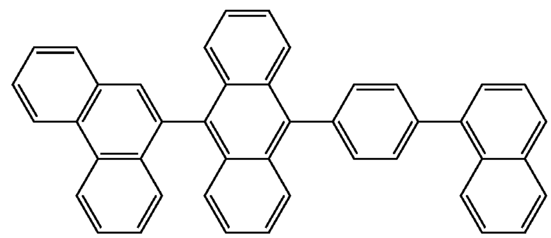
(BH-55)
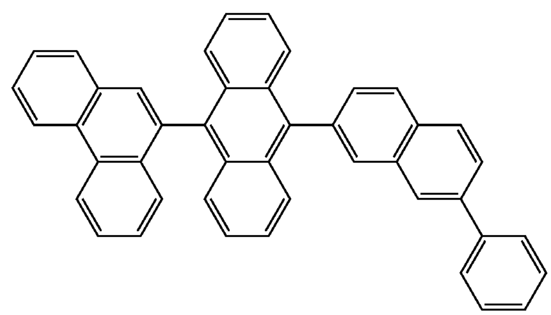
(BH-56)
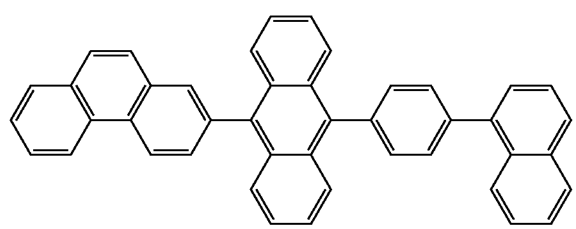
(BH-57)
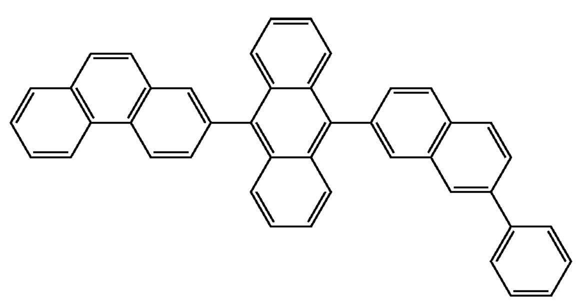

Formula 52
(BH-61)
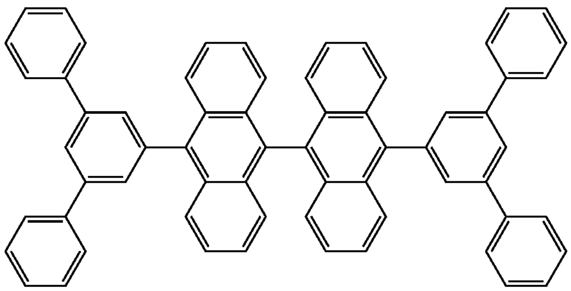
(BH-62)
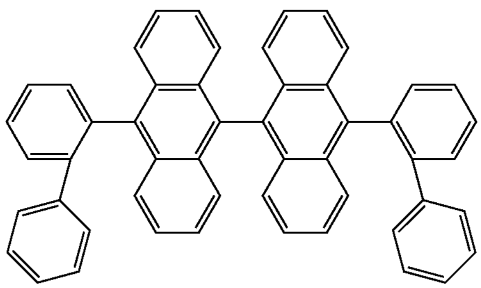
(BH-63)
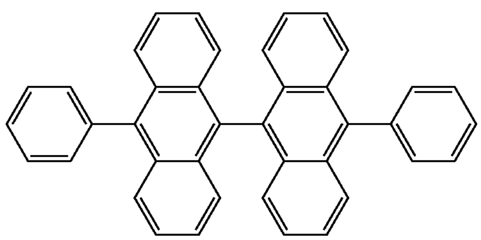
(BH-64)
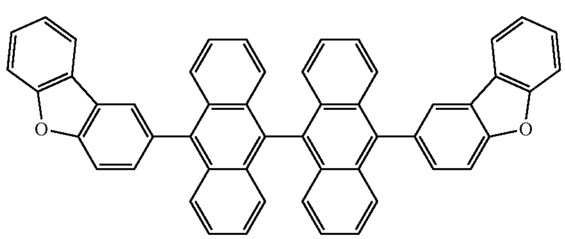
(BH-65)
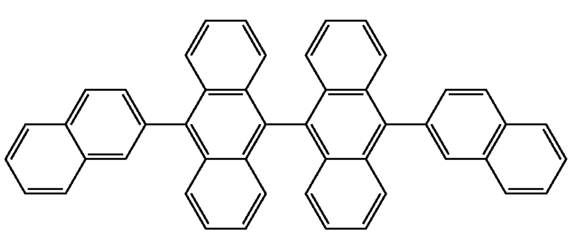
(BH-66)
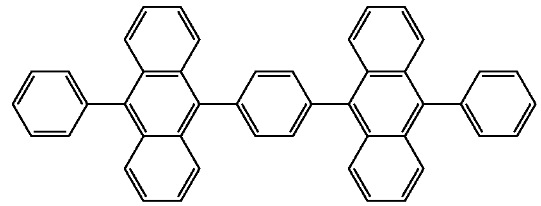
(BH-67)
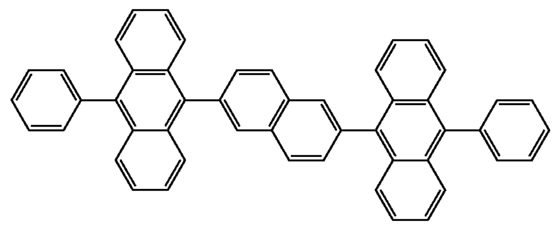
(BH-68)
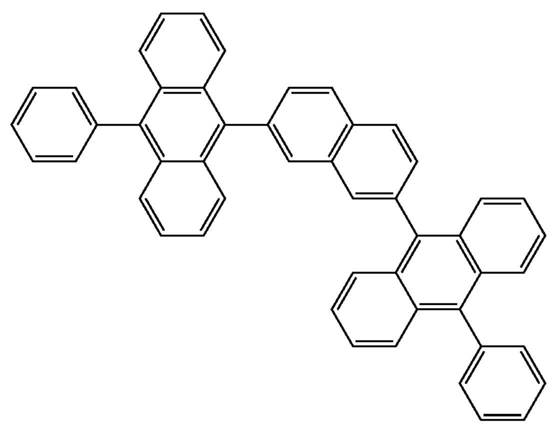
(BH-69)
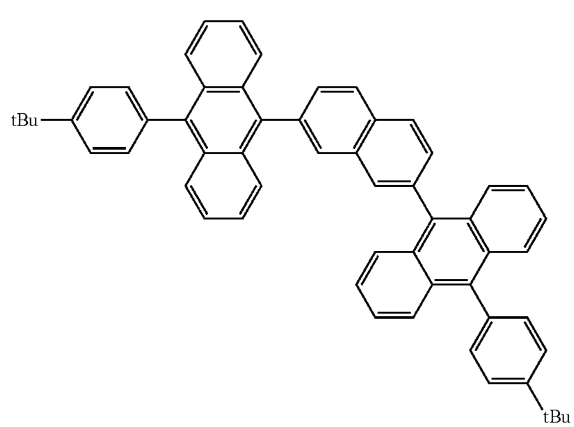

-continued (BH-70)

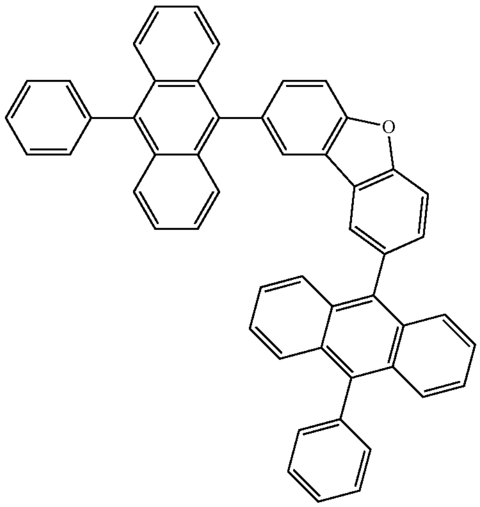

(BH-71)

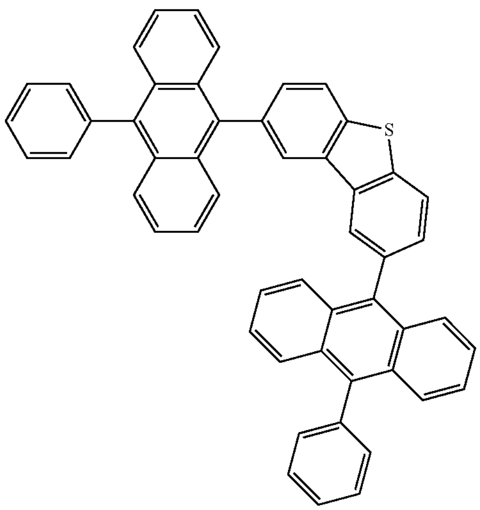

(BH-72)

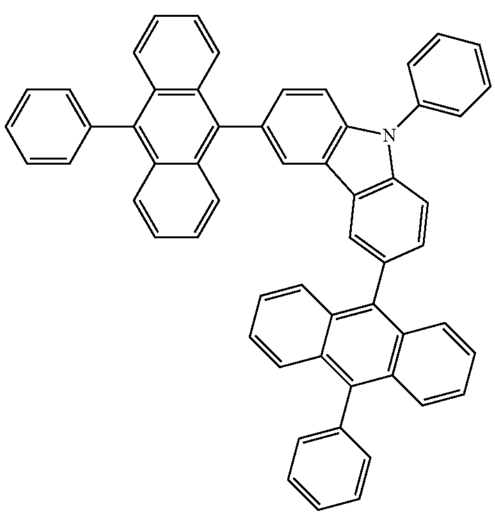

Fluorene-Based Compound

A compound represented by general formula (4) basically functions as the host.

Formula 53

(4)

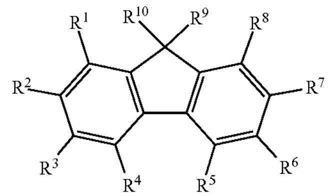

In formula (4) described above, $R^1$ to $R^{20}$ are independently hydrogen, aryl, heteroaryl (the heteroaryl may be bonded to a fluorene skeleton in formula (4) described above through a connecting group), diarylamino, diheteroarylamino, arylheteroarylamino, alkyl, cycloalkyl, alkenyl, alkoxy or aryloxy, and at least one hydrogen therein may be replaced by aryl, heteroaryl, alkyl or cycloalkyl, $R^1$ and $R^2$, $R^2$ and $R^3$, $R^3$ and $R^4$, $R^5$ and $R^6$, $R^6$ and $R^7$, $R^7$ and $R^8$, or $R^9$ and $R^{10}$ may be independently bonded to form a fused ring or a spiro ring, and at least one hydrogen in the ring formed may be replaced by aryl, heteroaryl (the heteroaryl may be bonded to the ring formed through a connecting group), diarylamino, diheteroarylamino, arylheteroarylamino, alkyl, cycloalkyl, alkenyl, alkoxy or aryloxy, and at least one hydrogen therein may be replaced by aryl, heteroaryl, alkyl or cycloalkyl, and at least one hydrogen in the compound represented by formula (4) may be replaced by halogen, cyano or deuterium.

With regard to a detail of each group in the definition of formula (4) described above, the description in the polycyclic aromatic compound of formula (1) described above can be cited.

Specific examples of alkenyl in $R^1$ to $R^{20}$ include alkenyl having 2 to 30 carbons, and alkenyl having 2 to 20 carbons is preferred, alkenyl having 2 to 10 carbons is further preferred, alkenyl having 2 to 6 carbons is still further preferred, and alkenyl having 2 to 4 carbons is particularly preferred. Specific examples of preferred alkenyl include vinyl, 1-propenyl, 2-propenyl, 1-butenyl, 2-butenyl, 3-butenyl, 1-pentenyl, 2-pentenyl, 3-pentenyl, 4-pentenyl, 1-hexenyl, 2-hexenyl, 3-hexenyl, 4-hexenyl or 5-hexenyl.

In addition, specific examples of heteroaryl also include a monovalent group having a structure of formula (4-Ar1), formula (4-Ar2), formula (4-Ar3), formula (4-Ar4) or formula (4-Ar5) described below.

Formula 54

(4-Ar1)

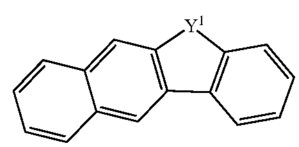

(4-Ar2)

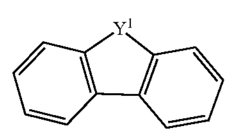

-continued (4-Ar3)

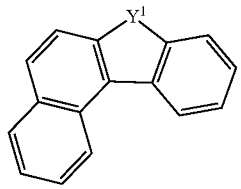

(4-Ar4)

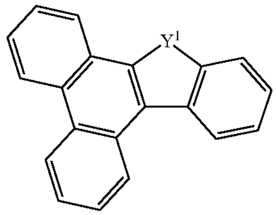

(4-Ar5)

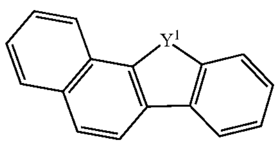

In formula (4-Ar1) to formula (4-Ar5), $Y^2$ is independently O, S or N—R, R is phenyl, biphenylyl, naphthyl, anthracenyl or hydrogen, and at least one hydrogen in the structure of formula (4-Ar1) to formula (4-Ar5) described above may be replaced by phenyl, biphenylyl, naphthyl, anthracenyl, phenanthrenyl, methyl, ethyl, propyl or butyl.

The heteroaryl may be bonded to a fluorene skeleton in formula (4) described above through a connecting group. More specifically, the fluorene skeleton in formula (4) and the heteroaryl described above are directly bonded to each other, and also may be bonded to each other through the connecting group therebetween. Specific examples of the connecting group include phenylene, biphenylene, naphthylene, anthracenylene, methylene, ethylene, $—OCH_2CH_2—$, $—CH_2CH_2O—$ or $—OCH_2CH_2O—$.

Moreover, $R^1$ and $R^2$, $R^2$ and $R^3$, $R^3$ and $R^4$, $R^5$ and $R^6$, $R^6$ and $R^7$, or $R^7$ and $R^8$ in formula (4) may be independently bonded to form a fused ring, and $R^9$ and $R^{10}$ may be bonded to form a spiro ring. The fused ring formed by $R^2$ to $R^8$ is a ring fused to a benzene ring in formula (4), and is an aliphatic ring or an aromatic ring. The fused ring is preferably an aromatic ring, and specific examples of a structure including the benzene ring in formula (4) include a naphthalene ring and a phenanthrene ring. The spiro ring formed by $R^9$ and $R^{10}$ is a ring which performs spiro bonding to a 5-membered ring in formula (4), and is an aliphatic ring or an aromatic ring. The spiro ring is preferably an aromatic ring, and specific examples thereof include a fluorene ring.

The compound represented by general formula (4) is preferably a compound represented by formula (4-1), formula (4-2) or formula (4-3) described below, and a compound in which benzene rings formed by bonding $R^1$ and $R^2$ to each other in general formula (4) are fused, a compound in which benzene rings formed by bonding $R^3$ and $R^4$ to each other in general formula (4) are fused, and a compound in which none of $R^1$ to $R^8$ is not bonded in general formula (4), respectively.

Formula 55

(4-1)

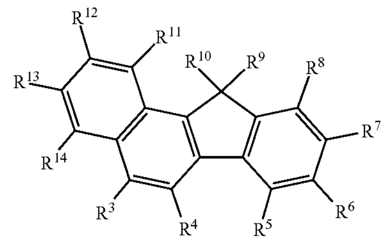

(4-2)

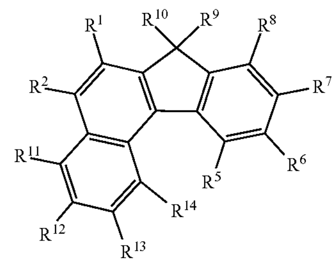

(4-3)

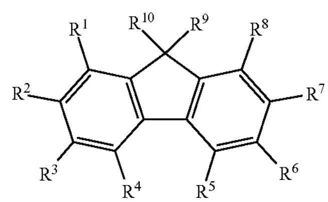

A definition of $R^1$ to $R^{10}$ in formula (4-1), formula (4-2) and formula (4-3) is identical to the definition of $R^1$ to $R^{10}$ corresponding thereto in formula (4), and a definition of $R^{11}$ to $R^{14}$ in formula (4-1) and formula (4-2) is identical to a definition of $R^1$ to $R^{10}$ in formula (4), too.

The compound represented by general formula (4) is further preferably a compound represented by formula (4-1A), formula (4-2A) or formula (4-3A) described below, and a compound in which $R^9$ and $R^{10}$ are bonded to form a spiro-fluorene ring in formula (4-1), formula (4-1) or formula (4-3), respectively.

Formula 56

(4-1A)

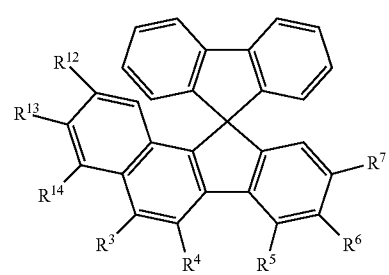

-continued (4-2A)

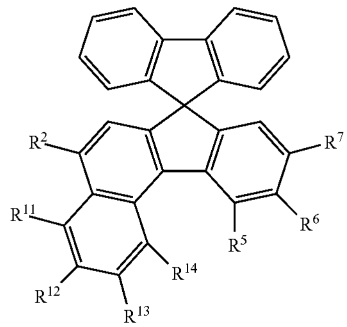

(4-3A)

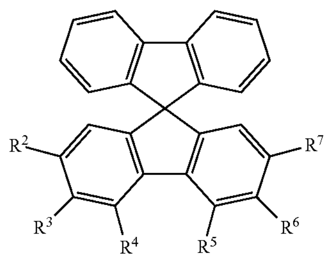

A definition of $R^2$ to $R^7$ in formula (4-1A), formula (4-2A) and formula (4-3A) is identical to the definition of $R^2$ to $R^7$ corresponding thereto in formula (4-1), formula (4-2) and formula (4-3), and a definition of $R^{11}$ to $R^{14}$ in formula (4-1A) and formula (4-2A) is also identical to the definition of $R^{11}$ to $R^{14}$ in formula (4-1) and formula (4-2).

Moreover, hydrogen in the compound represented by formula (4) may be wholly or partly replaced by halogen, cyano or deuterium.

Electron Injection Layer and Electron Transport Layer in Organic Electroluminescent Device Electron injection layer 107 plays a role of efficiently injecting the electron moved from cathode 108 into luminescent layer 105 or electron transport layer 106. Electron transport layer 106 plays a role of efficiently transporting the electron injected from cathode 108 or the electron injected from cathode 108 through electron injection layer 107, to luminescent layer 105. Electron transport layer 106 and electron injection layer 107 each are formed by laminating and mixing one or two or more kinds of electron transport-injection materials, or by a mixture of the electron transport-injection material and a polymer binder.

An electron injection-transport layer is a layer into which the electron is injected from a cathode and which takes charge of and further transport of the electron, in which high electron injection efficiency and efficient transport of the injected electron are desirable. For the purpose thereof, the layer preferably has a substance in which electron affinity is large, and also electronic mobility is large, further stability is excellent, and impurities serving as a trap are hard to be caused during production and use. However, when a transport balance between the positive hole and the electron is considered, when the layer mainly plays a role of being capable of efficiently preventing the positive hole from the anode from flowing onto a cathode side without causing recombination, even if electron transport capacity is not high significantly, the layer has an effect of improving luminous efficiency at a level equivalent to an effect of a material with high electron transport capacity. Accordingly, the electron injection-transport layer in the present embodiment may also include a function of a layer that can efficiently prevent movement of the positive hole.

As a material that forms electron transport layer 106 or electron injection layer 107 (electron transport material), the material can arbitrarily selected and used from among a compound that has so far been commonly used as an electron transfer compound in a photoconductive material, and a publicly-known compound that has been used in an electron injection layer and an electron transport layer of an organic EL device.

The material used in the electron transport layer or the electron injection layer preferably contains at least one kind selected from: a compound composed of an aromatic ring or a heteroaromatic ring composed of one of more kinds of atoms selected from carbon, hydrogen, oxygen, sulfur, silicon and phosphorus; a pyrrole derivative and a fused ring derivative thereof; and a metal complex having electron-accepting nitrogen.

Specific examples thereof include a fused ring-based aromatic ring derivative such as naphthalene and anthracene, a styryl-based aromatic ring derivative typified by 4,4'-bis(diphenylethenyl)biphenyl, a perinone derivative, a coumarin derivative, a naphthalimide derivative, a quinone derivative such as anthraquinone and diphenoquinone, a phosphorus oxide derivative, a carbazole derivative and an indole derivative. Specific examples of the metal complex having electron-accepting nitrogen include a hydroxyazole complex such as a hydroxyphenyloxazole complex, an azomethine complex, a tropolone metal complex, a flavonol metal complex and a benzoquinoline metal complex. The materials described above are used alone, but may be mixed with a different material and used.

Moreover, specific examples of any other electron transfer compound include a pyridine derivative, a naphthalene derivative, an anthracene derivative, a phenanthroline derivative, a perinone derivative, a coumarin derivative, a naphthalimide derivative, an anthraquinone derivative, a diphenoquinone derivative, a diphenylquinone derivative, a perylene derivative, an oxadiazole derivative (1,3-bis[(4-t-butylphenyl)1,3,4-oxadiazolyl]phenylene and the like), a thiophene derivative, a triazole derivative (N-naphthyl-2,5-diphenyl-1,3,4-triazole and the like), a thiadiazole derivative, a metal complex of an oxine derivative, a quinolinol-based metal complex, a quinoxaline derivative, a polymer of a quinoxaline derivative, a benzazoles compound, a gallium complex, a pyrazol derivative, a perfluorophenylene derivative, a triazine derivative, a pyrazine derivative, a benzoquinoline derivative (2,2'-bis(benzo[h]quinolin-2-yl)-9,9'-spirobifluorene and the like), an imidazopyridine derivative, a borane derivative, a benzimidazole derivative (tris(N-phenylbenzimidazole-2-yl)benzene and the like), a benzoxazol derivative, a benzothiazole derivative, a quinoline derivative, an oligopyridine derivative such as terpyridine, a bipyridine derivative, a terpyridine derivative (1,3-bis(4'-(2,2':6'2"-terpyridinyl))benzene and the like), a naphthyridine derivative (bis(1-naphthyl)-4-(1,8-naphthyridine-2-yl)phenylphosphine oxide and the like), an aldazine derivative, a carbazole derivative, an indole derivative, a phosphorus oxide derivative and a bisstyryl derivative.

Moreover, the metal complex having electron-accepting nitrogen can also be used, and specific examples thereof include a quinolinol-based metal complex, a hydroxyazole complex such as a hydroxyphenyloxazole complex, an azomethine complex, a tropolone metal complex, a flavonol metal complex and a benzoquinoline metal complex.

The materials described above are used alone, but may be mixed with a different material and used.

Among the materials described above, a borane derivative, a pyridine derivative, a fluoranthene derivative, a BO-based derivative, an anthracene derivative, a benzofluorene derivative, a phosphine oxide derivative, a pyrimidine derivative, a carbazole derivative, a triazine derivative, a benzimidazole derivative, a phenanthroline derivative and a quinolinol-based metal complex are preferred.

Borane Derivative

The borane derivative is a compound represented by general formula (ETM-1) described below, for example, and disclosed in JP 2007-27587 A in detail.

Formula 57

(ETM-1)

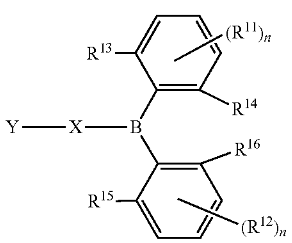

In formula (ETM-1) described above, $R^{11}$ and $R^{12}$ are independently at least one of hydrogen, alkyl, cycloalkyl, aryl which may be substituted, substituted silyl, nitrogen-containing heterocyclic ring which may be substituted, or cyano, $R^{13}$ to $R^{16}$ are independently alkyl which may be substituted, cycloalkyl which may be substituted or aryl which may be substituted, X is arylene which may be substituted, Y is aryl having 16 or less carbons which may be substituted, substituted boryl or carbazolyl which may be substituted, and n is independently an integer from 0 to 3.

Moreover, specific examples of a substituent "which may be substituted" or when "substituted" include aryl, heteroaryl, alkyl or cycloalkyl.

Among the compounds represented by general formula (ETM-1) described above, a compound represented by general formula (ETM-1-1) described below or a compound represented by general formula (ETM-1-2) described below is preferred.

Formula 58

(ETM-1-1)

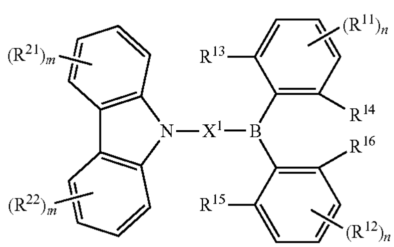

In formula (ETM-1-1), $R^{11}$ and $R^{12}$ are independently at least one of hydrogen, alkyl, cycloalkyl, aryl which may be substituted, substituted silyl, nitrogen-containing heterocyclic ring which may be substituted or cyano, $R^{13}$ to $R^{16}$ are independently alkyl which may be substituted, cycloalkyl which may be substituted or aryl which may be substituted, $R^{21}$ and $R^{22}$ are independently at least one of hydrogen, alkyl, cycloalkyl, aryl which may be substituted, substituted silyl, nitrogen-containing heterocyclic ring which may be substituted or cyano, $X^1$ is arylene having 20 or less carbons which may be substituted, n is independently an integer from 0 to 3, and m is independently an integer from 0 to 4. Moreover, specific examples of a substituent "which may be substituted" or when "substituted" include aryl, heteroaryl, alkyl or cycloalkyl.

Formula 59

(ETM-1-2)

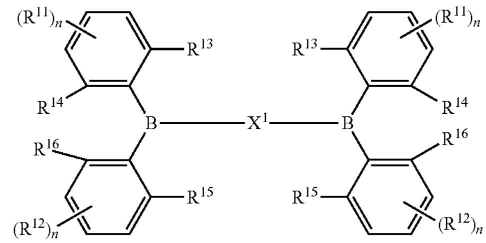

In formula (ETM-1-2), $R^{11}$ and $R^{12}$ are independently at least one of hydrogen, alkyl, cycloalkyl, aryl which may be substituted, substituted silyl, nitrogen-containing heterocyclic ring which may be substituted or cyano, $R^{13}$ to $R^{16}$ are independently alkyl which may be substituted, cycloalkyl which may be substituted or aryl which may be substituted, $X^1$ is arylene having 20 or less carbons which may be substituted, and m is independently an integer from 0 to 4. Moreover, specific examples of a substituent "which may be substituted" or when "substituted" include aryl, heteroaryl, alkyl or cycloalkyl.

Specific examples of $X^1$ include a divalent group represented by formula (X-1) to formula (X-9) described below.

Formula 60

(X-1)

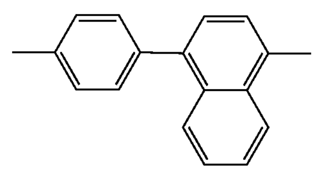

(X-2)

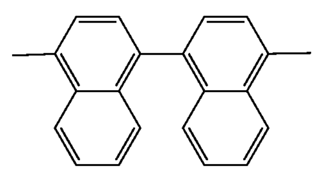

(X-3)

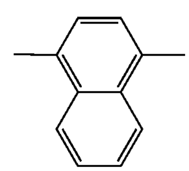

(X-4)

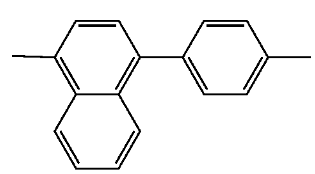

-continued (X-5)

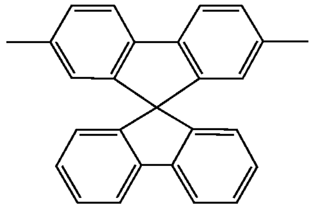

(X-6)

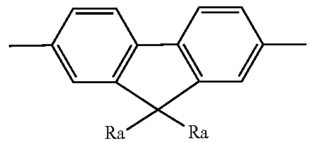

(X-7)

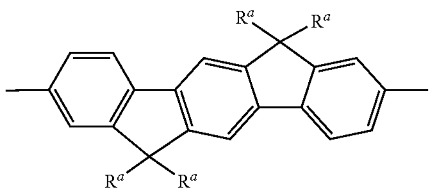

(X-8)

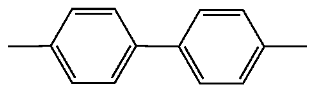

(X-9)

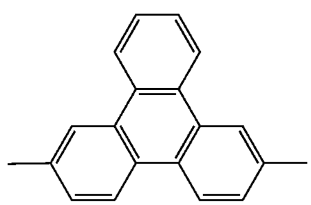

In each formula, $R^a$ is independently an alkyl group, a cycloalkyl group, or a phenyl group which may be substituted.

Specific examples of the borane derivative include a compound described below.

Formula 61

ET-1

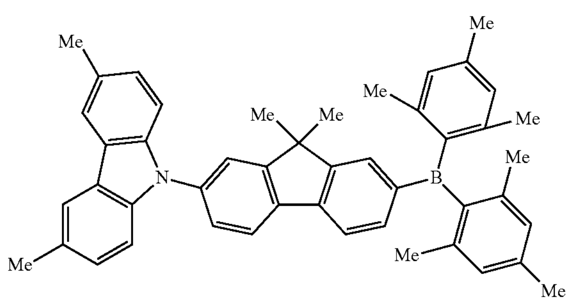

The borane derivative can be produced using a publicly-known raw material and a publicly-known synthesis method.

Pyridine Derivative

The pyridine derivative is a compound represented by formula (ETM-2) described below, for example, and preferably a compound represented by formula (ETM-2-1) or formula (ETM-2-2).

Formula 62

(ETM-2)

$$\varnothing\text{—(Pyridine-based substituent)}_n$$

(ETM-2-1)

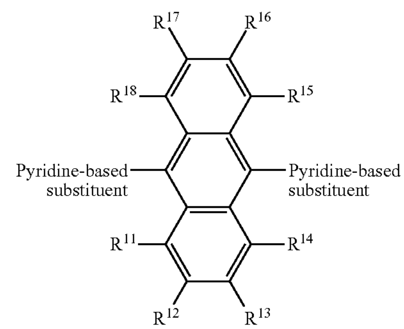

(ETM-2-2)

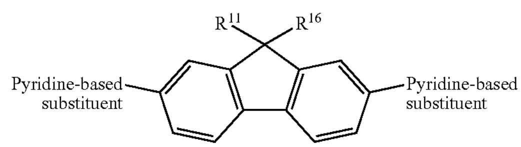

Then, φ is an n-valent aryl ring (preferably, n-valent benzene ring, naphthalene ring, anthracene ring, fluorene ring, benzofluorene ring, phenalene ring, phenanthrene ring or triphenylene ring), and n is an integer from 1 to 4.

In formula (ETM-2-1) described above, $R^{11}$ to $R^{18}$ are independently hydrogen, alkyl (preferably, alkyl having 1 to 24 carbons), cycloalkyl (preferably, cycloalkyl having 3 to 12 carbos) or aryl (preferably, aryl having 6 to 30 carbons).

In formula (ETM-2-2) described above, $R^{11}$ and $R^{12}$ are independently hydrogen, alkyl (preferably, alkyl having 1 to 24 carbons), cycloalkyl (preferably, cycloalkyl having 3 to 12 carbos) or aryl (preferably, aryl having 6 to 30 carbons), and $R^{11}$ and $R^{12}$ may be bonded to form a ring.

In each formula, "pyridine-based substituent" is any one of formula (Py-1) to formula (Py-15) described below, and the pyridine-based substituent may be independently subjected to replacement by alkyl having 1 to 4 carbons or cycloalkyl having 5 to 10 carbons. Moreover, the pyridine-based substituent may be bonded to φ, an anthracene ring or a fluorene ring in each formula through a phenylene group or a naphthylene group.

Formula 63

(Py-1)

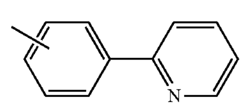

(Py-2)

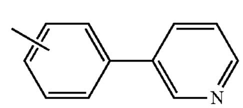

(Py-3)

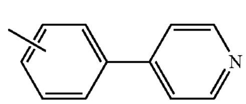

-continued
(Py-4)
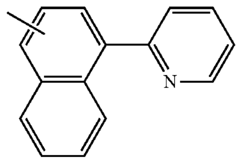
(Py-5)
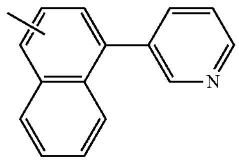
(Py-6)
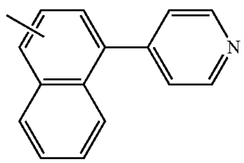
(Py-7)
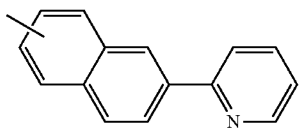
(Py-8)
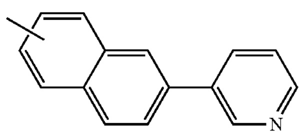
(Py-9)
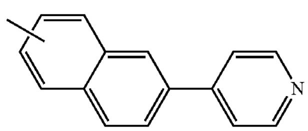
(Py-10)
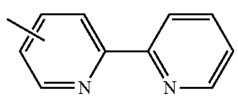
(Py-11)
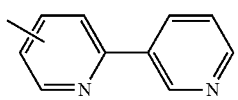
(Py-12)
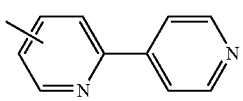
(Py-13)
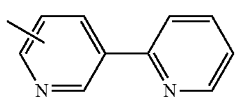
(Py-14)
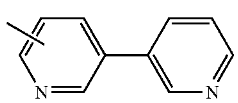
(Py-15)
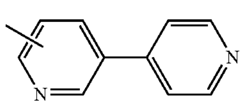
The pyridine-based substituent is any one of formula (Py-1) to formula (Py-15) described above, and among the formulas, the pyridine-based substituent is preferably any one of formula (Py-21) to formula (Py-44) described below.
Formula 64
(Py-21)
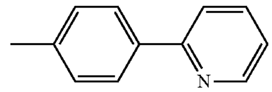
(Py-22)
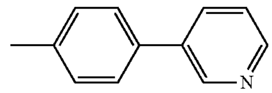
(Py-23)
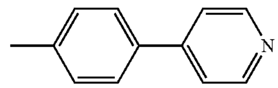
(Py-24)
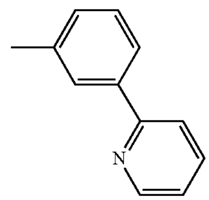
(Py-25)
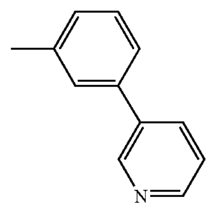
(Py-26)
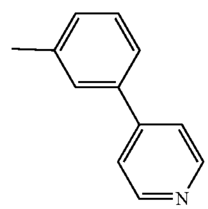
(Py-27)
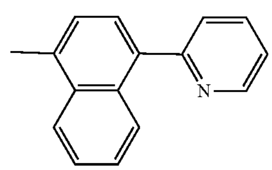
(Py-28)
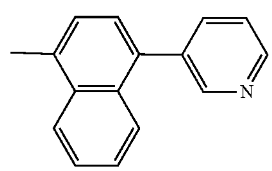
(Py-29)
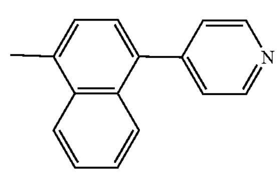

-continued (Py-30)

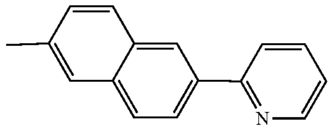

(Py-31)

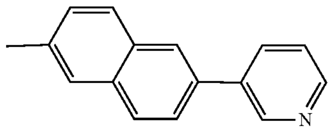

(Py-32)

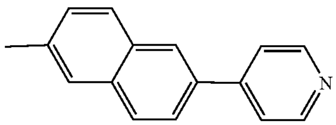

(Py-33)

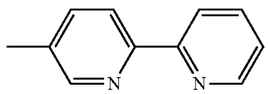

(Py-34)

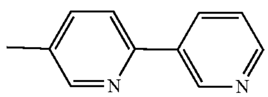

(Py-35)

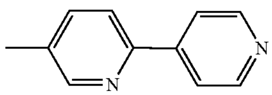

(Py-36)

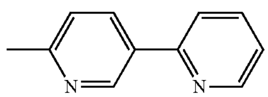

(Py-37)

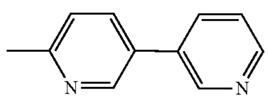

(Py-38)

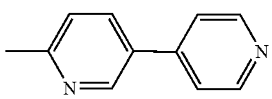

(Py-39)

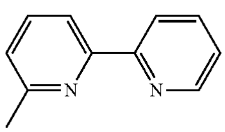

(Py-40)

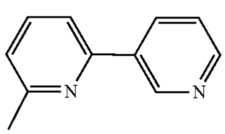

(Py-41)

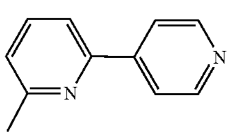

(Py-42)

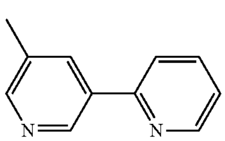

-continued (Py-43)

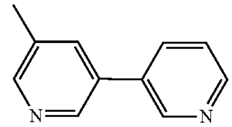

(Py-44)

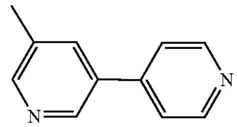

At least one hydrogen in each pyridine derivative may be replaced by deuterium, and one of two "pyridine-based substituents" in formula (ETM-2-1) and formula (ETM-2-2) described above may be replaced by aryl.

"Alkyl" in $R^{11}$ to $R^{18}$ may be any of straight-chain alkyl and branched-chain alkyl, and specific examples thereof include straight-chain alkyl having 1 to 24 carbons or branched-chain alkyl having 3 to 24 carbons. Preferred "alkyl" is alkyl having 1 to 18 carbons (branched-chain alkyl having 3 to 18 carbons). Further preferred "alkyl" is alkyl having 1 to 12 carbons (branched-chain alkyl having 3 to 12 carbons). Still further preferred "alkyl" is alkyl having 1 to 6 carbons (branched-chain alkyl having 3 to 6 carbons). Particularly preferred "alkyl" is alkyl having 1 to 4 carbons (branched-chain alkyl having 3 to 4 carbons).

Specific examples of "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl and n-eicosyl.

With regard to alkyl having 1 to 4 carbons in which replacement is made by a pyridine-based substituent, the description of alkyl described above can be cited.

Specific examples of "cycloalkyl" in $R^{11}$ to $R^{18}$ include cycloalkyl having 3 to 12 carbons. Preferred "cycloalkyl" is cycloalkyl having 3 to 10 carbons. Further preferred "cycloalkyl" is cycloalkyl having 3 to 8 carbons. Still further preferred "cycloalkyl" is cycloalkyl having 3 to 6 carbons.

Specific examples of "cycloalkyl" include cyclopropyl, cyclobutyl, cyclopentyl, cyclohexyl, methylcyclopentyl, cycloheptyl, methylcyclohexyl, cyclooctyl or dimethylcyclohexyl.

With regard to cycloalkyl having 5 to 10 carbons in which replacement is made by a pyridine-based substituent, the description of cycloalkyl described above can be cited.

As "aryl" in $R^{11}$ to $R^{18}$, preferred aryl is aryl having 6 to 30 carbons, further preferred aryl is aryl having 6 to 18 carbons, still further preferred aryl is aryl having 6 to 14 carbons, and particularly preferred aryl is aryl having 6 to 12 carbons.

Specific examples of "aryl having 6 to 30 carbons" include: phenyl as monocyclic aryl; (1-,2-)naphthyl as fused bicyclic aryl; acenaphthylene-(1-,3-,4-,5-)yl, fluorene-(1-,2-,3-,4-,9-)yl, phenalene-(1-,2-)yl and (1-,2-,3-,4-,9-)phenanthryl as fused tricyclic aryl; triphenylene-(1-,2-)yl, pyrene-(1-,2-,4-)yl and naphthacene-(1-,2-,5-)yl as fused tetracyclic aryl; and perylene-(1-,2-,3-)yl and pentacene-(1-,2-,5-,6-)yl as fused pentacyclic aryl.

Specific examples of "aryl having 6 to 30 carbons" include preferably phenyl, naphthyl, phenanthryl, chrysenyl or triphenylenyl, further preferably phenyl, 1-naphthyl, 2-naphthyl or phenanthryl, and particularly preferably phenyl, 1-naphthyl or 2-naphthyl.

$R^{11}$ and $R^{12}$ in formula (ETM-2-2) described above may be bonded to form a ring, and as a result, a 5-membered ring of a fluorene skeleton may be spiro-bonded with cyclobutane, cyclopentane, cyclopentene, cyclopentadiene, cyclohexane, fluorene, indene or the like.

Specific examples of the pyridine derivative include a compound described below.

Formula 65

ET-2

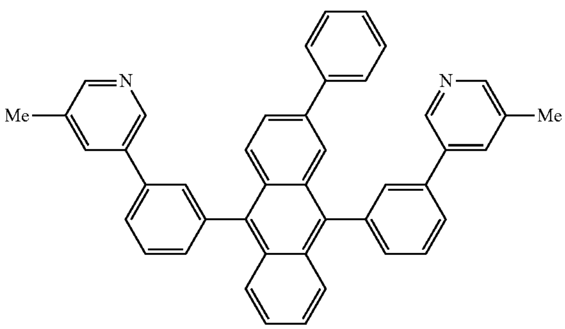

ET-3

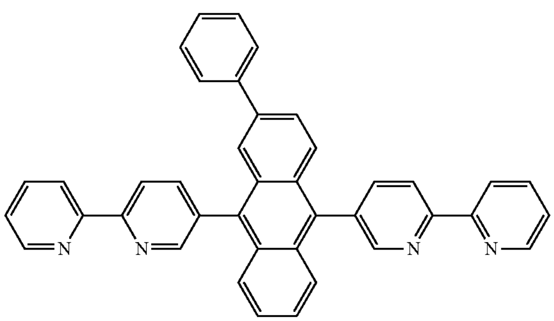

ET-6

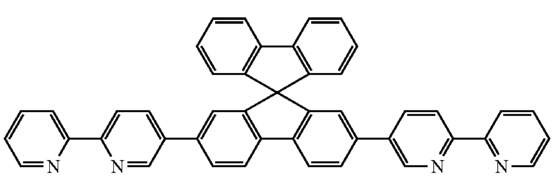

ET-7

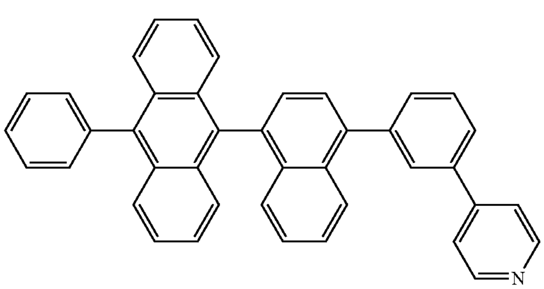

The pyridine derivative can be produced using a publicly-known raw material and a publicly-known synthesis method.

Fluoranthene Derivative

The fluoranthene derivative is a compound represented by general formula (ETM-3) described below, for example, and disclosed in WO 2010/134352 A in detail.

Formula 66

(ETM-3)

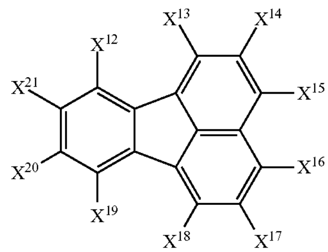

In formula (ETM-3) described above, $X^{12}$ to $X^{21}$ represent hydrogen, halogen, straight-chain alkyl, branched-chain alkyl, cyclic alkyl, straight-chain alkoxy, branched-chain alkoxy, cyclic alkoxy, substituted or non-substituted aryl, or substituted or non-substituted heteroaryl. Here, specific examples of a substituent when substituted include aryl, heteroarylalkyl or cycloalkyl.

Specific examples of the fluoranthene derivative include a compound described below.

Formula 67

(ETM-3-1)

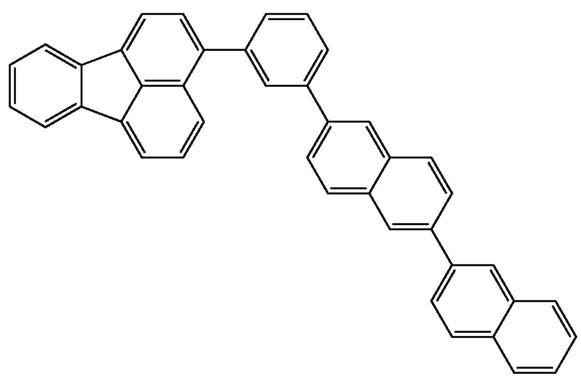

(ETM-3-2)

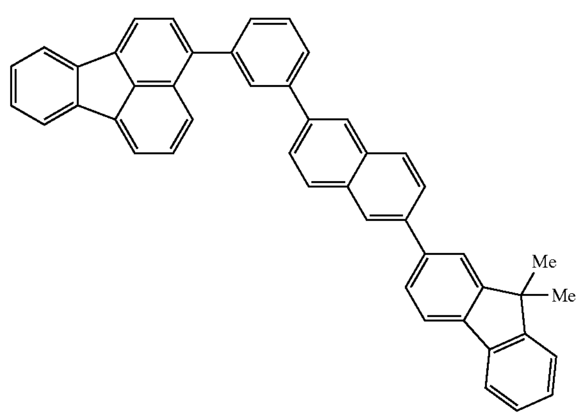

-continued (ETM-3-3)

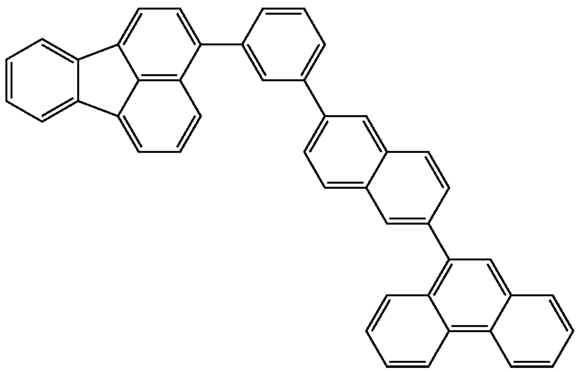

BO-Based Derivative

The BO-based derivative is a polycyclic aromatic compound represented by formula (ETM-4) described below or a multimer of a polycyclic aromatic compound having a plurality of structures represented by formula (ETM-4) described below, for example.

Formula 68

(ETM-4)

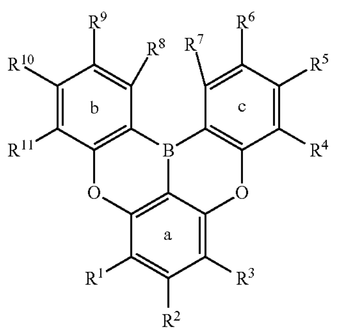

$R^1$ to $R^{11}$ are independently hydrogen, aryl, heteroaryl, diarylamino, diheteroarylamino, arylheteroarylamino, alkyl, cycloalkyl, alkoxy or aryloxy, and at least one hydrogen therein may be replaced by aryl, heteroaryl, alkyl or cycloalkyl.

Moreover, adjacent groups of $R^1$ to $R^{11}$ may be bonded to each other to form an aryl ring or a heteroaryl ring together with an a ring, a b ring or a c ring, and at least one hydrogen in the ring formed may be replaced by aryl, heteroaryl, diarylamino, diheteroarylamino, arylheteroarylamino, alkyl, cycloalkyl, alkoxy or aryloxy, and at least one hydrogen therein may be replaced by aryl, heteroaryl, alkyl or cycloalkyl.

Moreover, at least one hydrogen in the compound or the structure represented by formula (ETM-4) may be replaced by halogen or deuterium.

With regard to the description of a substituent or a form of ring formation in formula (ETM-4), the description of the polycyclic aromatic compound represented by general formula (1) described above can be cited.

Specific examples of the BO-based derivative include a compound described below.

Formula 69

ET-5

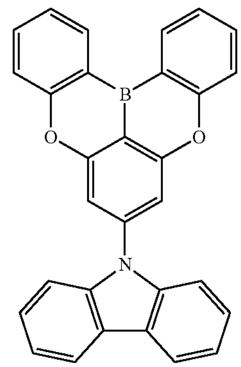

The BO-based derivative can be produced using a publicly-known raw material and a publicly-known synthesis method.

Anthracene Derivative

One of the anthracene derivatives is a compound represented by formula (ETM-5-1) described below, for example.

Formula 70

(ETM-5-1)

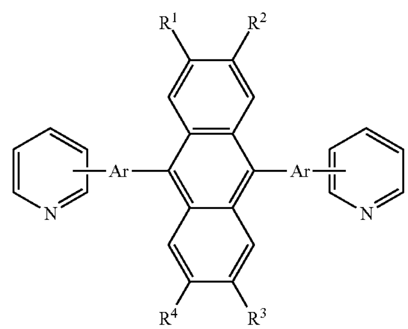

Ar is independently divalent benzene or naphthalene, and $R^1$ to $R^4$ are independently hydrogen, alkyl having 1 to 6 carbons, cycloalkyl having 3 to 6 carbons or aryl having 6 to 20 carbons.

Ar can be independently appropriately selected from divalent benzene or naphthalene, and two pieces of Ar may be different from or identical to each other, and are preferably identical from a viewpoint of ease of synthesis of the anthracene derivative. Ar is bonded to pyridine to form a "moiety composed of Ar and pyridine," and the moiety is bonded to anthracene as a group represented by any one of formula (Py-1) to formula (Py-12) described below, for example.

Formula 71

(Py-1)

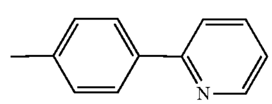

(Py-2)

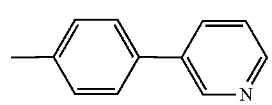

-continued (Py-3)

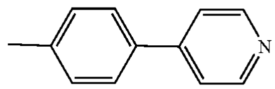

(Py-4)

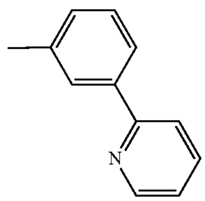

(Py-5)

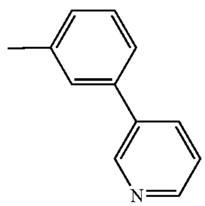

(Py-6)

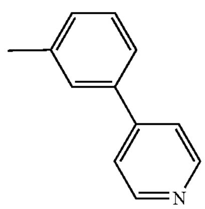

(Py-7)

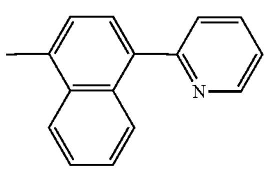

(Py-8)

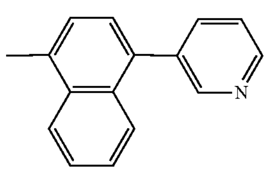

(Py-9)

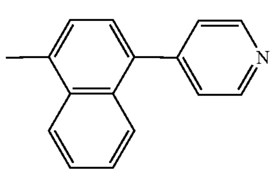

(Py-10)

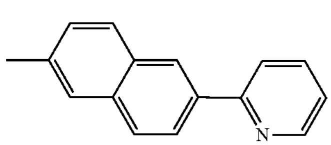

(Py-11)

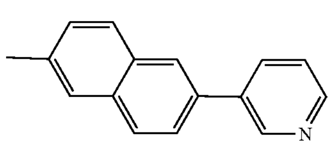

-continued (Py-12)

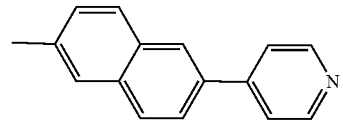

Among the groups, a group represented by any one of formula (Py-1) to formula (Py-9) described above is preferred, and a group represented by any one of formula (Py-1) to formula (Py-6) described above is further preferred. Two "moieties composed of Ar and pyridine" bonded to anthracene may be identical to or different from each other in structures thereof, and are preferably identical from a viewpoint of ease of synthesis of the anthracene derivative. However, from a viewpoint of device properties, two structures of the "moieties composed of Ar and pyridine" are preferred whether the structures are identical to or different from each other.

Alkyl having 1 to 6 carbons in $R^1$ to $R^4$ may be any of straight-chain alkyl and branched-chain alkyl. More specifically, alkyl having 1 to 6 carbons in $R^1$ to $R^4$ is straight-chain alkyl having 1 to 6 carbons or branched-chain alkyl having 3 to 6 carbons, and preferably alkyl having 1 to 4 carbons (branched-chain alkyl having 3 to 4 carbons). Specific examples thereof include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl or 2-ethylbutyl, preferably methyl, ethyl, n-propyl, isopropyl, n-butyl, isobutyl, s-butyl or t-butyl, and further preferably methyl, ethyl or t-butyl.

Specific examples of the cycloalkyl having 3 to 6 carbons in $R^1$ to $R^4$ include cyclopropyl, cyclobutyl, cyclopentyl, cyclohexyl, methylcyclopentyl, cycloheptyl, methylcyclohexyl, cyclooctyl or dimethylcyclohexyl.

With regard to aryl having 6 to 20 carbons in $R^1$ to $R^4$, aryl having 6 to 16 carbons is preferred, aryl having 6 to 12 carbons is further preferred, and aryl having 6 to 10 carbons is particularly preferred.

Specific examples of "aryl having 6 to 20 carbons" include: phenyl, (o-,m-,p-)tolyl, (2,3-,2,4-,2,5-,2,6-,3,4-,3,5-)xylyl, mesityl(2,4,6-trimethylphenyl) and (o-,m-,p-)cumenyl as monocyclic aryl; (2-,3-,4-)biphenylyl as bicyclic aryl; (1-,2-)naphthyl as fused bicyclic aryl; terphenylyl(m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) as tricyclic aryl; anthracene-(1-,2-,9-)yl, acenaphthylene-(1-,3-,4-,5-)yl, fluorene-(1-,2-,3-,4-,9-)yl, phenalene-(1-,2-)yl and (1-,2-,3-,4-,9-)phenanthryl as fused tricyclic aryl; triphenylene-(1-,2-)yl, pyrene-(1-,2-,4-)yl and tetracene-(1-,2-,5-)yl as fused tetracyclic aryl; and perylene-(1-,2-,3-)yl as fused pentacyclic aryl.

"Aryl having 6 to 20 carbons" is preferably phenyl, biphenylyl, terphenylyl or naphthyl, further preferably phenyl, biphenylyl, 1-naphthyl, 2-naphthyl or m-terphenyl-5'-yl, still further preferably phenyl, biphenylyl, 1-naphthyl or 2-naphthyl, and most preferably phenyl.

One of the anthracene derivatives is a compound represented by formula (ETM-5-2) described below, for example.

Formula 72

(ETM-5-2)

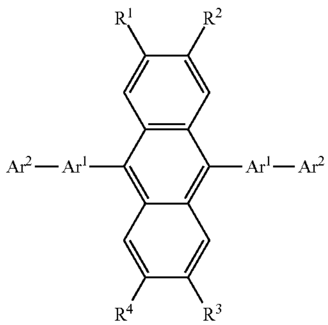

$Ar^1$ is independently a single bond, divalent benzene, naphthalene, anthracene, fluorene or phenalene.

$Ar^2$ is independently aryl having 6 to 20 carbons, and the same description as "aryl having 6 to 20 carbons" in formula (ETM-5-1) described above can be cited. Aryl having 6 to 16 carbons is preferred, aryl having 6 to 12 carbons is further preferred, and aryl having 6 to 10 carbons is particularly preferred. Specific examples thereof include phenyl, biphenylyl, naphthyl, terphenylyl, anthracenyl, acenaphthylenyl, fluorenyl, phenalenyl, phenanthryl, triphenylenyl, pyrenyl, tetracenyl and perylenyl.

$R^1$ to $R^4$ are independently hydrogen, alkyl having 1 to 6 carbons, cycloalkyl having 3 to 6 carbons or aryl having 6 to 20 carbons, and the description in formula (ETM-5-1) described above can be cited.

Specific examples of the anthracene derivatives include a compound described below.

Formula 73

ET-7

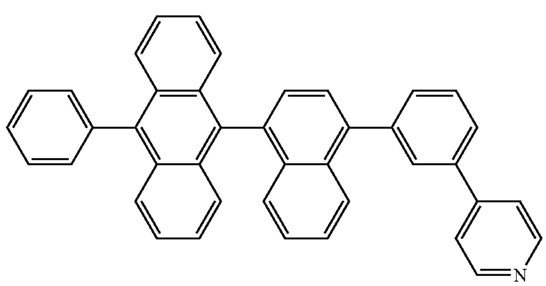

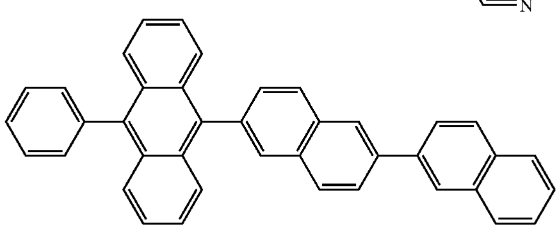

The anthracene derivatives can be produced using a publicly-known raw material and a publicly-known synthesis method.

Benzofluorene Derivative

The benzofluorene derivative is a compound represented by formula (ETM-6) described below, for example.

Formula 74

(ETM-6)

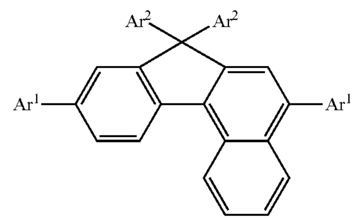

$Ar^1$ is independently aryl having 6 to 20 carbons, in which the same description as "aryl having 6 to 20 carbons" in formula (ETM-5-1) described above can be cited. Aryl having 6 to 16 carbons is preferred, aryl having 6 to 12 carbons is further preferred, and aryl having 6 to 10 carbons is particularly preferred. Specific examples thereof include phenyl, biphenylyl, naphthyl, terphenylyl, anthracenyl, acenaphthylenyl, fluorenyl, phenalenyl, phenanthryl, triphenylenyl, pyrenyl, tetracenyl and perylenyl.

$Ar^2$ is independently hydrogen, alkyl (preferably, alkyl having 1 to 24 carbons), cycloalkyl (preferably, cycloalkyl having 3 to 12 carbos) or aryl (preferably, aryl having 6 to 30 carbons), and two pieces of $Ar^2$ may be bonded to form a ring.

"Alkyl" in $Ar^2$ may be any of straight-chain alkyl and branched-chain alkyl, and specific examples thereof include straight-chain alkyl having 1 to 24 carbons or branched-chain alkyl having 3 to 24 carbons. Preferred "alkyl" is alkyl having 1 to 18 carbons (branched-chain alkyl having 3 to 18 carbons). Further preferred "alkyl" is alkyl having 1 to 12 carbons (branched-chain alkyl having 3 to 12 carbons). Still further preferred "alkyl" is alkyl having 1 to 6 carbons (branched-chain alkyl having 3 to 6 carbons). Particularly preferred "alkyl" is alkyl having 1 to 4 carbons (branched-chain alkyl having 3 to 4 carbons). Specific examples of "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl and 1-methylhexyl.

Specific examples of "cycloalkyl" in $Ar^2$ include cycloalkyl having 3 to 12 carbons. Preferred "cycloalkyl" is cycloalkyl having 3 to 10 carbons. Further preferred "cycloalkyl" is cycloalkyl having 3 to 8 carbons. Still further preferred "cycloalkyl" is cycloalkyl having 3 to 6 carbons. Specific examples of "cycloalkyl" include cyclopropyl, cyclobutyl, cyclopentyl, cyclohexyl, methylcyclopentyl, cycloheptyl, methylcyclohexyl, cyclooctyl or dimethylcyclohexyl.

As "aryl" in $Ar^2$, preferred aryl is aryl having 6 to 30 carbons, further preferred aryl is aryl having 6 to 18 carbons, still further preferred aryl is aryl having 6 to 14 carbons, and particularly preferred aryl is aryl having 6 to 12 carbons.

Specific examples of "aryl having 6 to 30 carbons" include phenyl, naphthyl, acenaphthylenyl, fluorenyl, phenalenyl, phenanthryl, triphenylenyl, pyrenyl, naphthacenyl, perylenyl and pentacenyl.

Two pieces of $Ar^2$ may be bonded to form a ring, and as a result, a 5-membered ring of a fluorene skeleton may be spiro-bonded with cyclobutane, cyclopentane, cyclopentene, cyclopentadiene, cyclohexane, fluorene, indene or the like.

Specific examples of the benzofluorene derivative include a compound described below.

Formula 75

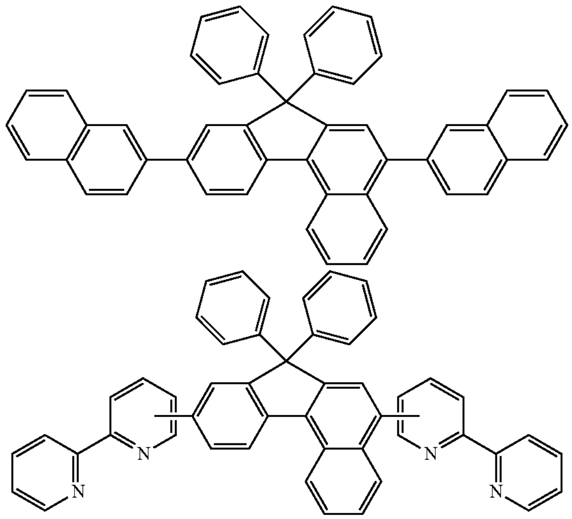

The benzofluorene derivative can be produced using a publicly-known raw material and a publicly-known synthesis method.

Phosphine Oxide Derivative

The phosphine oxide derivative is a compound represented by formula (ETM-7-1) described below, for example. A detail thereof is described also in WO 2013/079217 A.

Formula 76

(ETM-7-1)

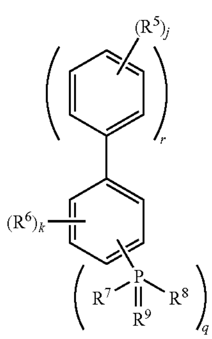

- $R^5$ is, substituted or non-substituted, alkyl having 1 to 20 carbons, cycloalkyl having 3 to 20 carbons, aryl having 6 to 20 carbons or heteroaryl having 5 to 20 carbons,
- $R^6$ is CN, substituted or non-substituted, alkyl having 1 to 20 carbons, cycloalkyl having 3 to 20 carbons, heteroalkyl having 1 to 20 carbons, aryl having 6 to 20 carbons, heteroaryl having 5 to 20 carbons, alkoxy having 1 to 20 carbons or aryloxy having 6 to 20 carbons,
- $R^7$ and $R^8$ are independently, substituted or non-substituted, aryl having 6 to 20 carbons or heteroaryl having 5 to 20 carbons,
- $R^9$ is oxygen or sulfur, and
- j is 0 or 1, k is 0 or 1, r is an integer from 0 to 4, and q is an integer from 1 to 3.

Here, specific examples of a substituent when substituted include aryl, heteroaryl, alkyl or cycloalkyl.

The phosphine oxide derivative may be a compound represented by formula (ETM-7-2) described below, for example.

Formula 77

(EMT-7-2)

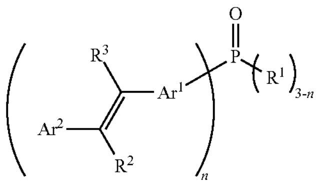

$R^1$ to $R^3$ may be identical to or different from each other, and are selected from hydrogen, an alkyl group, a cycloalkyl group, an aralkyl group, an alkenyl group, a cycloalkenyl group, an alkynyl group, an alkoxy group, an alkylthio group, a cycloalkylthio group, an arylether group, an arylthioether group, an aryl group, a heterocyclic group, halogen, a cyano group, an aldehyde group, a carbonyl group, a carboxyl group, an amino group, a nitro group, a silyl group and a fused ring formed with an adjacent substituent.

$Ar^1$ may be identical to or different from each other, and is an arylene group or a heteroarylene group. $Ar^2$ may be identical to or different from each other, and is an aryl group or a heteroaryl group. However, at least one of $Ar^1$ and $Ar^2$ has a substituent, or forms a fused ring with an adjacent substituent. Then, n is an integer from 0 to 3, and when n is 0, no unsaturated structure moiety is present, and when n is 3, $R^1$ is absent.

The alkyl group among the substituents indicates a saturated aliphatic hydrocarbon group such as a methyl group, an ethyl group, a propyl group and a butyl group, for example, and may be non-substituted or substituted. A substituent when substituted is not particularly limited, and specific examples thereof include an alkyl group, an aryl group and a heterocyclic group, and this point is also common to the description described below. Moreover, the number of carbons of the alkyl group is not particularly limited, and is ordinarily in the range of 1 to 20 from a viewpoint of ease of availability or cost.

Moreover, the cycloalkyl group indicates a saturated alicyclic hydrocarbon group such as cyclopropyl, cyclohexyl, norbornyl and adamantyl, for example, and may be non-substituted or substituted. The number of carbons of an alkyl group moiety is not particularly limited, and is ordinarily in the range of 3 to 20.

Moreover, the aralkyl group indicates an aromatic hydrocarbon group through aliphatic hydrocarbon, such as a benzyl group and a phenylethyl group, for example, and both of the aliphatic hydrocarbon and the aromatic hydrocarbon may be non-substituted or substituted. The number of carbons of an aliphatic moiety is not particularly limited, and is ordinarily in the range of 1 to 20.

Moreover, the alkenyl group indicates an unsaturated aliphatic hydrocarbon group containing a double bond, such as a vinyl group, an allyl group and a butadienyl group, for example, and may be non-substituted or substituted. The number of carbons of the alkenyl group is not particularly limited, and is ordinarily in the range of 2 to 20.

Moreover, the cycloalkenyl group indicates an unsaturated alicyclic hydrocarbon group containing a double bond, such as a cyclopentenyl group, a cyclopentadienyl group and a cyclohexene group, for example, and may be non-substituted or substituted.

Moreover, the alkynyl group indicates an unsaturated aliphatic hydrocarbon group containing a triple bond, such as an acetylenyl group, for example, and may be non-substituted or substituted. The number of carbons of the alkynyl group is not particularly limited, and is ordinarily in the range of 2 to 20.

Moreover, the alkoxy group indicates an aliphatic hydrocarbon group through an ether bond, such as a methoxy group, for example, and the aliphatic hydrocarbon group may be non-substituted or substituted. The number of carbons of the alkoxy group is not particularly limited, and is ordinarily in the range of 1 to 20.

Moreover, the alkylthio group means a group in which an oxygen atom in an ether bond of the alkoxy group is replaced by a sulfur atom.

Moreover, the cycloalkylthio group means a group in which an oxygen atom in an ether bond of a cycloalkoxy group is replaced by a sulfur atom.

Moreover, the arylether group indicates an aromatic hydrocarbon group through an ether bond, such as a phenoxy group, for example, and the aromatic hydrocarbon group may be non-substituted or substituted. The number of carbons of the arylether group is not particularly limited, and is ordinarily in the range of 6 to 40.

Moreover, the arylthioether group means a group in which an oxygen atom in an ether bond of the arylether group is replaced by a sulfur atom.

Moreover, the aryl group indicates an aromatic hydrocarbon group such as a phenyl group, a naphthyl group, a biphenyl group, a phenanthryl group, a terphenyl group and a pyrenyl group, for example. The aryl group may be non-substituted or substituted. The number of carbons of the aryl group is not particularly limited, and is ordinarily in the range of 6 to 40.

Moreover, the heterocyclic group indicates a cyclic structural group having an atom other than carbon, such as a furanyl group, a thiophenyl group, an oxazolyl group, a pyridyl group, a quinolinyl group and a carbazolyl group, for example, and may be non-substituted or substituted. The number of carbons of the heterocyclic group is not particularly limited, and is ordinarily in the range of 2 to 30.

Halogen indicates fluorine, chlorine, bromine and iodine.

The aldehyde group, the carbonyl group and the amino group can also include a group in which replacement is made by aliphatic hydrocarbon, alicyclic hydrocarbon, aromatic hydrocarbon, a heterocyclic ring or the like.

Moreover, aliphatic hydrocarbon, alicyclic hydrocarbon, aromatic hydrocarbon and a heterocyclic ring may be non-substituted or substituted.

The silyl group indicates a silicon compound group such as a trimethylsilyl group, for example, and may be non-substituted or substituted. The number of carbons of the silyl group is not particularly limited, and is ordinarily in the range of 3 to 20. Moreover, the number of silicon is ordinarily 1 to 6.

The fused ring formed with the adjacent substituent is a conjugated or non-conjugated fused ring formed between $Ar^1$ and $R^2$, between $Ar^1$ and $R^3$, between $Ar^2$ and $R^2$, between $Ar^2$ and $R^3$, between $R^2$ and $R^3$, between $Ar^1$ and $Ar^2$, or the like, for example. Here, when n is 1, a conjugated or non-conjugated fused ring may be formed between $R^1$ and $R^1$. The fused rings may contain a nitrogen atom, an oxygen atom or a sulfur atom in endocyclic structure, and may be further fused with another ring.

Specific examples of the phosphine oxide derivative include a compound described below.

Formula 78

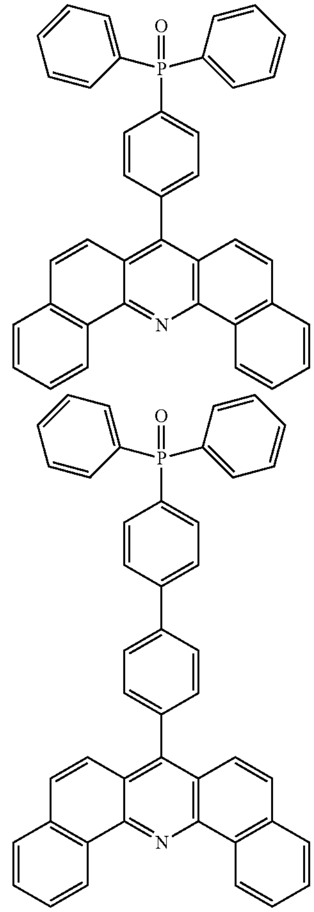

The phosphine oxide derivative can be produced using a publicly-known raw material and a publicly-known synthesis method.

Pyrimidine Derivative

The pyrimidine derivative is a compound represented by formula (ETM-8) described below, for example, and preferably a compound represented by formula (ETM-8-1) described below. A detail thereof is described also in WO 2011/021689 A.

Formula 79

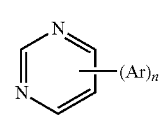

(ETM-8)

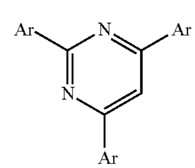

(ETM-8-1)

Ar is independently aryl which may be substituted, or heteroaryl which may be substituted. Then, n is an integer from 1 to 4, preferably an integer from 1 to 3, and further preferably 2 or 3.

Specific examples of "aryl" of "aryl which may be substituted" include aryl having 6 to 30 carbons, preferably aryl having 6 to 24 carbons, further preferably aryl having 6 to 20 carbons, and still further preferably aryl having 6 to 12 carbons.

Specific examples of "aryl" include: phenyl as monocyclic aryl; (2-,3-,4-)biphenylyl as bicyclic aryl; (1-,2-)naphthyl as fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) as tricyclic aryl; acenaphthylene-(1-,3-,4-,5-)yl, fluorene-(1-,2-,3-,4-,9-)yl, phenalene-(1-,2-)yl and (1-,2-,3-,4-,9-)phenanthryl as fused tricyclic aryl; quaterphenylyl (5'-phenyl-m-terphenyl-2-yl, 5'-phenyl-m-terphenyl-3-yl, 5'-phenyl-m-terphenyl-4-yl and m-quaterphenylyl) as tetracyclic aryl; triphenylene-(1-,2-)yl, pyrene-(1-,2-,4-)yl and naphthacene-(1-,2-,5-)yl as fused tetracyclic aryl; and perylene-(1-,2-,3-)yl and pentacene-(1-,2-,5-,6-)yl as fused pentacyclic aryl Specific examples of "heteroaryl" of "heteroaryl which may be substituted" include heteroaryl having 2 to 30 carbons, and heteroaryl having 2 to 25 carbons is preferred, heteroaryl having 2 to 20 carbons is further preferred, heteroaryl having 2 to 15 carbons is still further preferred, and heteroaryl having 2 to 10 carbons is particularly preferred. Moreover, specific examples of heteroaryl include a heterocyclic ring containing one to five hetero atoms selected from oxygen, sulfur and nitrogen other than carbon as a ring-constituting atom.

Specific examples of heteroaryl include furyl, thienyl, pyrrolyl, oxazolyl, isoxazolyl, triazolyl, isothiazolyl, imidazolyl, pyrazolyl, oxadiazolyl, furazanyl, thiadiazolyl, triazolyl, tetrazolyl, pyridyl, pyrimidinyl, pyridazinyl, pyrazinyl, thoriadinyl, benzofuranyl, isobenzofuranyl, benzo[b]thienyl, indolyl, isoindolyl, 1H-indazolyl, benzoimidazolyl, benzoxazolyl, benzothiazolyl, 1H-benzotriazolyl, quinolyl, isoquinolyl, cinnolyl, quinazolyl, quinoxalinyl, phthalazinyl, naphthyridinyl, purinyl, buteridinyl, carbazolyl, acridinyl, phenoxazinyl, phenothiazinyl, phenazinyl, phenoxathiinyl, thianthrenyl and indridinyl.

Moreover, aryl and heteroaryl described above may be substituted, and for example, each may be replaced by aryl or heteroaryl described above.

Specific examples of the pyrimidine derivative include a compound described below.

Formula 80

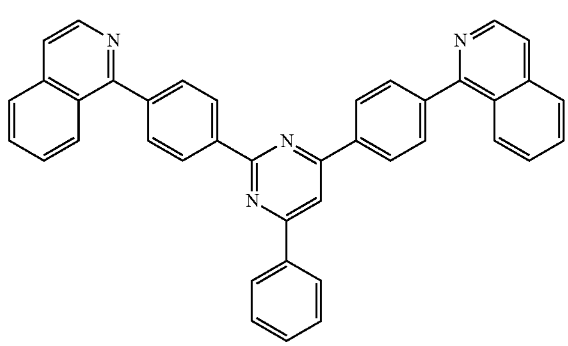

The pyrimidine derivative can be produced using a publicly-known raw material and a publicly-known synthesis method.

Carbazole Derivative

The carbazole derivative is a compound represented by formula (ETM-9) described below, for example, or a multimer in which a plurality of the compounds are bonded by a single bond or the like. A detail thereof is described in US 2014/0197386 A.

Formula 81

(ETM-9)

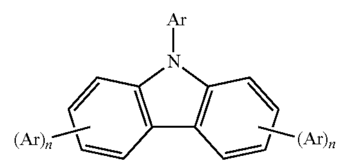

Ar is independently aryl which may be substituted, or heteroaryl which may be substituted. Then, n is an integer from 0 to 4, preferably an integer from 0 to 3, and further preferably 0 or 1.

Specific examples of "aryl" of "aryl which may be substituted" include aryl having 6 to 30 carbons, preferably aryl having 6 to 24 carbons, further preferably aryl having 6 to 20 carbons, and still further preferably aryl having 6 to 12 carbons.

Specific examples of "aryl" include: phenyl as monocyclic aryl; (2-,3-,4-)biphenylyl as bicyclic aryl; (1-,2-)naphthyl as fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) as tricyclic aryl; acenaphthylene-(1-,3-,4-,5-)yl, fluorene-(1-,2-,3-,4-,9-)yl, phenalene-(1-,2-)yl and (1-,2-,3-,4-,9-)phenanthryl as fused tricyclic aryl; quaterphenylyl (5'-phenyl-m-terphenyl-2-yl, 5'-phenyl-m-terphenyl-3-yl, 5'-phenyl-m-terphenyl-4-yl and m-quaterphenylyl) as tetracyclic aryl; triphenylene-(1-,2-)yl, pyrene-(1-,2-,4-)yl and naphthacene-(1-,2-,5-)yl as fused tetracyclic aryl; and perylene-(1-,2-,3-)yl and pentacene-(1-,2-,5-,6-)yl as fused pentacyclic aryl Specific examples of "heteroaryl" of "heteroaryl which may be substituted" include heteroaryl having 2 to 30 carbons, and heteroaryl having 2 to 25 carbons is preferred, heteroaryl having 2 to 20 carbons is further preferred, heteroaryl having 2 to 15 carbons is still further preferred, and heteroaryl having 2 to 10 carbons is particularly preferred. Moreover, specific examples of heteroaryl include a heterocyclic ring containing one to five hetero atoms selected from oxygen, sulfur and nitrogen other than carbon as a ring-constituting atom.

Specific examples of heteroaryl include furyl, thienyl, pyrrolyl, oxazolyl, isoxazolyl, triazolyl, isothiazolyl, imidazolyl, pyrazolyl, oxadiazolyl, furazanyl, thiadiazolyl, triazolyl, tetrazolyl, pyridyl, pyrimidinyl, pyridazinyl, pyrazinyl, thoriadinyl, benzofuranyl, isobenzofuranyl, benzo[b]thienyl, indolyl, isoindolyl, 1H-indazolyl, benzoimidazolyl, benzoxazolyl, benzothiazolyl, 1H-benzotriazolyl, quinolyl, isoquinolyl, cinnolyl, quinazolyl, quinoxalinyl, phthalazinyl, naphthyridinyl, purinyl, buteridinyl, carbazolyl, acridinyl, phenoxazinyl, phenothiazinyl, phenazinyl, phenoxathiinyl, thianthrenyl and indridinyl.

Moreover, aryl and heteroaryl described above may be substituted, and for example, each may be replaced by aryl or heteroaryl described above.

The carbazole derivative may be a multimer in which a plurality of compounds represented by formula (ETM-9) described above are bonded by a single bond or the like. In this case, the compounds may be bonded by an aryl ring (preferably, polyvalent benzene ring, naphthalene ring, anthracene ring, fluorene ring, benzofluorene ring, phenalene ring, phenanthrene ring or triphenylene ring) in addition to the single bond.

Specific examples of the carbazole derivative include a compound described below.

Formula 82

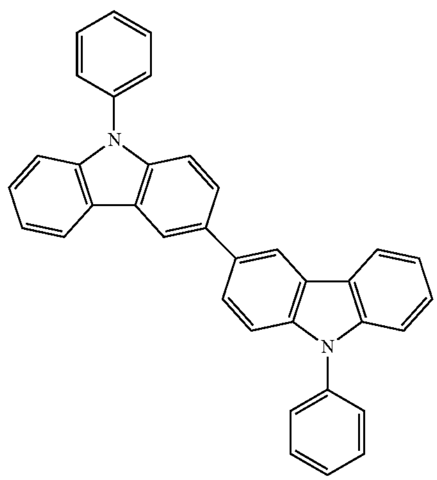

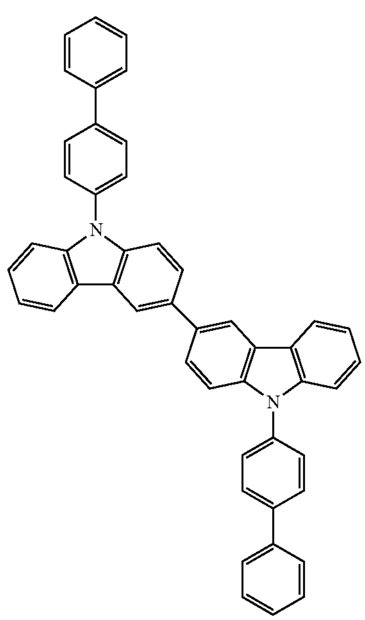

-continued

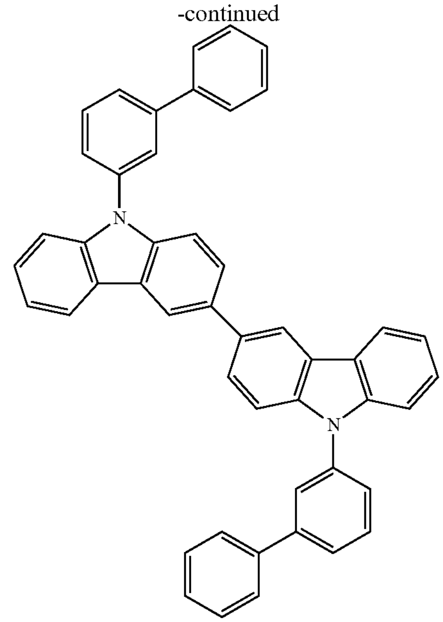

The carbazole derivative can be produced using a publicly-known raw material and a publicly-known synthesis method.

Triazine Derivative

The triazine derivative is a compound represented by formula (ETM-10) described below, for example, and preferably a compound represented by formula (ETM-10-1) described below. A detail thereof is described in US 2011/0156013 A.

Formula 83

(ETM-10)

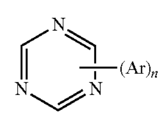

(ETM-10-1)

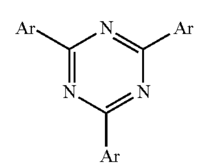

Ar is independently aryl which may be substituted, or heteroaryl which may be substituted. Then, n is an integer from 1 to 3, and preferably 2 or 3.

Specific examples of "aryl" of "aryl which may be substituted" include aryl having 6 to 30 carbons, preferably aryl having 6 to 24 carbons, further preferably aryl having 6 to 20 carbons, and still further preferably aryl having 6 to 12 carbons.

Specific examples of "aryl" include: phenyl as monocyclic aryl; (2-,3-,4-)biphenylyl as bicyclic aryl; (1-,2-)naphthyl as fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) as tricyclic aryl; acenaphthylene-(1-,3-,4-,5-)yl, fluorene-(1-,2-,3-,4-,9-)yl, phenalene-(1-,2-)

yl and (1-,2-,3-,4-,9-)phenanthryl as fused tricyclic aryl; quaterphenylyl (5'-phenyl-m-terphenyl-2-yl, 5'-phenyl-m-terphenyl-3-yl, 5'-phenyl-m-terphenyl-4-yl and m-quaterphenylyl) as tetracyclic aryl; triphenylene-(1-,2-)yl, pyrene-(1-,2-,4-)yl and naphthacene-(1-,2-,5-)yl as fused tetracyclic aryl; and perylene-(1-,2-,3-)yl and pentacene-(1-,2-,5-,6-)yl as fused pentacyclic aryl Specific examples of "heteroaryl" of "heteroaryl which may be substituted" include heteroaryl having 2 to 30 carbons, and heteroaryl having 2 to 25 carbons is preferred, heteroaryl having 2 to 20 carbons is further preferred, heteroaryl having 2 to 15 carbons is still further preferred, and heteroaryl having 2 to 10 carbons is particularly preferred. Moreover, specific examples of heteroaryl include a heterocyclic ring containing one to five hetero atoms selected from oxygen, sulfur and nitrogen other than carbon as a ring-constituting atom.

Specific examples of heteroaryl include furyl, thienyl, pyrrolyl, oxazolyl, isoxazolyl, triazolyl, isothiazolyl, imidazolyl, pyrazolyl, oxadiazolyl, furazanyl, thiadiazolyl, triazolyl, tetrazolyl, pyridyl, pyrimidinyl, pyridazinyl, pyrazinyl, thoriadinyl, benzofuranyl, isobenzofuranyl, benzo[b]thienyl, indolyl, isoindolyl, 1H-indazolyl, benzoimidazolyl, benzoxazolyl, benzothiazolyl, 1H-benzotriazolyl, quinolyl, isoquinolyl, cinnolyl, quinazolyl, quinoxalinyl, phthalazinyl, naphthyridinyl, purinyl, buteridinyl, carbazolyl, acridinyl, phenoxazinyl, phenothiazinyl, phenazinyl, phenoxathiinyl, thianthrenyl and indridinyl.

Moreover, aryl and heteroaryl described above may be substituted, and for example, each may be replaced by aryl or heteroaryl described above.

Specific examples of the triazine derivative include a compound described below.

Formula 84

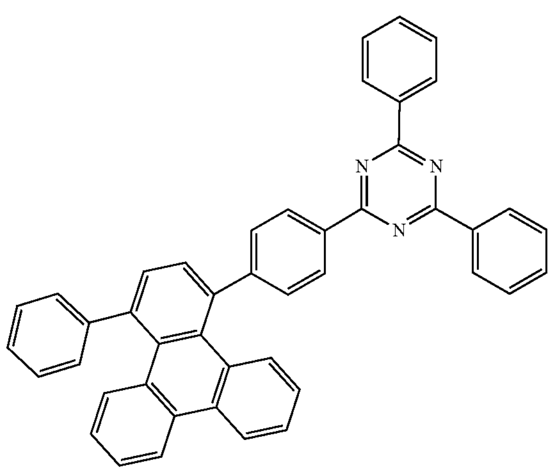

-continued

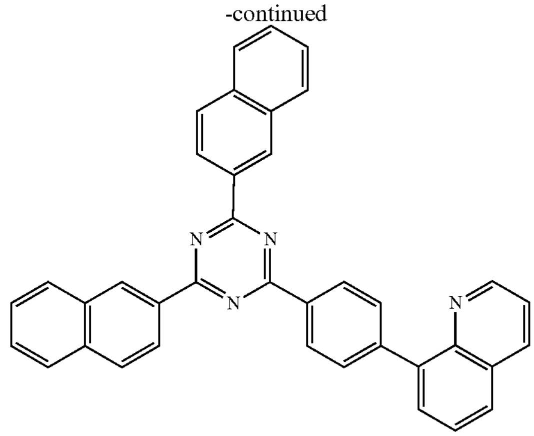

The triazine derivative can be produced using a publicly-known raw material and a publicly-known synthesis method.

Benzimidazole Derivative

The benzimidazole derivative is a compound represented by formula (ETM-11) described below, for example.

Formula 85

$$\phi\text{—(Benzimidazole-based substituent)}_n \qquad \text{(ETM-11)}$$

Then, φ is an n-valent aryl ring (preferably, n-valent benzene ring, naphthalene ring, anthracene ring, fluorene ring, benzofluorene ring, phenalene ring, phenanthrene ring or triphenylene ring), n is an integer from 1 to 4, a "benzimidazole-based substituent" is a substituent in which a pyridyl group in the "pyridine-based substituent" in formula (ETM-2), formula (ETM-2-1) and formula (ETM-2-2) described above is replaced by a benzimidazole group, and at least one hydrogen in the benzimidazole derivative may be replaced by deuterium.

Formula 86

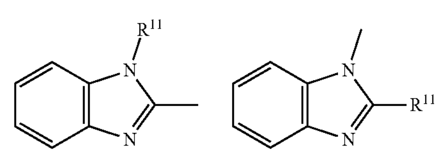

Benzimidazole group $R^{11}$ in the benzimidazole group described above is hydrogen, alkyl having 1 to 24 carbons, cycloalkyl having 3 to 12 carbos or aryl having 6 to 30 carbons, and the description of $R^{11}$ in formula (ETM-2-1) and formula (ETM-2-2) described above can be cited.

Then, φ is further preferably an anthracene ring or a fluorene ring, and in a structure in this case, the description in formula (ETM-2-1) or formula (ETM-2-2) described above can be cited, and in $R^{11}$ to $R^{18}$ in each formula, the description in formula (ETM-2-1) or formula (ETM-2-2) described above can be cited. Moreover, in formula (ETM-2-1) or formula (ETM-2-2) described above, description is performed in a form in which two pyridine-based substituents are bonded thereto, and in replacement thereof to the benzimidazole-based substituent, both of the pyridine-based substituents may be replaced by the benzimidazole-based substituent (namely, n=2), or any one of the pyridine-based substituents may be replaced by the benzimidazole-based substituent and the other pyridine-based substituent may be replaced by $R^{11}$ to $R^{18}$ (namely, n=1). Further, for example, at least one of $R^{11}$ to $R^{18}$ in formula (ETM-2-1) described above is replaced by the benzimidazole-based substituent, and the "pyridine-based substituent" may be replaced by $R^{11}$ to $R^{18}$.

Specific examples of the benzimidazole derivative include 1-phenyl-2-(4-(10-phenylanthracene-9-yl)phenyl)-1H-benzo[d]imidazole, 2-(4-(10-(naphthalene-2-yl)anthracene-9-yl)phenyl)-1-phenyl-1H-benzo[d]imidazole, 2-(3-(10-(naphthalene-2-yl)anthracene-9-yl)phenyl)-1-phenyl-1H-benzo[d]imidazole, 5-(10-(naphthalene-2-yl)anthracene-9-yl)-1,2-diphenyl-1H-benzo[d]imidazole, 1-(4-(10-(naphthalene-2-yl)anthracene-9-yl)phenyl)-2-phenyl-1H-benzo[d]imidazole, 2-(4-(9,10-di(naphthalene-2-yl)anthracene-2-yl)phenyl)-1-phenyl-1H-benzo[d]imidazole, 1-(4-(9,10-di(naphthalene-2-yl)anthracene-2-yl)phenyl)-2-phenyl-1H-benzo[d]imidazole, and 5-(9,10-di(naphthalene-2-yl)anthracene-2-yl)-1,2-diphenyl-1H-benzo[d]imidazole.

Formula 87

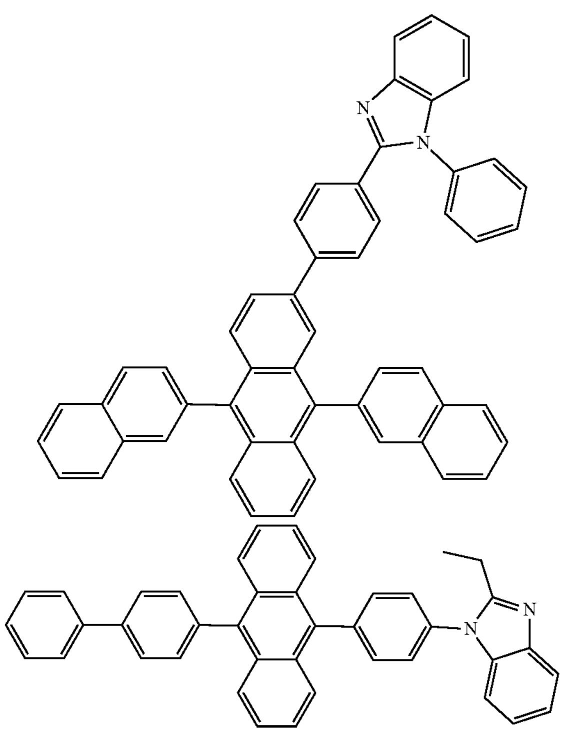

The benzimidazole derivative can be produced using a publicly-known raw material and a publicly-known synthesis method.

Phenanthroline Derivative

The phenanthroline derivative is a compound represented by formula (ETM-12) or formula (ETM-12-1) described below, for example. A detail thereof is described in WO 2006/021982 A.

Formula 88

(ETM-12)

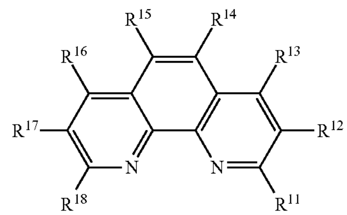

(ETM-12-1)

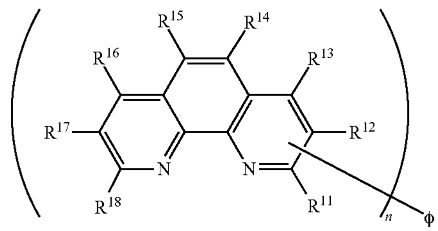

Then, φ is an n-valent aryl ring (preferably, n-valent benzene ring, naphthalene ring, anthracene ring, fluorene ring, benzofluorene ring, phenalene ring, phenanthrene ring or triphenylene ring), and n is an integer from 1 to 4.

$R^{11}$ to $R^{18}$ in each formula are independently hydrogen, alkyl (preferably, alkyl having 1 to 24 carbons), cycloalkyl (preferably, cycloalkyl having 3 to 12 carbos) or aryl (preferably, aryl having 6 to 30 carbons). Moreover, in formula (ETM-12-1) described above, any one of $R^{11}$ to $R^{18}$ is bonded to φ as an aryl ring.

At least one hydrogen in each phenanthroline derivative may be replaced by deuterium.

As alkyl, cycloalkyl and aryl in $R^{11}$ to $R^{18}$, the description of $R^{11}$ to $R^{18}$ in formula (ETM-2) described above can be cited. Moreover, specific examples of φ include a structural formula described below in addition to the examples described above. In addition, R in the structural formula described below is independently hydrogen, methyl, ethyl, isopropyl, cyclohexyl, phenyl, 1-naphthyl, 2-naphthyl, biphenylyl or terphenylyl.

Formula 89

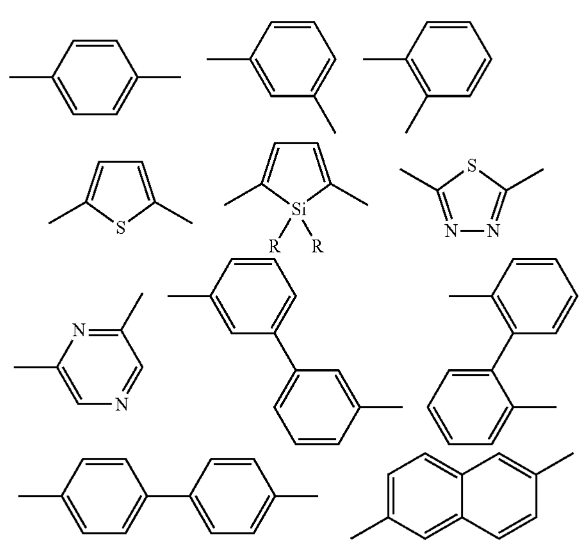

-continued

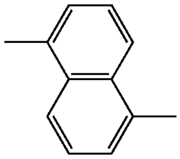
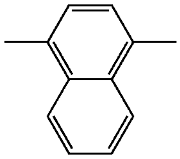
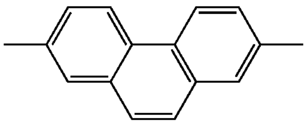
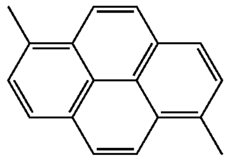
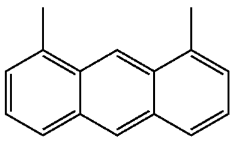
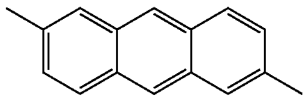
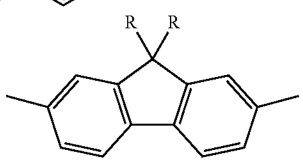

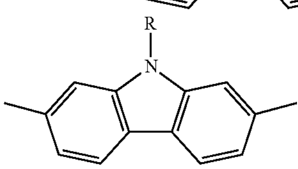

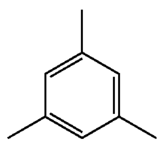
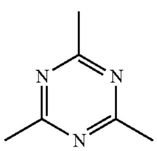

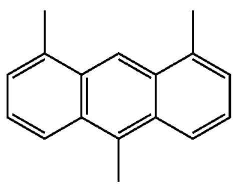
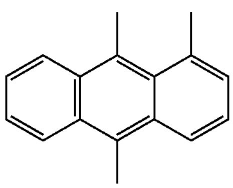
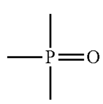

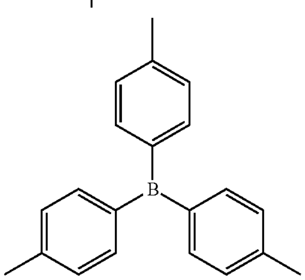

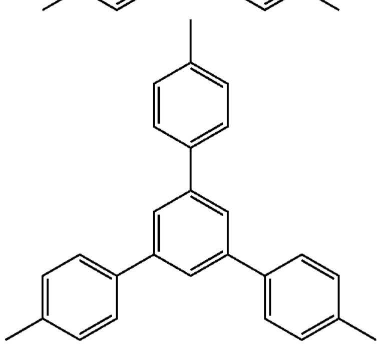

-continued

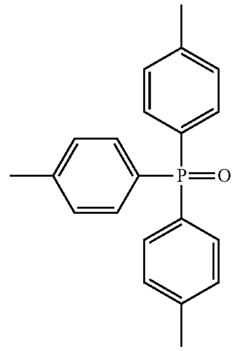

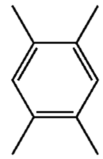
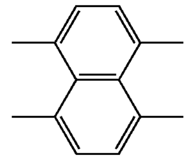
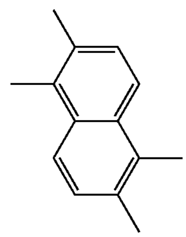
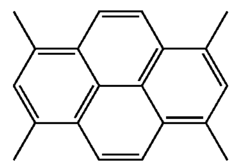

Specific examples of the phenanthroline derivative include 4,7-diphenyl-1,10-phenanthroline, 2,9-dimethyl-4,7-diphenyl-1,10-phenanthroline, 9,10-di(1,10-phenanthroline-2-yl)anthracene, 2,6-di(1,10-phenanthroline-5-yl)pyridine, 1,3,5-tri(1,10-phenanthroline-5-yl)benzene, 9,9'-difluoro-bis(1,10-phenanthroline-5-yl), bathocuproine and 1,3-bis(2-phenyl-1,10-phenanthroline-9-yl)benzene.

Formula 90

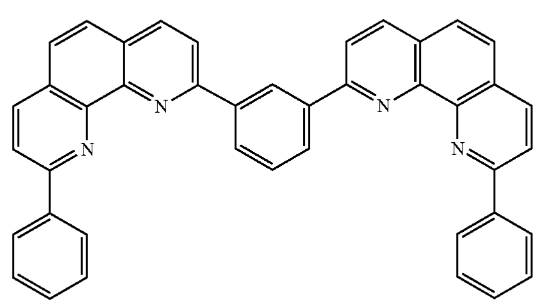

The phenanthroline derivative can be produced using a publicly-known raw material and a publicly-known synthesis method.

Quinolinol-Based Metal Complex

The quinolinol-based metal complex is a compound represented by general formula (ETM-13) described below, for example.

Formula 91

(ETM-13)

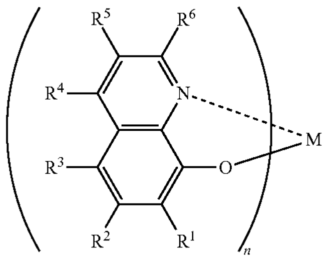

In the formula, $R^1$ to $R^6$ are independently hydrogen, fluorine, alkyl, cycloalkyl, aralkyl, alkenyl, cyano, alkoxy or aryl, M is Li, Al, Ga, Be or Zn, and n is an integer from 1 to 3.

Specific examples of the quinolinol-based metal complex include 8-quinolinollithium, tris(8-quinolinolate)aluminum, tris(4-methyl-8-quinolinolate)aluminum, tris(5-methyl-8-quinolinolate)aluminum, tris(3,4-dimethyl-8-quinolinolate) aluminum, tris(4,5-dimethyl-8-quinolinolate)aluminum, tris (4,6-dimethyl-8-quinolinolate)aluminum, bis(2-methyl-8-quinolinolate) (phenolate)aluminum, bis(2-methyl-8-quinolinolate) (2-methylphenolate)aluminum, bis(2-methyl-8-quinolinolate) (3-methylphenolate)aluminum, bis(2-methyl-8-quinolinolate) (4-methylphenolate)aluminum, bis (2-methyl-8-quinolinolate) (2-phenylphenolate)aluminum, bis(2-methyl-8-quinolinolate) (3-phenylphenolate)aluminum, bis(2-methyl-8-quinolinolate) (4-phenylphenolate)aluminum, bis(2-methyl-8-quinolinolate) (2,3-dimethylphenolate)aluminum, bis(2-methyl-8-quinolinolate) (2,6-dimethylphenolate)aluminum, bis(2-methyl-8-quinolinolate) (3,4-dimethylphenolate)aluminum, bis(2-methyl-8-quinolinolate) (3,5-dimethylphenolate)aluminum, bis(2-methyl-8-quinolinolate) (3,5-di-t-butylphenolate)aluminum, bis(2-methyl-8-quinolinolate) (2,6-diphenylphenolate)aluminum, bis(2-methyl-8-quinolinolate) (2,4,6-triphenylphenolate)aluminum, bis(2-methyl-8-quinolinolate) (2,4,6-trimethylphenolate)aluminum, bis(2-methyl-8-quinolinolate) (2,4,5,6-tetramethylphenolate)aluminum, bis(2-methyl-8-quinolinolate) (1-naphtholate)aluminum, bis(2-methyl-8-quinolinolate) (2-naphtholate)aluminum, bis(2,4-dimethyl-8-quinolinolate) (2-phenylphenolate)aluminum, bis(2,4-dimethyl-8-quinolinolate) (3-phenylphenolate)aluminum, bis(2,4-dimethyl-8-quinolinolate) (4-phenylphenolate)aluminum, bis(2,4-dimethyl-8-quinolinolate) (3,5-dimethylphenolate)aluminum, bis(2,4-dimethyl-8-quinolinolate) (3,5-di-t-butylphenolate)aluminum, bis(2-methyl-8-quinolinolate)aluminum-μ-oxo-bis(2-methyl-8-quinolinolate)aluminum, bis(2,4-dimethyl-8-quinolinolate) aluminum-μ-oxo-bis(2,4-dimethyl-8-quinolinolate) aluminum, bis(2-methyl-4-ethyl-8-quinolinolate)aluminum-μ-oxo-bis(2-methyl-4-ethyl-8-quinolinolate)aluminum, bis (2-methyl-4-methoxy-8-quinolinolate)aluminum-μ-oxo-bis (2-methyl-4-methoxy-8-quinolinolate)aluminum, bis(2-methyl-5-cyano-8-quinolinolate)aluminum-μ-oxo-bis(2-methyl-5-cyano-8-quinolinolate)aluminum, bis(2-methyl-5-trifluoromethyl-8-quinolinolate)aluminum-μ-oxo-bis(2-methyl-5-trifluoromethyl-8-quinolinolate)aluminum, and bis(10-hydroxybenzo[h]quinoline)beryllium.

The quinolinol-based metal complex can be produced using a publicly-known raw material and a publicly-known synthesis method.

Thiazole Derivative and Benzothiazole Derivative

The thiazole derivative is a compound represented by formula (ETM-14-1) described below, for example.

Formula 92

$$\phi\text{—(Thiazole-based substituent)}_n \quad \text{(ETM-14-1)}$$

The benzothiazole derivative is a compound represented by formula (ETM-14-2) described below, for example.

Formula 93

$$\phi\text{—(Benzothiazole-based substituent)}_n \quad \text{(ETM-14-2)}$$

Then, φ in each formula is an n-valent aryl ring (preferably, n-valent benzene ring, naphthalene ring, anthracene ring, fluorene ring, benzofluorene ring, phenalene ring, phenanthrene ring or triphenylene ring), n is an integer from 1 to 4, a "thiazole-based substituent" or a "benzothiazole-based substituent" is a substituent in which a pyridyl group in the "pyridine-based substituent" in formula (ETM-2), formula (ETM-2-1) and formula (ETM-2-2) described above is replaced by a thiazole group or a benzothiazole group, and at least one hydrogen in the thiazole derivative and the benzothiazole derivative may be replaced by deuterium.

Formula 94

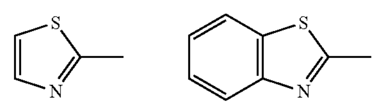

Thiazole group Benzothiazole group

Then, φ is further preferably an anthracene ring or a fluorene ring, and in a structure in this case, the description in formula (ETM-2-1) or formula (ETM-2-2) described above can be cited, and in $R^{11}$ to $R^{18}$ in each formula, the description in formula (ETM-2-1) or formula (ETM-2-2) described above can be cited. Moreover, in formula (ETM-2-1) or formula (ETM-2-2) described above, description is performed in a form in which two pyridine-based substituents are bonded thereto, and in replacement thereof to the thiazole-based substituent (or the benzothiazole-based substituent), both of the pyridine-based substituents may be replaced by the thiazole-based substituent (or the benzothiazole-based substituent) (namely, n=2), or any one of the pyridine-based substituents may be replaced by the thiazole-based substituent (or the benzothiazole-based substituent) and the other pyridine-based substituents may be replaced by $R^{11}$ to $R^{18}$ (namely, n=1). Further, for example, at least one of $R^{11}$ to $R^{18}$ in formula (ETM-2-1) described above is replaced by the thiazole-based substituent (or the benzothiazole-based substituent), and the "pyridine-based substituent" may be replaced by $R^{11}$ to $R^{18}$.

The thiazole derivative or the benzothiazole derivative can be produced using a publicly-known raw material and a publicly-known synthesis method.

The electron transport layer or the electron injection layer may further contain a substance that can reduce a material that forms the electron transport layer or the electron injection layer. As the reducing substance, various substances are used if the substances have certain reducibility, and at least one selected from the group of alkali metal, alkaline earth metal, rare earth metal, oxide of alkali metal, halide of alkali metal, oxide of alkaline earth metal, halide of alkaline earth metal, oxide of rare earth metal, halide of rare earth metal, an organic complex of alkali metal, an organic complex of alkaline earth metal and an organic complex of rare earth metal can be preferably used, for example.

Specific examples of a preferred reducing substance include alkali metal such as Na (work function: 2.36 eV), K (the same: 2.28 eV), Rb (the same: 2.16 eV) or Cs (the same: 1.95 eV), or alkaline earth metal such as Ca (the same: 2.9 eV), Sr (the same: 2.0 to 2.5 eV) or Ba (the same: 2.52 eV), and a substance in which the work function is 2.9 eV or less is particularly preferred. Among the substances, a reducing substance is further preferably alkali metal of K, Rb or Cs, still further preferably Rb or Cs, and most preferably Cs. The alkali metals particularly have high reduction ability, and improvement of luminance and extension of service life in the organic EL device are achieved by addition of a comparatively small amount to the material that forms the electron transport layer or the electron injection layer. Moreover, as the reducing substance in which the work function is 2.9 eV or less, a combination of two or more kinds of alkali metal described above is also preferred, and a combination including Cs, for example, a combination of Cs and Na, a combination of Cs and K, a combination of Cs and Rb, or a combination of Cs, Na and K is particularly preferred. Reduction ability can be efficiently developed by including Cs, and the improvement of luminance and the extension of service life in the organic EL device are achieved by addition to the material that forms the electron transport layer or the electron injection layer.

Cathode in Organic Electroluminescent Device

Cathode 108 plays a role of injecting the electron into luminescent layer 105 through electron injection layer 107 and electron transport layer 106.

A material that forms cathode 108 is not particularly limited if a substance that can efficiently inject the electron into the organic layer is applied, and a material similar to the material that forms anode 102 can be used. Above all, metal such as tin, indium, calcium, aluminum, silver, copper, nickel, chromium, gold, platinum, iron, zinc, lithium, sodium, potassium, cesium and magnesium, or an alloy thereof (a magnesium-silver alloy, a magnesium-indium alloy, an aluminum-lithium alloy such as lithium fluoride/aluminum) or the like is preferred. In order to improve electron injection efficiency to improve device properties, lithium, sodium, potassium, cesium, calcium or magnesium, or an alloy containing low work function metal is effective. However, the low work function metals are generally unstable in atmospheric air in many cases. In order to improve this point, for example, a method for using an electrode with high stability by doping a trace amount of lithium, cesium or magnesium into the organic layer is known. As any other dopant, mineral salt such as lithium fluoride, cesium fluoride, lithium oxide and cesium oxide can also be used. However, the dopant is not limited thereto.

Further, in order to protect the electrode, specific preferred examples include lamination of metal such as platinum, gold, silver, copper, iron, tin, aluminum and indium, or an alloy using the metals, an inorganic substance such as silica, titania and silicon nitride, polyvinyl alcohol, vinyl chloride, a hydrocarbon-based polymer compound, and the like. Methods of preparing the electrodes, such as resistance heating, electron beam vapor deposition, sputtering, ion plating and coating, are not particularly limited, either, as long as electrical continuity can be taken.

Binder that May be Used in Each Layer

A material used in the hole injection layer, the hole transport layer, the luminescent layer, the electron transport layer and the electron injection layer described above can form each layer alone, and can also be used as a polymer binder by dispersing the material into a solvent soluble resin such as polyvinyl chloride, polycarbonate, polystyrene, poly(N-vinylcarbazole), polymethyl methacrylate, polybutyl methacrylate, polyester, polysulfone, polyphenylene oxide, polybutadiene, a hydrocarbon resin, a ketone resin, a phenoxy resin, polyamide, ethylcellulose, a vinyl acetate resin, an ABS resin and a polyurethane resin, or a curable resin such as a phenolic resin, a xylene resin, a petroleum resin, a urea resin, a melamine resin, an unsaturated polyester resin, a alkyd resin, an epoxy resin and a silicone resin.

Method for Preparing Organic Electroluminescent Device

Each layer that configures the organic EL device can be formed by forming a material to compose each layer into a thin film by a method such as a vapor deposition method, resistance heating vapor deposition, electron beam vapor deposition, sputtering, a molecular stacking method, a printing method, a spin coating method, a cast method or a coating method. A film thickness of each layer thus formed is not particularly limited, and can be appropriately set according to properties of the material. The film thickness is ordinarily in the range of 2 nanometers to 5000 nanometers. The film thickness can be ordinarily measured by a crystal oscillator type film thickness measurement system or the like. When a thin film of the layer is formed using the vapor deposition method, vapor deposition conditions thereof are different depending on a kind of the material, an objective crystal structure and aggregate structure of the film, or the like. In general, the vapor deposition conditions are preferably appropriately set in the range of +50 to +400° C. in boat heating temperature, $10^{-6}$ to $10^{-3}$ Pa in a vacuum degree, 0.01 to 50 nanometers/second in a deposition rate, −150 to +300° C. in a substrate temperature, and 2 nanometers to 5 micrometers in a film thickness.

Next, as one example of a method for preparing the organic EL device, a method for preparing the organic EL device formed of an anode/a hole injection layer/a hole transport layer/a luminescent layer composed of a host material and a dopant material/an electron transport layer/an electron injection layer/a cathode will be described. A thin film of an anode material is formed on a suitable substrate by the vapor deposition method or the like to prepare the anode, and then a thin film of the hole injection layer and the hole transport layer is formed on the anode. A thin film is formed thereon by performing co-deposition of the host material and the dopant material to prepare the luminescent layer, the electron transport layer and the electron injection layer are formed on the luminescent layer, and a thin film composed of a substance for a cathode is further formed by the vapor deposition method or the like to prepare the cathode, and thus an objective organic EL device can be obtained. In addition, in preparation of the organic EL device described above, the device can also be prepared by reversing a preparation order in the order of the cathode, the electron injection layer, the electron transport layer, the luminescent layer, the hole transport layer, the hole injection layer and the anode.

When direct current voltage is applied to the thus obtained organic EL device, the voltage only needs to be applied by using the anode as positive polarity and the cathode as negative polarity, and if a voltage of about 2 to 40 V is applied thereto, luminescence can be observed from a transparent or translucent electrode side (anode or cathode, and both). Moreover, the organic EL device causes luminescence also when pulse current or alternate current is applied thereto. In addition, a waveform of the alternating current to be applied may be arbitrary.

Example of Application of Organic Electroluminescent Device

Moreover, the invention can also be applied to a display unit equipped with the organic EL device, a lighting unit equipped with the organic EL device, or the like.

The display unit or the lighting unit equipped with the organic EL device can be produced according to a publicly-known method such as connection of the organic EL device according to the present embodiment to a publicly-known driving device, and can be driven by appropriately using a publicly-known driving method such as direct current drive, pulse drive and alternating current drive.

Specific examples of the display unit include a panel display such as a color flat-panel display, and a flexible display such as a flexible color organic electroluminescent (EL) display (for example, refer to JP H10-335066 A, JP 2003-321546 A, JP 2004-281086 A or the like). Moreover, specific examples of a display mode of the display include a matrix mode and/or a segment mode. In addition, matrix display and segment display may coexist in the same panel.

In a matrix, pixels for display are two-dimensionally arranged such as in a lattice form or a mosaic form, and a character and an image are displayed by aggregation of the pixels. A shape or a size of the pixel is determined according to the application. For example, a pixel of a 300 micrometers or less square is ordinarily used for image and character display in a personal computer, a monitor and a television, and in the case of a large display such as a display panel, a pixel in the order of millimeters in one side is used. In monochrome display, pixels with the same color only need to be aligned, but in color display, a red pixel, a green pixel and a blue pixel are displayed side by side. In this case, the display typically has a delta type and a stripe type. Then, a driving method of the matrix may be any of a line sequential driving method or an active matrix. Line sequential driving has an advantage of a simpler structure, but when operating properties are taken into account, the active matrix may be occasionally superior, and therefore different methods are required to be used depending on the application.

In the segment mode (type), a pattern is formed so as to display predetermined information to cause luminescence of a determined region. Specific examples thereof include time and temperature display in a digital watch/clock or a thermometer, operating status display of audio equipment, an electromagnetic cooker and the like, and panel display of an automobile.

Specific examples of the lighting unit include a lighting unit of indoor lighting or the like, and a backlight of a liquid crystal display device (for example, refer to JP 2003-257621 A, JP 2003-277741 A, JP 2004-119211 A or the like). The backlight is mainly used for the purpose of improving visibility of the display unit that does not cause self-luminescence, and is used in the liquid crystal display device, a watch/clock, an audio unit, an automobile panel, a display panel, a sign and the like. In particular, considering that, as the backlight for a liquid crystal display device application, above all, a personal computer application in which thickness reduction becomes a problem, the backlight is formed of a fluorescent lamp or a lightguide plate according to a conventional system, and therefore thickness reduction is difficult, the backlight using the luminescent device according to the present embodiment has features of thinness and lightweight.

3-2. Any Other Organic Device

The polycyclic aromatic compound according to the invention can be used for preparation of the organic field effect transistor, the organic thin film photovoltaic cell or the like in addition to the organic electroluminescent device described above.

The organic field effect transistor means a transistor in which electric current is controlled by an electric field generated by voltage input, in which a gate electrode is provided in addition to a source electrode and a drain electrode. The organic field effect transistor refers to the transistor in which, if voltage is applied to the gate electrode, the electric field is generated, and electric current can be controlled by arbitrarily blocking a flow of the electron (or hole) that flows between the source electrode and the drain electrode. A field effect transistor is easier to reduce a size in comparison with a mere transistor (bipolar transistor), and is commonly used as a device constituting an integrated circuit or the like.

In a structure of the organic field effect transistor, the source electrode and the drain electrode are ordinarily provided in contact with an organic semiconductor active layer formed using the polycyclic aromatic compound according to the invention, and further the gate electrode only needs to be provided by interposing an insulation layer (dielectric layer) in contact with the organic semiconductor active layer. Specific examples of a device structure thereof include a structure described below:

(1) substrate/gate electrode/insulation layer/source electrode-drain electrode/organic semiconductor active layer;
(2) substrate/gate electrode/insulation layer/organic semiconductor active layer/source electrode-drain electrode;
(3) substrate/organic semiconductor active layer/source electrode-drain electrode/insulation layer/gate electrode; and
(4) substrate/source electrode-drain electrode/organic semiconductor active layer/insulation layer/gate electrode.

The organic field effect transistor thus configured can be applied as a liquid crystal display of an active matrix driving mode, a pixel driving switching device of an organic electroluminescence display, or the like.

The organic thin film photovoltaic cell has a structure in which the anode such as ITO, the hole transport layer, a photoelectric conversion layer, the electron transport layer and the cathode are stacked on a transparent substrate such as glass. The photoelectric conversion layer has a p-type semiconductor layer on a side of the anode, and an n-type semiconductor layer on a side of the cathode. The polycyclic aromatic compound according to the invention can be used as a material of the hole transport layer, the p-type semiconductor layer, the n-type semiconductor layer and the electron transport layer according to physical properties thereof. The polycyclic aromatic compound according to the invention can function as a hole transport material or an electron transport material in the organic thin film photovoltaic cell. The organic thin film photovoltaic cell may appropriately have a hole block layer, an electron block layer, the electron injection layer, the hole injection layer, a smoothing layer or the like in addition to the layers description above. In the organic thin film photovoltaic cell, known materials used in the organic thin film photovoltaic cell can be appropriately selected, combined, and used.

EXAMPLES

The invention will be further specifically described using Examples as described below. However, the invention is not limited by the Examples.

First, a synthesis example of a polycyclic aromatic compound of the invention will be described below.

Formula 95

(1-50)

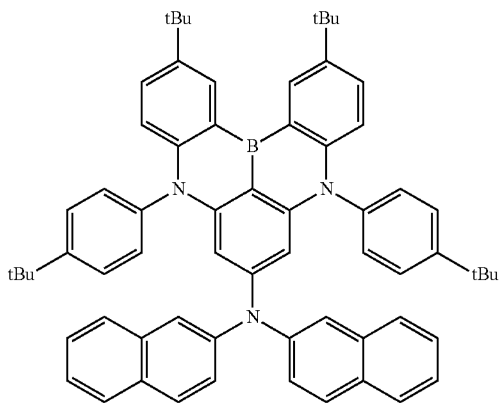

(1-66)

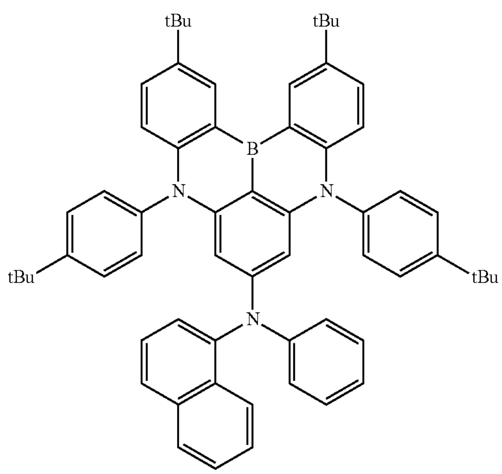

(1-124)

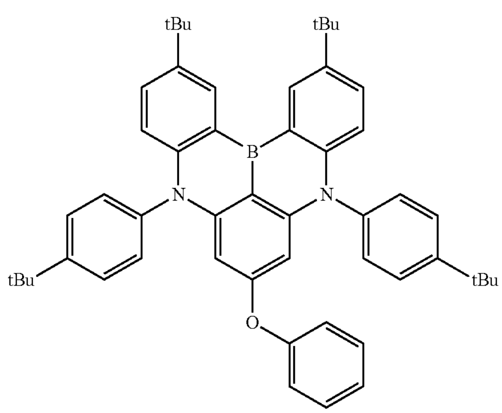

-continued (1-128)

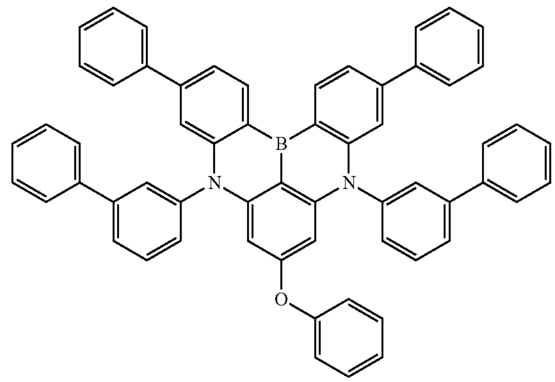

(1-132)

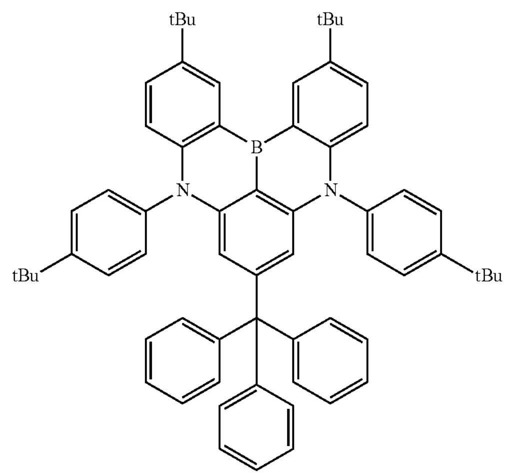

(1-136)

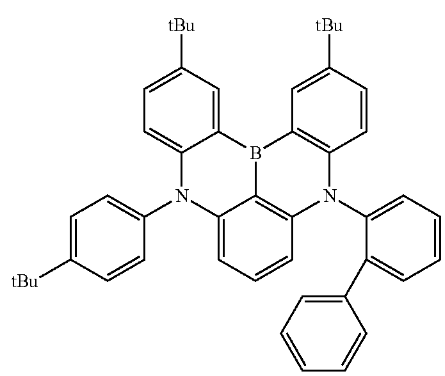

-continued
Formula 96
(1-166)
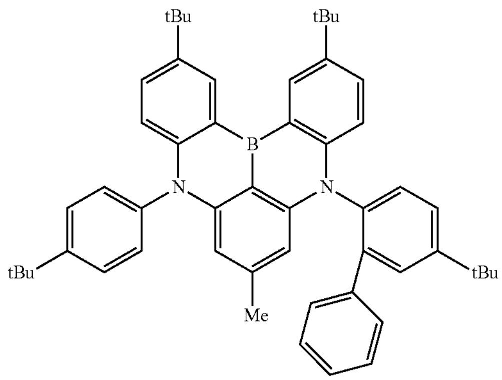
(1-170)
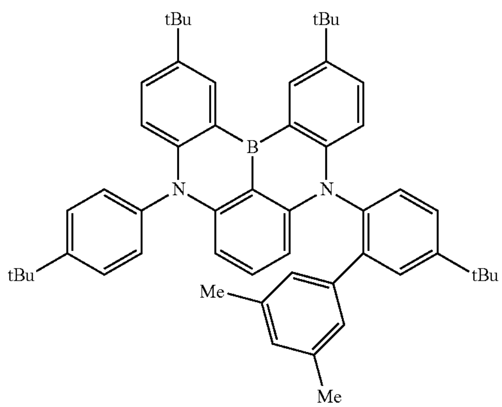
(1-180)
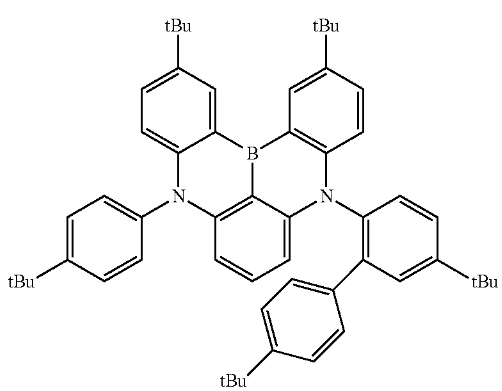
-continued
(1-200)
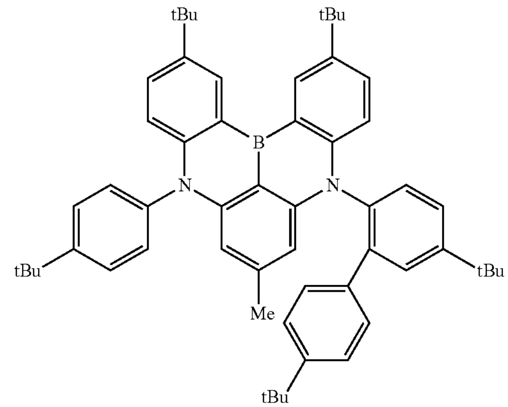
(1-208)
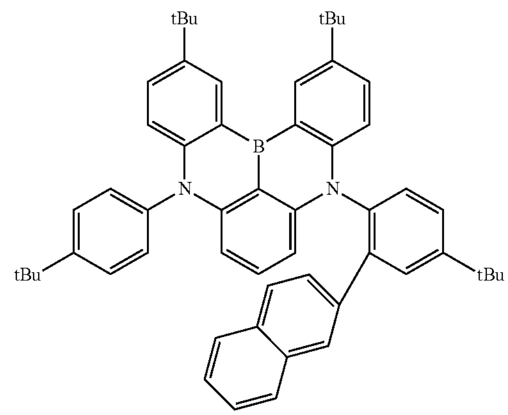
(1-216)
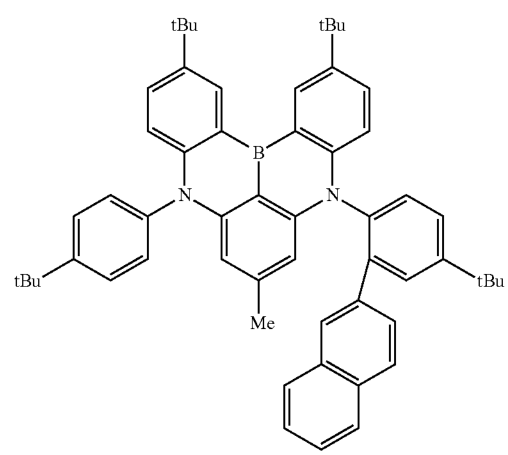

-continued
Formula 97
(1-240)
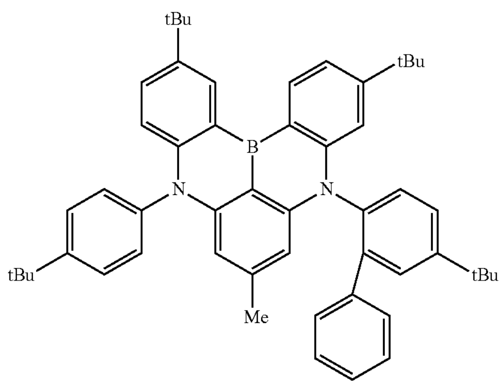
(1-244)
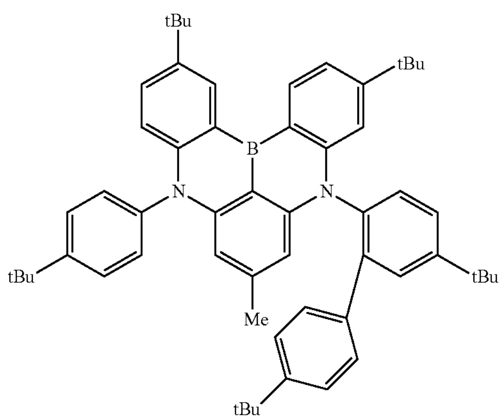
(1-252)
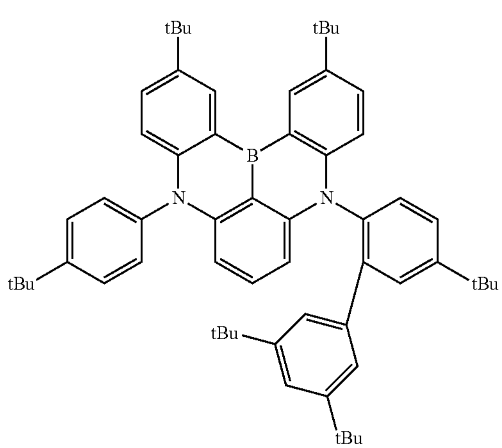
-continued
(1-296)
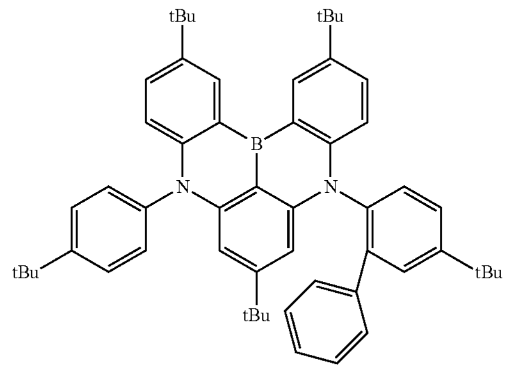
Formula 98
(1-300)
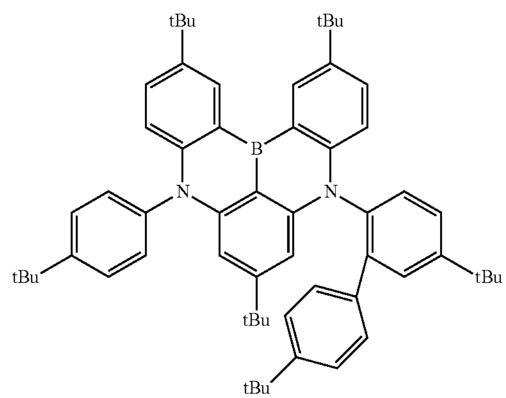
(1-715)
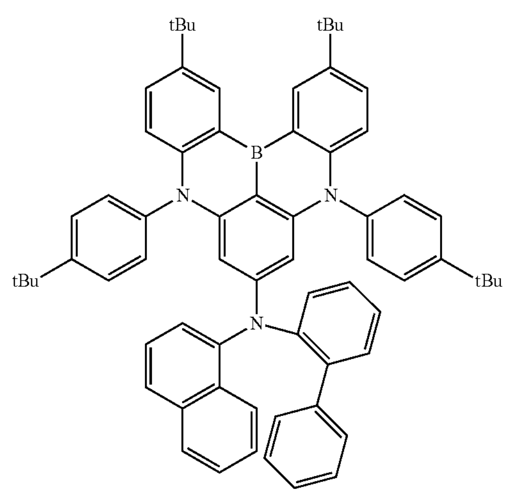

-continued (1-730)

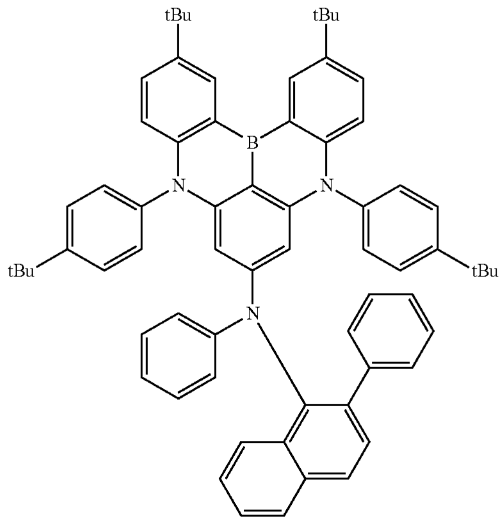

(1-733)

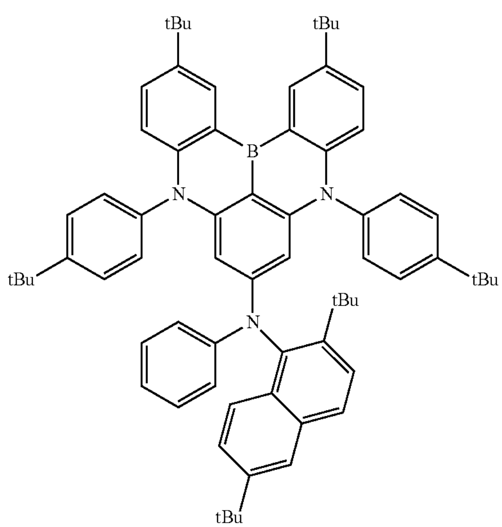

Synthesis Example (1)

Synthesis of Compound (1-50)

Formula 99

(1-50)

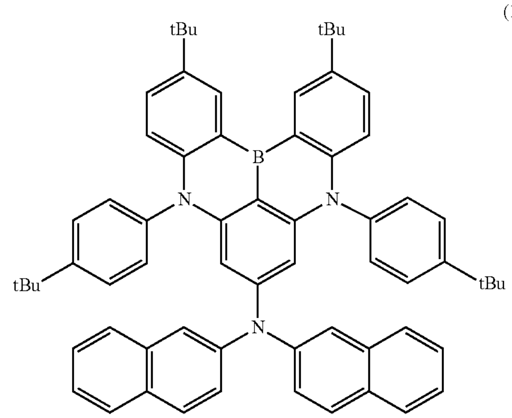

Under a nitrogen atmosphere, in a flask in which 3,4,5-trichloroaniline (7.0 g), 2-bromonaphthalene (22.0 g), dichlorobis[(di-t-butyl(4-dimethylaminophenyl)phosphino) palladium (Pd-132, 0.25 g) as a palladium catalyst, sodium-t-butoxide (NaOtBu, 8.6 g) and xylene (130 mL) were put, the resulting mixture was heated and stirred at 130° C. for 1 hour, and then the resulting reaction mixture was cooled down to room temperature, and then water and ethyl acetate were added thereto, and liquid was separated. An organic layer was washed with water, and then a solvent was distilled off under reduced pressure. Then, the resulting residue was purified with a silica gel column (eluent: toluene/heptane=1/9 (volume ratio)) to obtain intermediate (A) (15.0 g).

Formula 100

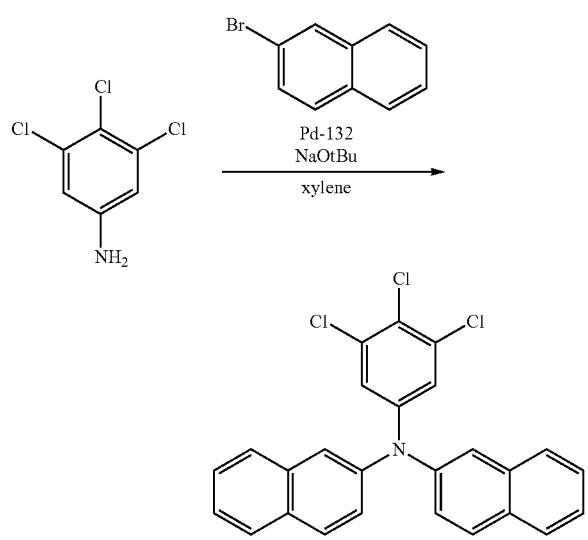

(A)

Under a nitrogen atmosphere, in a flask in which intermediate (A) (15.0 g), bis(4-(t-butyl)phenylamine (20.7 g), bis(dibenzylideneacetone)palladium(0) (Pd(dba)$_2$, 0.38 g), 2-dicyclohexylphosphino-2',6'-dimethoxybiphenyl (SPhos, 0.69 g), NaOtBu (8.0 g) and xylene (120 mL) were put, the resulting mixture was heated and stirred at 100° C. for 2 hours. The resulting reaction mixture was cooled down to room temperature, and then water and ethyl acetate were added thereto, and liquid was separated. An organic layer was washed with water, and then a solvent was distilled off under reduced pressure. Then, the resulting residue was purified with a silica gel short-pass column (eluent: toluene) and subjected to reprecipitation in heptane to obtain intermediate (B) (14.0 g).

Formula 101

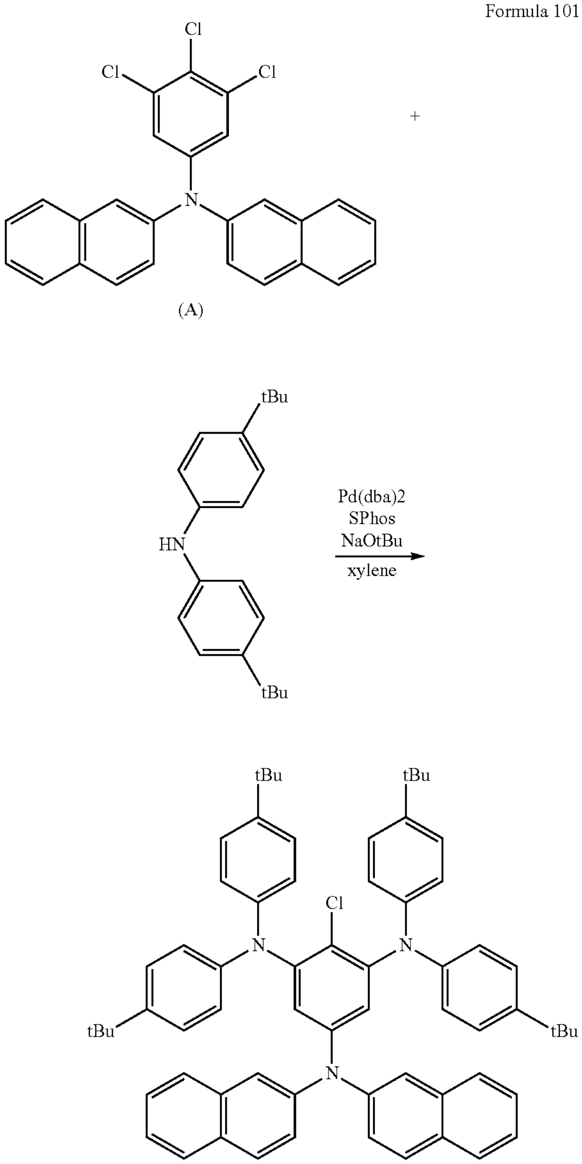

Under a nitrogen atmosphere, in a flask in which intermediate (B) (14.0 g) and t-butylbenzene (250 mL) were put, while the resulting mixture was cooled in an ice bath, a t-butyllithium/pentane solution (1.62 M, 18.4 mL) was added thereto. After completion of dropwise addition, the resulting mixture was heated to 70° C. and stirred for 1 hour, and then a component having a boiling point lower than t-butylbenzene was distilled off under reduced pressure. The resulting mixture was cooled down to −50° C., boron tribromide (7.5 g) was added thereto, and the resulting mixture was heated to room temperature and stirred for 0.5 hour. Then, the resulting mixture was cooled again in an ice bath, and N,N-diisopropylethylamine (3.9 g) was added thereto. The resulting mixture was stirred at room temperature until heat generation ceased, and then heated to 100° C., and heated and stirred for 1 hour. The resulting reaction mixture was cooled down to room temperature, and an aqueous sodium acetate solution cooled in an ice bath, and subsequently ethyl acetate were added thereto, and liquid was separated, and then a solvent was distilled off under reduced pressure, and the resulting residue was washed with heptane. Then, the resulting residue was purified with a silica gel short-pass column (eluent: toluene), further subjected to reprecipitation in heptane, and finally sublimated and purified to obtain a compound represented by formula (1-50) (6.2 g).

Formula 102

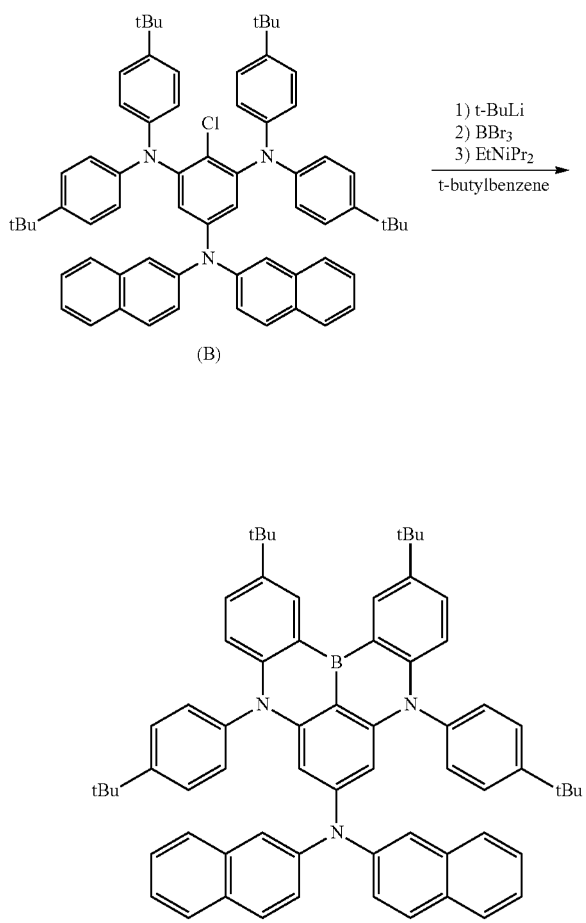

A structure of the compound obtained was confirmed by NMR measurement.

$^1$H-NMR: 5=8.97 (s, 2H), 7.68 (d, 2H), 7.54 (d, 2H), 7.51 (d, 2H), 7.47 (d, 2H), 7.41 (s, 2H), 7.39-7.32 (m, 4H), 7.25 (d, 4H), 7.13-7.10 (m, 6H), 6.76 (d, 2H), 5.69 (s, 2H), 1.47 (s, 18H), 0.97 (s, 18H).

Synthesis Example (2)

Synthesis of Compound (1-66)

Formula 103

(1-66)

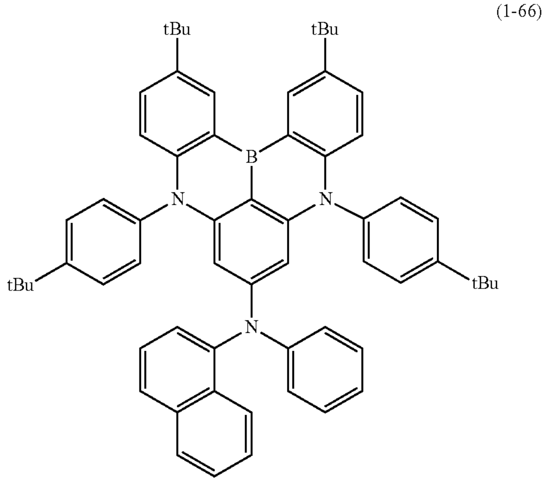

Under a nitrogen atmosphere, in a flask in which 3,4,5-trichloro-N-phenylaniline (10.0 g), 1-bromonaphthalene (9.1 g), Pd-132 (0.26 g), NaOtBu (5.3 g) and xylene (75 mL) were put, the resulting mixture was heated and stirred at 100° C. for 1 hour. The resulting reaction mixture was cooled down to room temperature, and then water and ethyl acetate were added thereto, and liquid was separated. An organic layer was washed with water, and then a solvent was distilled off under reduced pressure. Then, the resulting residue was purified with a silica gel short-pass column (eluent: toluene), and further subjected to reprecipitation in heptane to obtain intermediate (C) (11.0 g).

Formula 104

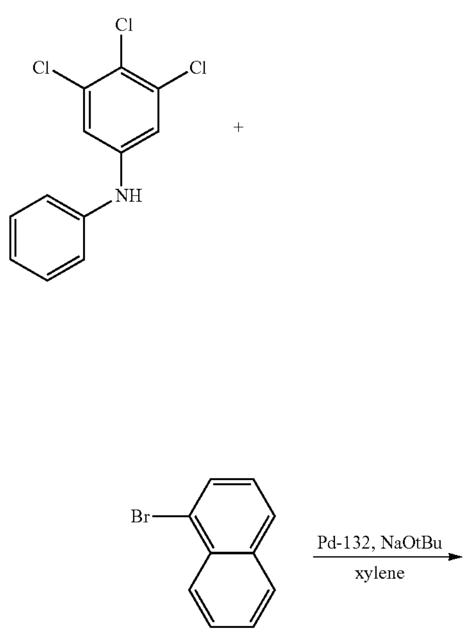

-continued

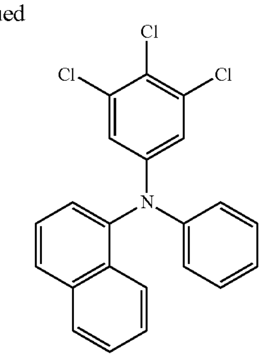

(C)

Under a nitrogen atmosphere, in a flask in which intermediate (C) (11.0 g), bis(4-(t-butyl)phenyl)amine (17.1 g), $Pd(dba)_2$ (0.32 g), SPhos (0.57 g), NaOtBu (6.6 g) and xylene (90 mL) were put, the resulting mixture was heated and stirred at 110° C. for 1 hour. The resulting reaction mixture was cooled down to room temperature, and then water and ethyl acetate were added thereto, and liquid was separated. An organic layer was washed with water, and then a solvent was distilled off under reduced pressure. Then, the resulting residue was purified with a silica gel short-pass column (eluent: toluene) and subjected to reprecipitation in heptane to obtain intermediate (D) (14.6 g).

Formula 105

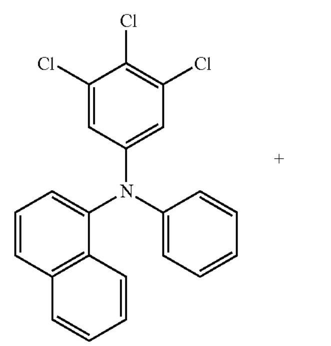

(C)

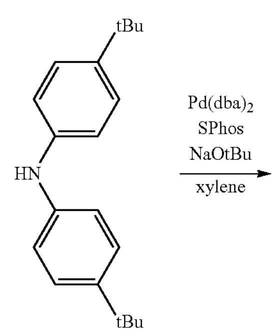

-continued

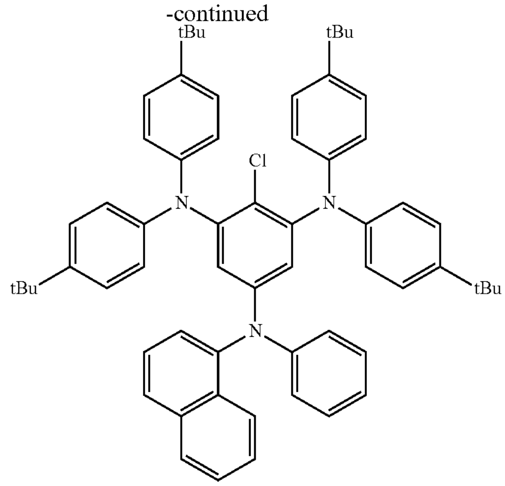

(D)

-continued

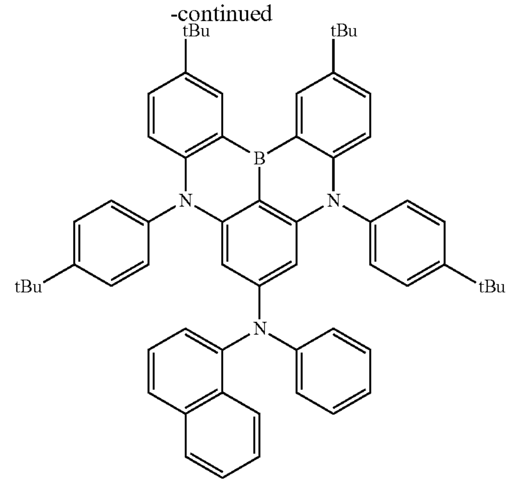

(1-66)

Under a nitrogen atmosphere, in a flask in which intermediate (D) (14.5 g) and t-butylbenzene (120 mL) were put, while the resulting mixture was cooled in an ice bath, a t-butyllithium/pentane solution (1.62 M, 20.1 mL) was added thereto. After completion of dropwise addition, the resulting mixture was heated to 70° C. and stirred for 1 hour, and then a component having a boiling point lower than t-butylbenzene was distilled off under reduced pressure. The resulting mixture was cooled down to −50° C., boron tribromide (8.2 g) was added thereto, and the resulting mixture was heated to room temperature and stirred for 0.5 hour. Then, the resulting mixture was cooled again in an ice bath, and N,N-diisopropylethylamine (4.2 g) was added thereto. The resulting mixture was stirred at room temperature until heat generation ceased, and then heated to 100° C., and heated and stirred for 1 hour. The resulting reaction mixture was cooled down to room temperature, and an aqueous sodium acetate solution cooled in an ice bath, and subsequently ethyl acetate were added thereto, and liquid was separated, and then a solvent was distilled off under reduced pressure, and the resulting residue was washed with heptane. Then, the resulting residue was purified with a silica gel short-pass column (eluent: toluene), further subjected to reprecipitation in heptane, and finally sublimated and purified to obtain a compound represented by formula (1-66) (5.0 g).

Formula 106

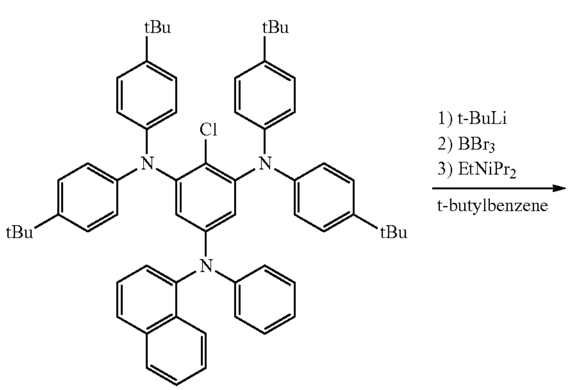

(D)

A structure of the compound obtained was confirmed by NMR measurement.

$^1$H-NMR (400 MHz, $CDCl_3$): δ=8.92 (s, 2H), 7.79 (d, 1H), 7.67 (d, 1H), 7.56 (d, 1H), 7.42 (dd, 3H), 7.28-7.21 (m, 7H), 7.06-6.95 (m, 8H), 6.84 (t, 1H), 6.68 (d, 2H), 5.40 (s, 2H), 1.45 (s, 18H), 1.31 (s, 18H).

Synthesis Example (3)

Synthesis of Compound (1-124)

Formula 107

(1-124)

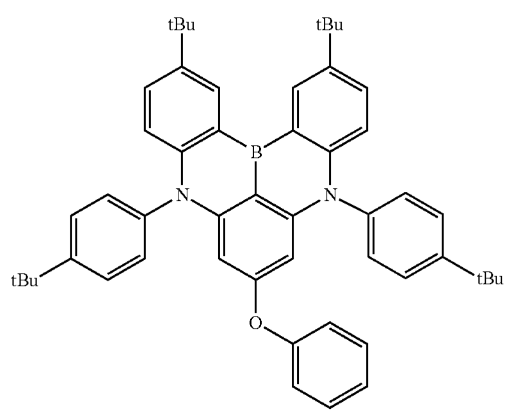

Under a nitrogen atmosphere, in a flask in which phenol (4.4 g), potassium carbonate (8.2 g) and N-methylpyrrolidone (NMP, 80 mL) were put, 1,3-dibromo-5-fluorobenzene (10.0 g) was added at room temperature, and the resulting mixture was heated and stirred at 180° C. for 2 hours. After the reaction, the resulting mixture was cooled down to room temperature, and then water and toluene were added thereto, and liquid was separated. An organic layer was washed with water, and then a solvent was distilled off under reduced pressure. Then, the resulting residue was purified with a silica gel short-pass column (eluent: toluene/heptane=1/1 (volume ratio)) to obtain 1,3-dibromo-5-phenoxybenzene (11.0 g).

Formula 108

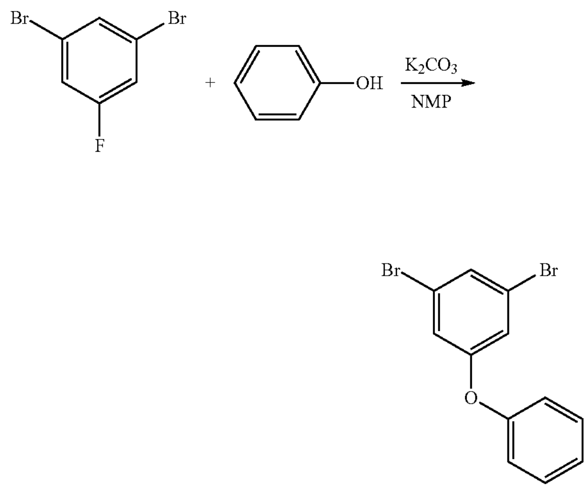

Under a nitrogen atmosphere, in a flask in which 1,3-dibromo-5-phenoxybenzene (11.0 g), bis(4-(t-butyl)phenyl) amine (20.8 g), Pd-132 (0.24 g), NaOtBu (8.1 g) and xylene (70 mL) were put, the resulting mixture was heated and stirred at 100° C. for 0.5 hour. The resulting reaction mixture was cooled down to room temperature, and then water and ethyl acetate were added thereto, and liquid was separated. An organic layer was washed with water, and then a solvent was distilled off under reduced pressure. Then, the resulting residue was purified with a silica gel short-pass column (eluent: toluene) and subjected to reprecipitation in heptane to obtain intermediate (E) (15.3 g).

Formula 109

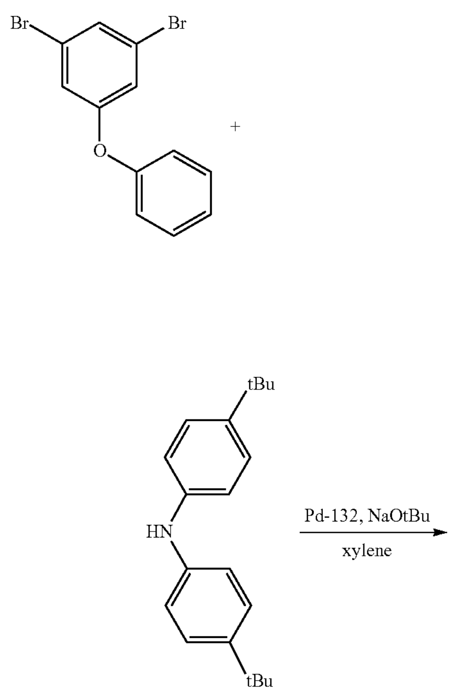

-continued

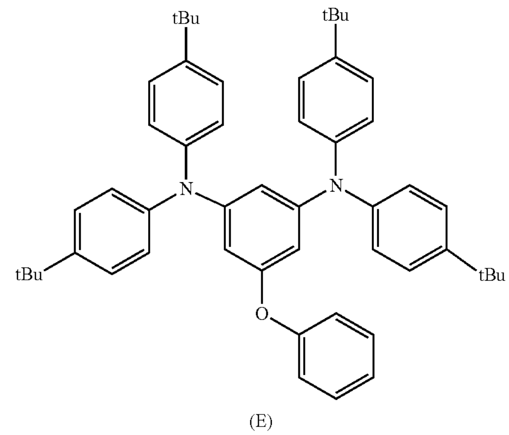

(E)

Under a nitrogen atmosphere, in a flask in which intermediate (E) (15.0 g) and o-dichlorobenzene (80 mL) were put, boron tribromide (15.0 g) was added at room temperature, and then the resulting mixture was heated and stirred at 170° C. for 6 hours. The resulting reaction mixture was cooled down to room temperature, an aqueous sodium acetate solution cooled in an ice bath was added thereto, and the resulting mixture was stirred at room temperature for 1 hour, and then an organic layer was washed with water. An organic layer was washed with water, and then a solvent was distilled off under reduced pressure. Then, the resulting residue was purified with a silica gel column (eluent: toluene/heptane=1/3 (volume ratio)), further subjected to reprecipitation in heptane, and then subjected to recrystallization in chlorobenzene to obtain a compound represented by formula (1-124) (0.62 g).

Formula 110

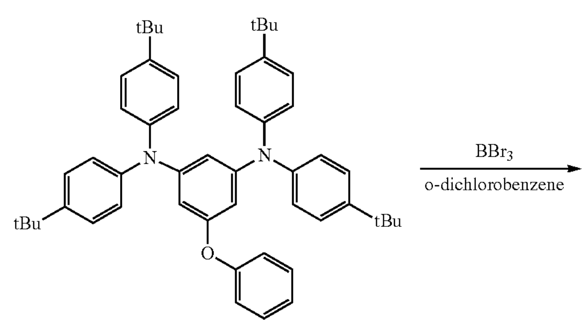

(E)

-continued

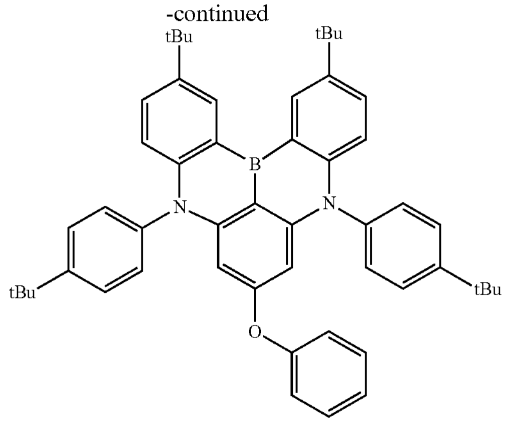

(1-124)

A structure of the compound obtained was confirmed by NMR measurement.

$^1$H-NMR: δ=8.98 (s, 2H), 7.57 (d, 4H), 7.49 (dd, 2H), 7.21 (d, 4H), 7.15 (t, 2H), 6.97 (t, 1H), 6.86 (d, 2H), 6.73 (d, 2H), 5.66 (s, 2H), 1.47 (s, 18H), 1.39 (s, 18H).

Synthesis Example (4)

Synthesis of Compound (1-128)

Formula 111

Formula 112

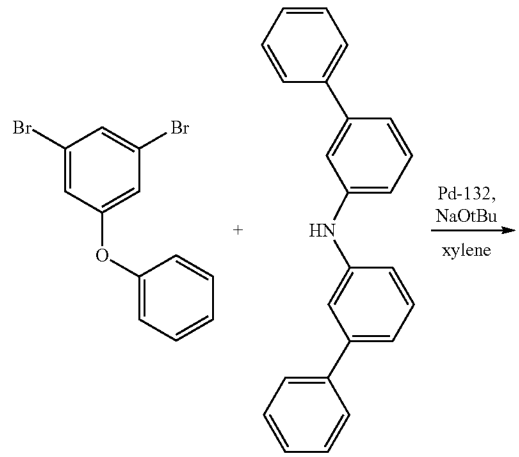

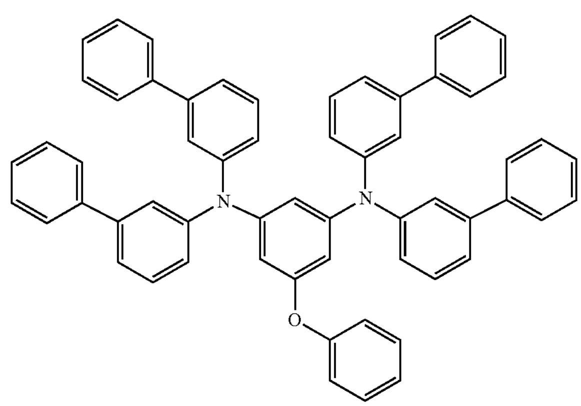

(F)

(1-128)

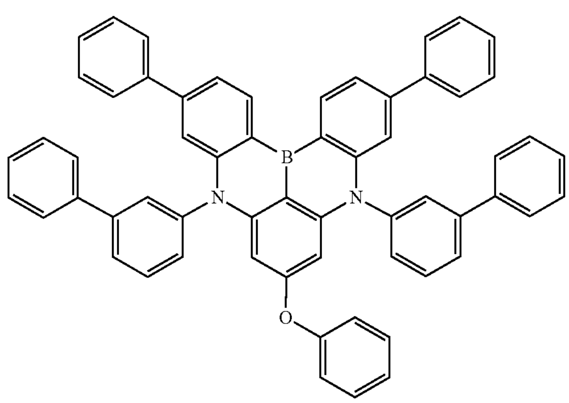

Under a nitrogen atmosphere, in a flask in which 1,3-dibromo-5-phenoxybenzene (9.7 g), di([1,1'-biphenyl]-3-yl) amine (21.0 g), Pd-132 (0.34 g), NaOtBu (6.9 g) and xylene (100 mL) were put, the resulting mixture was heated and stirred at 100° C. for 1 hour. The resulting reaction mixture was cooled down to room temperature, and then water and ethyl acetate were added thereto, and liquid was separated. An organic layer was washed with water, and then a solvent was distilled off under reduced pressure. Then, the resulting residue was purified with a silica gel short-pass column (eluent: toluene) and subjected to reprecipitation in heptane to obtain intermediate (F) (21.0 g).

Under a nitrogen atmosphere, in a flask in which intermediate (F) (21.0 g) and o-dichlorobenzene (100 mL) were put, boron tribromide (20.0 g) was added at room temperature, and then the resulting mixture was heated and stirred at 170° C. for 14 hours. The resulting reaction mixture was cooled down to room temperature, an aqueous sodium acetate solution cooled in an ice bath was added thereto, and the resulting mixture was stirred at room temperature for 1 hour. An organic layer was washed with water, and then a solvent was distilled off under reduced pressure. Then, the resulting residue was purified with a silica gel column (eluent: toluene/heptane=1/1 (volume ratio)), and further subjected to reprecipitation in heptane to obtain a compound represented by formula (1-128) (6.7 g).

Formula 113
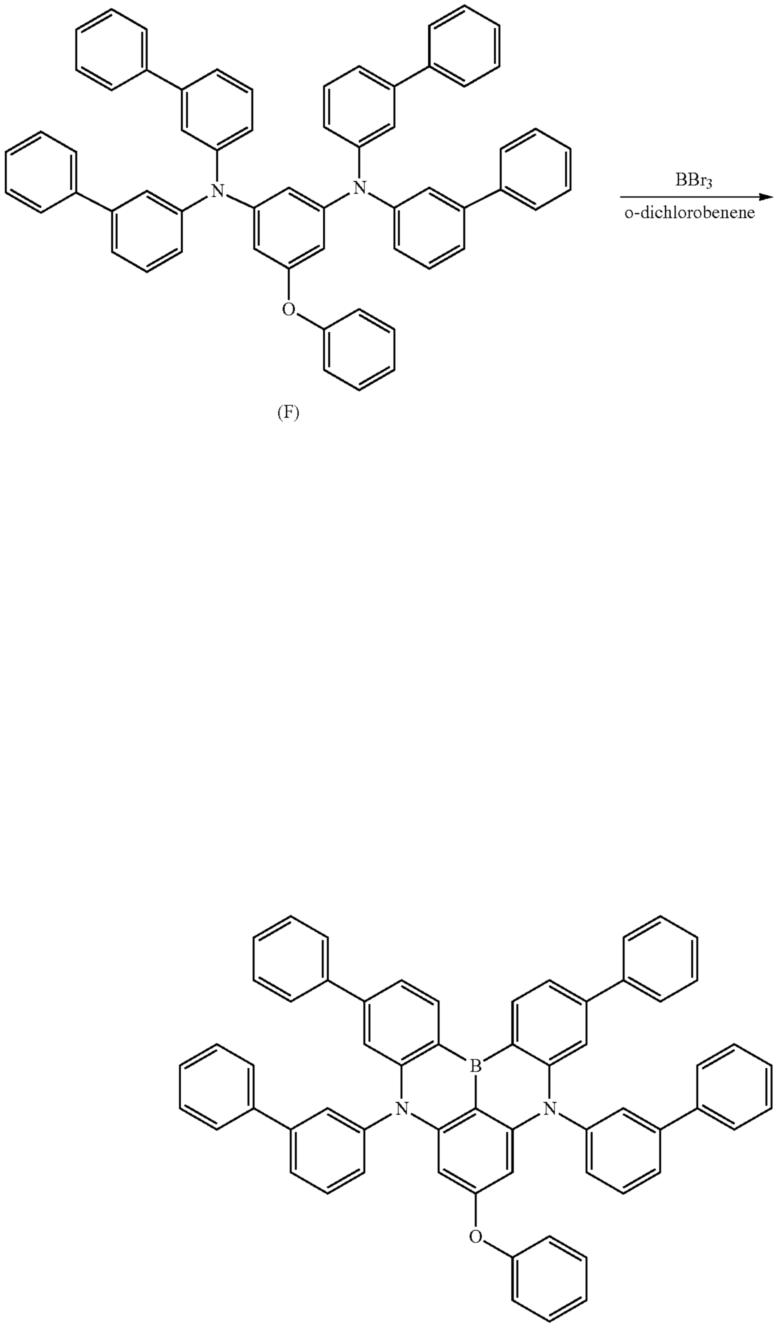

A structure of the compound obtained was confirmed by NMR measurement.

$^1$H-NMR: δ=9.05 (d, 2H), 7.76 (d, 2H), 7.74 (t, 2H), 7.63-7.59 (m, 6H), 7.56 (dd, 2H), 7.54 (d, 4H), 7.46 (t, 4H), 7.44-7.30 (m, 10H), 7.09-7.06 (m, 4H), 6.92 (t, 1H), 6.84 (d, 2H), 5.82 (s, 2H).

Synthesis Example (5)

Synthesis of Compound (1-132)

Formula 114

(1-132)

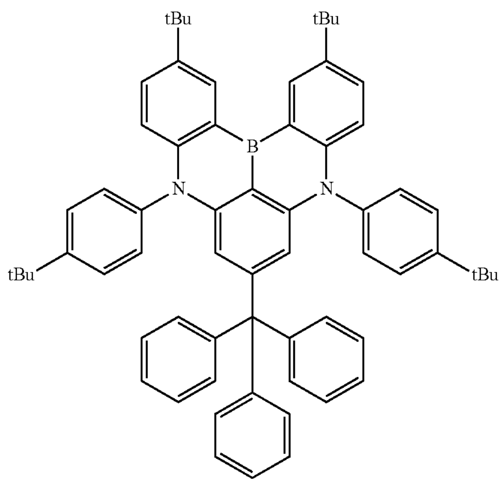

Under a nitrogen atmosphere, 4-tritylaniline (25.0 g), acetonitrile (MeCN, 100 mL), tetrahydrofuran (THF, 150 mL), chlorobenzene (100 mL) and N-methylpyrrolidone (NMP, 50 mL) were put in a flask, and the resulting mixture was heated to be uniformly dissolved, and cooled down to room temperature again. Thereto, bromine (29.8 g) was added dropwise, and the resulting mixture was stirred for 1 hour. After the reaction, an aqueous sodium sulfite solution was added thereto to stop the reaction, and then toluene was added thereto, and the resulting mixture was stirred, and an organic layer was separated, and further was washed with water. The organic layer was concentrated, and heptane was added thereto, and an objective substance was precipitated to obtain 2,6-dibromo-4-tritylaniline (27.5 g).

Formula 115

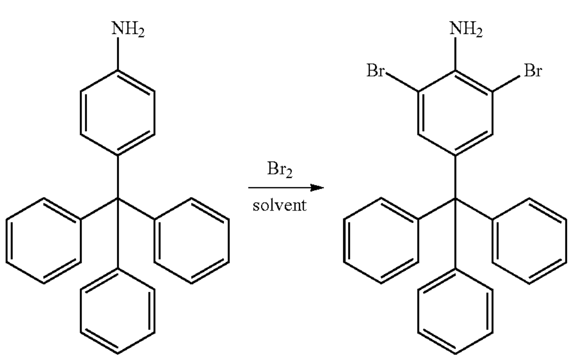

Under a nitrogen atmosphere, in a flask in which 2,6-dibromo-4-tritylaniline (13.0 g), copper chloride (4.3 g) and acetonitrile (MeCN, 150 mL) were put, the resulting mixture was heated at 60° C., acetonitrile (MeCN, 20 mL) of t-butyl nitrite (4.3 mL) was added dropwise thereto for about 5 minutes, and the resulting mixture was stirred for 30 hours. After the reaction, the resulting mixture was cooled down to room temperature, and then dilute hydrochloric acid was added thereto to stop the reaction. Thereto, toluene was added, the resulting mixture was stirred and then liquid was separated, and an organic layer was washed with water and concentrated, and a crude product obtained was purified with a silica gel short-pass column (eluent: toluene) to obtain 1,3-dibromo-2-chloro-5-tritylbenzene (10.5 g).

Formula 116

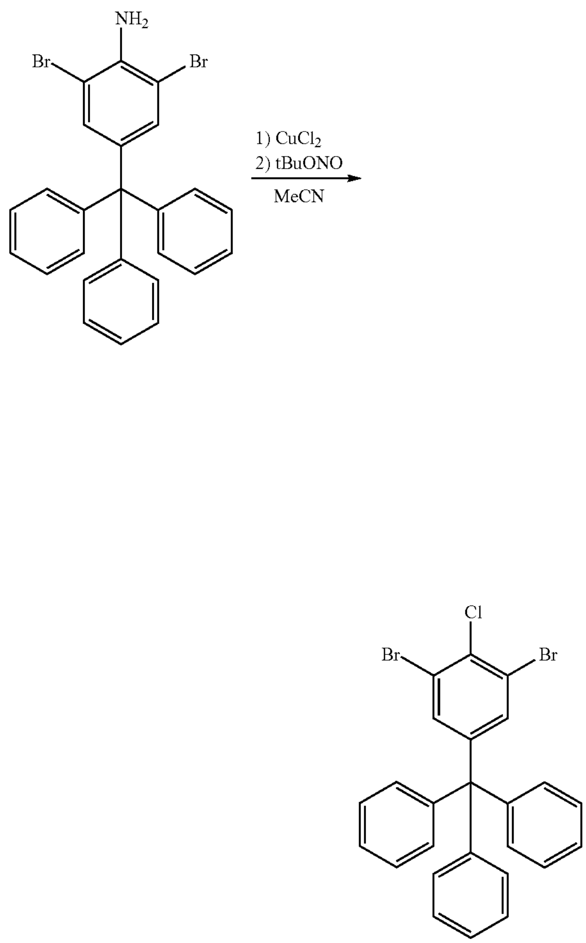

Under a nitrogen atmosphere, in a flask in which 1,3-dibromo-2-chloro-5-tritylbenzene (8.0 g), bis(4-(t-butyl)phenyl)amine (9.7 g), Pd-132 (0.11 g), NaOtBu (3.7 g) and xylene (80 mL) were put, the resulting mixture was heated and stirred at 100° C. for 2 hours. The resulting reaction mixture was cooled down to room temperature, and then water and ethyl acetate were added thereto, and liquid was separated. An organic layer was washed with water, and then a solvent was distilled off under reduced pressure. Then, the resulting residue was purified with a silica gel short-pass column (eluent: toluene) and subjected to reprecipitation in heptane to obtain intermediate (G) (13.1 g).

Formula 117

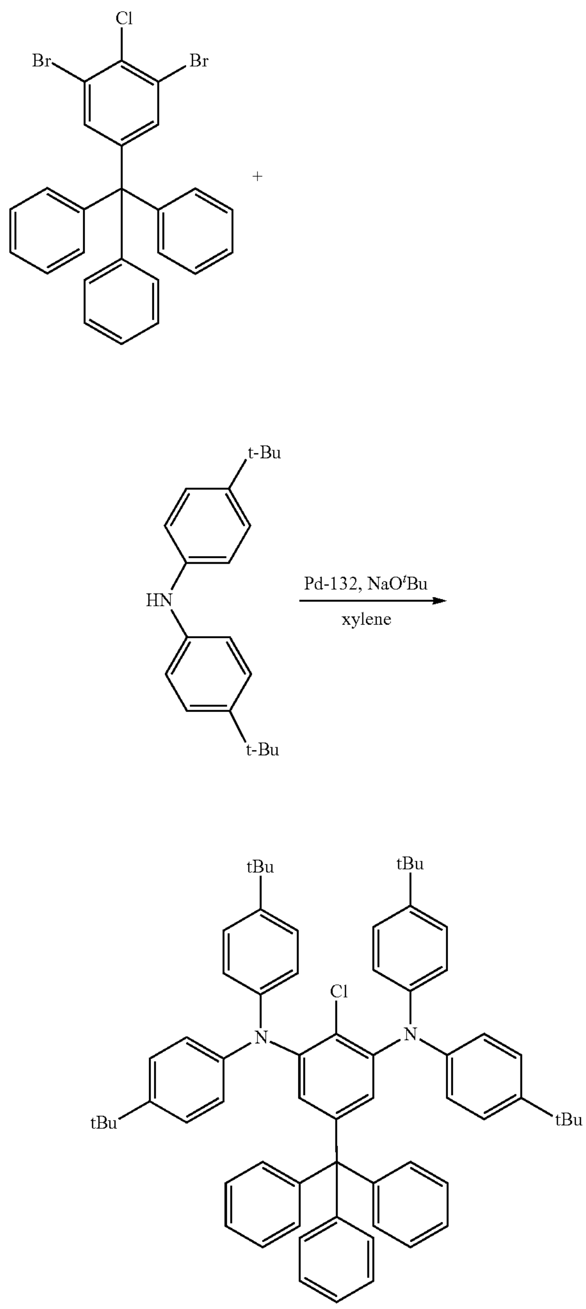

(G)

Under a nitrogen atmosphere, in a flask in which intermediate (G) (13.0 g) and t-butylbenzene (190 mL) were put, while the resulting mixture was cooled in an ice bath, a t-butyllithium/pentane solution (1.64 M, 17.3 mL) was added thereto. After completion of dropwise addition, the resulting mixture was heated to 80° C. and stirred for 1 hour, and then a component having a boiling point lower than t-butylbenzene was distilled off under reduced pressure. The resulting mixture was cooled down to −50° C., boron tribromide (7.1 g) was added thereto, and the resulting mixture was heated to room temperature and stirred for 0.5 hour. Then, the resulting mixture was cooled again in an ice bath, and N,N-diisopropylethylamine (3.7 g) was added thereto. The resulting mixture was stirred at room temperature until heat generation ceased, and then heated to 100° C., and heated and stirred for 1 hour. The resulting reaction mixture was cooled down to room temperature, and an aqueous sodium acetate solution cooled in an ice bath, and subsequently ethyl acetate were added thereto, and liquid was separated, and then a solvent was distilled off under reduced pressure, and the resulting residue was washed with heptane. Then, the resulting residue was purified with a silica gel short-pass column (eluent: toluene), and further subjected to reprecipitation in heptane to obtain a compound represented by formula (1-132) (5.4 g).

Formula 118

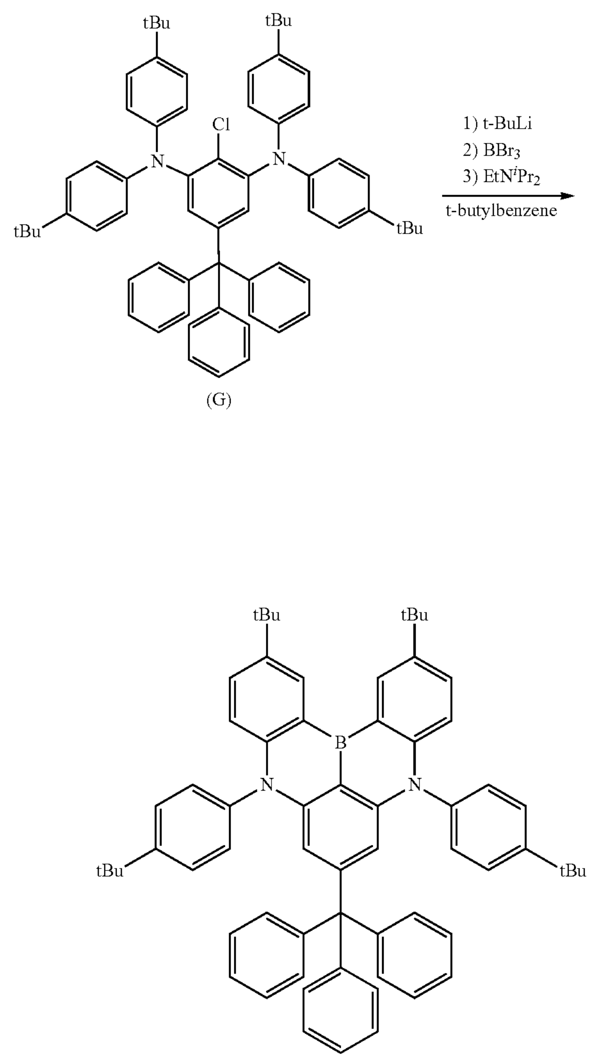

(1-132)

A structure of the compound obtained was confirmed by NMR measurement.

$^1$H-NMR (400 MHz, $CDCl_3$): δ=8.94 (s, 2H), 7.47 (d, 2H), 7.42 (d, 4H), 7.05-7.00 (m, 13H), 6.99-6.91 (m, 6H), 6.72 (s, 2H), 5.97 (m, 2H), 1.45 (s, 18H), 1.36 (s, 18H).

Synthesis Example (6)

Synthesis of Compound (1-136)

Formula 119

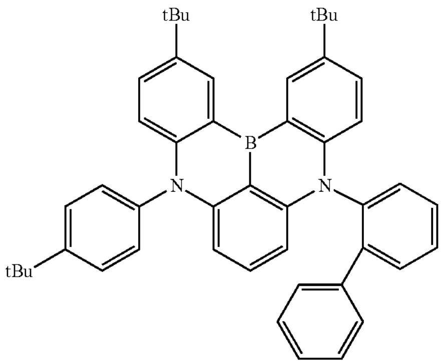

(1-136)

Under a nitrogen atmosphere, in a flask in which [1,1'-biphenyl]-2-amine (5.0 g), 1-bromo-4-(t-butyl)benzene (6.3 g), Pd-132 (0.21 g), NaOtBu (4.3 g) and xylene (60 mL) were put, the resulting mixture was heated and stirred at 100° C. for 1 hour, and then the resulting reaction mixture was cooled down to room temperature, and then water and ethyl acetate were added thereto, and liquid was separated. An organic layer was washed with water, and then a solvent was distilled off under reduced pressure. Then, the resulting residue was purified with a silica gel short-pass column (eluent: toluene/heptane=1/4 (volume ratio)) to obtain intermediate (H) (8.7 g).

Formula 120

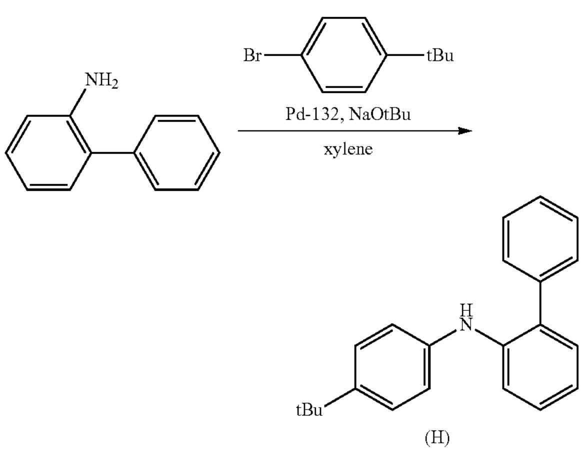

Under a nitrogen atmosphere, in a flask in which intermediate (H) (7.1 g), intermediate (I) (10.0 g), Pd-132) 0.17 g), NaOtBu (3.4 g) and xylene (50 mL) were put, the resulting mixture was heated and stirred at 100° C. for 1 hour. The resulting reaction mixture was cooled down to room temperature, and then water and ethyl acetate were added thereto, and liquid was separated. An organic layer was washed with water, and then a solvent was distilled off under reduced pressure. Then, the resulting residue was purified with a silica gel short-pass column (eluent: toluene/heptane=1/4 (volume ratio)) to obtain intermediate (J) (12.7 g).

Formula 121

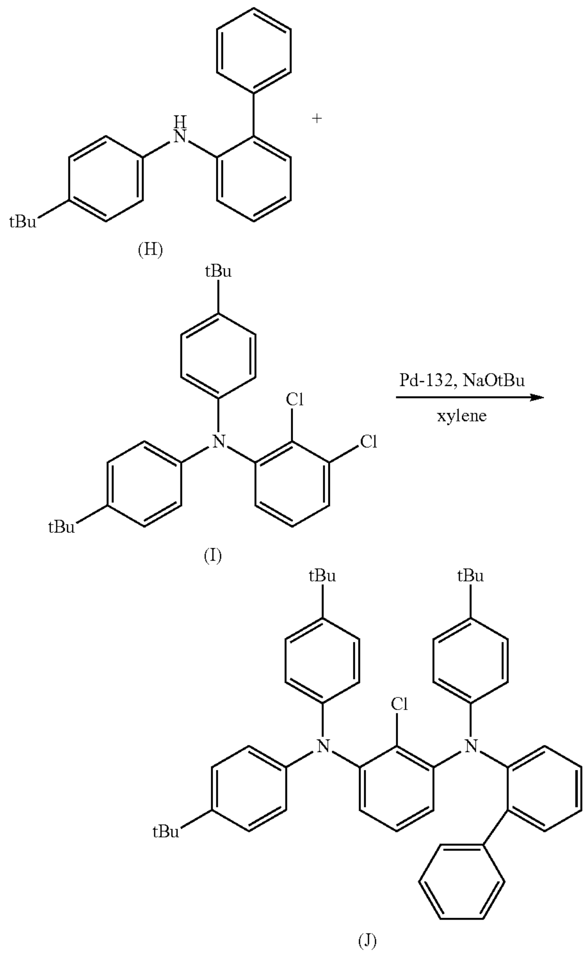

Under a nitrogen atmosphere, in a flask in which intermediate (J) (10.0 g) and t-butylbenzene (100 mL) were put, while the resulting mixture was cooled in an ice bath, a t-butyllithium/pentane solution (1.64 M, 17.6 mL) was added thereto. After completion of dropwise addition, the resulting mixture was heated to 70° C. and stirred for 1 hour, and then a component having a boiling point lower than t-butylbenzene was distilled off under reduced pressure. The resulting mixture was cooled down to −50° C., boron tribromide (7.2 g) was added thereto, and the resulting mixture was heated to room temperature and stirred for 0.5 hour. Then, the resulting mixture was cooled again in an ice bath, and N,N-diisopropylethylamine (3.7 g) was added thereto. The resulting mixture was stirred at room temperature until heat generation ceased, and then heated to 100° C., and heated and stirred for 1 hour. The resulting reaction mixture was cooled down to room temperature, and an aqueous sodium acetate solution cooled in an ice bath, and subsequently ethyl acetate were added thereto, and liquid was separated, and then a solvent was distilled off under reduced pressure, and the resulting residue was washed with heptane. Then, the resulting residue was purified by a silica gel column (eluent: toluene/heptane=1/3 (volume ratio)), further subjected to reprecipitation in heptane, and finally sublimated and purified to obtain a compound represented by formula (1-136) (2.4 g).

Formula 122

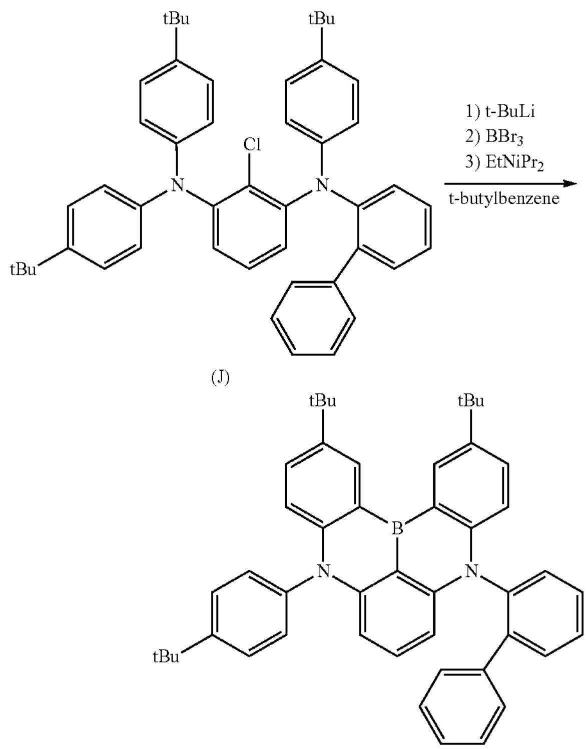

(J)

(1-136)

A structure of the compound obtained was confirmed by NMR measurement.

$^1$H-NMR: δ=8.93 (s, 1H), 8.89 (s, 1H), 7.71-7.60 (m, 5H), 7.50 (d, 1H), 7.46 (d, 1H), 7.38-7.14 (m, 6H), 6.99-6.98 (m, 3H), 6.76 (d, 1H), 6.72 (d, 1H), 6.18 (d, 1H), 6.08 (d, 1H), 1.45 (s, 9H), 1.44 (s, 18H).

Synthesis Example (7)

Synthesis of Compound (1-166)

Formula 123

(1-166)

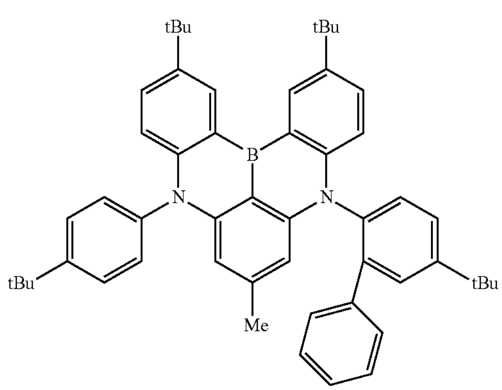

Under a nitrogen atmosphere, in a flask in which 2,3-dichloro-5-methylaniline (25.0 g), 1-bromo-4-(t-butylbenzene) (75.6 g), Pd-132 (2.5 g), NaOtBu (34.0 g) and xylene (250 mL) were put, the resulting mixture was heated and stirred at 120° C. for 4 hours, and then the resulting reaction mixture was cooled down to room temperature, and then water and ethyl acetate were added thereto, and liquid was separated. An organic layer was washed with water, and then a solvent was distilled off under reduced pressure. Then, the resulting residue was purified with a silica gel short-pass column (eluent: toluene/heptane=3/7 (volume ratio)), and further purified with an alumina column (eluent: heptane) to obtain intermediate (K) (55.0 g).

Formula 124

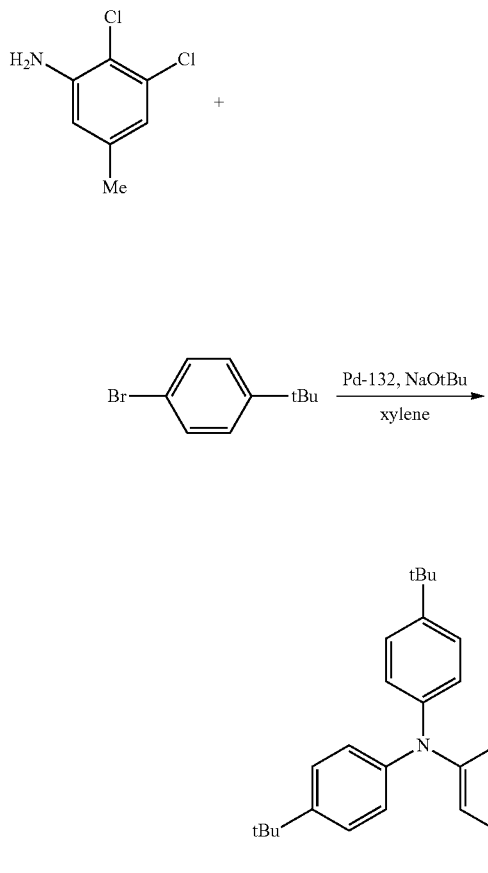

(K)

Under a nitrogen atmosphere, in a flask in which intermediate (K) (12.0 g), intermediate (L) (9.7 g), Pd-132 (0.19 g), NaOtBu (3.9 g) and xylene (60 mL) were put, the resulting mixture was heated and stirred at 120° C. for 1 hour. The resulting reaction mixture was cooled down to room temperature, and then water and ethyl acetate were added thereto, and liquid was separated. An organic layer was washed with water, and then a solvent was distilled off under reduced pressure. Then, the resulting residue was subjected to reprecipitation in heptane, and further purified with a silica gel short-pass column (eluent: toluene) to obtain intermediate (M) (19.0 g).

Formula 125

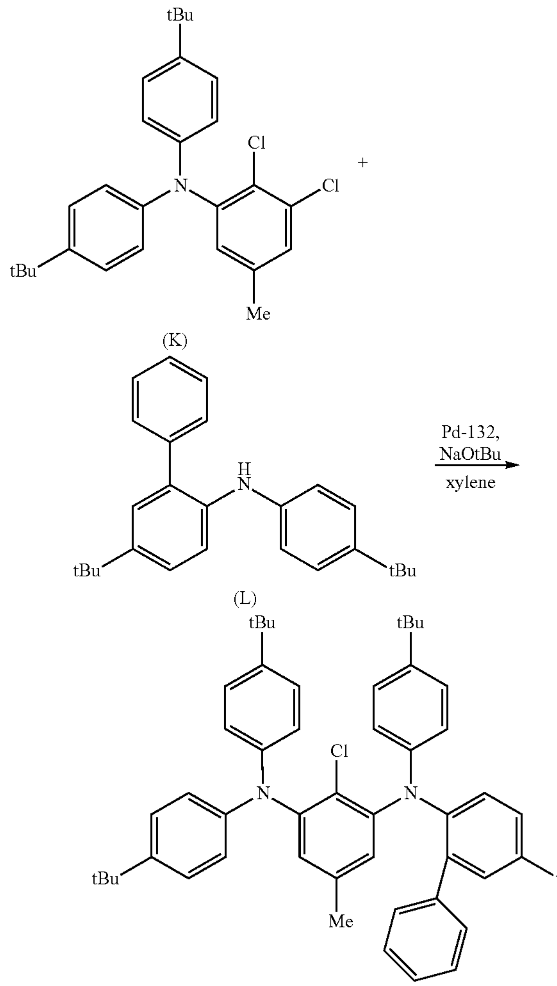

(M)

Under a nitrogen atmosphere, while being cooled in an ice bath, a t-butyllithium/pentane solution (1.62 M, 41.6 mL) was added into a flask in which intermediate (M) (19.0 g) and t-butylbenzene (100 mL) were put. After completion of dropwise addition, the resulting mixture was heated to 70° C. and stirred for 1 hour, and then a component having a boiling point lower than t-butylbenzene was distilled off under reduced pressure. The resulting mixture was cooled down to −50° C., boron tribromide (18.8 g) was added thereto, and the resulting mixture was heated to room temperature and stirred for 0.5 hour. Then, the resulting mixture was cooled again in an ice bath, and N,N-diisopropylethylamine (6.4 g) was added thereto. The resulting mixture was stirred at room temperature until heat generation ceased, and then heated to 100° C., and heated and stirred for 1 hour. The resulting reaction mixture was cooled down to room temperature, and an aqueous sodium acetate solution cooled in an ice bath, and subsequently ethyl acetate were added thereto, and liquid was separated. An organic layer was washed with water, and then a solvent was distilled off under reduced pressure. Then, the resulting residue was purified with a silica gel column (eluent: toluene/heptane=3/7 (volume ratio)), and further subjected to reprecipitation in heptane to obtain a compound represented by formula (1-166) (2.6 g).

Formula 126

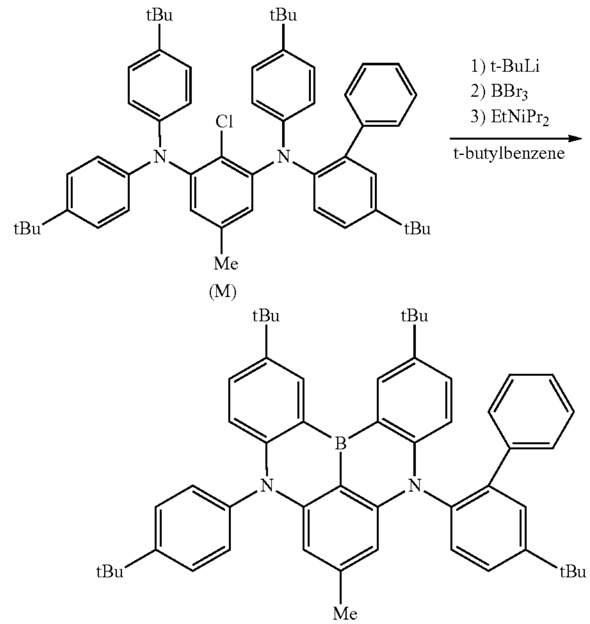

(1-166)

A structure of the compound obtained was confirmed by NMR measurement.

$^{1}$H-NMR: δ=8.92 (s, 1H), 8.86 (s, 1H), 7.68 (s, 1H), 7.67 (d, 2H), 7.64 (d, 1H), 7.48 (dd, 1H), 7.43 (dd, 1H), 7.27-7.14 (m, 5H), 7.00-6.98 (m, 3H), 6.71 (d, 1H), 6.65 (d, 1H), 6.05 (s, 1H), 5.90 (s, 1H), 2.17 (s, 3H), 1.48 (s, 9H), 1.46 (s, 9H), 1.45 (s, 9H), 1.43 (s, 9H).

Synthesis Example (8)

Synthesis of Compound (1-170)

Formula 127

(1-170)

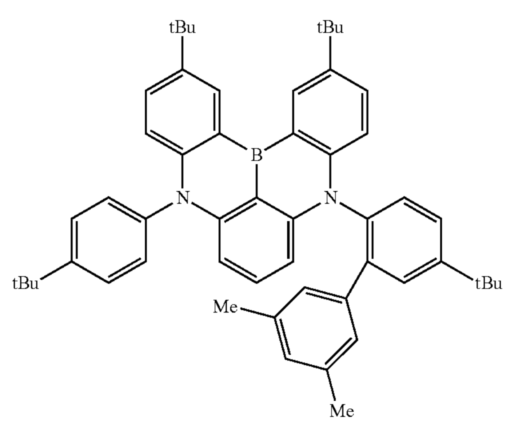

Under a nitrogen atmosphere, in a flask in which 2-bromo-4-t-butylaniline (30.0 g), 3,5-dimethylphenylboronic acid (23.7 g), Pd-132 (0.93 g), tripotassium phosphate (56.0 g), toluene (400 mL), t-butanol (40 mL) and water (20 mL) were put, the resulting mixture was heated and stirred at 100° C. After the reaction, the resulting mixture was cooled, and water and ethyl acetate were added thereto, and the resulting mixture was stirred, and then an organic layer was separated, and washed with water, and further the organic layer was washed with dilute hydrochloric acid, and washed with water, and then concentrated to obtain a crude product. The crude product was purified with a silica gel column (eluent: toluene/heptane=1/1 (volume ratio)) to obtain intermediate (N) (30.0 g).

Formula 128

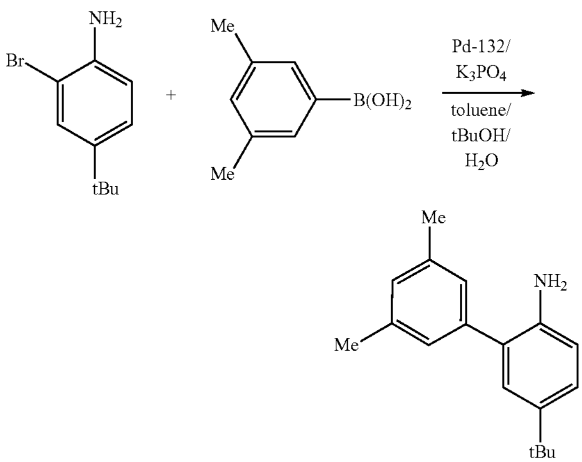

(N)

Under a nitrogen atmosphere, in a flask in which intermediate (N) (20.0 g), 4-bromo-t-butylbenzene (16.8 g), Pd-132 (0.56 g), NaOtBu (11.4 g) and xylene (150 mL) were put, the resulting mixture was stirred at 110° C. for 0.5 hour. After the reaction, water and ethyl acetate were added thereto, and the resulting mixture was stirred, and then an organic layer was washed with water twice and concentrated, and a crude product obtained was purified with a silica gel column (eluent: toluene/heptane=2/8 (volume ratio)) to obtain intermediate (0) (28.0 g).

Formula 129

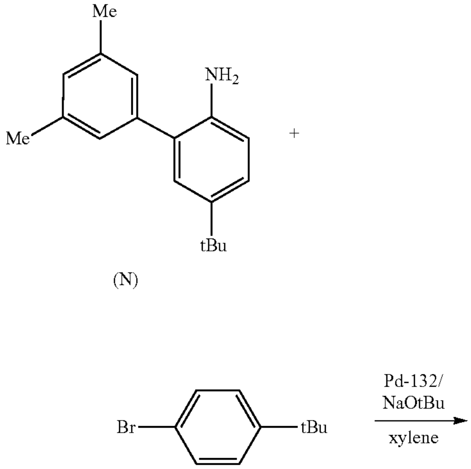

-continued

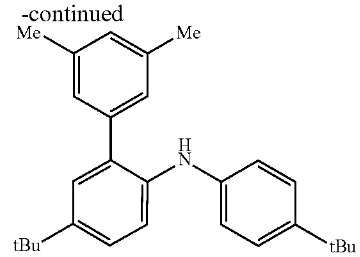

(O)

Under a nitrogen atmosphere, in a flask in which intermediate (I) (12.0 g), intermediate (0) (10.3 g), Pd-132 (0.19 g), NaOtBu (3.9 g) and xylene (60 mL) were put, the resulting mixture was stirred at 120° C. for 1 hour. After the reaction, water and ethyl acetate were added thereto, and the resulting mixture was stirred, and then an organic layer was washed with water twice and concentrated, and a crude product obtained was purified with a silica gel short-pass column (eluent: toluene) to obtain intermediate (P) (17.3 g).

Formula 130

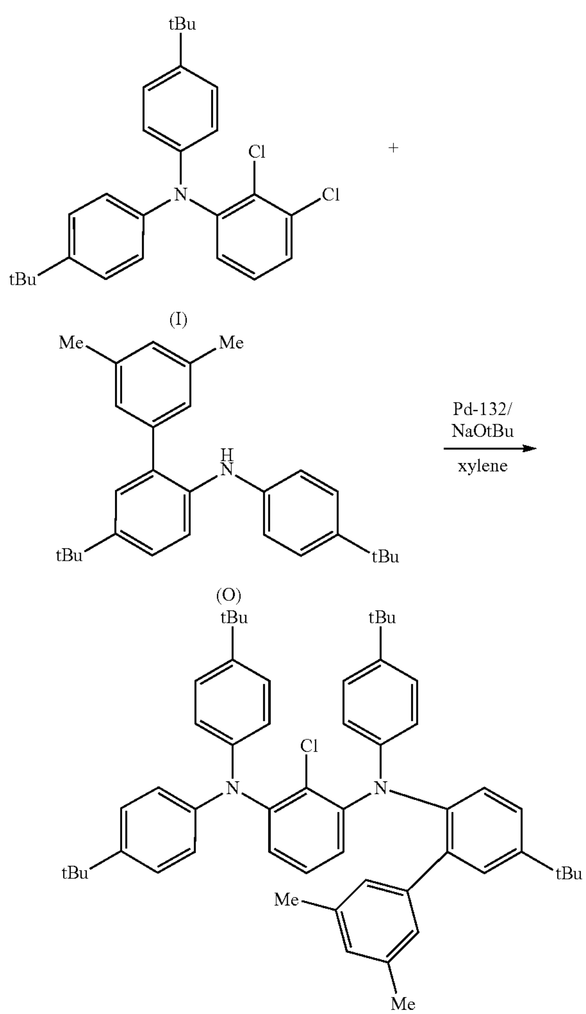

(P)

Under a nitrogen atmosphere, in a flask in which intermediate (P) (17.0 g) and t-butylbenzene (100 mL) were put, while the resulting mixture was cooled in an ice bath, a t-butyllithium/pentane solution (1.62 M, 27.1 mL) was added thereto. After completion of dropwise addition, the resulting mixture was heated to 70° C. and stirred for 1 hour, and then a component having a boiling point lower than t-butylbenzene was distilled off under reduced pressure. The resulting mixture was cooled down to −50° C., boron tribromide (11.0 g) was added thereto, and the resulting mixture was heated to room temperature and stirred for 0.5 hour. Then, the resulting mixture was cooled again in an ice bath, and N,N-diisopropylethylamine (5.7 g) was added thereto. The resulting mixture was stirred at room temperature until heat generation ceased, and then heated to 100° C., and heated and stirred for 1 hour. The resulting reaction mixture was cooled down to room temperature, and an aqueous sodium acetate solution cooled in an ice bath, and subsequently ethyl acetate were added thereto, and liquid was separated. An organic layer was washed with water, and then a solvent was distilled off under reduced pressure. Then, the resulting residue was purified with a silica gel column (eluent: toluene/heptane=25/75 (volume ratio)), and further subjected to reprecipitation in heptane to obtain a compound represented by formula (1-170) (2.1 g).

Formula 131

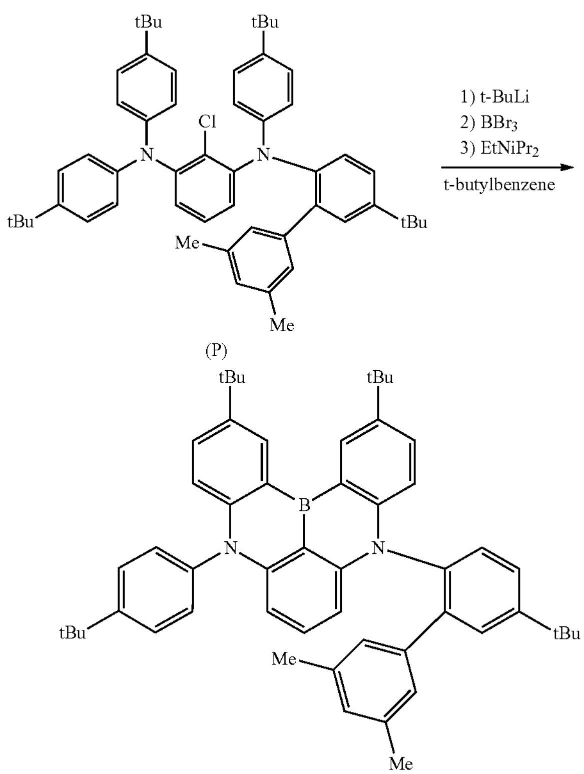

(P)

(1-170)

A structure of the compound obtained was confirmed by NMR measurement.

$^1$H-NMR: δ=1.4 (s, 9H), 1.4 (s, 9H), 1.5 (s, 9H), 1.5 (s, 9H), 1.9 (s, 6H), 6.1 (d, 1H), 6.2 (d, 1H), 6.6 (s, 1H), 6.7 (d, 1H), 6.8 (d, 1H), 7.2-7.3 (m, 6H), 7.5 (m, 2H), 7.6 (m, 1H), 7.6-7.7 (m, 3H), 8.9 (d, 1H), 8.9 (d, 1H).

Synthesis Example (9)

Synthesis of Compound (1-180)

Formula 132

(1-180)

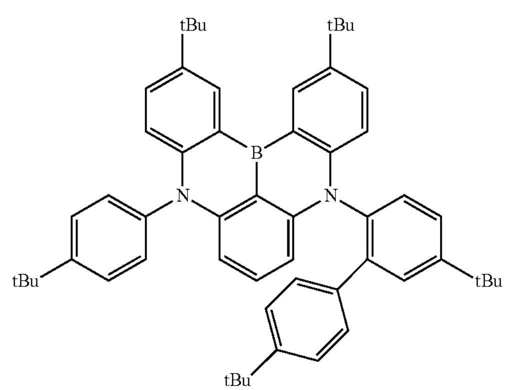

Under a nitrogen atmosphere, in a flask in which intermediate (Q) (22.5 g), 4-bromo-t-butylbenzene (17.0 g), Pd-132 (0.57 g), NaOtBu (11.5 g) and xylene (150 mL) were put, the resulting mixture was heated and stirred for 1 hour. After the reaction, water and ethyl acetate were added thereto, and the resulting mixture was stirred, and then an organic layer was washed with water twice and concentrated, and a crude product obtained was purified with a silica gel column (eluent: toluene/heptane=2/8 (volume ratio)) to obtain intermediate (R) (31.0 g).

Formula 133

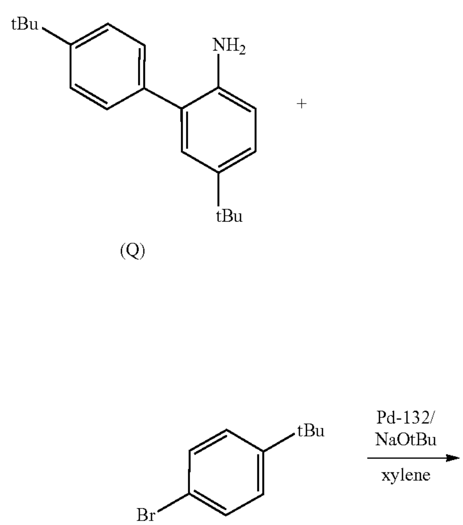

(Q)

-continued

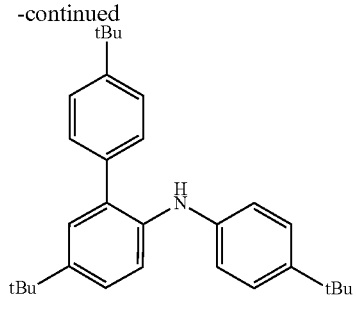

(R)

Under a nitrogen atmosphere, in a flask in which intermediate (I) (7.6 g), intermediate (R) (7.0 g), Pd-132 (0.12 g), NaOtBu (2.60 g) and xylene (50 mL) were put, the resulting mixture was stirred at 120° C. for 1 hour. After the reaction, water and ethyl acetate were added thereto, and the resulting mixture was stirred, and then an organic layer was washed with water twice and concentrated, and a crude product obtained was purified with a silica gel column (eluent: toluene/heptane=3/7 (volume ratio)) to obtain intermediate (S) (11.5 g).

Formula 134

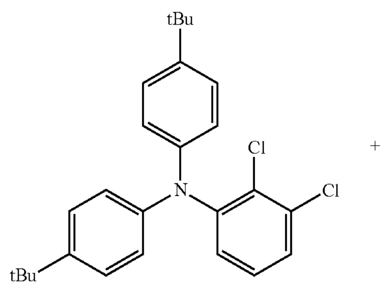

(I)

-continued

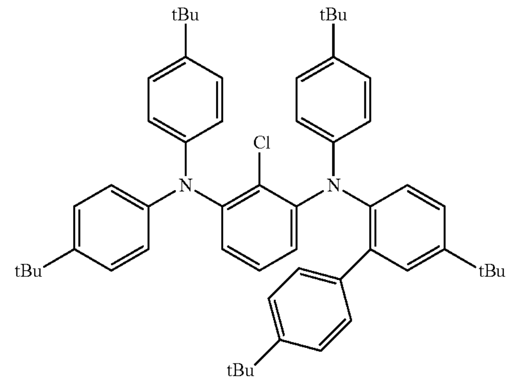

(S)

Under a nitrogen atmosphere, in a flask in which intermediate (S) (10.0 g) and t-butylbenzene (50 mL) were put, the resulting mixture was cooled in an ice bath, and a t-butyllithium/heptane solution (1.62 M, 19.2 mL) was added thereto, and then a low boiling point component was removed at 60° C. under reduced pressure. The resulting mixture was cooled down to about −50° C. in a dry ice bath, and boron tribromide (9.4 g) was added thereto. The resulting mixture was heated to room temperature, and N,N-diisopropylethylamine (3.2 g) was added thereto in an ice bath, and then the resulting mixture was stirred at 100° C. for 1 hour. After the reaction, an aqueous sodium acetate solution was added to a reaction solution, and the resulting mixture was stirred, and ethyl acetate was added thereto, and the resulting mixture was stirred, and then an organic layer was separated. A crude product was purified with a silica gel column (eluent: toluene/heptane=3/7 (volume ratio)) to obtain a compound represented by formula (1-180) (3.4 g).

Formula 135

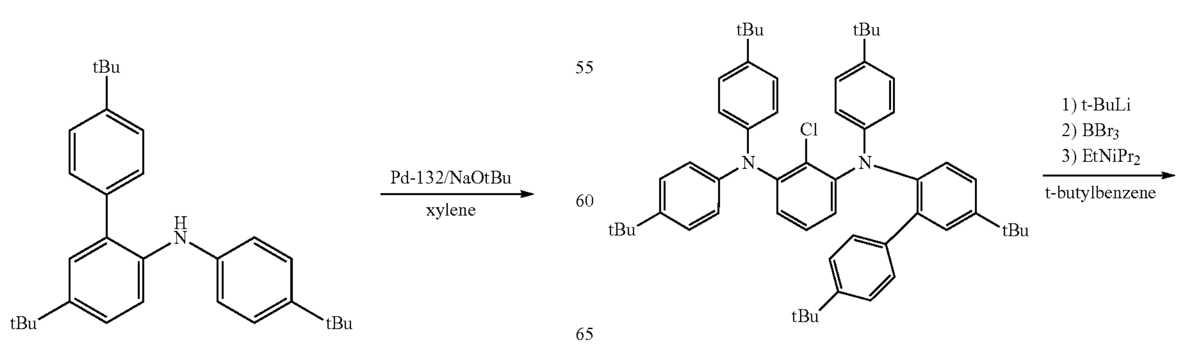

-continued

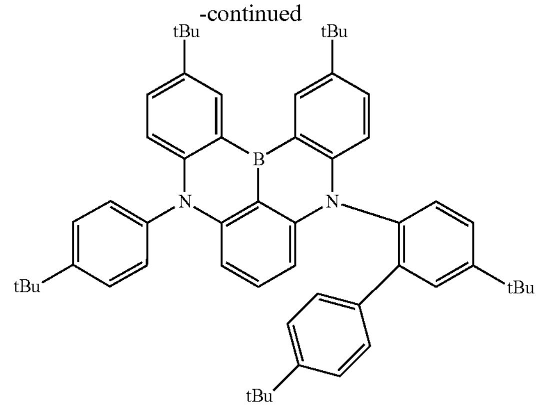

(1-180)

A structure of the compound obtained was confirmed by NMR measurement.

$^1$H-NMR: δ=1.1 (s, 9H), 1.4 (s, 9H), 1.5 (s, 9H), 1.5 (s, 9H), 1.5 (s, 9H), 6.1 (d, 1H), 6.2 (d, 1H), 6.7 (d, 1H), 6.8 (d, 1H), 7.0 (d, 1H), 7.1 (d, 1H), 7.2-7.3 (m, 7H), 7.5 (dd, 1H), 7.5 (dd, 1H), 7.7 (m, 3H), 8.9 (d, 1H), 8.9 (d, 1H).

Synthesis Example (10)

Synthesis of Compound (1-200)

Formula 136

(1-200)

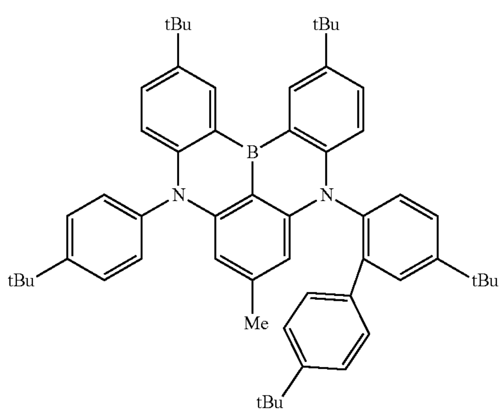

Under a nitrogen atmosphere, in a flask in which intermediate (K) (12.0 g), intermediate (R) (10.7 g), Pd-132 (0.19 g), NaOtBu (3.9 g) and xylene (60 mL) were put, the resulting mixture was stirred at 120° C. for 1 hour. After the reaction, water and ethyl acetate were added thereto, and the resulting mixture was stirred, and then an organic layer was washed with water twice and concentrated, and a crude product obtained was purified with a silica gel column (eluent: toluene/heptane=2/8 (volume ratio)) to obtain intermediate (T) (19.9 g).

Formula 137

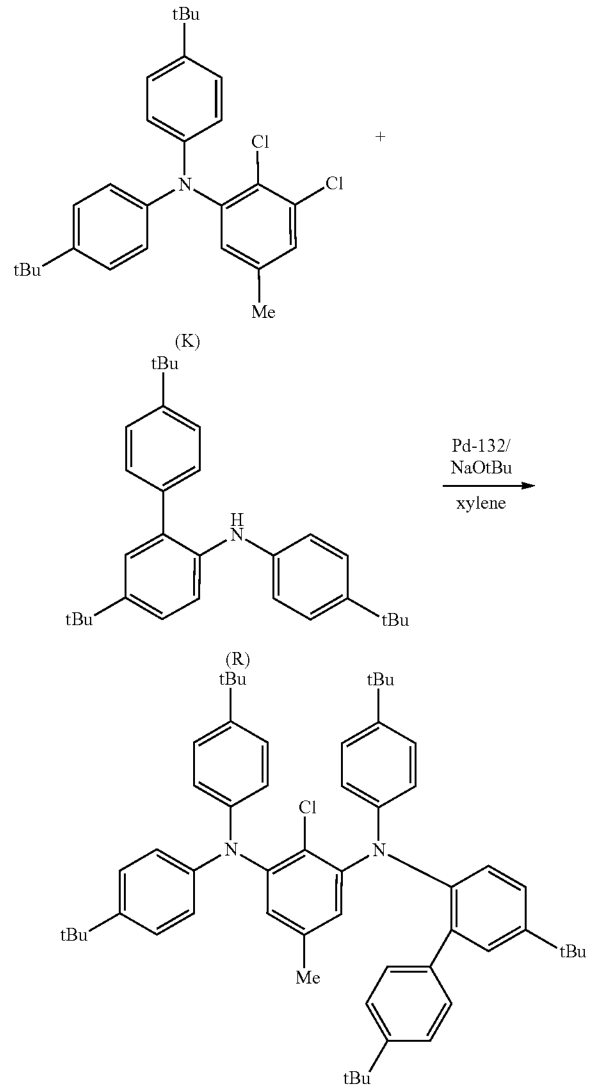

(T)

Under a nitrogen atmosphere, in a flask in which intermediate (T) (18.0 g) and t-butylbenzene (90 mL) were put, the resulting mixture was cooled in an ice bath, and t-butyllithium (1.62 M, 40.0 mL) was added thereto, and then a low boiling point component was removed at 60° C. under reduced pressure. The resulting mixture was cooled down to about −50° C. in a dry ice bath, and boron tribromide (16.5 g) was added thereto. The resulting mixture was heated to room temperature, and N,N-diisopropylethylamine (5.7 g) was added thereto in an ice bath, and then the resulting mixture was stirred at 100° C. for 1 hour. After the reaction, an aqueous sodium acetate solution was added to a reaction solution, and the resulting mixture was stirred, and ethyl acetate was added thereto, and the resulting mixture was stirred, and then an organic layer was separated. A crude product was purified with a silica gel column (eluent: toluene/heptane=2/8 (volume ratio)) to obtain a compound represented by formula (1-200) (4.0 g).

Formula 138

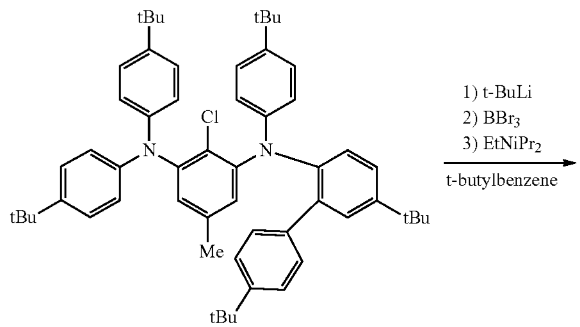

(T)

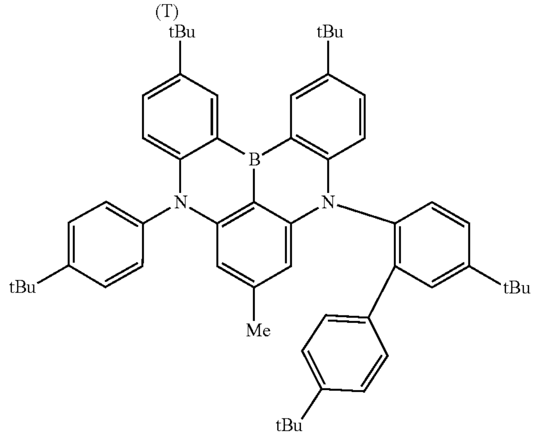

(1-200)

A structure of the compound obtained was confirmed by NMR measurement.

$^1$H-NMR: δ=1.1 (s, 9H), 1.4 (s, 9H), 1.5 (s, 9H), 1.5 (s, 9H), 1.5 (s, 9H), 2.2 (s, 3H), 5.9 (s, 1H), 6.1 (s, 1H), 6.7 (m, 2H), 7.0 (d, 2H), 7.1 (d, 2H), 7.2 (d, 1H), 7.3 (m, 2H), 7.4 (m, 1H), 7.5 (m, 1H), 7.6 (dd, 1H), 7.7 (m, 3H), 8.9 (d, 1H), 8.9 (d, 1H).

Synthesis Example (11)

Synthesis of Compound (1-208)

Formula 139

(1-208)

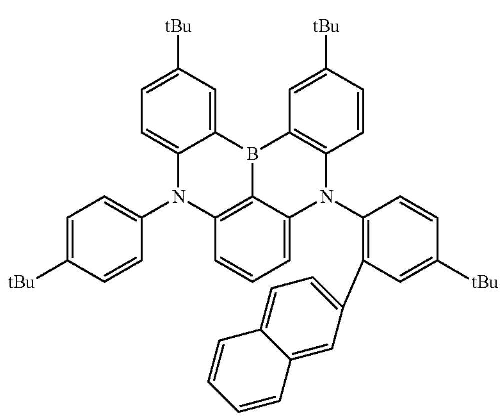

Under a nitrogen atmosphere, 2-bromo-4-t-butylaniline (25.0 g), 2-naphthaleneboronic acid (22.6 g), Pd-132 (0.78 g), tripotassium phosphate (47.0 g), toluene (400 mL), t-butanol (40 mL) and water (20 mL) were put in a flask, and the resulting mixture was stirred at 100° C. for 1 hour. After the reaction, water and ethyl acetate were added thereto, and the resulting mixture was stirred, and then an organic layer was washed with water twice and concentrated, and a crude product obtained was purified with a silica gel short-pass column (eluent: toluene/heptane=2/8 (volume ratio)) to obtain intermediate (U) (23.2 g).

Formula 140

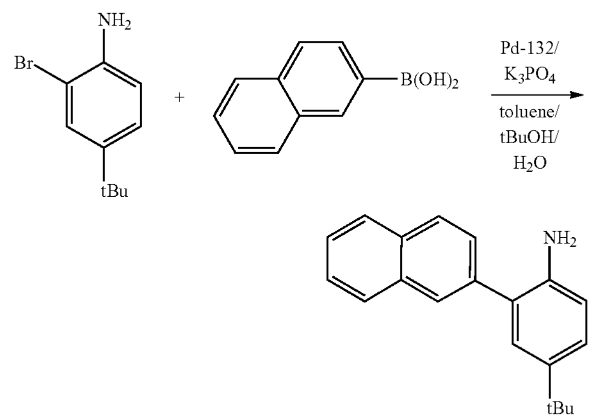

(U)

Under a nitrogen atmosphere, in a flask in which intermediate (U), (20.0 g), 4-bromo-t-butylbenzene (15.5 g), Pd-132 (0.51 g), NaOtBu (10.5 g) and xylene (150 mL) were put, the resulting mixture was stirred at 110° C. for 0.5 hour. After the reaction, water and ethyl acetate were added thereto, and the resulting mixture was stirred, and then an organic layer was washed with water twice and concentrated, and a crude product obtained was purified with a silica gel column (eluent: toluene/heptane=2/8 (volume ratio)), and subsequently subjected to recrystallization in heptane to obtain intermediate (V) (27.3 g).

Formula 141

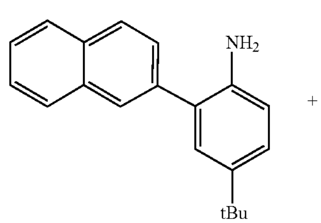

(U)

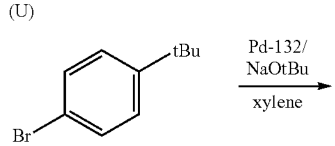

-continued

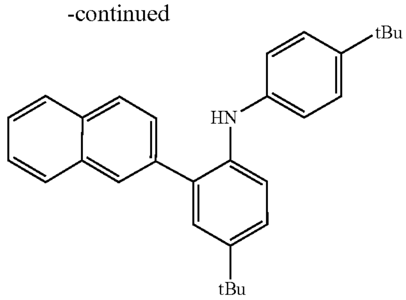

(V)

Under a nitrogen atmosphere, in a flask in which intermediate (I) (12.0 g), intermediate (V) (10.9 g), Pd-132 (0.19 g), NaOtBu (4.1 g) and xylene (60 mL) were put, the resulting mixture was stirred at 120° C. for 1.5 hours. After the reaction, water and ethyl acetate were added thereto, and the resulting mixture was stirred, and then an organic layer was washed with water twice and concentrated, and a crude product obtained was purified with a silica gel column (eluent: toluene/heptane=2/8 (volume ratio)), and subsequently purified with an alumina column (eluent: toluene/heptane=25/75 (volume ratio)) to obtain intermediate (W) (17.0 g).

Formula 142

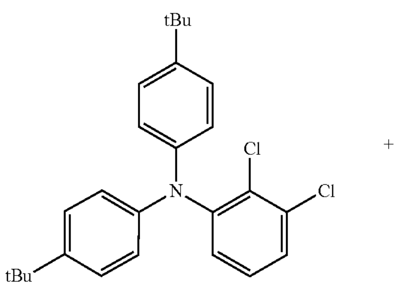

(I)

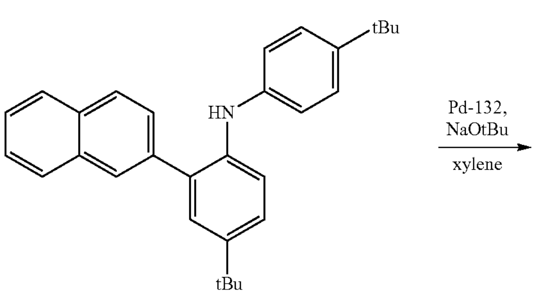

(V)

-continued

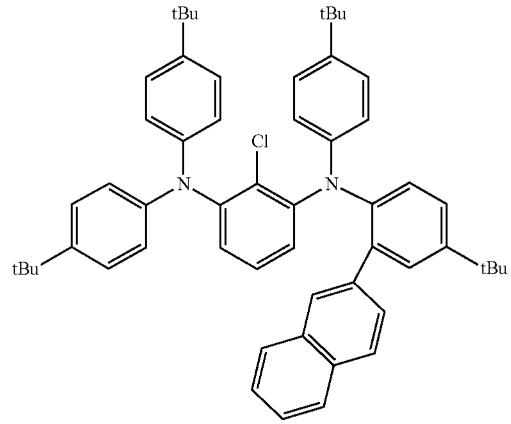

(W)

Under a nitrogen atmosphere, in a flask in which intermediate (W) (16.0 g) and t-butylbenzene (80 mL) were put, the resulting mixture was cooled in an ice bath, and a t-butyllithium/pentane solution (1.62 M, 31.0 mL) was added thereto, and then the resulting mixture was stirred at 70° C. for 1 hour. The resulting mixture was cooled down to about −50° C. in a dry ice bath, and boron tribromide (15.1 g) was added thereto. The resulting mixture was heated to room temperature, and N,N-diisopropylethylamine (5.2 g) was added thereto in an ice bath, and then the resulting mixture was stirred at 100° C. for 1 hour. After the reaction, an aqueous sodium acetate solution was added to a reaction solution, and the resulting mixture was stirred, and ethyl acetate was added thereto, and the resulting mixture was stirred, and then an organic layer was separated. A crude product was purified with a silica gel column (eluent: toluene/heptane=25/75 (volume ratio)) to obtain a compound represented by formula (1-208) (0.6 g).

Formula 143

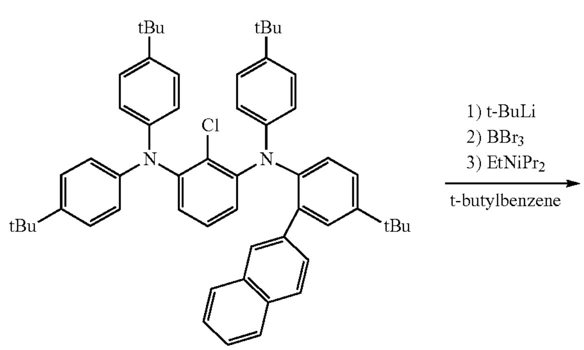

(W)

-continued

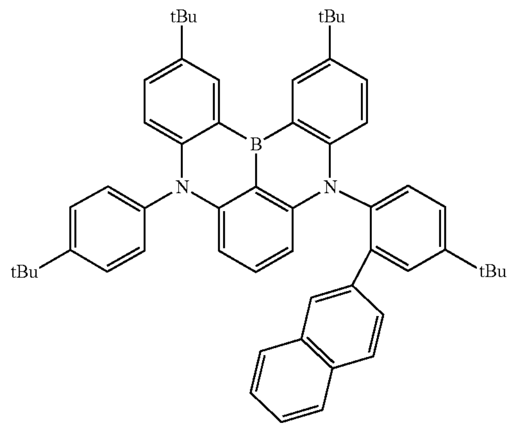

(1-208)

A structure of the compound obtained was confirmed by NMR measurement.

$^{1}$H-NMR: δ=1.4 (s, 9H), 1.4 (s, 9H), 1.4 (s, 9H), 1.5 (s, 9H), 6.1 (d, 1H), 6.3 (d, 1H), 6.7 (d, 1H), 6.8 (d, 1H), 7.2-7.3 (m, 6H), 7.3 (d, 1H), 7.4 (d, 1H), 7.5 (m, 3H), 7.6 (m, 1H), 7.6-7.7 (m, 4H), 7.8 (d, 1H), 8.9 (d, 1H), 8.9 (d, 1H).

Synthesis Example (12)

Synthesis of Compound (1-216)

Formula 144

(1-216)

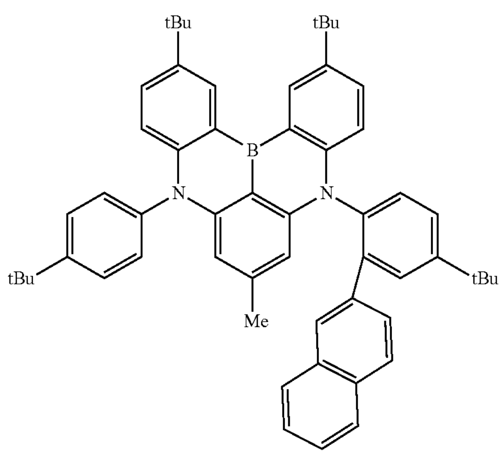

Formula 145

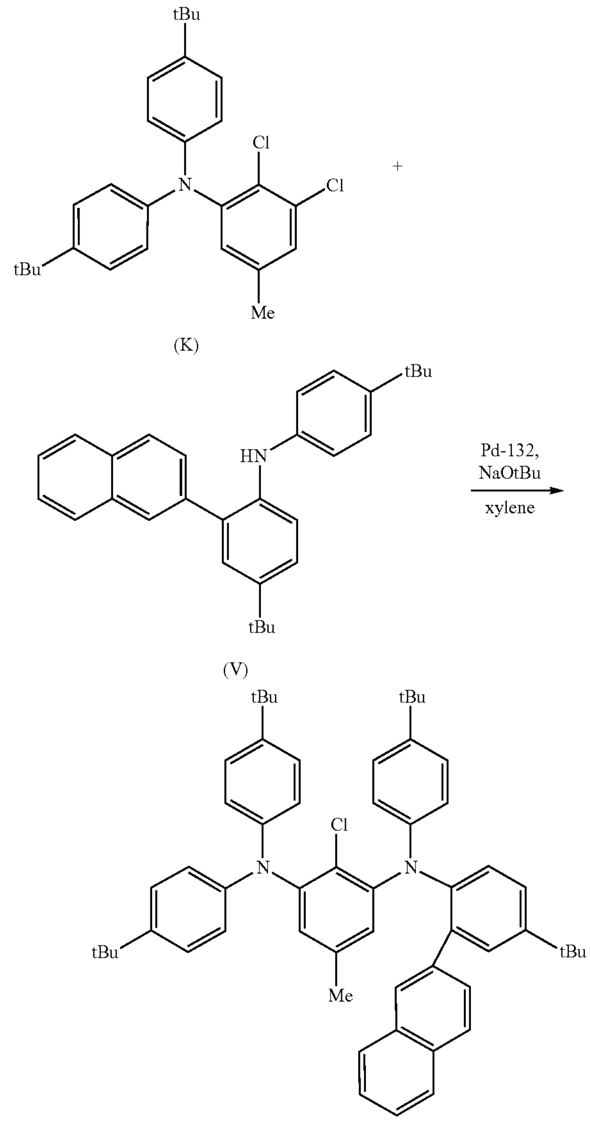

(X)

Under a nitrogen atmosphere, in a flask in which intermediate (K) (13.2 g), intermediate (V) (10.6 g), Pd-132 (0.19 g), NaOtBu (3.9 g) and xylene (60 mL) were put, the resulting mixture was stirred at 120° C. for 1 hour. After the reaction, water and ethyl acetate were added thereto, and the resulting mixture was stirred, and then an organic layer was washed with water twice and concentrated, and a crude product obtained was purified with a silica gel column (eluent: toluene/heptane=25/75 (volume ratio)) to obtain intermediate (X) (18.3 g).

Under a nitrogen atmosphere, in a flask in which intermediate (X) (17.0 g) and t-butylbenzene (100 mL) were put, the resulting mixture was cooled in an ice bath, and a t-butyllithium/pentane solution (1.62 M, 25.8 mL) was added thereto, and then the resulting mixture was stirred at 60° C. for 0.5 hour. The resulting mixture was cooled down to about −50° C. in a dry ice bath, and boron tribromide (10.5 g) was added thereto. The resulting mixture was heated to room temperature, and N,N-diisopropylethylamine (5.4 g) was added thereto in an ice bath, and the resulting mixture was stirred at 100° C. for 1 hour. After the reaction, an aqueous sodium acetate solution was added to a reaction solution, and the resulting mixture was stirred, and ethyl acetate was added thereto, and the resulting mixture was stirred, and then an organic layer was separated. A crude product was purified with a silica gel column (eluent: toluene/heptane=25/75 (volume ratio)) to obtain a compound represented by formula (1-216) (1.2 g).

Formula 146

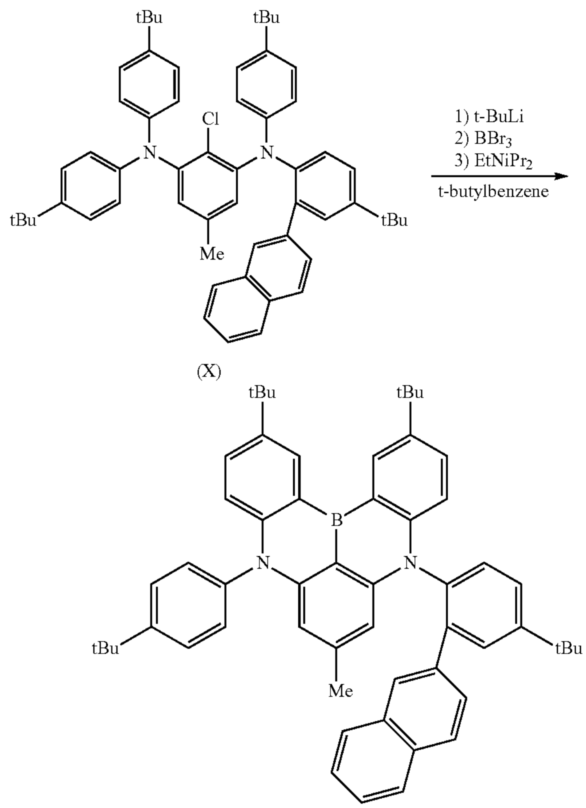

(X)

(1-216)

A structure of the compound obtained was confirmed by NMR measurement.

$^1$H-NMR: δ=1.4 (s, 9H), 1.4 (s, 9H), 1.5 (s, 9H), 1.5 (s, 9H), 2.2 (s, 3H), 5.9 (s, 1H), 6.1 (s, 1H), 6.6 (d, 1H), 6.8 (d, 1H), 7.2-7.3 (m, 6H), 7.4 (d, 1H), 7.4-7.5 (m, 2H), 7.5 (m, 1H), 7.6 (m, 1H), 7.6-7.7 (m, 4H), 7.8 (d, 1H), 8.8 (d, 1H), 8.9 (d, 1H).

Synthesis Example (13)

Synthesis of Compound (1-240)

Formula 147

(1-240)

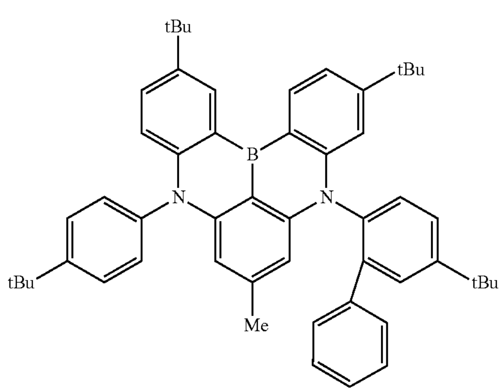

Under a nitrogen atmosphere, 2-bromo-4-t-butylaniline (25.0 g), phenylboronic acid (16.0 g), Pd-132 (0.78 g), tripotassium phosphate (47.0 g), toluene (400 mL), t-butanol (40 mL) and water (20 mL) were put in a flask, and the resulting mixture was stirred at 100° C. for 1 hour. After the reaction, water and ethyl acetate were added thereto, and the resulting mixture was stirred, and then an organic layer was washed with water twice and concentrated, and a crude product obtained was purified with a silica gel short-pass column (eluent: toluene/heptane=2/8 (volume ratio)) to obtain intermediate (N-1) (19.1 g).

Formula 148

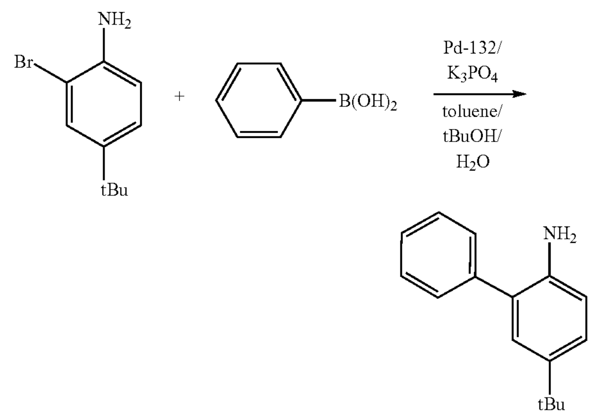

(N-1)

Under a nitrogen atmosphere, in a flask in which intermediate (N-1) (19.0 g), 3-bromo-t-butylbenzene (18.0 g), Pd-132 (0.60 g), NaOtBu (12.2 g) and xylene (170 mL) were put, the resulting mixture was stirred at 110° C. for 0.5 hour. After the reaction, water and ethyl acetate were added thereto, and the resulting mixture was stirred, and then an organic layer was washed with water twice and concentrated, and a crude product obtained was purified with a silica gel column (eluent: toluene/heptane=2/8 (volume ratio)), and then subjected to recrystallization in heptane to obtain intermediate (Y) (27.0 g).

Formula 149

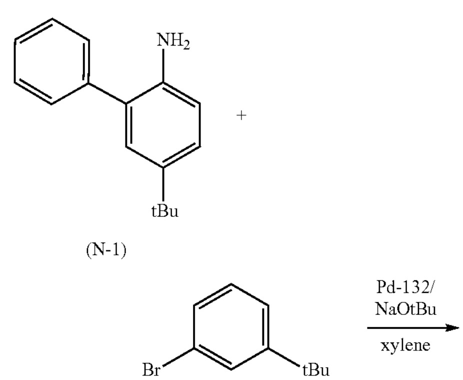

-continued

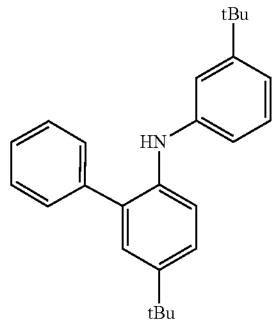

(Y)

Under a nitrogen atmosphere, in a flask in which intermediate (K) (15.0 g), intermediate (Y) (11.6 g), Pd-132 (0.24 g), NaOtBu (4.9 g) and xylene (70 mL) were put, the resulting mixture was stirred at 120° C. for 1 hour. After the reaction, water and ethyl acetate were added thereto, and the resulting mixture was stirred, and then an organic layer was washed with water twice and concentrated, and a crude product obtained was purified with a silica gel short-pass column (eluent: toluene), and then subjected to recrystallization in heptane to obtain intermediate (Z) (22.0 g).

Formula 150

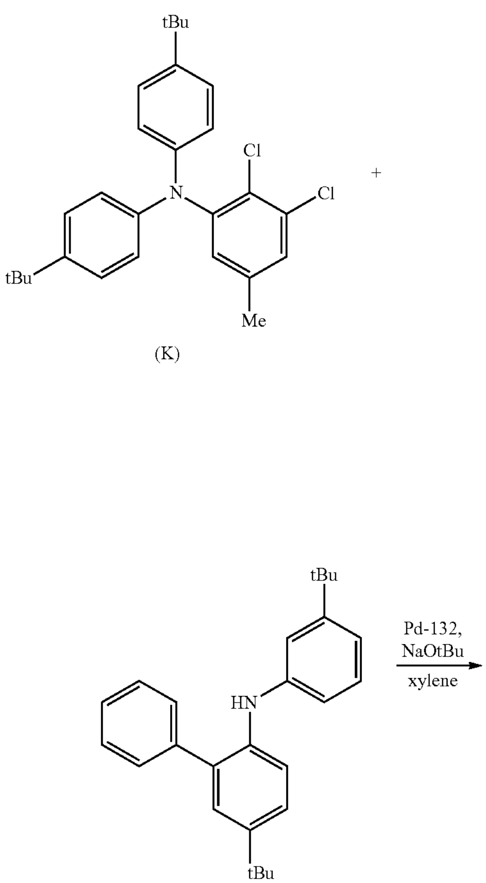

-continued

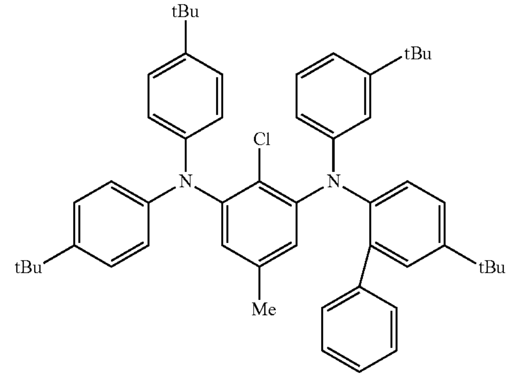

(Z)

Under a nitrogen atmosphere, in a flask in which intermediate (Z) (22.0 g) and t-butylbenzene (120 mL) were put, the resulting mixture was cooled in an ice bath, and t-butyllithium (1.62 M, 44.6 mL) was added thereto, and then a low boiling point component was removed at 60° C. under reduced pressure. The resulting mixture was cooled down to about −50° C. in a dry ice bath, and boron tribromide (21.7 g) was added thereto. The resulting mixture was heated to room temperature, and diisopropylethylamine (7.5 g) was added thereto in an ice bath, and then the resulting mixture was stirred at 100° C. for 1 hour. After the reaction, an aqueous sodium acetate solution was added to a reaction solution, and the resulting mixture was stirred, and ethyl acetate was added thereto, and the resulting mixture was stirred, and then an organic layer was separated. A crude product was purified with a silica gel column (eluent: toluene/heptane=3/7 (volume ratio)) to obtain a compound represented by formula (1-240) (3.5 g).

Formula 151

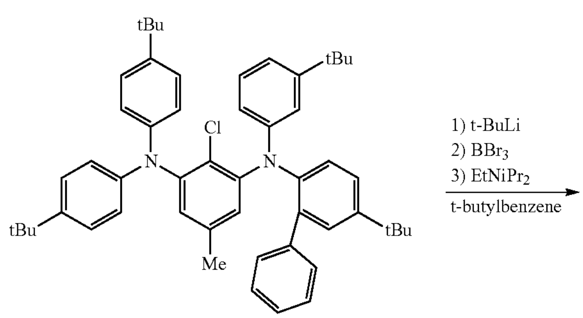

-continued

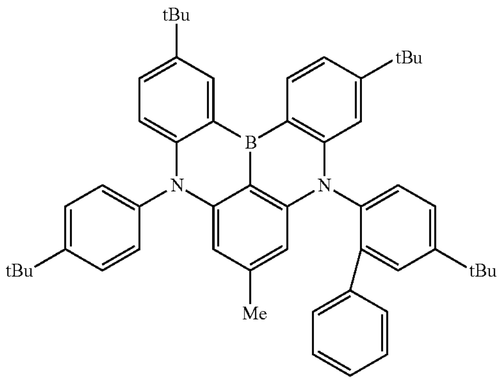

(1-240)

A structure of the compound obtained was confirmed by NMR measurement.

$^1$H-NMR: δ=1.2 (s, 9H), 1.4 (s, 9H), 1.5 (s, 9H), 1.5 (s, 9H), 2.2 (s, 3H), 5.9 (s, 1H), 6.2 (s, 1H), 6.6-6.7 (m, 2H), 6.9-7.0 (m, 3H), 7.1 (m, 2H), 7.2 (dd, 1H), 7.2-7.3 (m, 3H), 7.4 (dd, 1H), 7.6-7.7 (m, 3H), 7.7 (d, 1H), 8.7 (d, 1H), 8.9 (d, 1H).

Synthesis Example (14)

Synthesis of Compound (1-244)

Formula 152

(1-244)

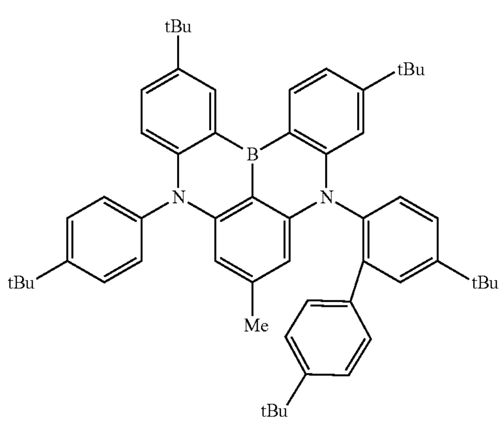

Under a nitrogen atmosphere, in a flask in which intermediate (Q) (22.5 g), 3-bromo-t-butylbenzene (17.0 g), Pd-132, 0.57 g), NaOtBu (11.5 g) and xylene (150 mL) were put, the resulting mixture was heated and stirred for 1 hour. After the reaction, water and ethyl acetate were added thereto, and the resulting mixture was stirred, and then an organic layer was washed with water twice and concentrated, and a crude product obtained was purified with a silica gel column (eluent: toluene/heptane=2/8 (volume ratio)) to obtain intermediate (R-1) (31.0 g).

Formula 153

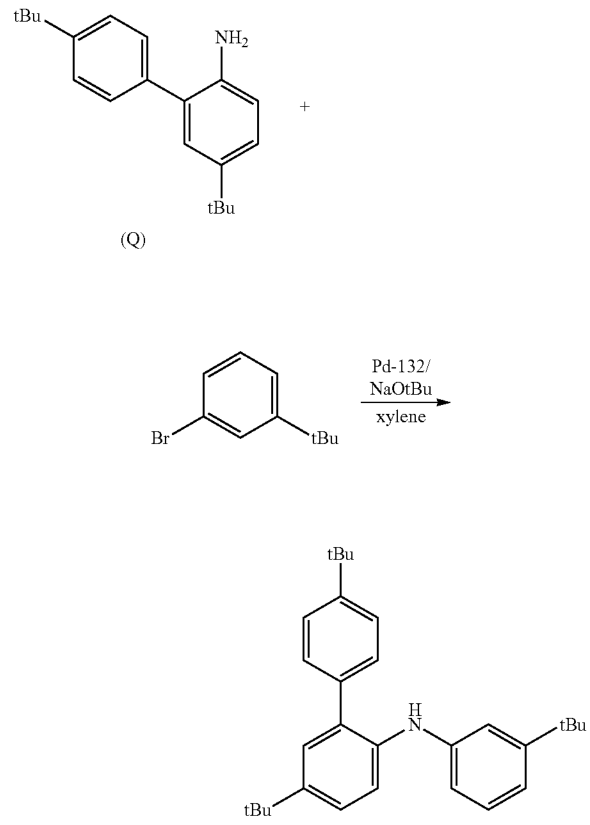

(R-1)

Under a nitrogen atmosphere, in a flask in which intermediate (K) (15 g), intermediate (R-1) (13.4 g), Pd-132 (0.24 g), NaOtBu (4.9 g) and xylene (70 mL) were put, the resulting mixture was stirred at 120° C. for 1.5 hours. After the reaction, water and ethyl acetate were added thereto, and the resulting mixture was stirred, and then an organic layer was washed with water twice and concentrated, and a crude product obtained was purified with a silica gel column (eluent: toluene/heptane=2/8 (volume ratio)) to obtain intermediate (S-1) (21.1 g).

Formula 154

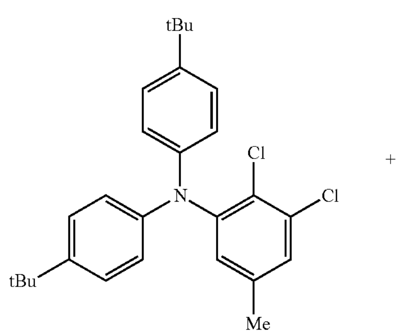

(K)

-continued

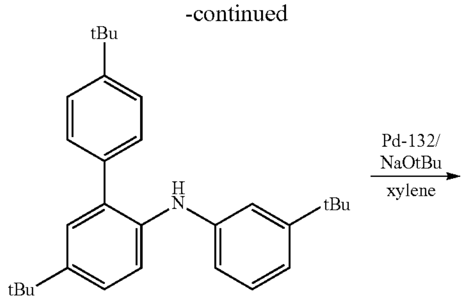

(R-1)

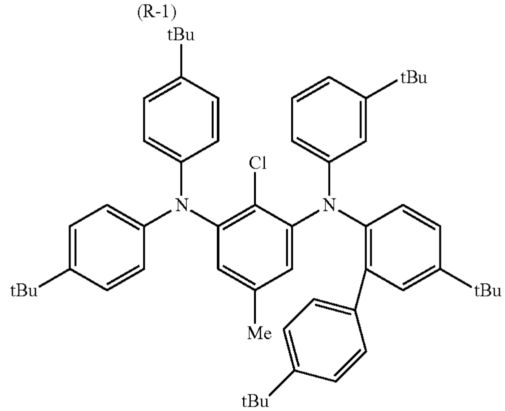

(S-1)

Under a nitrogen atmosphere, in a flask in which intermediate (S-1) (21.0 g) and t-butylbenzene (100 mL) were put, the resulting mixture was cooled in an ice bath, and t-butyllithium (1.62 M, 39.6 mL) was added thereto, and then a low boiling point component was removed at 60° C. under reduced pressure. The resulting mixture was cooled down to about −50° C. in a dry ice bath, and boron tribromide (19.3 g) was added thereto. The resulting mixture was heated to room temperature, and N,N-diisopropylethylamine (6.6 g) was added thereto in an ice bath, and then the resulting mixture was stirred at 100° C. for 1 hour. After the reaction, an aqueous sodium acetate solution was added to a reaction solution, and the resulting mixture was stirred, and ethyl acetate was added thereto, and the resulting mixture was stirred, and then an organic layer was separated. A crude product was purified with a silica gel column (eluent: toluene/heptane=3/7 (volume ratio)) to obtain a compound represented by formula (1-244) (7.1 g).

Formula 155

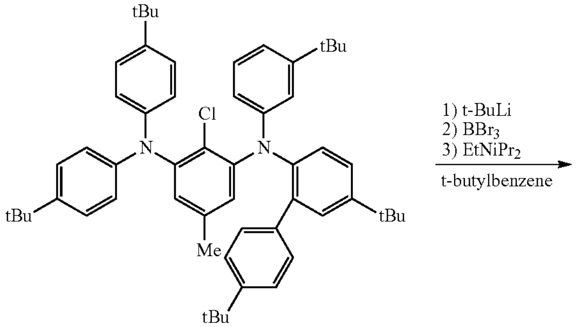

(S-1)

-continued

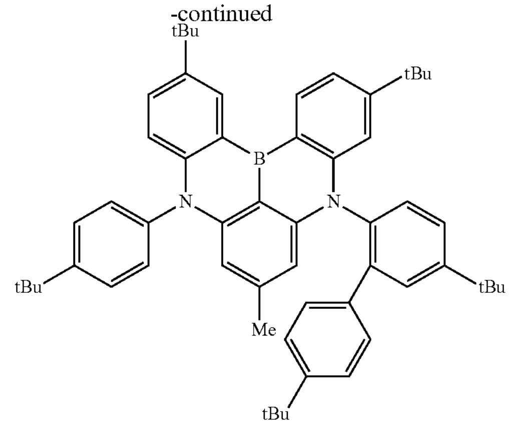

(1-244)

A structure of the compound obtained was confirmed by NMR measurement.

$^{1}$H-NMR: δ=1.1 (s, 9H), 1.2 (s, 9H), 1.4 (s, 9H), 1.5 (s, 9H), 1.5 (s, 9H), 2.2 (s, 3H), 5.9 (s, 1H), 6.2 (s, 1H), 6.7 (m, 2H), 7.0 (d, 2H), 7.1 (d, 2H), 7.2-7.3 (m, 4H), 7.5 (dd, 1H), 7.6 (dd, 1H), 7.7 (m, 2H), 7.7 (m, 1H), 8.7 (d, 1H), 8.9 (d, 1H).

Synthesis Example (15)

Synthesis of Compound (1-252)

Formula 156

(1-252)

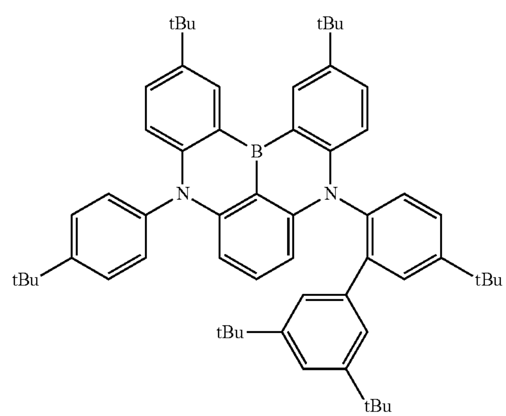

Under a nitrogen atmosphere, in a flask in which 1-bromo-3,5-di(t-butyl)benzene (50.0 g), bis(pinacolate)diboron (52.0 g), [1,1'-bis(diphenylphosphino)ferrocene]palladium(II) dichloride·dichloromethane adduct ($PdCl_2$(dppf) $.CH_2Cl_2$, 4.5 g), potassium acetate (55.0 g) and cyclopentyl methyl ether (CPME, 500 mL) were put, the resulting mixture was heated and stirred at 120° C. for 6 hours. After the reaction, water and toluene were added thereto, and the resulting mixture was stirred, and then an organic layer was separated, and further washed with water. The organic layer was concentrated, and a crude product obtained was purified with a silica gel short-pass column (eluent: toluene) to obtain 3,5-di(t-butyl)phenylboronic acid pinacol ester (56.0 g).

Formula 157

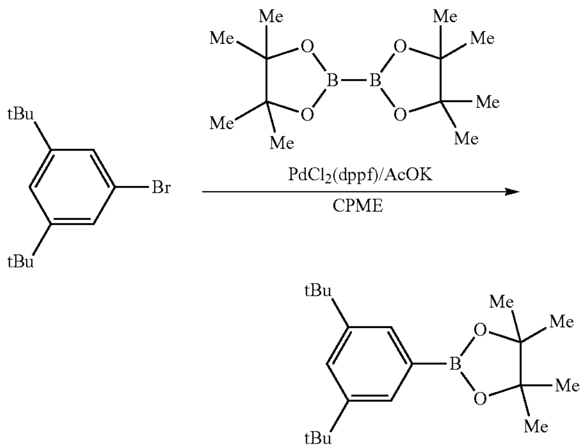

In a flask in which 2-bromo-4-t-butylaniline (15.0 g), 3,5-di(t-butyl)phenylboronic acid pinacol ester (25.0 g), Pd-132 (0.47 g), tripotassium phosphate (28.0 g), toluene (300 mL), t-butanol (30 mL) and water (15 mL) were put, the resulting mixture was stirred at 100° C. for 1 hour. After the reaction, water and ethyl acetate were added thereto, and the resulting mixture was stirred, and then an organic layer was washed with water twice and concentrated, and heptane was added thereto and cooled to obtain precipitate. The resulting precipitate was subjected to filtration to obtain intermediate (N-2) (20.0 g).

Formula 158

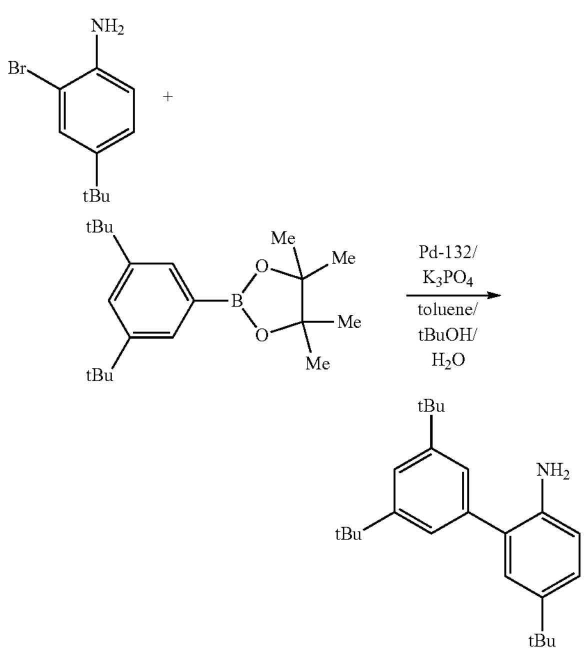

(N-2)

Under a nitrogen atmosphere, in a flask in which intermediate (N-2) (18.0 g), 1-bromo-4-t-butylbenzene (11.4 g), Pd-132 (0.38 g), NaOtBu (7.7 g) and xylene (150 mL) were put, the resulting mixture was stirred at 110° C. for 0.5 hour. After the reaction, water and ethyl acetate were added thereto, and the resulting mixture was stirred, and then an organic layer was washed with water twice and concentrated, and a crude product obtained was purified with a silica gel column (eluent: toluene/heptane=3/7 (volume ratio)) to obtain intermediate (R-2) (23.1 g).

Formula 159

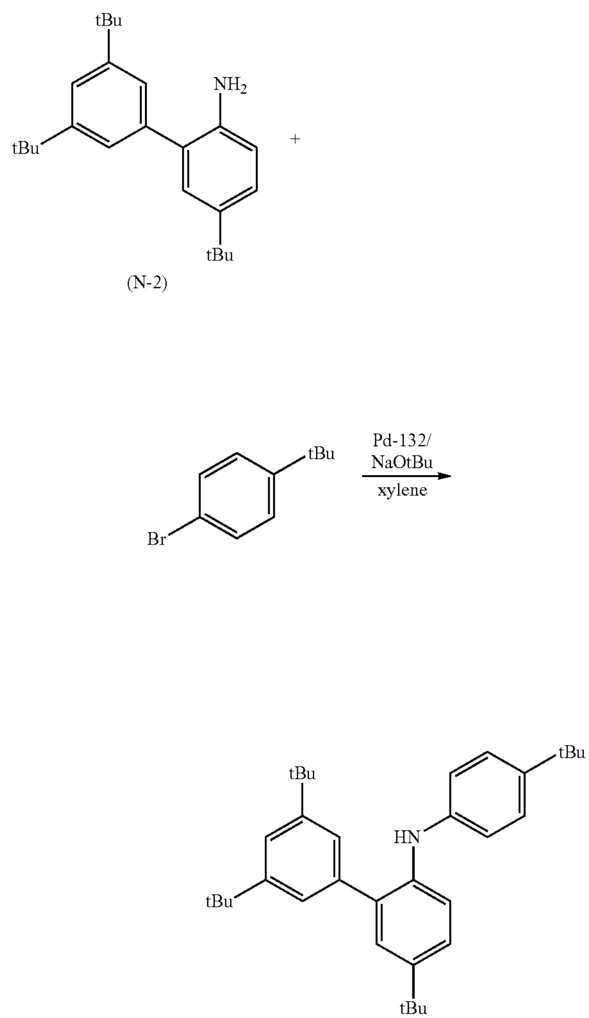

(N-2)

(R-2)

Under a nitrogen atmosphere, in a flask in which intermediate (I) (12.0 g), intermediate (R-2) (12.6 g), Pd-132 (0.19 g), NaOtBu (3.9 g) and xylene (60 mL) were put, the resulting mixture was stirred at 120° C. for 1 hour. After the reaction, water and ethyl acetate were added thereto, and the resulting mixture was stirred, and then an organic layer was washed with water twice and concentrated, and a crude product obtained was purified with a silica gel short-pass column (eluent: toluene) to obtain intermediate (S-2) (15.1 g).

Formula 160

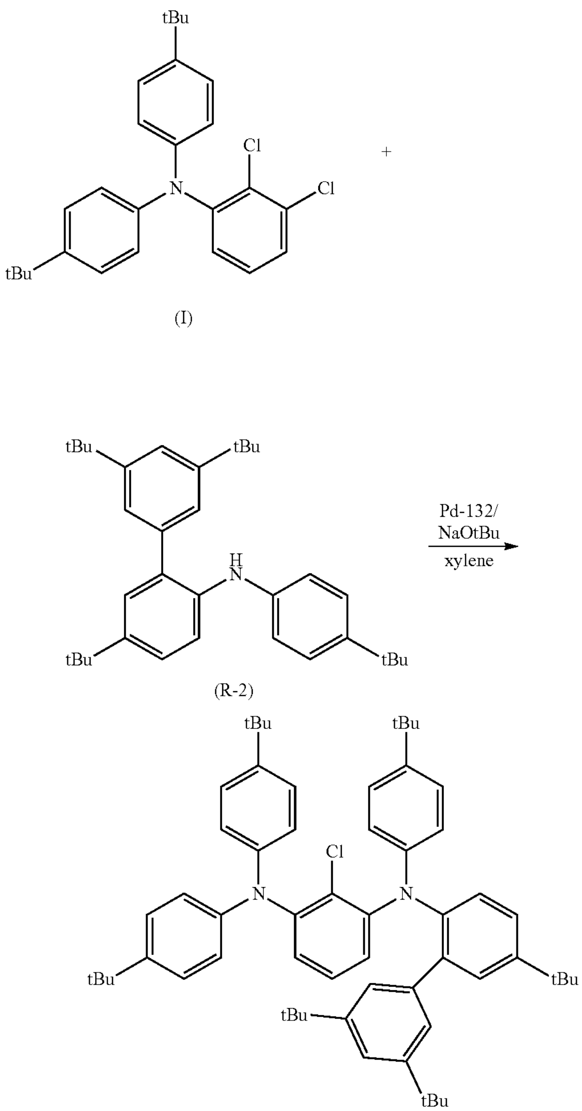

(I) (R-2) (S-2)

Under a nitrogen atmosphere, in a flask in which intermediate (S-2) (16.0 g) and t-butylbenzene (70 mL) were put, the resulting mixture was cooled in an ice bath, and t-butyllithium (1.62 M, 28.7 mL) was added thereto, and then a low boiling point component was removed at 60° C. under reduced pressure. The resulting mixture was cooled down to about −50° C. in a dry ice bath, and boron tribromide (14.0 g) was added thereto. The resulting mixture was heated to room temperature, and N,N-diisopropylethylamine (4.8 g) was added thereto in an ice bath, and then the resulting mixture was stirred at 100° C. for 1 hour. After the reaction, an aqueous sodium acetate solution was added to a reaction solution, and the resulting mixture was stirred, and ethyl acetate was added thereto, and the resulting mixture was stirred, and then an organic layer was separated. A crude product was purified with a silica gel column (eluent: toluene/heptane=3/7 (volume ratio)) to obtain a compound represented by formula (1-252) (3.1 g).

Formula 161

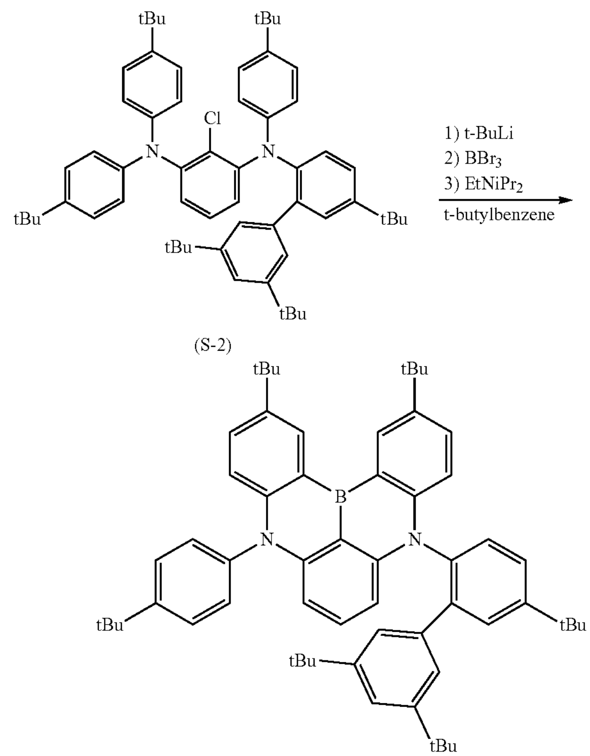

(S-2) (1-252)

A structure of the compound obtained was confirmed by NMR measurement.

$^{1}$H-NMR: δ=1.0 (s, 18H), 1.5 (s, 9H), 1.6 (s, 9H), 1.6 (s, 9H), 1.6 (s, 9H), 6.2 (d, 1H), 6.4 (d, 1H), 6.8 (d, 1H), 6.9 (d, 2H), 7.0 (d, 1H), 7.0 (m, 1H), 7.3-7.4 (m, 3H), 7.5 (d, 1H), 7.6 (dd, 1H), 7.6 (m, 1H), 7.8 (m, 4H), 8.9 (d, 1H), 9.0 (d, 1H).

Synthesis Example (16)

Synthesis of Compound (1-296)

Formula 162

(1-296)

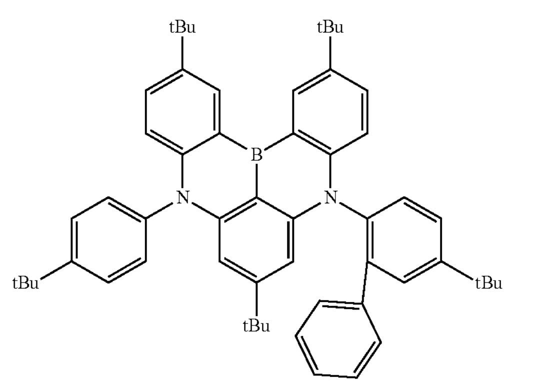

Under a nitrogen atmosphere, in a flask in which intermediate (I-1) (10.0 g), intermediate (R-3) (7.1 g), Pd-132

(0.14 g), NaOtBu (2.8 g) and xylene (50 mL) were put, the resulting mixture was stirred at 120° C. for 1 hour. After the reaction, water and ethyl acetate were added thereto, and the resulting mixture was stirred, and then an organic layer was washed with water twice and concentrated, and a crude product obtained was purified with a silica gel short-pass column (eluent: toluene) to obtain intermediate (S-3) (14.2 g).

Formula 163

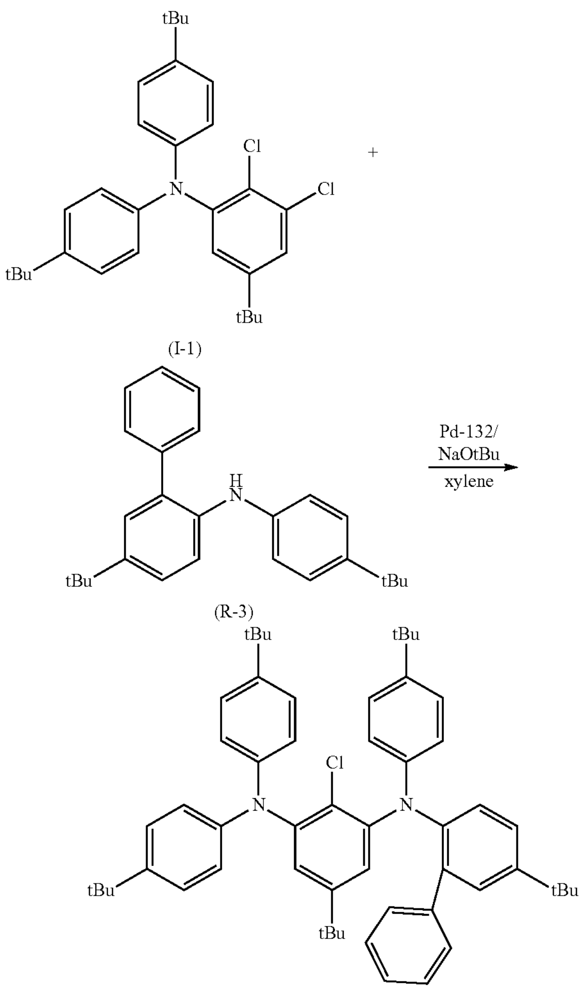

(I-1)

(R-3)

(S-3)

Under a nitrogen atmosphere, in a flask in which intermediate (S-3) (14.0 g) and t-butylbenzene (90 mL) were put, the resulting mixture was cooled in an ice bath, and t-butyllithium (1.62 M, 28.0 mL) was added thereto, and then a low boiling point component was removed at 60° C. under reduced pressure. The resulting mixture was cooled down to about −50° C. in a dry ice bath, and boron tribromide (13.1 g) was added thereto. The resulting mixture was heated to room temperature, and N,N-diisopropylethylamine (4.5 g) was added thereto in an ice bath, and the resulting mixture was stirred at 100° C. for 1 hour. After the reaction, an aqueous sodium acetate solution was added to a reaction solution, and the resulting mixture was stirred, and ethyl acetate was added thereto, and the resulting mixture was stirred, and then an organic layer was separated. A crude product was purified with a silica gel column (eluent: toluene/heptane=3/7 (volume ratio)) to obtain a compound represented by formula (1-296) (1.4 g).

Formula 164

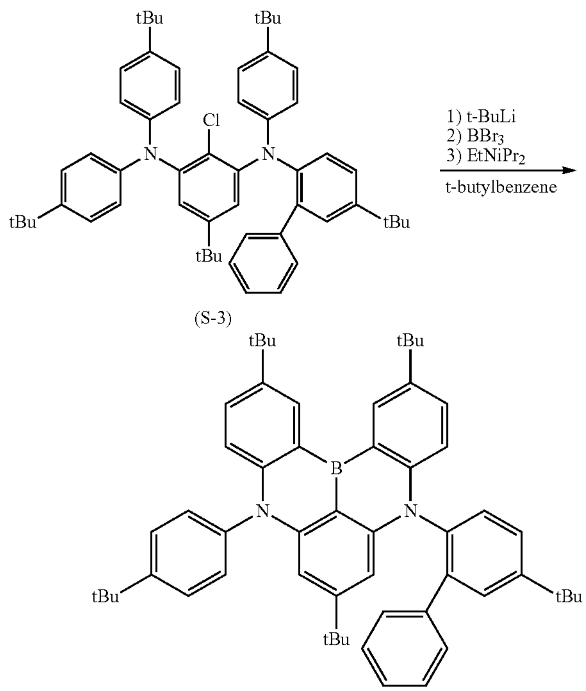

(S-3)

(1-296)

A structure of the compound obtained was confirmed by NMR measurement.

$^{1}$H-NMR: δ=1.0 (s, 9H), 1.4 (s, 9H), 1.5 (s, 18H), 1.5 (s, 9H), 6.0 (s, 1H), 6.1 (s, 1H), 6.7 (d, 1H), 6.9 (d, 1H), 7.0 (m, 3H), 7.1-7.2 (m, 2H), 7.3 (m, 3H), 7.5 (m, 2H), 7.6-7.7 (m, 4H), 8.9 (d, 1H), 8.9 (d, 1H).

Synthesis Example (17)

Synthesis of Compound (1-300)

Formula 165

(1-300)

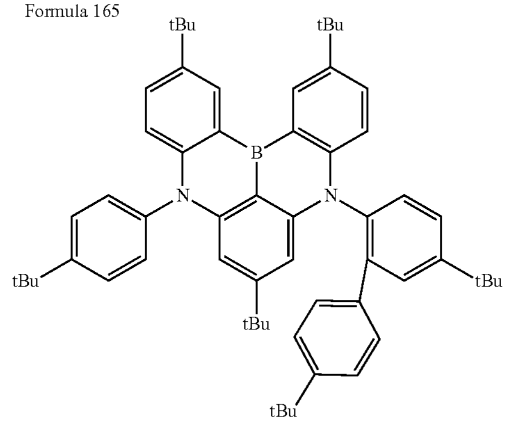

Under a nitrogen atmosphere, in a flask in which intermediate (I-1) (10.0 g), intermediate (R) (8.2 g), Pd-132 (0.14 g), NaOtBu (2.8 g) and xylene (50 mL) were put, the resulting mixture was stirred at 110° C. for 1 hour. After the reaction, water and ethyl acetate were added thereto, and the resulting mixture was stirred, and then an organic layer was washed with water twice and concentrated, and a crude product obtained was purified with a silica gel column (eluent: toluene) to obtain intermediate (S-4) (15.1 g).

Formula 166

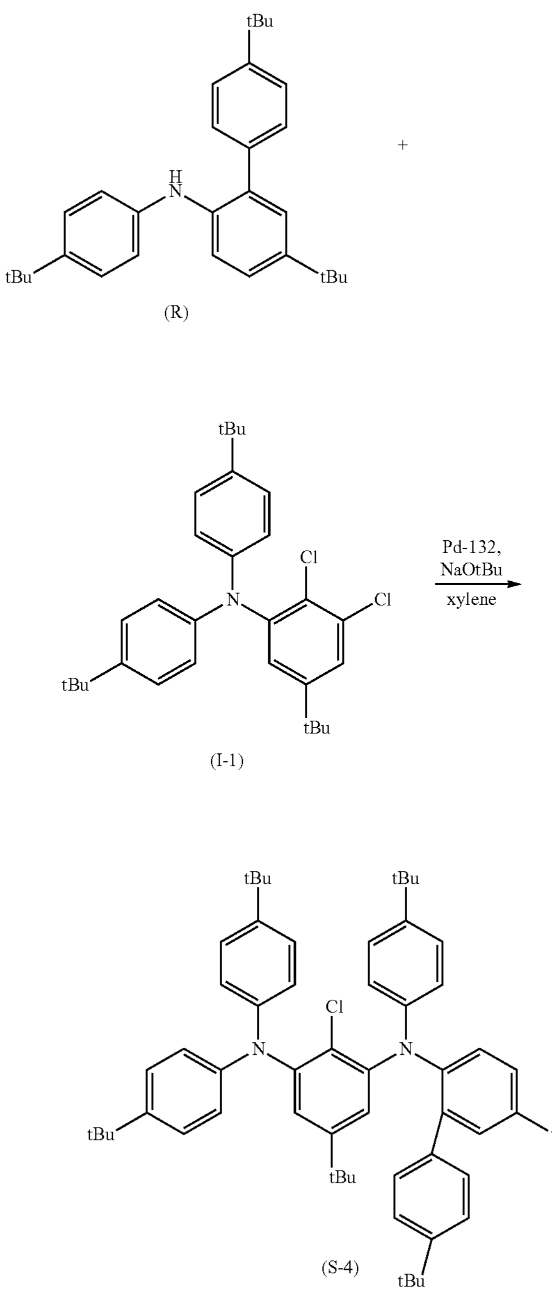

(R)

(I-1)

(S-4)

Under a nitrogen atmosphere, in a flask in which intermediate (S-4) (15.0 g) and t-butylbenzene (90 mL) were put, the resulting mixture was cooled in an ice bath, and t-butyllithium (1.62 M, 26.9 mL) was added thereto, and then the resulting mixture was stirred at 60° C. for 1 hour, and then a low boiling point component was removed at 60° C. under reduced pressure. The resulting mixture was cooled down to about −50° C. in a dry ice bath, and boron tribromide (13.1 g) was added thereto. The resulting mixture was heated to room temperature, and N,N-diisopropylethylamine (4.5 g) was added thereto in an ice bath, and then the resulting mixture was stirred at 100° C. for 1 hour. After the reaction, an aqueous sodium acetate solution was added to a reaction solution, and the resulting mixture was stirred, and further ethyl acetate was added thereto, and the resulting mixture was stirred, and then an organic layer was separated. A crude product was purified with a silica gel column (eluent: toluene/heptane=3/7 (volume ratio)) to obtain a compound represented by formula (1-300) (2.9 g).

Formula 167

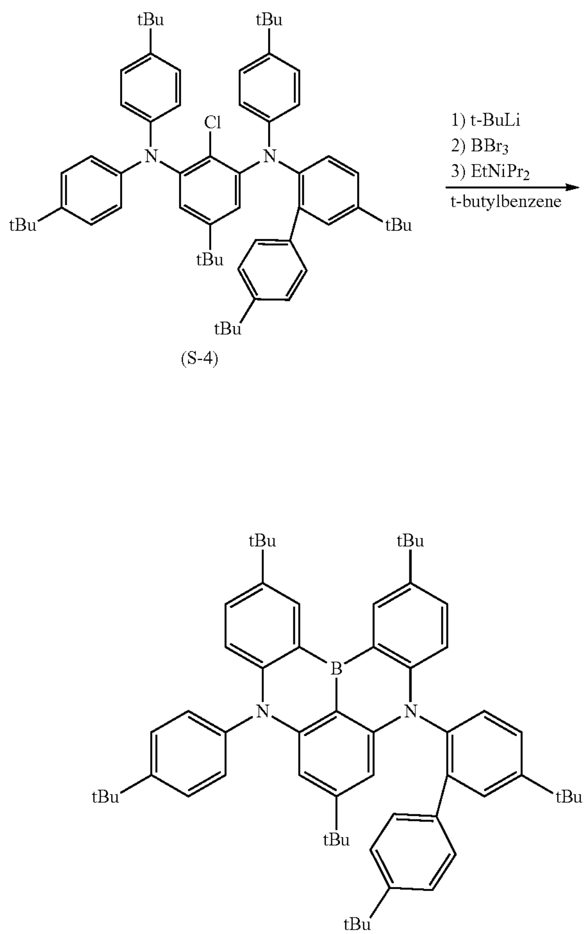

(S-4)

(1-300)

A structure of the compound obtained was confirmed by NMR measurement.

$^1$H-NMR: δ=1.0 (s, 9H), 1.1 (s, 9H), 1.4 (s, 9H), 1.5 (s, 9H), 1.5 (s, 9H), 1.5 (s, 9H), 6.0 (s, 1H), 6.2 (s, 1H), 6.7 (d, 1H), 6.8 (d, 1H), 7.0 (d, 2H), 7.1 (d, 2H), 7.2 (d, 2H), 7.3 (s, 1H), 7.4-7.5 (m, 2H), 7.6 (dd, 1H), 7.7 (d, 2H), 7.7 (d, 1H), 8.9 (d, 1H), 8.9 (d, 1H).

Synthesis Example (18)

Synthesis of Compound (1-715)

Formula 168

(1-715)

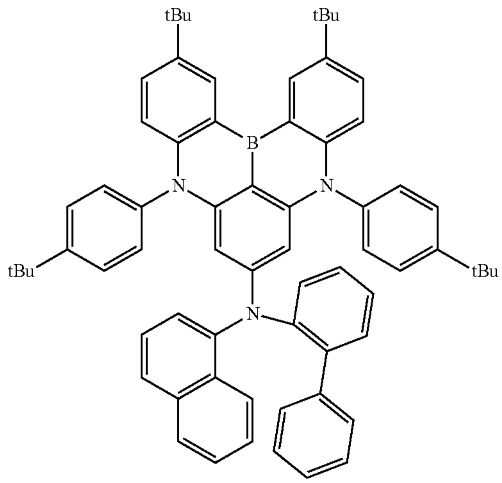

Under a nitrogen atmosphere, in a flask in which 3,4,5-trichloroaniline (10.0 g), 2-bromobiphenyl (11.9 g), Pd-132 (0.36 g), NaOtBu (7.3 g) and xylene (100 mL) were put, the resulting mixture was heated and stirred at 130° C. for 1 hour. The resulting reaction mixture was cooled down to room temperature, and then water and ethyl acetate were added thereto, and liquid was separated. An organic layer was washed with water, and then a solvent was distilled off under reduced pressure. Then, the resulting mixture was purified with a silica gel short pass column (eluent: toluene). Further, the resulting mixture was subjected to reprecipitation in heptane to obtain intermediate (1-2) (10.0 g).

Formula 169

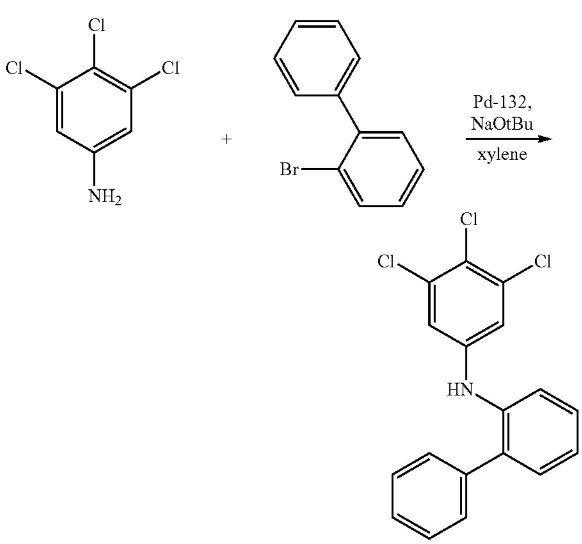

(I-2)

Under a nitrogen atmosphere, in a flask in which intermediate (1-2) (10.0 g), 1-bromonaphthalene (8.9 g), Pd-132 (0.20 g), NaOtBu (4.1 g) and xylene (80 mL) were put, the resulting mixture was heated and stirred at 120° C. for 0.5 hour. The resulting reaction mixture was cooled down to room temperature, and then water and ethyl acetate were added thereto, and liquid was separated. An organic layer was washed with water, and then a solvent was distilled off under reduced pressure. Then, the resulting residue was purified with a silica gel column (eluent: toluene/heptane=15/85 (volume ratio)). Further, the resulting mixture was subjected to reprecipitation in heptane to obtain intermediate (1-3) (11.0 g).

Formula 170

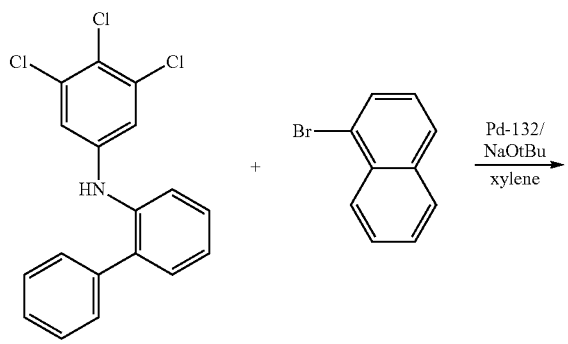

(I-2)

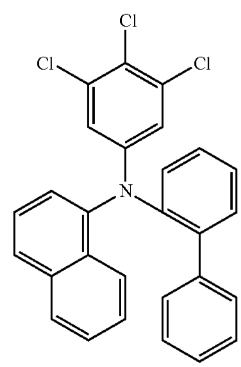

(I-3)

Under a nitrogen atmosphere, in a flask in which intermediate (1-3) (11.0 g), bis(4-(t-butyl)phenyl)amine (14.3 g), $Pd(dba)_2$ (0.40 g), SPhos (0.57 g), NaOtBu (5.6 g) and xylene (90 mL) were put, the resulting mixture was heated and stirred at 110° C. for 1 hour. The resulting reaction mixture was cooled down to room temperature, and then water and ethyl acetate were added thereto, and liquid was separated. An organic layer was washed with water, and then a solvent was distilled off under reduced pressure. Then, the resulting residue was purified with a silica gel short-pass column (eluent: toluene) and subjected to reprecipitation in heptane to obtain intermediate (S-5) (14.0 g).

Formula 171

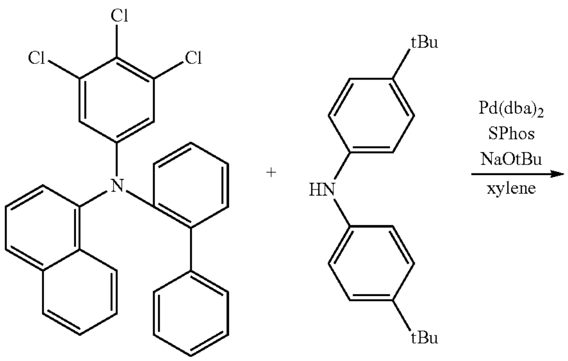

(I-3)

Formula 172

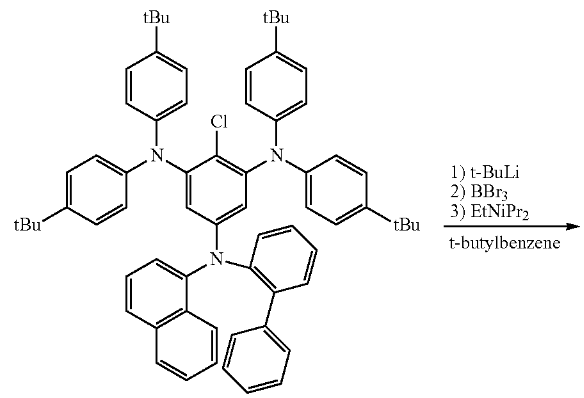

(S-5)

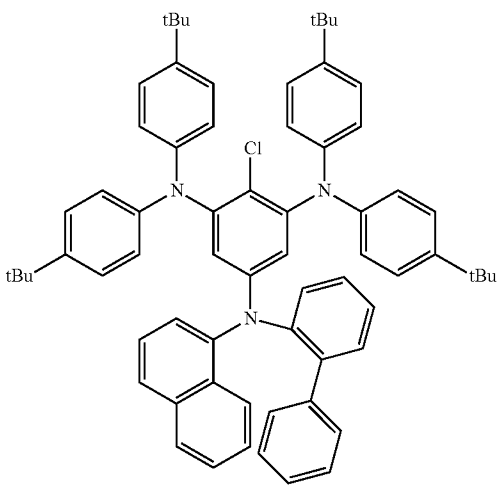

(S-5)

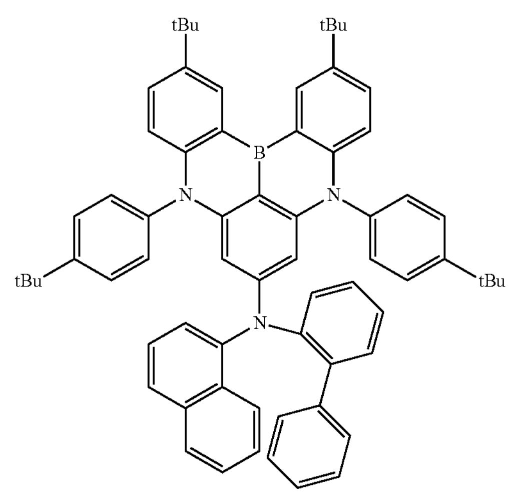

(1-715)

Under a nitrogen atmosphere, in a flask in which intermediate (S-5) (14.0 g) and t-butylbenzene (100 mL) were put, the resulting mixture was cooled in an ice bath, t-butyllithium (1.62 M, 21.7 mL) was added thereto, and the resulting mixture was stirred at 60° C. for 1 hour, and then a low boiling point component was removed at 60° C. under reduced pressure. The resulting mixture was cooled down to about −50° C. in a dry ice bath, and boron tribromide (10.0 g) was added thereto. The resulting mixture was heated to room temperature, and N,N-diisopropylethylamine (3.4 g) was added thereto in an ice bath, and then the resulting mixture was stirred at 100° C. for 1 hour. After the reaction, an aqueous sodium acetate solution was added to a reaction solution, and the resulting mixture was stirred, and further ethyl acetate was added thereto, and the resulting mixture was stirred, and then an organic layer was separated. A crude product was purified with a silica gel column (eluent: toluene/heptane=3/7 (volume ratio)) to obtain a compound represented by formula (1-715) (2.1 g).

A structure of the compound obtained was confirmed by NMR measurement.

$^{1}$H-NMR: δ=1.3 (s, 18H), 1.4 (s, 18H), 5.0 (s, 1H), 5.3 (s, 1H), 6.6-7.5 (m, 27H).7.6 (d, 1H), 8.9 (d, 2H).

Synthesis Example (19)

Synthesis of Compound (1-730)

Formula 173

(1-730)

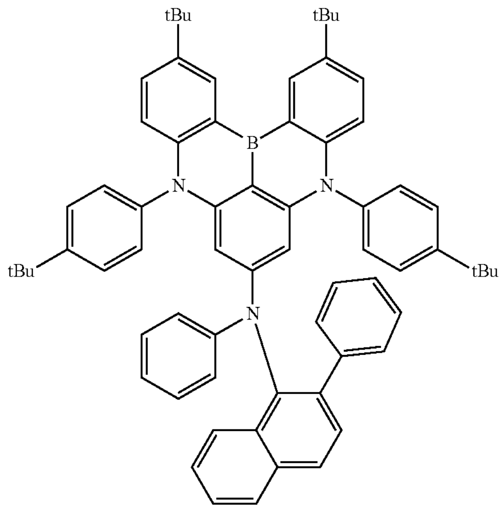

Under a nitrogen atmosphere, in a flask in which 1-bromo-2-naphthol (45.0 g) and pyridine (250 mL) were put, the resulting mixture was cooled in an ice bath, and trifluoromethanesulfonic anhydride (85.0 g) was added dropwise thereto, and then the resulting mixture was stirred at room temperature for 1 hour. Then, water was added thereto to stop the reaction, and then toluene was added thereto, and an organic layer was washed with water using dilute hydrochloric acid, and then the organic layer was concentrated. The resulting crude product was purified by a silica gel column chromatography (eluent: toluene/heptane=1/2 (volume ratio)) to obtain intermediate (V-2) (61.0 g).

Formula 174

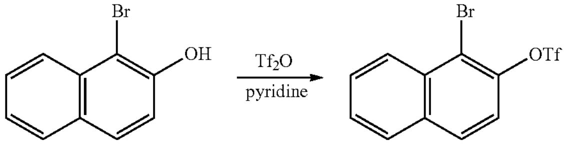

(V-2)

Under a nitrogen atmosphere, in a flask in which intermediate (V-2) (61.0 g), lithium bromide (14.9 g) and diethyl ether (100 mL) were put, while the resulting mixture was cooled in an ice bath, phenylmagnesium bromide (0.3 mol/100 mL diethyl ether solution), and subsequently [1.3-bis(diphenylphosphino)propane]palladium(II) dichloride ($PdCl_2$(dippp), 3.0 g) was added thereto, and the resulting mixture was stirred for 1 hour. After the reaction, methanol was added thereto to stop the reaction, and then dilute hydrochloric acid was added thereto, and the resulting mixture was stirred, and further toluene was added thereto, and the resulting mixture was stirred, and an organic layer was separated. The organic layer was concentrated, and then the resulting crude product was purified by a silica gel column chromatography (eluent: toluene/heptane=1/2 (volume ratio)) to obtain 1-bromo-2-phenylnaphthalene (17 g).

Formula 175

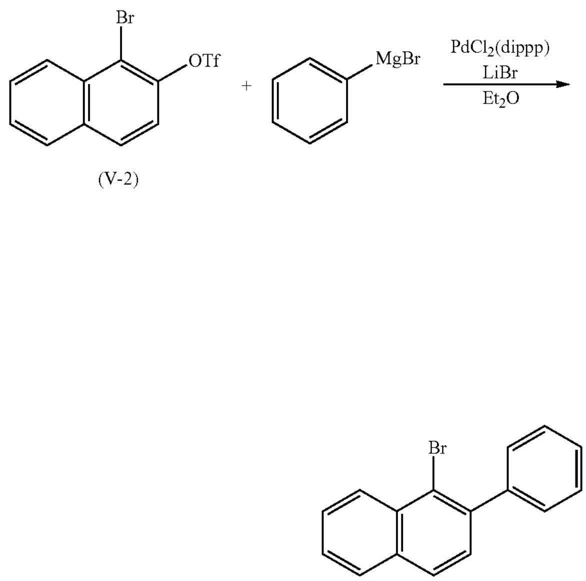

Under a nitrogen atmosphere, in a flask in which 3,4,5-trichloro-N-phenylaniline (11.6 g), 1-bromo-2-phenylnaphthalene (14.5 g), $Pd(dba)_2$ (0.24 g), SPhos (0.35 g), NaOtBu (6.0 g) and xylene (150 mL) were put, the resulting mixture was heated and stirred at 110° C. for 3 hours. The resulting reaction mixture was cooled down to room temperature, and then water and ethyl acetate were added thereto, and liquid was separated. An organic layer was washed with water, and then a solvent was distilled off under reduced pressure. Then, the resulting residue was purified by silica gel column chromatography (eluent: toluene/heptane=1/9 (volume ratio)) and subjected to reprecipitation in heptane to obtain intermediate (1-4) (7.3 g).

Formula 176

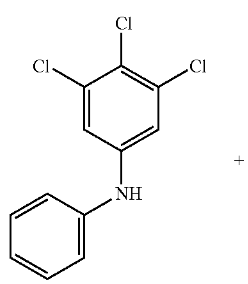

-continued

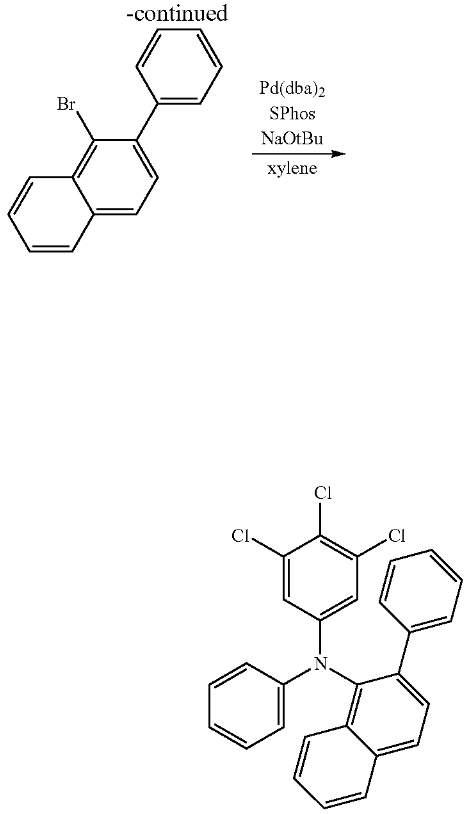

(I-4)

Under a nitrogen atmosphere, in a flask in which intermediate (1-4) (7.0 g), bis(4-(t-butyl)phenyl)amine (9.1 g), $Pd(dba)_2$ (0.17 g), SPhos (0.30 g), NaOtBu (3.5 g) and xylene (50 mL) were put, the resulting mixture was heated and stirred at 110° C. for 3 hours. The resulting reaction mixture was cooled down to room temperature, and then water and ethyl acetate were added thereto, and liquid was separated. An organic layer was washed with water, and then a solvent was distilled off under reduced pressure. Then, the resulting residue was purified by silica gel column chromatography (eluent: toluene/heptane=1/1 (volume ratio)) and subjected to reprecipitation in heptane to obtain intermediate (S-6) (8.1 g).

Formula 177

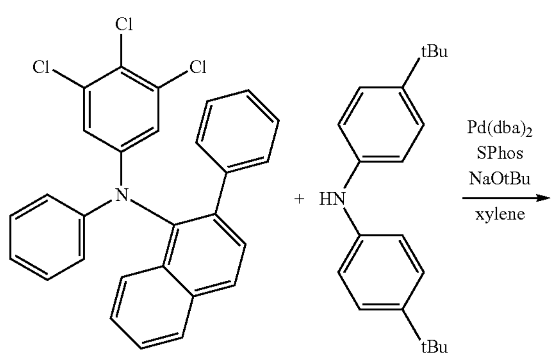

(I-4)

-continued

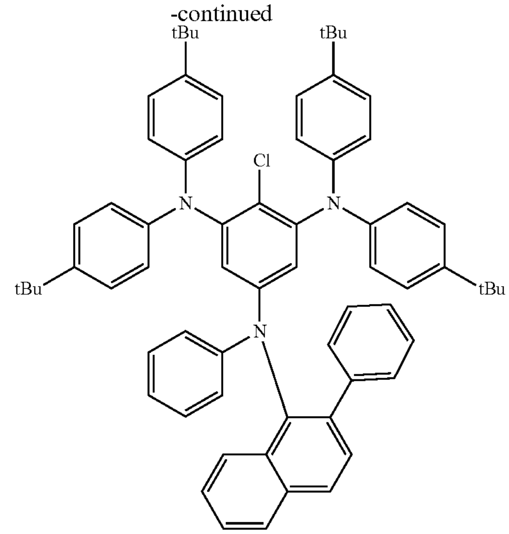

(S-6)

Under a nitrogen atmosphere, in a flask in which intermediate (S-6) (8.0 g) and t-butylbenzene (60 mL) were put, the resulting mixture was cooled in an ice bath, and t-butyllithium (1.52 M, 10.2 mL) was added thereto, and then the resulting mixture was stirred at 70° C. for 0.5 hour, and a low boiling point component was removed at 60° C. under reduced pressure. The resulting mixture was cooled down to about −50° C. in a dry ice bath, and boron tribromide (3.9 g) was added thereto. The resulting mixture was heated to room temperature, N,N-diisopropylethylamine (2.0 g) was added thereto in an ice bath, and then the resulting mixture was stirred at 100° C. for 1 hour. After the reaction, an aqueous sodium acetate solution was added to a reaction solution, and the resulting mixture was stirred, and ethyl acetate was added thereto, and the resulting mixture was stirred, and then an organic layer was separated. A crude product was purified with a silica gel column (eluent: toluene/heptane=1/1 (volume ratio)) to obtain a compound represented by formula (1-730) (2.8 g).

Formula 178

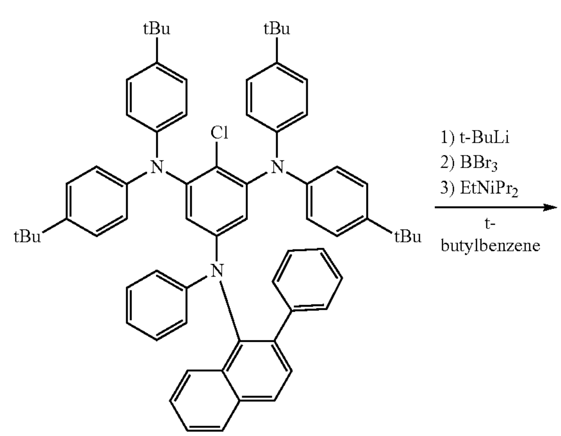

(S-6)

-continued

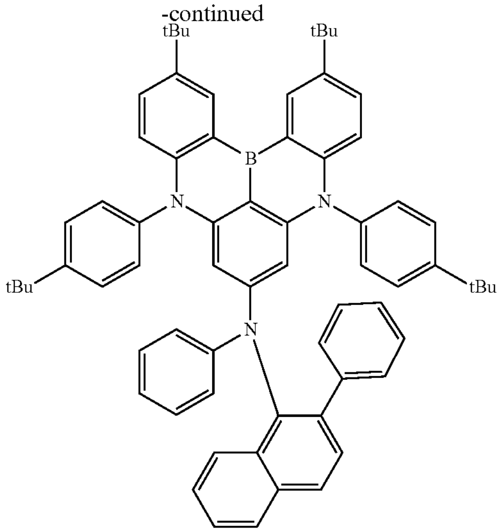

(1-730)

A structure of the compound obtained was confirmed by NMR measurement.

$^1$H-NMR: δ=1.3 (s, 18H), 1.5 (s, 18H), 5.5 (s, 2H), 6.5 (d, 2H), 6.6 (t, 1H), 6.7-7.5 (m, 22H), 7.7 (t, 2H), 7.8 (d, 1H), 8.9 (d, 2H).

Synthesis Example (20)

Synthesis of Compound (1-733)

Formula 179

(1-733)

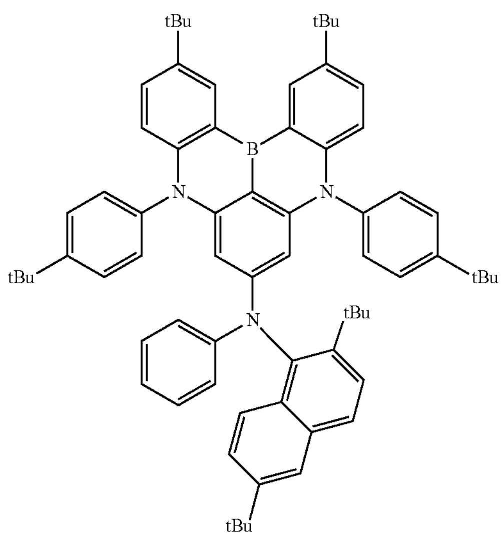

Under a nitrogen atmosphere, 2,6-di-tert-butylnaphthalene (25.0 g) and chloroform (100 mL) were put in a flask, and bromine (18.3 g) was slowly added dropwise thereto, and then the resulting mixture was stirred for 1 hour. After the reaction, the resulting reaction mixture was cooled in an ice bath, and then an aqueous sodium sulfite solution was added thereto to stop the reaction. An organic layer was separated and concentrated, and then the resulting residue was purified by silica gel column chromatography (eluent: toluene/heptane=1/1 (volume ratio)), and further subjected to recrystallization in SOLMIX to obtain 1-bromo-2,6-di-tert-butylnaphthalene (17.5 g).

Formula 180

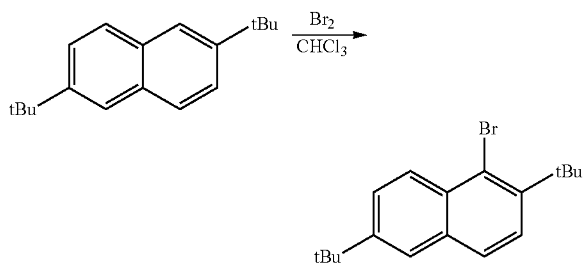

Under a nitrogen atmosphere, in a flask in which 3,4,5-trichloro-N-phenylaniline (12.0 g), 2,6-di-tert-butylnaphthalene (17.0 g), Pd-132 (0.31 g), NaOtBu (6.3 g) and xylene (90 mL) were put, the resulting mixture was heated and stirred at 110° C. for 0.5 hour. The resulting reaction mixture was cooled down to room temperature, and then water and ethyl acetate were added thereto, and liquid was separated. An organic layer was washed with water, and then a solvent was distilled off under reduced pressure. Then, the resulting residue was purified by silica gel column chromatography (eluent: toluene/heptane=5/95 (volume ratio)) and subjected to reprecipitation in heptane to obtain intermediate (I-5) (18.7 g).

Formula 181

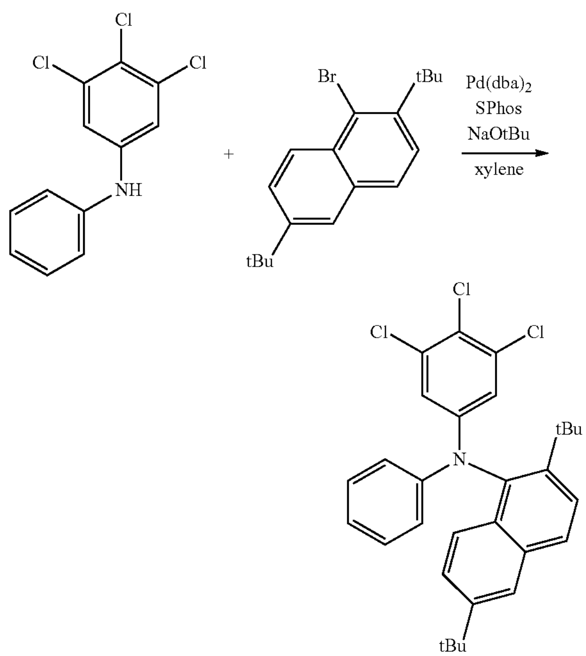

(I-5)

Under a nitrogen atmosphere, in a flask in which intermediate (I-5) (17.0 g), bis(4-(t-butyl)phenyl)amine (20.6 g), $Pd(dba)_2$ (0.38 g), SPhos (0.68 g), NaOtBu (8.0 g) and xylene (100 mL) were put, the resulting mixture was heated and stirred at 110° C. for 3 hours. The resulting reaction mixture was cooled down to room temperature, and then water and ethyl acetate were added thereto, and liquid was separated. An organic layer was washed with water, and then a solvent was distilled off under reduced pressure. Then, the resulting residue was purified by silica gel column chromatography (eluent: toluene/heptane=15/85 (volume ratio)) and subjected to reprecipitation in heptane to obtain intermediate (S-7) (20.0 g).

Formula 182

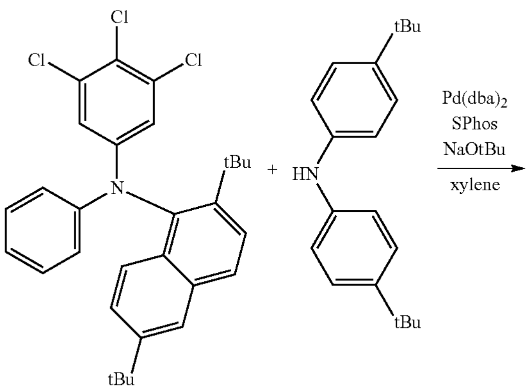

(I-5)

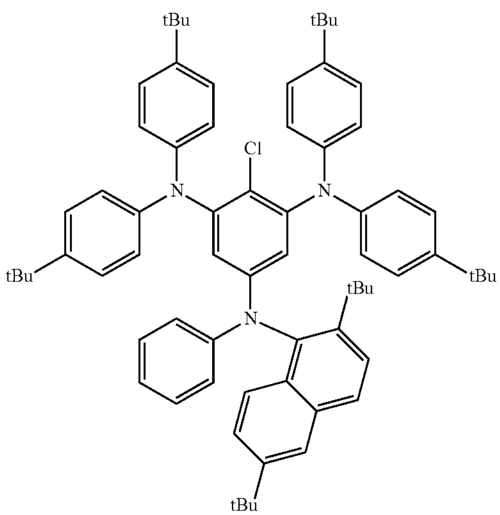

(S-7)

Under a nitrogen atmosphere, in a flask in which intermediate (S-7) (15.0 g) and t-butylbenzene (100 mL) were put, the resulting mixture was cooled in an ice bath, and t-butyllithium (1.52 M, 14.8 mL) was added thereto, and then the resulting mixture was stirred at 70° C. for 0.5 hour, and a low boiling point component was removed at 60° C. under reduced pressure. The resulting mixture was cooled down to about −50° C. in a dry ice bath, and boron tribromide (5.6 g) was added thereto. The resulting mixture was heated to room temperature, and N,N-diisopropylethylamine (2.9 g) was added thereto in an ice bath, and then the resulting mixture was stirred at 100° C. for 1 hour. After the reaction, an aqueous sodium acetate solution was added to a reaction solution, and the resulting mixture was stirred, and further ethyl acetate was added thereto, and the resulting mixture was stirred, and then an organic layer was separated. A crude product was purified with a silica gel column (eluent: toluene/heptane=1/1 (volume ratio)) to obtain a compound represented by formula (1-733) (4.2 g).

Formula 183

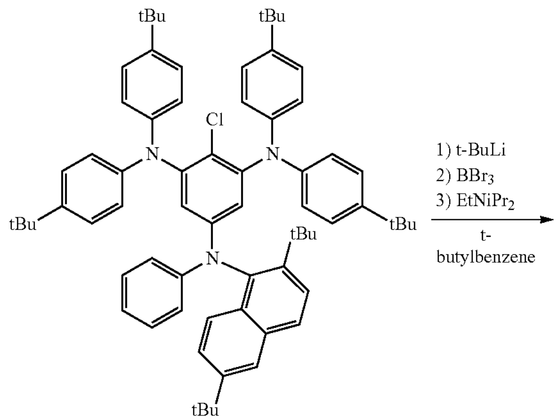

(S-7)

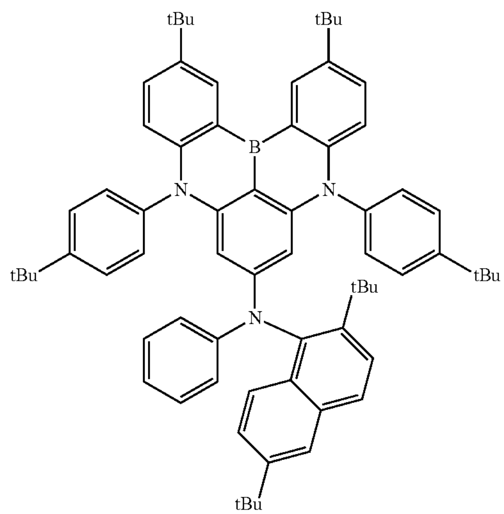

(1-733)

A structure of the compound obtained was confirmed by NMR measurement.

$^1$H-NMR: δ=1.1 (s, 9H), 1.2 (s, 9H), 1.3 (s, 18H), 1.5 (s, 18H), 5.4 (s, 2H), 6.7 (d, 2H), 6.8 (m, 1H), 7.0 (m, 8H), 7.2 (d, 1H), 7.3 (d, 4H), 7.4-7.5 (m, 4H), 7.5 (d, 1H), 7.7 (d, 1H), 9.0 (d, 2H).

Next, Synthesis Examples of comparative compounds (C-1) to (C-12) will be described below.

Formula 184
(C-1)
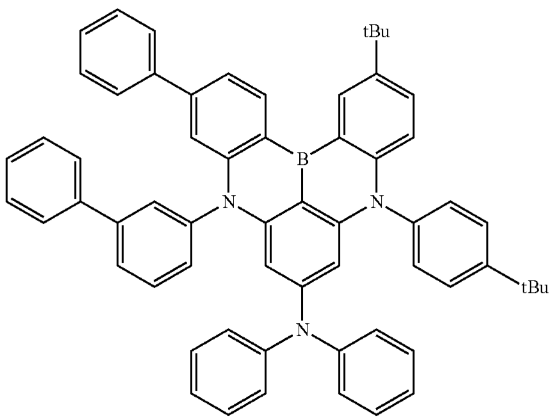
(C-2)
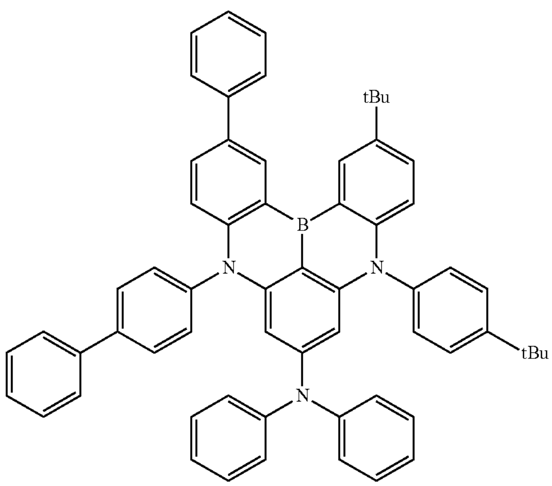
(C-3)
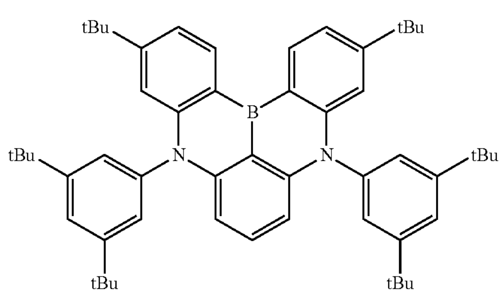
(C-4)
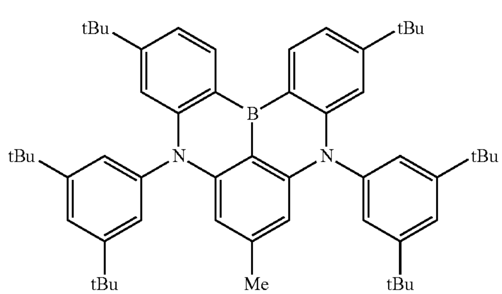
-continued
(C-5)
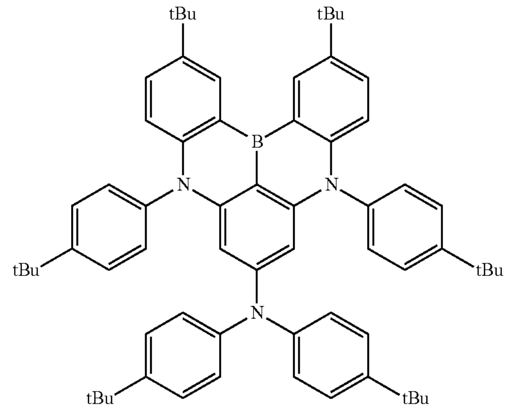
(C-6)
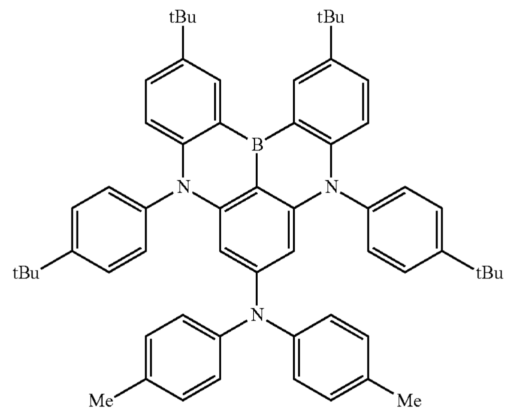
(C-7)
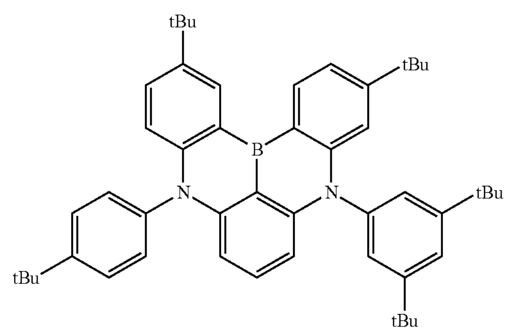
(C-8)
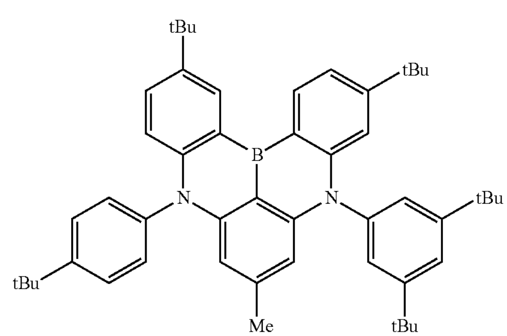

-continued (C-9)

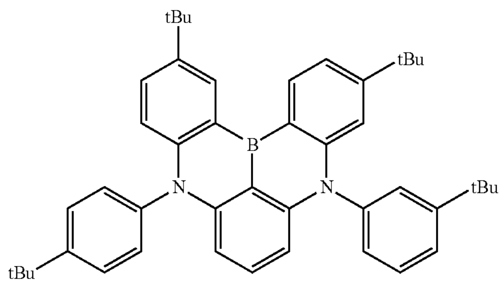

(C-10)

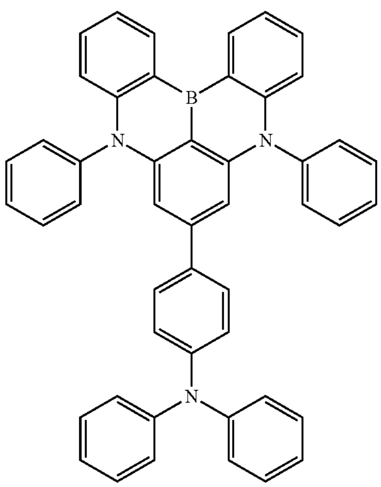

(C-11)

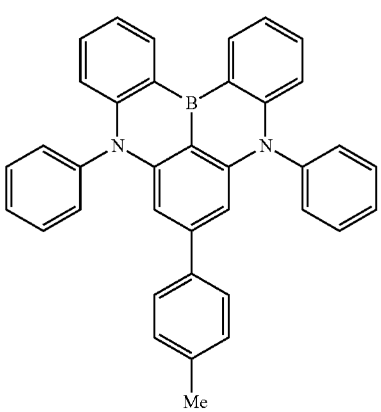

(C-12)

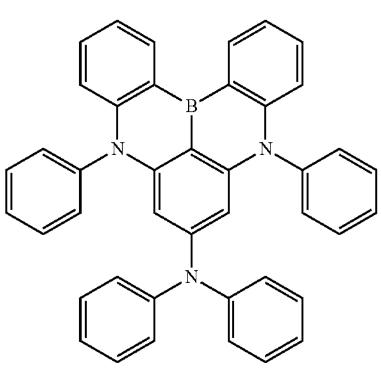

Comparative Synthesis Example (1)

Comparative Compound (C-12): Synthesis of N,N, 5,9-tetraphenyl-5,9-dihydro-5,9-diaza-13b-boranaphth[3,2,1-de]anthracene-7-amine Formula 185

(C-12)

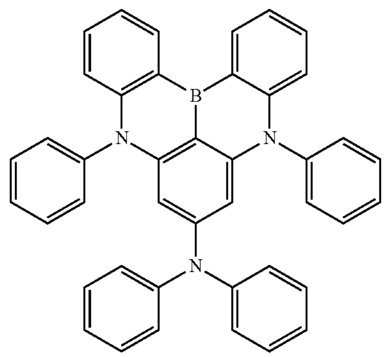

Under a nitrogen atmosphere, boron tribromide (3.78 mL, 40 mmol) was added to $N^1,N^1,N^3,N^3,N^5,N^5$-hexaphenyl-1,3,5-benzenetriamine (11.6 g, 20 mmol) and orthodichlorobenzene (ODCB, 120 mL) at room temperature, and then the resulting mixture was heated and stirred at 170° C. for 48 hours. Then, a reaction solution was distilled off at 60° C. under reduced pressure. The resulting mixture was subjected to filtration using a Florisil short-pass column, and a solvent was distilled off under reduced pressure to obtain a crude product. The crude product was washed using hexane to obtain a compound represented by formula (C-12) as a yellow solid (11.0 g, yield: 94%).

Formula 186

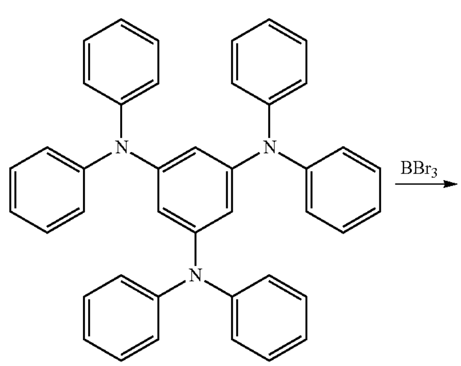

-continued

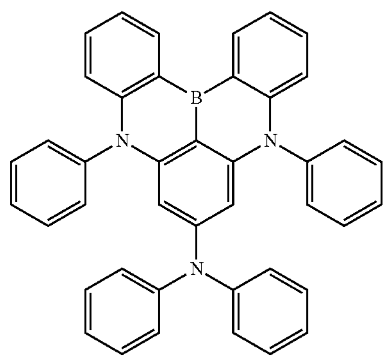

(C-12)

A structure of the compound obtained was confirmed by NMR measurement.

$^1$H-NMR (400 MHz, $CDCl_3$): δ=5.62 (brs, 2H), 6.71 (d, 2H), 6.90-6.93 (m, 6H), 7.05-7.09 (m, 4H), 7.20-7.27 (m, 6H), 7.33-7.38 (m, 4H), 7.44-7.48 (m, 4H), 8.90 (dd, 2H).

$^{13}$C-NMR (101 MHz, $CDCl_3$): δ=98.4 (2C), 116.8 (2C), 119.7 (2C), 123.5 (2C), 125.6 (4C), 128.1 (2C), 128.8 (4C), 130.2 (4C), 130.4 (2C), 130.7 (4C), 134.8 (2C), 142.1 (2C), 146.6 (2C), 147.7 (2C), 147.8 (2C), 151.1 (4H).

Comparative Synthesis Example (2)

Comparative Compound (C-10): Synthesis of 4-(5,9-diphenyl-5,9-dihydro-5,9-diaza-13b-boranaphth[3,2,1-de]anthracene-7-yl)-N,N-diphenylaniline Formula 187

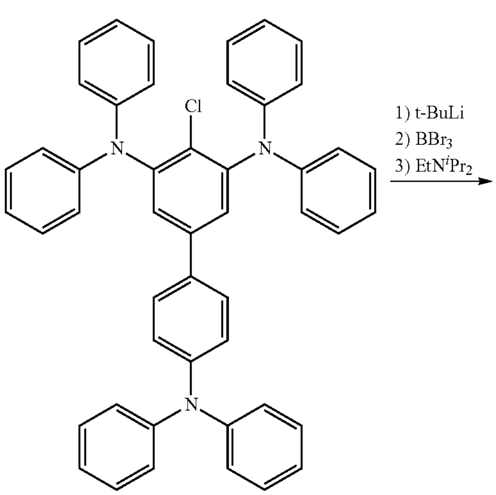

-continued

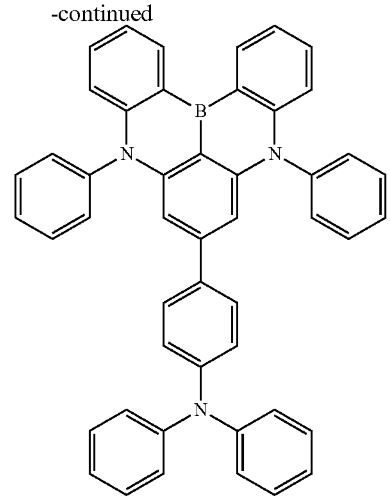

(C-10)

A compound represented by formula (C-10) was prepared using the same method as in the Synthesis Example as described above.

A structure of the compound obtained was confirmed by NMR measurement.

$^1$H-NMR ($CDCl_3$): δ=6.35 (s, 2H), 6.76 (d, 2H), 6.93 (d, 2H), 7.01 (t, 2H), 7.05 (d, 4H), 7.09 (d, 2H), 7.22 (t, 4H), 7.27 (t, 2H), 7.41-7.45 (m, 6H), 7.59 (t, 2H), 7.70 (d, 4H), 8.95 (dd, 2H).

Comparative Synthesis Example (3)

Comparative Compound (C-11): Synthesis of 5,9-diphenyl-7-(p-tolyl)-5,9-dihydro-5,9-diaza-13b-boranaphth[3,2,1-de]anthracene Formula 188

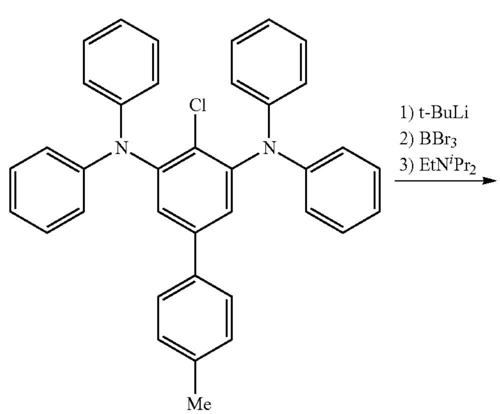

-continued

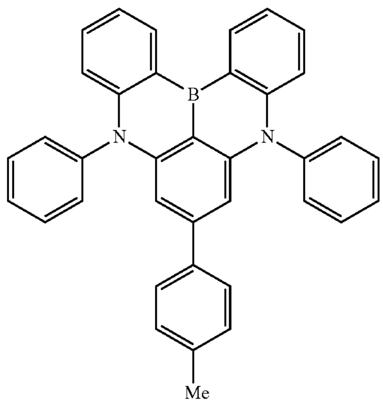

(C-11)

A compound represented by formula (C-11) was prepared using the same method as in the Synthesis Example as described above.

A structure of the compound obtained was confirmed by NMR measurement.

$^1$H-NMR ($CDCl_3$): δ=2.30 (s, 3H), 6.34 (s, 2H), 6.76 (s, 2H), 7.08 (d, 2H), 7.13 (d, 2H), 7.26-7.29 (m, 2H), 7.41-7.45 (m, 6H), 7.59 (t, 2H), 7.70 (t, 4H), 8.96 (dd, 2H).

Comparative Synthesis Example (4)

Comparative Compound (C-1): Synthesis of 9-([1,1'-biphenyl]-3-yl)-2-(t-butyl)-5-(4-(t-butyl)phenyl)-N,N,11-triphenyl-5,9-dihydro-5,9-diaza-13b-boranaphth[3,2,1-de]anthracene-7-amine Formula 189

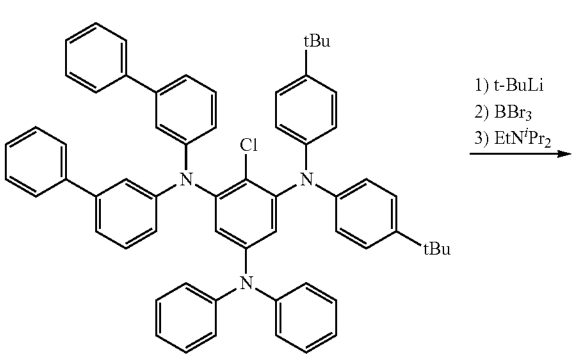

-continued

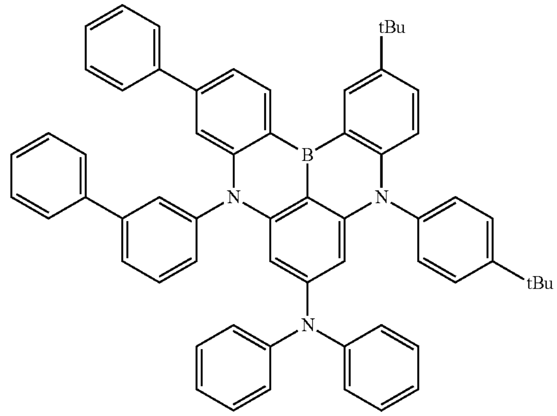

(C-1)

A compound represented by formula (C-1) was prepared using the same method as in the Synthesis Example as described above.

A structure of the compound obtained was confirmed by NMR measurement.

$^1$H-NMR ($CDCl_3$): δ=1.3 (s, 9H), 1.5 (s, 9H), 5.6 (d, 2H), 6.8 (d, 1H), 6.9 (t, 2H), 6.9-7.0 (m, 9H), 7.1 (d, 2H), 7.3 (m, 1H), 7.4 (t, 3H), 7.4-7.6 (m, 13H), 7.6 (m, 1H), 8.9 (d, 1H), 9.0 (d, 1H).

Comparative Synthesis Example (5)

Comparative Compound (C-2): Synthesis of 9-([1,1'-biphenyl]-4-yl)-2-(t-butyl)-5-(4-(t-butyl)phenyl)-N,N, 12-triphenyl-5,9-dihydro-5,9-diaza-13b-boranaphth[3,2,1-de]anthracene-7-amine Formula 190

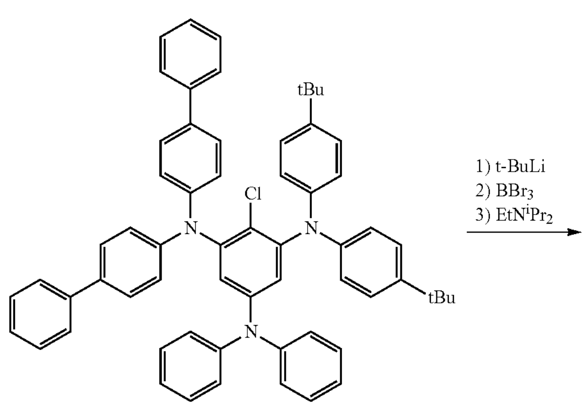

-continued

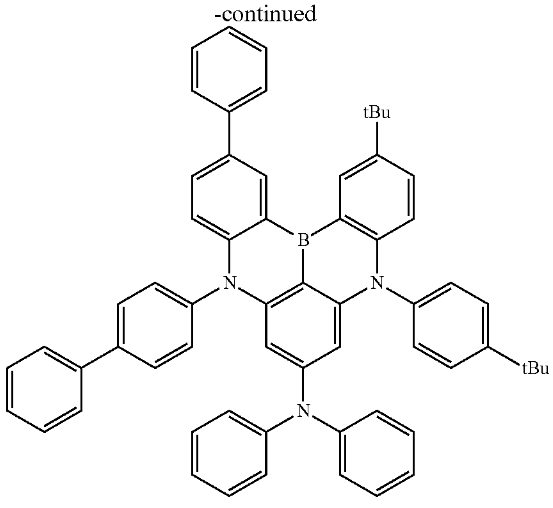

(C-2)

A compound represented by formula (C-2) was prepared using the same method as in the Synthesis Example as described above.

A structure of the compound obtained was confirmed by NMR measurement.

$^{1}$H-NMR ($CDCl_3$): δ=1.4 (s, 9H), 1.5 (s, 9H), 5.7 (s, 2H), 6.7 (d, 1H), 6.9 (m, 7H), 7.1 (m, 4H), 7.2 (d, 2H), 7.3 (t, 1H), 7.3 (d, 2H), 7.4 (t, 1H), 7.4-7.5 (m, 5H), 7.6 (d, 2H), 7.7 (d, 3H), 7.8 (t, 4H), 9.1 (d, 1H), 9.3 (d, 1H).

Comparative Synthesis Example (6)

Comparative Compound (C-3): Synthesis of 3,11-di-t-butyl-5,9-bis(3,5-di-t-butylphenyl)-5,9-dihydro-5,9-diaza-13b-boranaphth[3,2,1-de]anthracene Formula 191

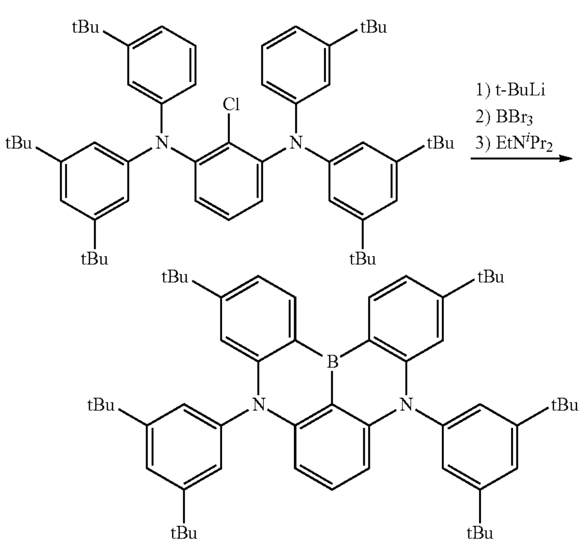

(C-3)

A compound represented by formula (C-3) was prepared using the same method as in the Synthesis Example as described above.

A structure of the compound obtained was confirmed by NMR measurement.

$^{1}$H-NMR ($CDCl_3$): δ=1.20 (s, 18H), 1.36 (s, 36H), 6.25 (d, 2H), 6.67 (d, 2H), 7.21 (d, 4H), 7.29-7.33 (m, 3H), 7.61 (t, 2H), 8.90 (d, 2H).

Comparative Synthesis Example (7)

Comparative Compound (C-4): Synthesis of 3,11-di-t-butyl-5,9-bis(3,5-di-t-butylphenyl)-7-methyl-5,9-dihydro-5,9-diaza-13b-boranaphth[3,2,1-de]anthracene Formula 192

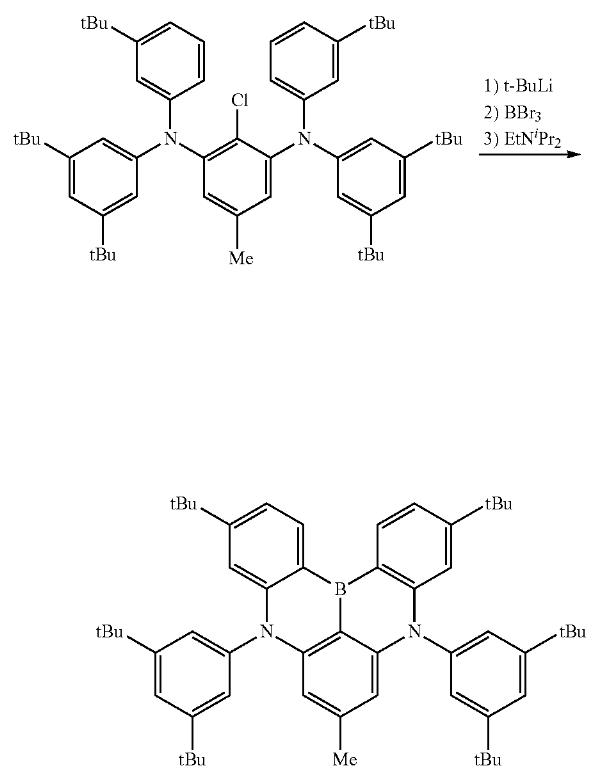

(C-4)

A compound represented by formula (C-4) was prepared using the same method as in the Synthesis Example as described above.

A structure of the compound obtained was confirmed by NMR measurement.

$^{1}$H-NMR ($CDCl_3$): δ=1.9 (s, 18H), 1.4 (s, 36H), 2.2 (s, 3H), 6.1 (s, 2H), 6.6 (d, 2H), 7.2 (d, 4H), 7.3 (dd, 2H), 7.6 (t, 2H), 8.9 (d, 2H).

Comparative Synthesis Example (8)

Comparative Compound (C-5): Synthesis of 2,12-di-t-butyl-N,N,5,9-tetrakis(4-(t-butyl)phenyl)-5,9-dihydro-5,9-diaza-13b-boranaphth[3,2,1-de]anthracene-7-amine Formula 193

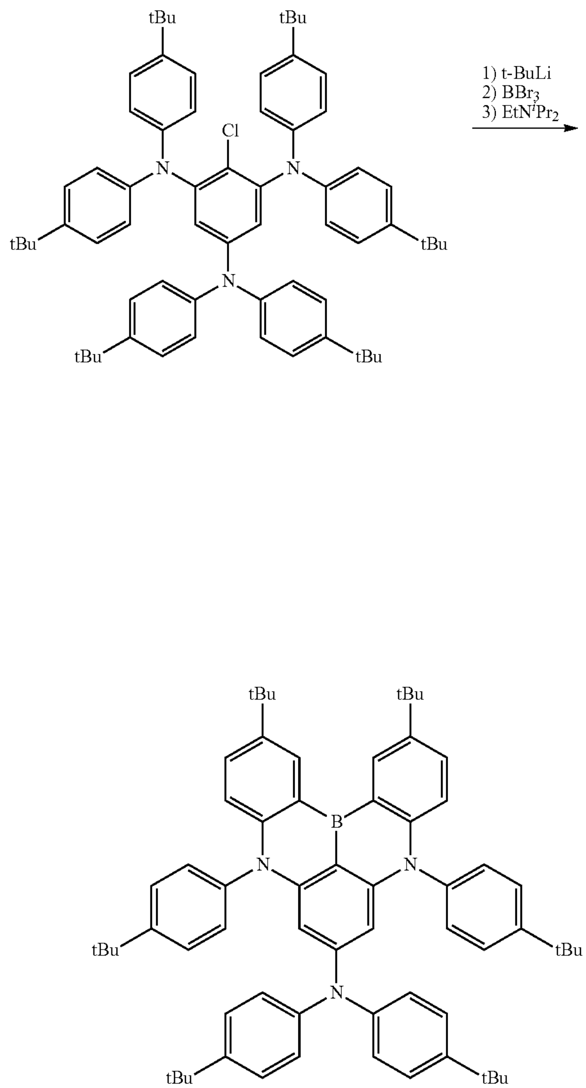

(C-5)

A compound represented by formula (C-5) was prepared using the same method as in the Synthesis Example as described above.

A structure of the compound obtained was confirmed by NMR measurement.

$^1$H-NMR ($CDCl_3$): δ=1.3 (s, 18H), 1.3 (s, 18H), 1.5 (s, 18H), 5.8 (s, 2H), 6.6 (d, 2H), 6.8 (dd, 4H), 7.1 (dd, 4H), 7.1 (dd, 4H), 7.4-7.5 (m, 6H), 8.9 (d, 2H).

Comparative Synthesis Example (9)

Comparative Compound (C-6): Synthesis of 2,12-di-t-butyl-5,9-bis(4-(t-butyl)phenyl)-N,N-di-μ-tolyl-5,9-dihydro-5,9-diaza-13b-boranaphth[3,2,1-de]anthracene-7-amine Formula 194

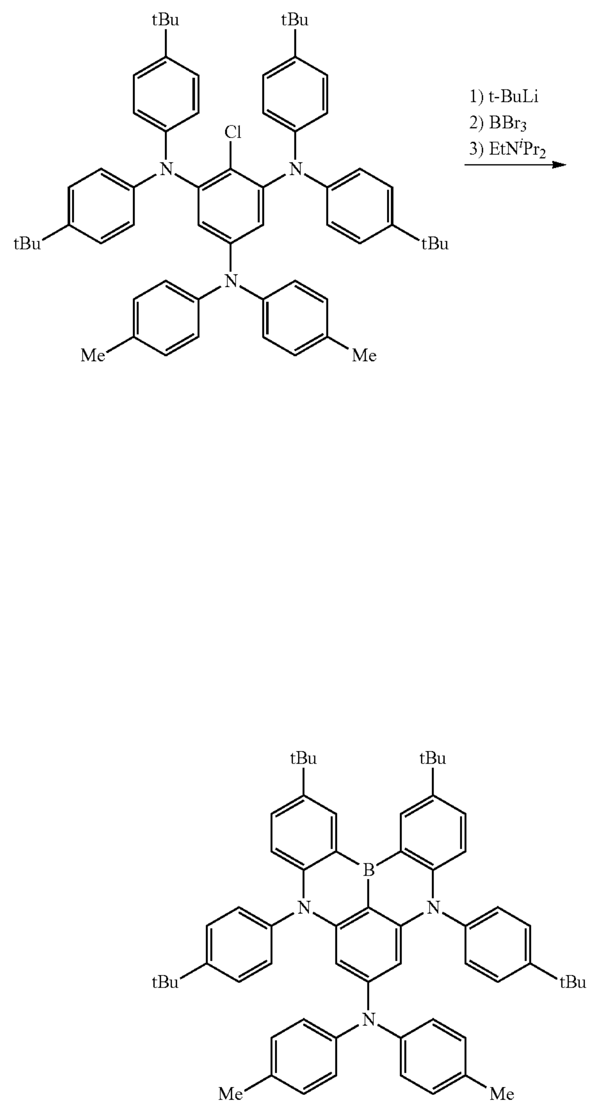

A compound represented by formula (C-6) was prepared using the same method as in the Synthesis Example as described above.

A structure of the compound obtained was confirmed by NMR measurement.

$^1$H-NMR ($CDCl_3$): δ=1.33 (s, 18H), 1.46 (s, 18H), 2.21 (s, 6H), 5.57 (s, 2H), 6.73 (d, 2H), 6.81 (d, 4H), 6.86 (d, 4H), 7.14 (d, 4H), 7.42-7.46 (m, 6H), 8.95 (d, 2H).

Comparative Synthesis Example (10)

Comparative Compound (C-7): Synthesis of 3,12-di-t-butyl-9-(4-(t-butyl)phenyl)-5-(3,5-di-t-butylphenyl)-5,9-dihydro-5,9-diaza-13b-boranaphth[3,2,1-de]anthracene Formula 195

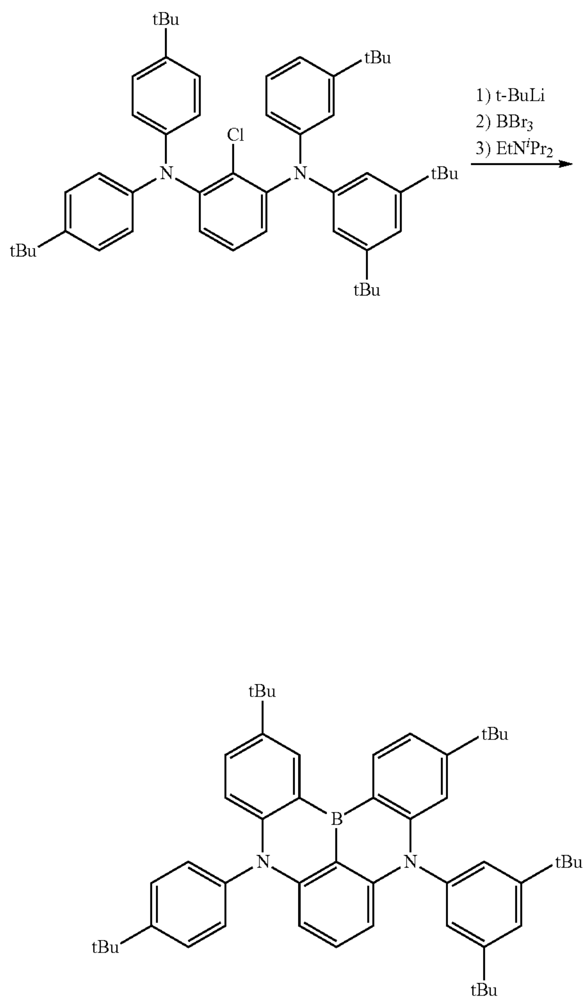

(C-7)

A compound represented by formula (C-7) was prepared using the same method as in the Synthesis Example as described above.

A structure of the compound obtained was confirmed by NMR measurement.

$^1$H-NMR ($CDCl_3$): δ=1.20 (s, 9H), 1.36 (s, 18H), 1.46 (s, 9H), 1.47 (s, 9H), 6.14 (d, 1H), 6.25 (d, 1H), 6.68 (d, 1H), 6.73 (d, 1H), 7.21 (d, 2H), 7.29 (d, 3H), 7.34 (dd, 1H), 7.51 (dd, 1H), 7.61 (t, 1H), 7.67 (d, 2H), 8.86 (d, 1H), 8.96 (d, 1H).

Comparative Synthesis Example (11)

Comparative Compound (C-8): Synthesis of 3,12-di-t-butyl-9-(4-(t-butyl)phenyl)-5-(3,5-di-t-butylphenyl)-7-methyl-5,9-dihydro-5,9-diaza-13b-boranaphth[3,2,1-de]anthracene Formula 196

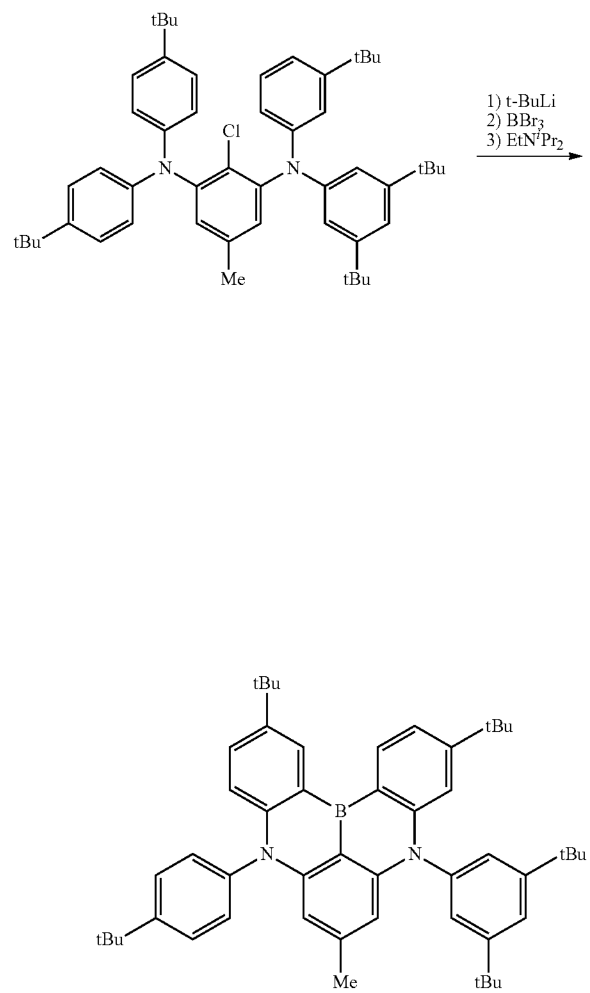

(C-8)

A compound represented by formula (C-8) was prepared using the same method as in the Synthesis Example as described above.

A structure of the compound obtained was confirmed by NMR measurement.

$^1$H-NMR ($CDCl_3$): δ=1.20 (s, 9H), 1.37 (s, 18H), 1.46 (s, 9H), 1.47 (s, 9H), 2.18 (s, 3H), 5.97 (s, 1H), 6.08 (d, 1H), 6.63 (d, 1H), 6.66 (d, 1H), 7.20 (d, 2H), 7.27 (d, 2H), 7.32 (dd, 1H), 7.48 (dd, 1H), 7.61 (t, 1H), 7.67 (d, 2H), 8.84 (d, 1H), 8.94 (d, 1H).

Comparative Synthesis Example (12)

Comparative Compound (C-9): Synthesis of 3,12-di-t-butyl-5-(3-(t-butyl)phenyl)-9-(4-(t-butyl)phenyl)-5,9-dihydro-5,9-diaza-13b-boranaphth[3,2,1-de] anthracene Formula 197

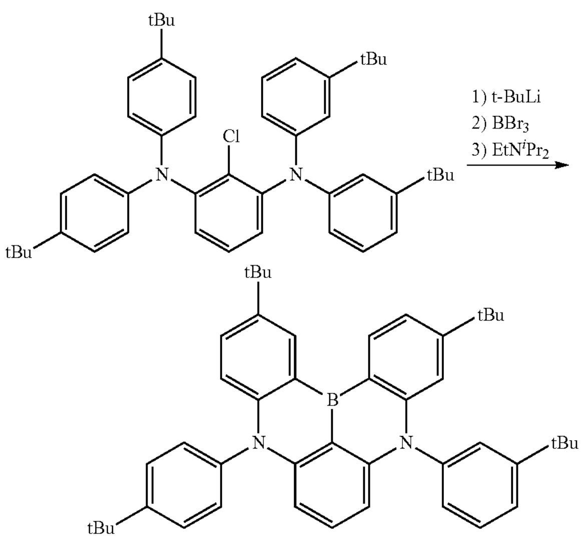

(C-9)

A compound represented by formula (C-9) was prepared using the same method as in the Synthesis Example as described above.

A structure of the compound obtained was confirmed by NMR measurement.

$^{1}$H-NMR ($CDCl_3$): δ=1.22 (s, 9H), 1.37 (s, 9H), 1.46 (s, 9H), 1.47 (s, 9H), 6.14 (d, 1H), 6.18 (d, 1H), 6.72 (d, 1H), 6.74 (d, 1H), 7.19 (ddd, 1H), 7.23-7.30 (m, 3H), 7.34 (dd, 1H), 7.41 (t, 1H), 7.51 (dd, 1H), 7.58-7.64 (m, 2H), 7.67 (d, 2H), 8.86 (d, 1H), 8.96 (d, 1H).

Other polycyclic aromatic compounds in the invention can be prepared by appropriately changing a compound as a raw material by a method as directed under the Synthesis Examples described above.

In order to describe the invention in more detail, Example of an organic EL device using a compound of the invention will be described. However, the invention is not limited by the Example.

Organic EL devices according to Examples 1 to 19 and Comparative Examples 1 to 14, and further organic EL devices according to Examples 20 to 23 were prepared, and voltage (V) and external quantum efficiency (%) as properties during luminescence at 1000 cd/m$^2$ were measured, respectively.

Quantum efficiency of a luminescent device includes internal quantum efficiency and the external quantum efficiency. The internal quantum efficiency indicates a proportion at which external energy injected into a luminescent layer of the luminescent device as an electron (or positive hole) is purely converted into a photon. On the other hand, the external quantum efficiency is calculated based on a quantity in which the photon is released even to an outside of the luminescent device, and the photons generated in the luminescent layer are partly absorbed or continued to be reflected inside the luminescent device, and are not released to the outside of the luminescent device, and therefore the external quantum efficiency becomes lower than the internal quantum efficiency.

A method for measuring the external quantum efficiency is as described below. Voltage at which luminance of the device reaches 1000 cd/m$^2$ was applied by using Voltage/Current Generator R6144 made by Advantest Corp. to allow the device to cause luminescence. Spectral radiance in a region of visible light was measured from a direction vertical to a luminescent surface by using Spectroradiometer SR-3AR made by TOPCON CORPORATION. Under the assumption that the luminescent surface is a perfect diffuse surface, a numeric value obtained by dividing a value of measured spectral radiance of each wavelength component by wavelength energy and multiplying π to the value obtained is the number of photons in each wavelength. Next, the number of photons is integrated in all observed wavelength regions, and the integrated number of photons is taken as the number of total photons released from the device. When a numeric value obtained by dividing an applied current value by elementary charge is taken as the number of carriers injected into the device, a numeric value obtained by dividing the number of total photons released from the device by the number of carriers injected into the device is the external quantum efficiency.

A material composition of each layer and EL characteristic data in prepared organic EL devices according to Examples 1 to 19 and Comparative Examples 1 to 14, and further organic EL devices according to Examples 20 to 23 are shown in Table 1A, Table 1B and Table 2 as described below.

TABLE 1A

| Example | Hole injection layer 1 (40 nm) | Hole injection layer 2 (5 nm) | Hole transport layer 1 (15 nm) | Hole transport layer 2 (10 nm) | Luminescent layer (25 nm) Host | Luminescent layer (25 nm) Dopant | Electron transport layer 1 (5 nm) | Electron transport layer 2 (25 nm) | Cathode (1 nm/100 nm) | Voltage (V) | External quantum efficiency (%) |
|---|---|---|---|---|---|---|---|---|---|---|---|
| 1 | HI | HAT-CN | HT-1 | HT-2 | BH-1 | 1-50 | ET-1 | ET-2 + Liq | Liq/MgAg | 3.7 | 6.4 |
| 2 | HI | HAT-CN | HT-1 | HT-2 | BH-1 | 1-66 | ET-1 | ET-2 + Liq | LiF/Al | 3.7 | 8 |
| 3 | HI | HAT-CN | HT-1 | HT-2 | BH-1 | 1-128 | ET-1 | ET-2 + Liq | Liq/MgAg | 3.5 | 7.1 |
| 4 | HI | HAT-CN | HT-1 | HT-2 | BH-1 | 1-132 | ET-1 | ET-2 + Liq | Liq/MgAg | 3.3 | 7.6 |
| 5 | HI | HAT-CN | HT-1 | HT-2 | BH-1 | 1-136 | ET-1 | ET-2 + Liq | Liq/MgAg | 3.5 | 6.7 |
| 6 | HI | HAT-CN | HT-1 | HT-2 | BH-1 | 1-166 | ET-1 | ET-2 + Liq | LiF/Al | 3.6 | 8.1 |
| 7 | HI | HAT-CN | HT-1 | HT-2 | BH-1 | 1-170 | ET-1 | ET-2 + Liq | LiF/Al | 3.5 | 8 |
| 8 | HI | HAT-CN | HT-1 | HT-2 | BH-1 | 1-170 | ET-3 | ET-4 + Liq | Liq/MgAg | 3.5 | 6.5 |
| 9 | HI | HAT-CN | HT-1 | HT-2 | BH-1 | 1-180 | ET-1 | ET-2 + Liq | LiF/Al | 3.6 | 7.7 |
| 10 | HI | HAT-CN | HT-1 | HT-2 | BH-1 | 1-180 | ET-1 | ET-2 + Liq | Liq/MgAg | 3.5 | 6.7 |

TABLE 1A-continued

| Example | Hole injection layer 1 (40 nm) | Hole injection layer 2 (5 nm) | Hole transport layer 1 (15 nm) | Hole transport layer 2 (10 nm) | Luminescent layer (25 nm) Host | Luminescent layer (25 nm) Dopant | Electron transport layer 1 (5 nm) | Electron transport layer 2 (25 nm) | Cathode (1 nm/100 nm) | Voltage (V) | External quantum efficiency (%) |
|---|---|---|---|---|---|---|---|---|---|---|---|
| 11 | HI | HAT-CN | HT-1 | HT-2 | BH-1 | 1-200 | ET-1 | ET-2 + Liq | LiF/Al | 3.7 | 7.7 |
| 12 | HI | HAT-CN | HT-1 | HT-2 | BH-1 | 1-208 | ET-1 | ET-2 + Liq | LiF/Al | 3.5 | 8.1 |
| 13 | HI | HAT-CN | HT-1 | HT-2 | BH-1 | 1-208 | ET-3 | ET-4 + Liq | Liq/MgAg | 3.6 | 6.5 |
| 14 | HI | HAT-CN | HT-1 | HT-2 | BH-1 | 1-216 | ET-1 | ET-2 + Liq | LiF/Al | 3.5 | 8.3 |
| 15 | HI | HAT-CN | HT-1 | HT-2 | BH-1 | 1-216 | ET-3 | ET-4 + Liq | Liq/MgAg | 3.6 | 6.6 |
| 16 | HI | HAT-CN | HT-1 | HT-2 | BH-1 | 1-240 | ET-1 | ET-2 + Liq | LiF/Al | 3.8 | 7.4 |
| 17 | HI | HAT-CN | HT-1 | HT-2 | BH-1 | 1-244 | ET-1 | ET-2 + Liq | LiF/Al | 3.8 | 7.3 |
| 18 | HI | HAT-CN | HT-1 | HT-2 | BH-1 | 1-252 | ET-1 | ET-2 + Liq | LiF/Al | 3.6 | 8.1 |
| 19 | HI | HAT-CN | HT-1 | HT-2 | BH-1 | 1-296 | ET-1 | ET-2 + Liq | LiF/Al | 3.7 | 8.5 |

TABLE IB

| Example | Hole injection layer 1 (40 nm) | Hole injection layer 2 (5 nm) | Hole transport layer 1 (15 nm) | Hole transport layer 2 (10 nm) | Luminescent layer (25 nm) Host | Luminescent layer (25 nm) Dopant | Electron transport layer 1 (5 nm) | Electron transport layer 2 (25 nm) | Cathode (1 nm/100 nm) | Voltage (V) | External quantum efficiency (%) |
|---|---|---|---|---|---|---|---|---|---|---|---|
| 20 | HI | HAT-CN | HT-1 | HT-2 | BH-1 | 1-300 | ET-1 | ET-2 + Liq | LiF/Al | 3.6 | 8.2 |
| 21 | HI | HAT-CN | HT-1 | HT-2 | BH-1 | 1-715 | ET-1 | ET-2 + Liq | LiF/Al | 3.7 | 8 |
| 22 | HI | HAT-CN | HT-1 | HT-2 | BH-1 | 1-730 | ET-1 | ET-2 + Liq | LiF/Al | 3.7 | 8.1 |
| 23 | HI | HAT-CN | HT-1 | HT-2 | BH-1 | 1-733 | ET-1 | ET-2 + Liq | LiF/Al | 3.6 | 8.3 |

TABLE 2

| Example | Hole injection layer 1 (40 nm) | Hole injection layer 2 (5 nm) | Hole transport layer 1 (15 nm) | Hole transport layer 2 (10 nm) | Luminescent layer (25 nm) Host | Luminescent layer (25 nm) Dopant | Electron transport layer 1 (5 nm) | Electron transport layer 2 (25 nm) | Cathode (1 nm/100 nm) | Voltage (V) | External quantum efficiency (%) |
|---|---|---|---|---|---|---|---|---|---|---|---|
| 1 | HI | HAT-CN | HT-1 | HT-2 | BH-1 | C-1 | ET-1 | ET-2 + Liq | Liq/MgAg | 3.5 | 5.9 |
| 2 | HI | HAT-CN | HT-1 | HT-2 | BH-1 | C-2 | ET-1 | ET-2 + Liq | Liq/MgAg | 3.8 | 5.2 |
| 3 | HI | HAT-CN | HT-1 | HT-2 | BH-1 | C-3 | ET-1 | ET-2 + Liq | Liq/MgAg | 3.6 | 5.5 |
| 4 | HI | HAT-CN | HT-1 | HT-2 | BH-1 | C-4 | ET-1 | ET-2 + Liq | Liq/MgAg | 4 | 5.7 |
| 5 | HI | HAT-CN | HT-1 | HT-2 | BH-1 | C-5 | ET-1 | ET-2 + Liq | Liq/MgAg | 3.8 | 5.7 |
| 6 | HI | HAT-CN | HT-1 | HT-2 | BH-1 | C-6 | ET-1 | ET-2 + Liq | Liq/MgAg | 3.8 | 5.6 |
| 7 | HI | HAT-CN | HT-1 | HT-2 | BH-1 | C-7 | ET-1 | ET-2 + Liq | Liq/MgAg | 3.5 | 5.9 |
| 8 | HI | HAT-CN | HT-1 | HT-2 | BH-1 | C-7 | ET-3 | ET-4 + Liq | Liq/MgAg | 3.8 | 5.8 |
| 9 | HI | HAT-CN | HT-1 | HT-2 | BH-1 | C-8 | ET-1 | ET-2 + Liq | Liq/MgAg | 3.5 | 5.8 |
| 10 | HI | HAT-CN | HT-1 | HT-2 | BH-1 | C-8 | ET-3 | ET-4 + Liq | Liq/MgAg | 3.8 | 5.7 |
| 11 | HI | HAT-CN | HT-1 | HT-2 | BH-1 | C-9 | ET-1 | ET-2 + Liq | Liq/MgAg | 3.7 | 5.9 |
| 12 | HI | HAT-CN | HT-1 | HT-2 | BH-1 | C-10 | ET-1 | ET-2 + Liq | Liq/MgAg | 3.7 | 5.7 |
| 13 | HI | HAT-CN | HT-1 | HT-2 | BH-1 | C-11 | ET-1 | ET-2 + Liq | Liq/MgAg | 3.7 | 5.4 |
| 14 | HI | HAT-CN | HT-1 | HT-2 | BH-1 | C-12 | ET-1 | ET-2 + Liq | Liq/MgAg | 4.1 | 4.1 |

In the Tables described above, "HI" is $N^4$,$N^{4'}$-diphenyl-$N^4$,$N^{4'}$-bis(9-phenyl-9H-carbazole-3-yl)-[1,1'-biphenyl]-4,4'-diamine, "HAT-CN" is 1,4,5,8,9,12-hexaazatriphenylene-hexacarbonitrile, "HT-1" is N-([1,1'-biphenyl]-4-yl-9,9-dimethyl-N-[4-(9-phenyl-9H-carbazole-3-yl)phenyl)-9H-fluorene-2-amine[1,1'-biphenyl]-4-amine, "HT-2" is N,N-bis(4-(dibenzo[b,d]furan-4-yl)phenyl)-[1,1': 4',1"-terphenyl]-4-amine, "BH-1" (host material) is 2-(10-phenylanthracene-9-yl)naphtho[2,3-b]benzofuran, "ET-1" is 4,6,8,10-tetraphenyl[1,4]benzoxabolinino[2,3,4-kl]phenoxabolinine, "ET-2" is 3,3'-((2-phenylanthracene-9,10-diyl)bis(4,1-phenylene))bis(4-methylpyridine), "ET-3" is 9-(5,9-dioxa-13b-boranaphth[3,2,1-de]anthracene-7-yl)-3,6-diphenyl-9H-carbazole, and "ET-4" is 2-([1,1'-biphenyl]-4-yl)-4-(9,9-diphenyl-9H-fluorene-4-yl)-6-phenyl-1,3,5-triazine. A chemical structure is shown below together with "Liq."

Formula 198

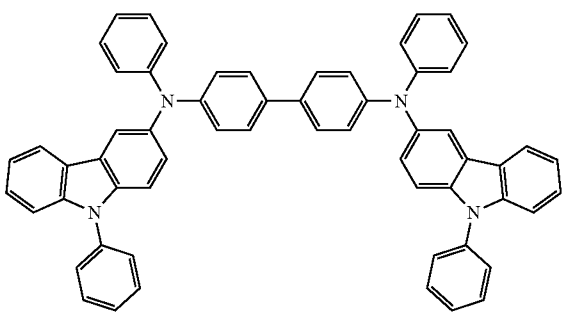

(HI)

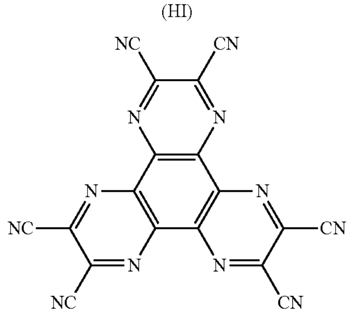

(HAT-CN)

(HT-1)

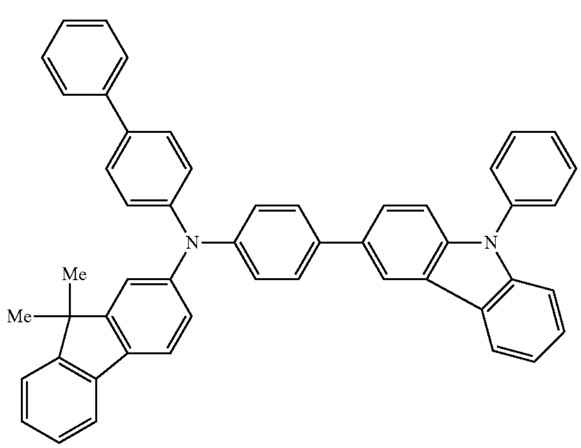

-continued (HT-2)

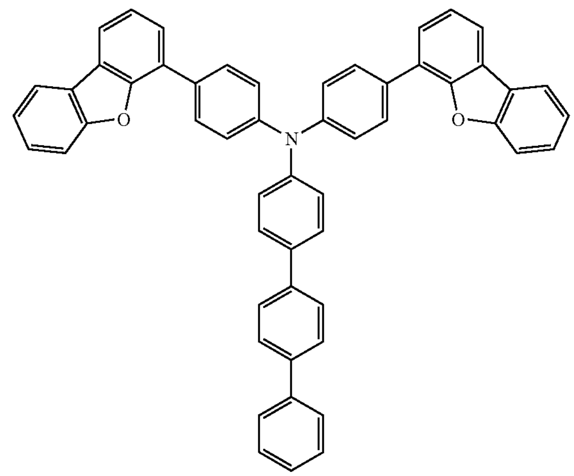

(ET-1)

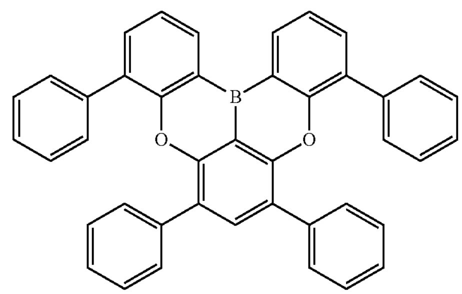

(ET-2)

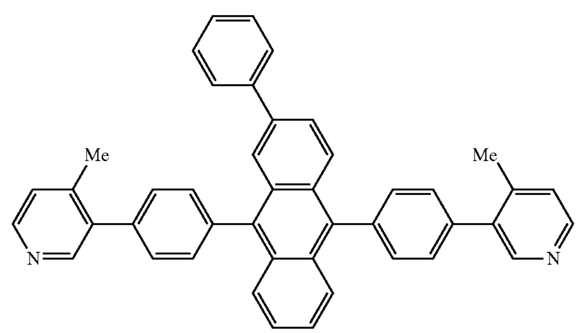

(ET-3)

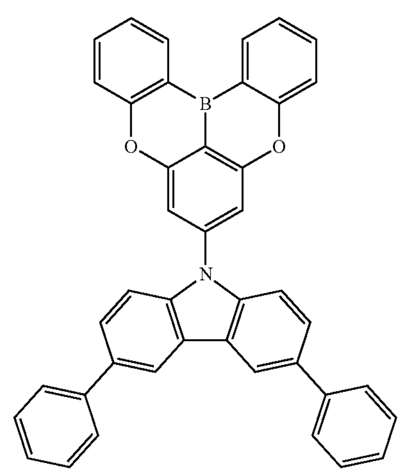

-continued (ET-4)

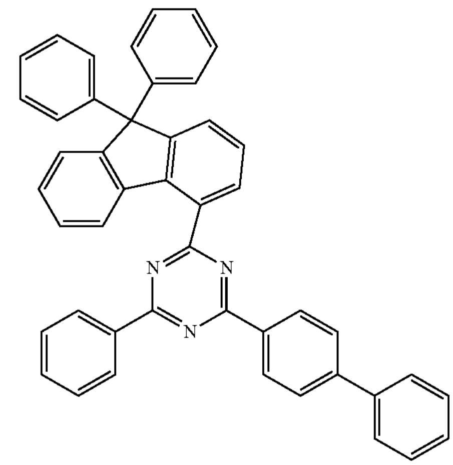

(BH-1)

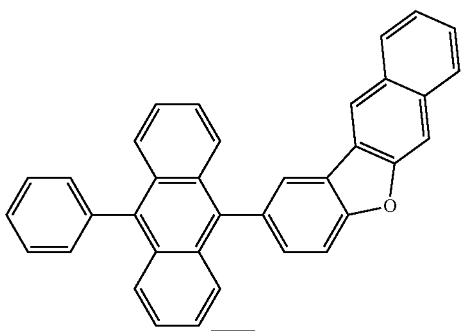

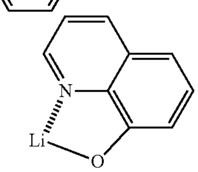

(Liq)

Example 1

Device with Host being BH-1 and Dopant being Compound (1-50)

A glass substrate with 26 millimeters x 28 millimeters x 0.7 millimeters in which ITO formed into a film having a thickness of 180 nanometers by sputtering was ground to 150 nanometers (made by OPTO SCIENCE, INC.) was applied as a transparent support substrate. The transparent support substrate was fixed to a substrate holder of a commercially available deposition apparatus (made by Showa Shinku Co., Ltd.), and a molybdenum boat for deposition in which HI, HAT-CN, HT-1, HT-2, BH-1, compound (1-50), ET-1 and ET-2 each were put and aluminum nitride boat for deposition in which Liq, magnesium and silver each were put were mounted thereon.

Each layer described below was sequentially formed on an ITO film of the transparent support substrate. A vacuum chamber was decompressed to $5\times10^{-4}$ Pa, and first HI was heated and deposited so as to have a film thickness of 40 nanometers to form hole injection layer 1. Next, HAT-CN was heated and deposited so as to have a film thickness of 5 nanometers to form hole injection layer 2. Next, HT-1 was heated and deposited so as to have a film thickness of 15 nanometers to form hole transport layer 1. Next, HT-2 was heated and deposited so as to have a film thickness of 10 nanometers to form hole transport layer 2. Next, BH-1 and compound (1-50) were heated and deposited simultaneously so as to have a film thickness of 25 nanometers to form a luminescent layer. A deposition rate was adjusted so as to be about 98 to 2 in a weight ratio for BH-1 to compound (1-50). Next, ET-1 was heated and deposited so as to have a film thickness of 5 nanometers to form electron transport layer 1. Next, ET-2 and Liq were heated and deposited simultaneously so as to have a film thickness of 25 nanometers to form electron transport layer 2. A deposition rate was adjusted so as to be about 50 to 50 in a weight ratio for ET-2 to Liq. The deposition rate of each layer was 0.01 to 1 nanometer/second.

Then, Liq was heated and deposited so as to have a film thickness of 1 nanometer at a deposition rate of 0.01 to 0.1 nanometer/second, and subsequently magnesium and silver were heated and deposited simultaneously so as to have a film thickness of 100 nanometers, thereby forming a cathode to obtain an organic EL device. At this time, a deposition rate was adjusted in the range of 0.1 to 10 nanometers/second so as to be 10 to 1 in a ratio of the number of atoms of magnesium to silver.

When an ITO electrode was applied as an anode and a magnesium/silver electrode as a cathode, and direct current voltage was applied thereto, and properties during luminescence at 1000 cd/$m^2$ were measured, driving voltage was 3.7 V, and the external quantum efficiency was 6.4%.

Examples 2 to 19 and Comparative Examples 1 to 14

A material described in Table 1A and Table 2 was selected as a material of each layer, and an organic EL device was obtained by a method as directed under Example 1. Moreover, organic EL properties were also evaluated in the same manner as in Example 1.

Example 20

Device with Host being BH-1 and Dopant being Compound (1-300)

A glass substrate with 26 millimeters x 28 millimeters x 0.7 millimeters in which ITO formed into a thickness of 180 nanometers by sputtering was ground to 150 nanometers (made by OPTO SCIENCE, INC.) was applied as a transparent support substrate. The transparent support substrate was fixed to a substrate holder of a commercially available deposition apparatus (made by Choshu Industry co., Ltd.), and a molybdenum boat for deposition in which HI, HAT-CN, HT-1, HT-2, BH-1, compound (1-300), ET-1 and ET-2 each were put and aluminum nitride boat for deposition in which Liq, LiF and aluminum each were put were mounted thereon.

Each layer described below was sequentially formed on an ITO film of a transparent substrate. A vacuum chamber was decompressed to $5\times10^{-4}$ Pa, and first HI was heated and deposited so as to have a film thickness of 40 nanometers to form hole injection layer 1. Next, HAT-CN was heated and deposited so as to have a film thickness of 5 nanometers to form hole injection layer 2. Next, HT-1 was heated and deposited so as to have a film thickness of 15 nanometers to form hole transport layer 1. Next, HT-2 was heated and deposited so as to have a film thickness of 10 nanometers to form hole transport layer 2. Next, BH-1 and compound (1-300) were heated and deposited simultaneously so as to have a film thickness of 25 nanometers to form a luminescent layer. A deposition rate was adjusted so as to be about 98 to 2 in a weight ratio for BH-1 to compound (1-300). Next, ET-1 was heated and deposited so as to have a film thickness of 5 nanometers to form electron transport layer 1. Next, ET-2 and Liq were heated and deposited simultaneously so as to have a film thickness of 25 nanometers to form electron transport layer 2. A deposition rate was adjusted so as to be about 50 to 50 in a weight ratio for ET-2 to Liq. The deposition rate of each layer was 0.01 to 1 nanometer/second.

Then, LiF was heated and deposited so as to have a film thickness of 1 nanometer at a deposition rate of 0.01 to 0.1 nanometer/second, and subsequently aluminum was heated and deposited so as to have a film thickness of 100 nanometers, thereby forming a cathode to obtain an organic EL device.

When an ITO electrode was applied as an anode and an aluminum electrode as a cathode, and direct current voltage was applied thereto, and properties during luminescence at 1000 cd/m$^2$ were measured, driving voltage was 3.6 V, and the external quantum efficiency was 8.2%.

Examples 21 to 23

A material described in Table 1B was selected as a material of each layer, and an organic EL device was obtained by a method as directed under Example 20. Moreover, organic EL properties were also evaluated in the same manner as in Example 20.

Example 24

Next, a relationship between a concentration of a compound represented by formula (1) and a fluorescence quantum yield was verified. In order to obtain high luminous efficiency by suppressing concentration quenching in a production process of an organic EL device, a luminescent layer is preferably formed at a low dopant concentration, but precise control of a significantly low dopant concentration is practically difficult for the reason of causing reduction of a margin in a device production process or the like. A compound represented by general formula (1) has a bulky substituent in a molecule, and therefore is considered that intermolecular aggregation can be suppressed to suppress concentration quenching, and presumed that high quantum efficiency can be obtained also in about 3% by weight as a practical concentration in production of an organic EL device.

In order to confirm the presumption, the fluorescence quantum yield was measured by changing a concentration of the compound using optically inactive PMMA (polymethyl methacrylate) as a matrix. Commercially available PMMA was used as a matrix material. A thin film sample dispersed in PMMA was prepared by dissolving PMMA and the compound to be evaluated into toluene, and then forming a thin film on a transparent support substrate (10 mm×10 mm) made of quartz according to a spin coating method, for example.

With regard to measurement of a fluorescence spectrum, the compounds in formula (1-66), formula (1-124), formula (1-128), formula (1-166), formula (1-170), formula (1-180), formula (1-208), formula (1-216) and formula (1-244) each were dispersed into PMMA at a concentration of 1% by weight or 3% by weight, and a thin film-forming substrate (made of quartz) was arranged, and excited at an excitation wavelength of 380 nanometers to measure the fluorescence quantum yield ($\varphi_{PL}$). The results are shown in Table 3 described below.

TABLE 3

| Invention compound | $\varphi_{PL}$ [%] at concentration of 3% | $\varphi_{PL}$ [%] at concentration of 1% | Difference of $\varphi_{PL}$ between concentrations of 3% and 1% |
|---|---|---|---|
| 1-66 | 69.1 | 73.2 | 4.1 |
| 1-124 | 80 | 82 | 2 |
| 1-128 | 87.4 | 85.8 | 1.6 |
| 1-166 | 76.8 | 81.9 | 5.1 |
| 1-170 | 78.3 | 83.2 | 4.9 |
| 1-180 | 78.9 | 84.1 | 5.2 |
| 1-208 | 76.7 | 81.8 | 5.1 |
| 1-216 | 75.5 | 79.1 | 3.6 |
| 1-244 | 75.6 | 75.7 | 0.1 |

In a similar manner, also with regard to the comparative compounds in formula (C-3), formula (C-4), formula (C-6), formula (C-7), formula (C-8), formula (C-9), formula (C-10) and formula (C-11), the fluorescence quantum yield ($\varphi_{PL}$) was measured at a concentration of 1% by weight or 3% by weight. The results are shown in Table 4 described below.

TABLE 4

| Comparative compound | $\varphi_{PL}$ [%] at concentration of 3% | $\varphi_{PL}$ [%] at concentration of 1% | Difference of $\varphi_{PL}$ between concentrations of 3% and 1% |
|---|---|---|---|
| C-3 | 72.2 | 82.5 | 10.3 |
| C-4 | 68.7 | 79.2 | 10.5 |
| C-6 | 57.4 | 83.8 | 26.4 |
| C-7 | 73.4 | 82.9 | 9.5 |
| C-8 | 70.8 | 81.6 | 10.8 |
| C-9 | 74.9 | 83.9 | 9 |
| C-10 | 78 | 86.9 | 8.9 |
| C-11 | 78.4 | 87.7 | 9.3 |

The results described above show that the compound represented by formula (1) has a sufficiently high fluorescence quantum yield ($\varphi_{PL}$), and a difference of $\varphi_{PL}$ between 1% by weight and 3% by weight is smaller and concentration dependence is lower in comparison with the comparative compound. The results indicate that, also in an actual production process of the organic EL device, a device that has a higher process margin to give high luminous efficiency even in a high dopant concentration can be prepared. Moreover, PMMA used in the present measurement is an optically inactive matrix, and therefore the results described above are presumably features inherent to the compound represented by formula (1) and independent on the matrix. Accordingly, with regard to high external quantum efficiency confirmed in Examples 1 to 19 and Examples 20 to 23 described above, a similar effect can be presumably obtained, even if a compound other than BH-1 is applied as a host material.

INDUSTRIAL APPLICABILITY

According to a preferred aspect of the invention, a polycyclic aromatic compound represented by general formula (1) described above and having a bulky substituent in a molecule is used as a material for an organic device, whereby, for example, an organic EL device excellent in quantum efficiency can be provided. In particular, concentration quenching can be suppressed even if a use concentration is comparatively high, and therefore the present art is advantageous in a device production process.

REFERENCE SIGNS LIST

100 Organic electroluminescent device
101 Substrate
102 Anode
103 Hole injection layer
104 Hole transport layer
105 Luminescent layer
106 Electron transport layer
107 Electron injection layer
108 Cathode

What is claimed is:

1. A material for an organic device, comprising a polycyclic aromatic compound represented by formula (1):

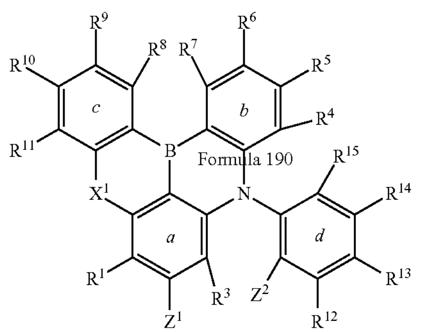

(1)

wherein:

$R^1$, $R^3$, $R^4$, $R^5$, $R^6$, $R^7$, $R^8$, $R^9$, $R^{10}$, $R^{11}$, $R^{12}$, $R^{13}$, $R^{14}$ and $R^{15}$ are independently hydrogen, aryl, heteroaryl, diarylamino, diheteroarylamino, arylheteroarylamino, alkyl, cycloalkyl, alkoxy or aryloxy, and at least one hydrogen therein may be replaced by aryl, heteroaryl, alkyl or cycloalkyl, and adjacent groups of $R^4$, $R^5$, $R^6$, $R^7$, $R^8$, $R^9$, $R^{10}$, $R^{11}$, $R^{12}$, $R^{13}$, $R^{14}$ and $R^{15}$ may be bonded to each other to form an aryl ring or a heteroaryl ring together with a b ring, a c ring or a d ring, and at least one hydrogen in the ring formed may be replaced by aryl, heteroaryl, diarylamino, diheteroarylamino, arylheteroarylamino, alkyl, cycloalkyl, alkoxy or aryloxy, and at least one hydrogen therein may be replaced by aryl, heteroaryl, alkyl or cycloalkyl, $X^1$ is >N—R, R of the >N—R is aryl having 6 to 12 carbons, and at least one hydrogen therein is replaced by aryl having 6 to 12 carbons, heteroaryl having 2 to 15 carbons, alkyl having 1 to 6 carbons or cycloalkyl having 3 to 14 carbons, $Z^1$ and $Z^2$ are independently aryl, diarylamino, aryloxy, aryl-substituted alkyl, hydrogen or alkyl, and at least one hydrogen therein may be replaced by aryl, alkyl or cycloalkyl, when $Z^1$ is phenyl which may be substituted by alkyl or cycloalkyl, m-biphenylyl which may be substituted by alkyl or cycloalkyl, p-biphenylyl which may be substituted by alkyl or cycloalkyl, diphenylamino which may be substituted by alkyl or cycloalkyl, hydrogen or alkyl, a case where $Z^2$ is hydrogen, alkyl or alkoxy is excluded, and at least one hydrogen in the compound represented by formula (1) may be replaced by halogen or deuterium.

2. The material for the organic device according to claim 1, wherein $R^1$, $R^3$, $R^4$, $R^5$,$R^6$, $R^7$, $R^8$, $R^9$, $R^{10}$, $R^{11}$, $R^{12}$, $R^{13}$, $R^{14}$ and $R^{15}$ are independently hydrogen, aryl having 6 to 30 carbons, heteroaryl having 2 to 30 carbons, diarylamino (in which aryl is aryl having 6 to 12 carbons), alkyl having 1 to 6 carbons, cycloalkyl having 3 to 14 carbons, alkoxy having 1 to 6 carbons or aryloxy having 6 to 12 carbons, and at least one hydrogen therein may be replaced by aryl having 6 to 12 carbons, alkyl having 1 to 6 carbons or cycloalkyl having 3 to 14 carbons, and adjacent groups of $R^4$, $R^5$, $R^6$, $R^7$, $R^8$, $R^9$, $R^{10}$, $R^{11}$, $R^{12}$, $R^{13}$, $R^{14}$ and $R^{15}$ may be bonded to each other to form an aryl ring having 9 to 16 carbons or a heteroaryl ring having 6 to 15 carbons together with a b ring, a c ring or a d ring, and at least one hydrogen in the ring formed may be replaced by aryl having 6 to 30 carbons, heteroaryl having 2 to 30 carbons, diarylamino (in which aryl is aryl having 6 to 12 carbons), alkyl having 1 to 6 carbons, cycloalkyl having 3 to 14 carbons, alkoxy having 1 to 6 carbons or aryloxy having 6 to 12 carbons, $X^1$ is >N—R, R of the >N—R is aryl having 6 to 12 carbons, and at least one hydrogen therein is replaced by aryl having 6 to 12 carbons, alkyl having 1 to 6 carbons or cycloalkyl having 3 to 14 carbons, $Z^1$ and $Z^2$ are independently aryl having 6 to 30 carbons, diarylamino (in which aryl is aryl having 6 to 16 carbon), aryloxy having 6 to 30 carbons, alkyl having 1 to 6 carbons in which replacement is made by aryl having 6 to 12 carbons, hydrogen, alkyl having 1 to 6 carbons or cycloalkyl having 3 to 14 carbons, and at least one hydrogen therein may be replaced by aryl having 6 to 16 carbons or alkyl having 1 to 6 carbons, when $Z^1$ is phenyl which may be substituted by alkyl having 1 to 6 carbons or cycloalkyl having 3 to 14 carbons, m-biphenylyl which may be substituted by alkyl having 1 to 6 carbons or cycloalkyl having 3 to 14 carbons, p-biphenylyl which may be substituted by alkyl having 1 to 6 carbons or cycloalkyl having 3 to 14 carbons, diphenylamino which may be substituted by alkyl having 1 to 6 carbons or cycloalkyl having 3 to 14 carbons, hydrogen or alkyl having 1 to 6 carbons, a case where $Z^2$ is hydrogen or alkyl having 1 to 6 carbons is excluded, and at least one hydrogen in the compound represented by formula (1) may be replaced by halogen or deuterium.

3. The material for the organic device according to claim 1, wherein $R^1$, $R^3$, $R^4$, $R^5$, $R^6$, $R^7$, $R^8$, $R^9$, $R^{10}$, $R^{11}$, $R^{12}$, $R^{13}$, $R^{14}$ and $R^{15}$ are independently hydrogen, aryl having 6 to 16 carbons, heteroaryl having 2 to 20 carbons, diarylamino (in which aryl is aryl having 6 to 12 carbons), alkyl having 1 to 6 carbons, cycloalkyl having 3 to 14 carbons, alkoxy having 1 to 6 carbons or aryloxy having 6 to 12 carbons, and adjacent groups of $R^4$, $R^5$, $R^6$, $R^7$, $R^8$, $R^9$, $R^{10}$, $R^{11}$, $R^{12}$, $R^{13}$, $R^{14}$ and $R^{15}$ may be bonded to each other to form an aryl ring having 9 to 16 carbons or a heteroaryl ring having 6 to 15 carbons together with a b ring, a c ring or a d ring, and at least one hydrogen in the ring formed may be replaced by aryl having 6 to 16 carbons, heteroaryl having 2 to 20 carbons, diarylamino (in which aryl is aryl having 6 to 12 carbons), alkyl having 1 to 6 carbons, cycloalkyl having 3 to 14 carbons, alkoxy having 1 to 6 carbons or aryloxy having 6 to 12 carbons, $X^1$ is >N—R, and R of the >N—R is aryl having 6 to 12 carbons, and at least one hydrogen therein is replaced by alkyl having 1 to 6 carbons or cycloalkyl having 3 to 14 carbons, $Z^1$ and $Z^2$ are independently aryl having 6 to 16 carbons, diarylamino (in which aryl is aryl having 6 to 16 carbon), aryloxy having 6 to 16 carbons, alkyl having 1 to 6 carbons in which at least one hydrogen is replaced by aryl having 6 to 12 carbons, hydrogen or alkyl having 1 to 6 carbons, and at least one hydrogen therein may be replaced by aryl having 6 to 16 carbons, alkyl having 1 to 6 carbons or cycloalkyl having 3 to 14 carbons, when $Z^1$ is phenyl which may be substituted by alkyl having 1 to 6 carbons or cycloalkyl having 3 to 14 carbons, m-biphenylyl which may be substituted by alkyl having 1 to 6 carbons or cycloalkyl having 3 to 14 carbons, p-biphenylyl which may be substituted by alkyl having 1 to 6 carbons or cycloalkyl having 3 to 14 carbons, diphenylamino which may be substituted by alkyl having 1 to 6 carbons or cycloalkyl having 3 to 14 carbons, hydrogen or alkyl having 1 to 6 carbons, a case where $Z^2$ is hydrogen or alkyl having 1 to 6 carbons is excluded, and at least one hydrogen in the compound represented by formula (1) may be replaced by halogen or deuterium.

4. The material for the organic device according to claim 1, wherein $R^1$, $R^3$, $R^4$, $R^5$, $R^6$, $R^7$, $R^8$, $R^9$, $R^{10}$, $R^{11}$, $R^{12}$, $R^{13}$, $R^{14}$ and $R^{15}$ are independently hydrogen, aryl having 6 to 16 carbons, heteroaryl having 2 to 20 carbons, diarylamino (in which aryl is aryl having 6 to 12 carbons), alkyl having 1 to 6 carbons, cycloalkyl having 3 to 14 carbons, alkoxy having 1 to 6 carbons or aryloxy having 6 to 12 carbons, and adjacent groups of $R^4$, $R^5$, $R^6$, $R^7$, $R^8$, $R^9$, $R^{10}$, $R^{11}$, $R^{12}$, $R^{13}$, $R^{14}$ and $R^{15}$ may be bonded to each other to form a naphthalene ring, a fluorene ring or a carbazole ring together with a b ring, a c ring or a d ring, and at least one hydrogen in the ring formed may be replaced by aryl having 6 to 16 carbons, heteroaryl having 2 to 20 carbons, diarylamino (in which aryl is aryl having 6 to 12 carbons), alkyl having 1 to 6 carbons, cycloalkyl having 3 to 14 carbons, alkoxy having 1 to 6 carbons or aryloxy having 6 to 12 carbons, $X^1$ is >N—R, and R of the >N—R is aryl having 6 to 12 carbons, and at least one hydrogen therein is replaced by alkyl having 1 to 6 carbons or cycloalkyl having 3 to 14 carbons, $Z^1$ and $Z^2$ are independently aryl having 6 to 10 carbons, diarylamino (in which aryl is aryl having 6 to 12 carbon), alkyl having 1 to 4 carbons in which at least one hydrogen therein is replaced by one to three aryl having 6 to 10 carbons, hydrogen, alkyl having 1 to 4 carbons or cycloalkyl having 5 to 10 carbons, and at least one hydrogen therein may be replaced by aryl having 6 to 12 carbons, alkyl having 1 to 4 carbons or cycloalkyl having 5 to 10 carbons, when $Z^1$ is phenyl which may be substituted by alkyl having 1 to 4 carbons or cycloalkyl having 5 to 10 carbons, m-biphenylyl which may be substituted by alkyl having 1 to 4 carbons or cycloalkyl having 5 to 10 carbons, p-biphenylyl which may be substituted by alkyl having 1 to 4 carbons or cycloalkyl having 5 to 10 carbons, diphenylamino which may be substituted by alkyl having 1 to 4 carbons or cycloalkyl having 5 to 10 carbons, hydrogen or alkyl having 1 to 4 carbons, a case where $Z^2$ is hydrogen or alkyl having 1 to 4 carbons is excluded, and at least one hydrogen in the compound represented by formula (1) may be replaced by halogen or deuterium.

5. The material for the organic device according to claim 1, wherein $Z^1$ is diarylamino, aryloxy, triaryl-substituted alkyl having 1 to 4 carbons, hydrogen, alkyl having 1 to 4 carbons or cycloalkyl having 5 to 10 carbons, and aryl therein is independently phenyl, biphenylyl or naphthyl in which at least one hydrogen therein may be replaced by alkyl having 1 to 4 carbons or phenyl, $Z^2$ is phenyl, biphenylyl or naphthyl in which at least one hydrogen therein may be replaced by alkyl having 1 to 4 carbons or cycloalkyl having 5 to 10 carbons, or hydrogen, alkyl having 1 to 4 carbons or cycloalkyl having 5 to 10 carbons, and when $Z^1$ is diphenylamino which may be substituted by alkyl having 1 to 4 carbons or cycloalkyl having 5 to 10 carbons, hydrogen or alkyl having 1 to 4 carbons, a case where $Z^2$ is hydrogen or alkyl having 1 to 4 carbons is excluded.

6. The material for the organic device according to claim 1, wherein the polycyclic aromatic compound represented by formula (1) is at least one selected from the group consisting of:

(1-50)

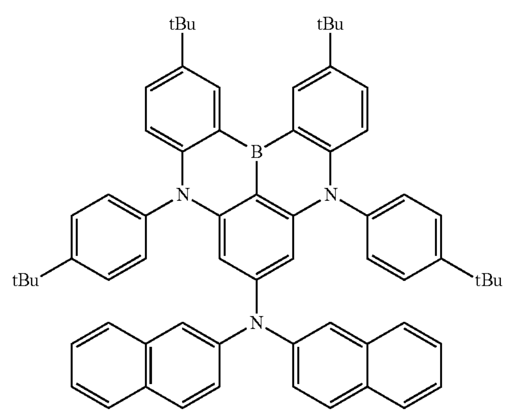

(1-66)

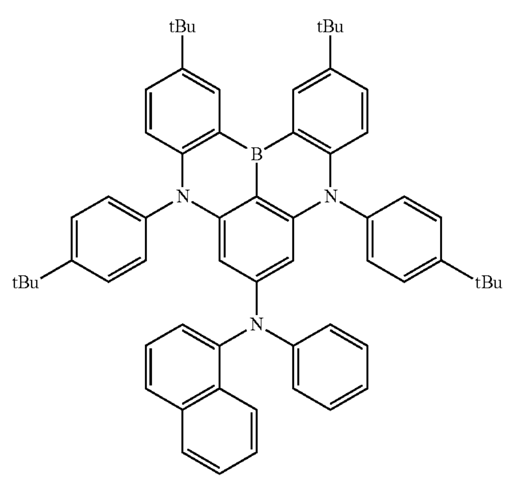

-continued
(1-124)
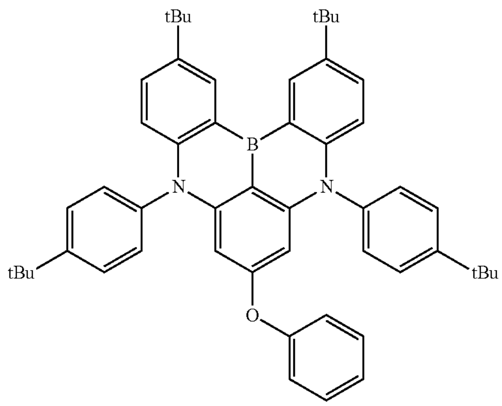
(1-128)
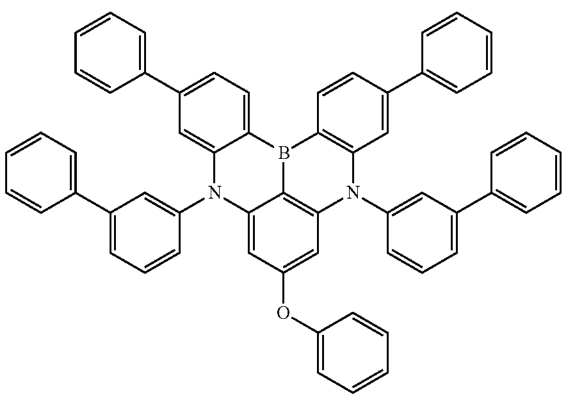
(1-132)
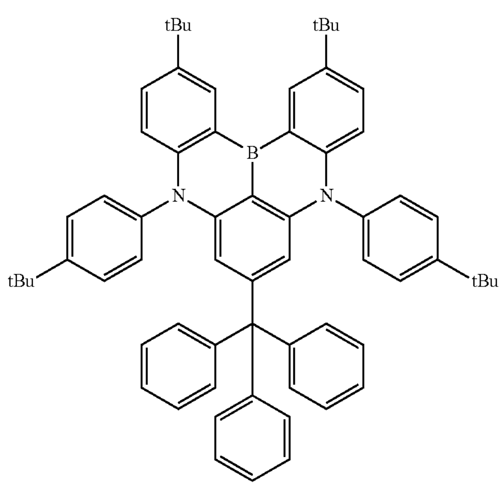
-continued
(1-136)
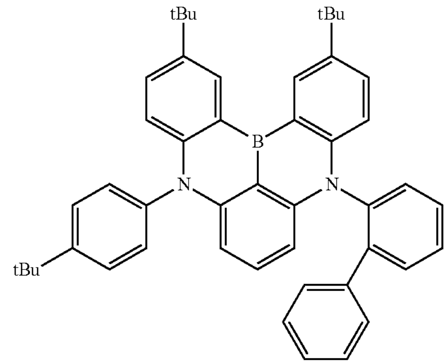
(1-166)
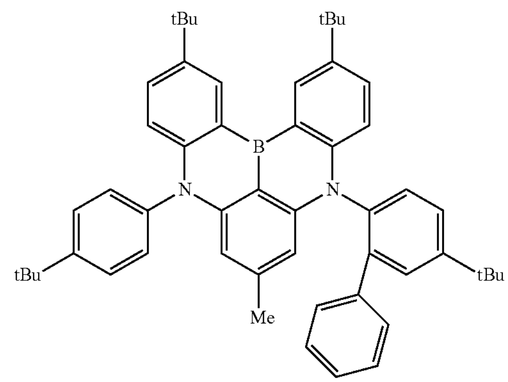
(1-170)
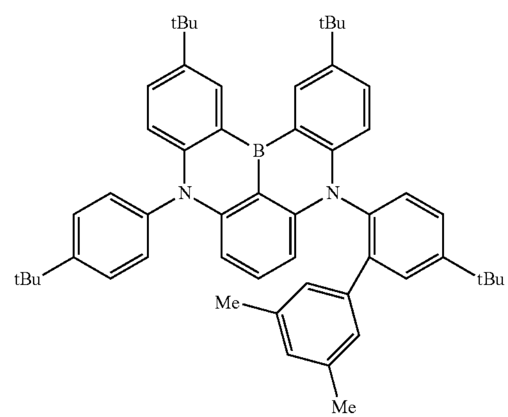
(1-180)
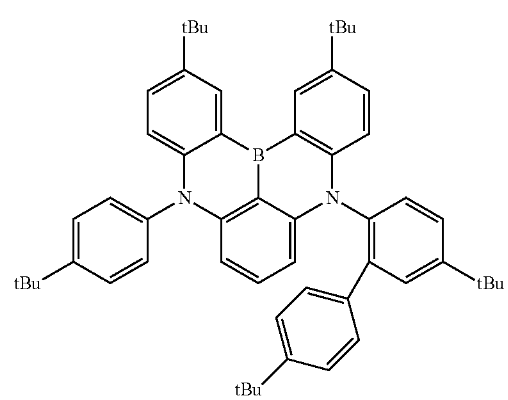

-continued
(1-200)
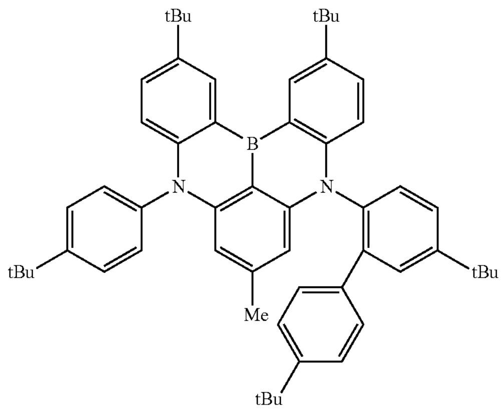
(1-208)
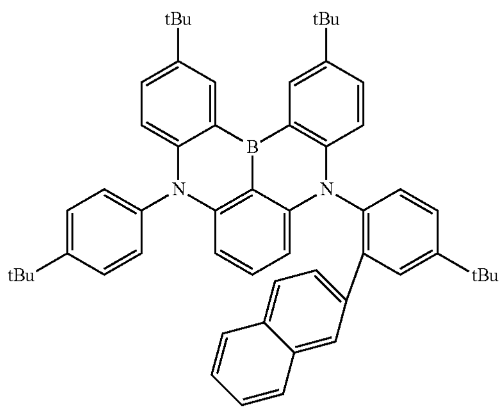
(1-216)
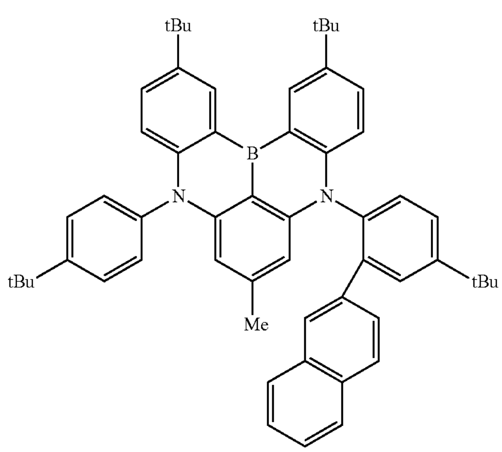
-continued
(1-240)
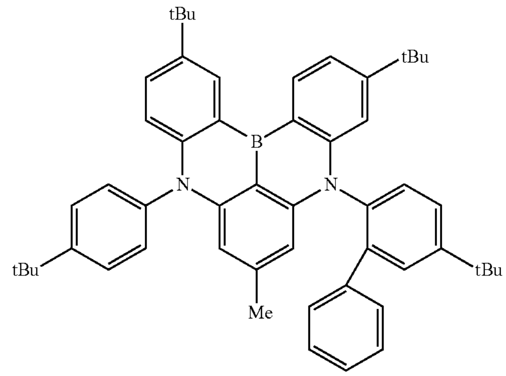
(1-244)
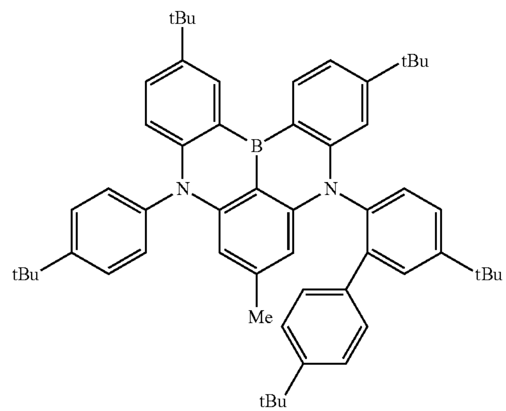
(1-252)
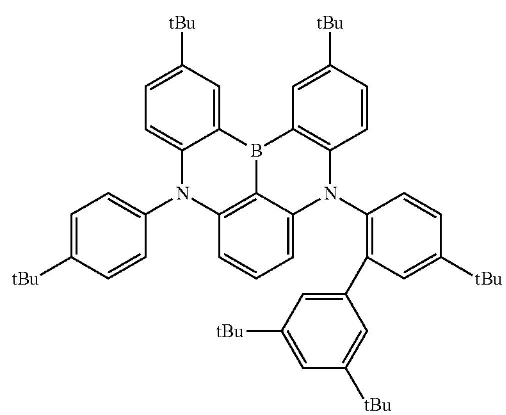
(1-296)
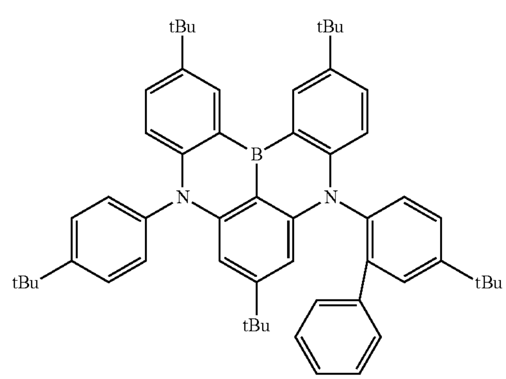

-continued (1-300)

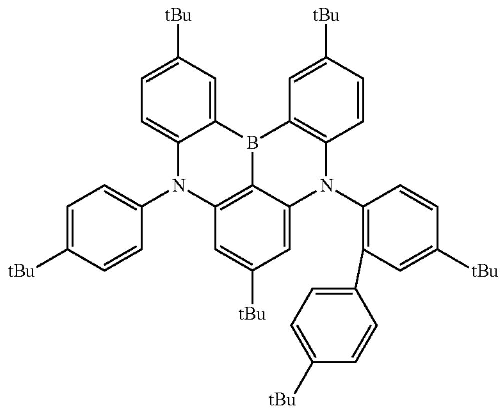

(1-715)

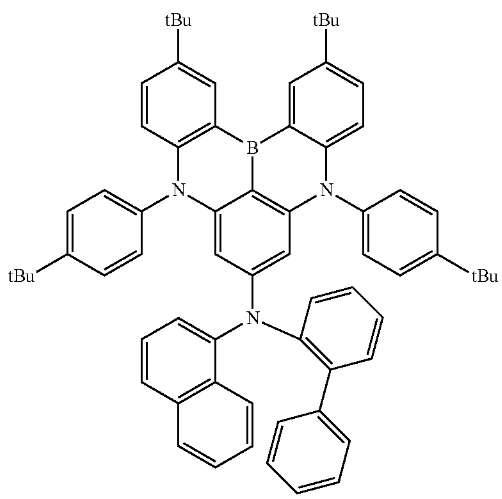

(1-730)

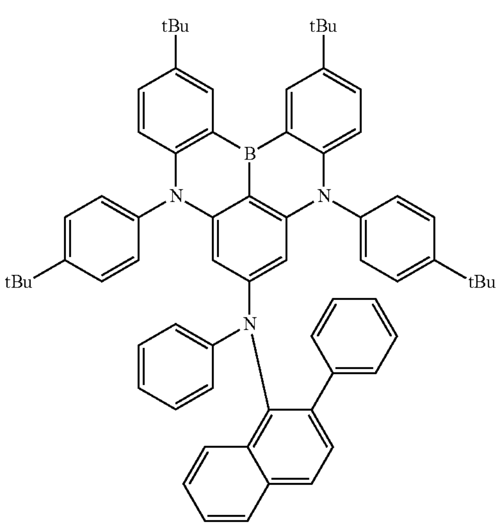

and

-continued (1-733)

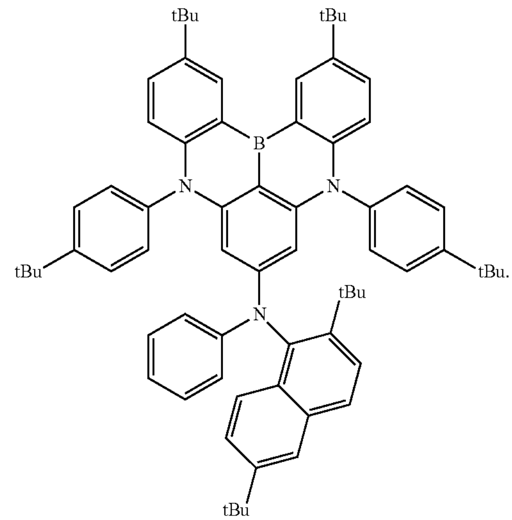

7. The material for the organic device according to claim 1, wherein the material for the organic device is a material for an organic electroluminescent device, a material for an organic field effect transistor or a material for an organic thin film photovoltaic cell.

8. An organic electroluminescent device, comprising a pair of electrodes formed of an anode and a cathode, and a luminescent layer arranged between the anode and the cathode, wherein the luminescent layer comprises the material for the organic device according to claim 1.

9. The organic electroluminescent device according to claim 8, wherein the luminescent layer comprises a host and the material for the organic device as a dopant.

10. The organic electroluminescent device according to claim 9, wherein the host is an anthracene-based compound, a dibenzochrysene-based compound or a fluorene-based compound.

11. The organic electroluminescent device according to claim 8, having an electron transport layer and/or an electron injection layer which are arranged between the cathode and the luminescent layer, wherein at least one of the electron transport layer and the electron injection layer comprises at least one derivative or complex selected from the group of a borane derivative, a pyridine derivative, a fluoranthene derivative, a BO-based derivative, an anthracene derivative, a benzofluorene derivative, a phosphine oxide derivative, a pyrimidine derivative, a carbazole derivative, a triazine derivative, a benzimidazole derivative, a phenanthroline derivative and a quinolinol-based metal complex.

12. The organic electroluminescent device according to claim 11, wherein the electron transport layer and/or the electron injection layer further comprises at least one selected from the group of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal and an organic complex of a rare earth metal.

13. A display unit or a lighting unit, comprising the organic electroluminescent device according to claim 8.

14. The material for the organic device according to claim 1, wherein $Z^1$ is phenylnaphthylamino or dinaphthylamino in which at least one hydrogen therein may be replaced by aryl, alkyl or cycloalkyl.

15. The material for the organic device according to claim 14, wherein $Z^2$ is hydrogen.

16. The material for the organic device according to claim 14, wherein the polycyclic aromatic compound represented by formula (1) is at least one selected from the group consisting of:

(1-50)

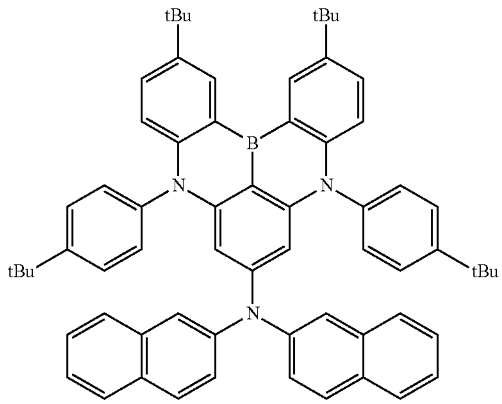

(1-66)

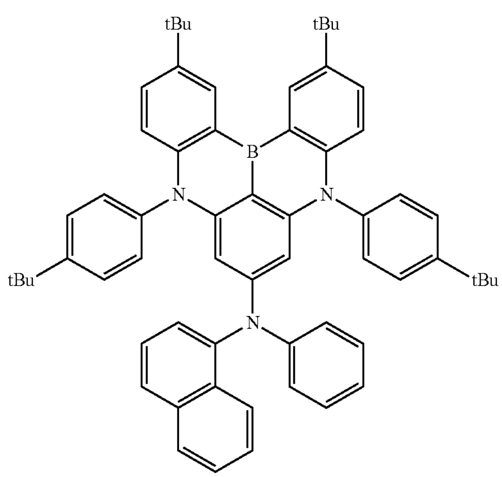

-continued (1-715)

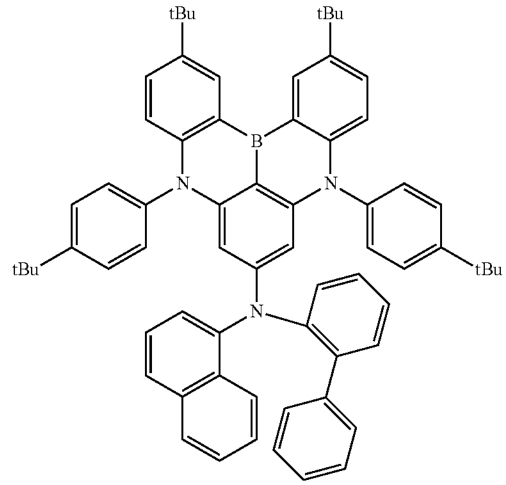

(1-730)

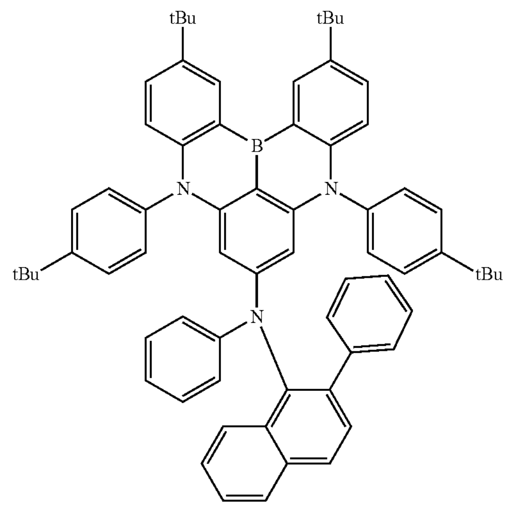

and (1-733)

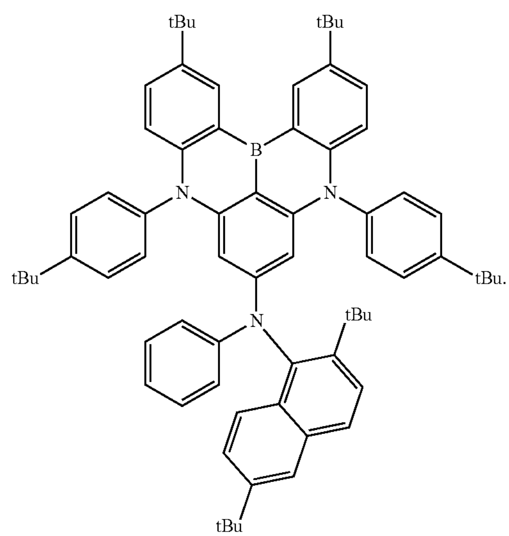

17. The material for the organic device according to claim 1, wherein $Z^1$ is phenylnaphthyamino in which at least one hydrogen therein may be replaced by aryl, alkyl or cycloalkyl.

18. The material for the organic device according to claim 17, wherein $Z^2$ is hydrogen.

19. The material for the organic device according to claim 17, wherein the polycyclic aromatic compound represented by formula (1) is at least one selected from the group consisting of:

(1-66)

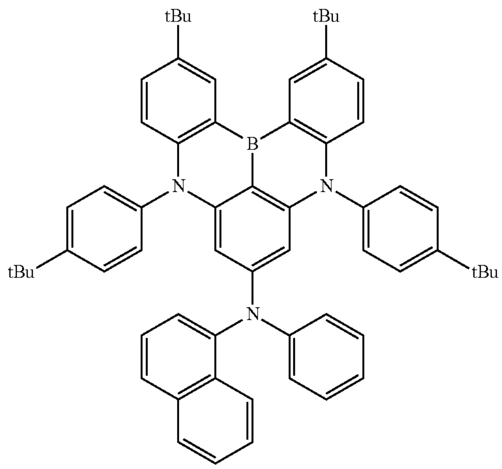

(1-715)

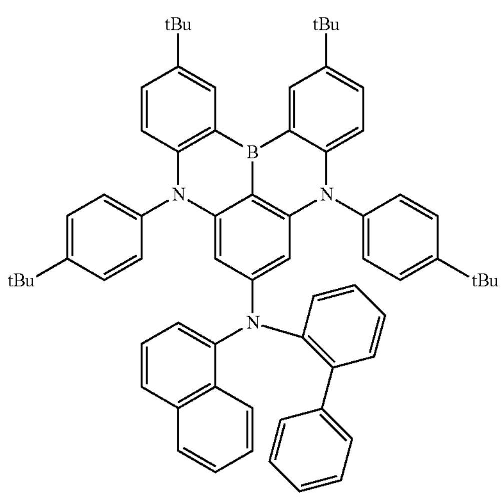

-continued (1-730)

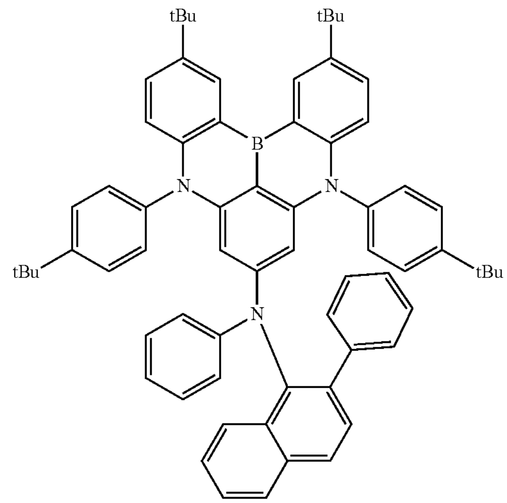

and (1-733)

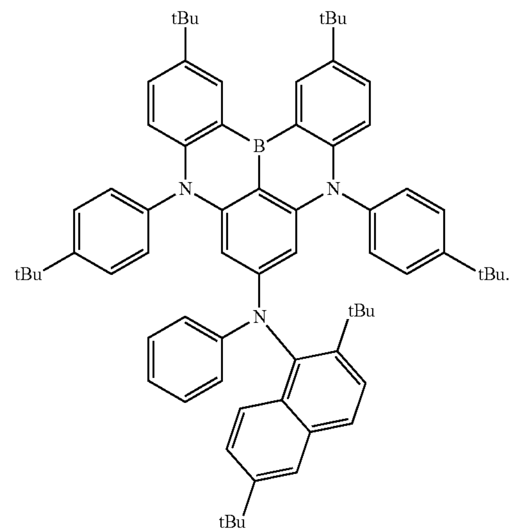

20. The material for the organic device according to claim 1, wherein the polycyclic aromatic compound represented by formula (1) is at least one selected from the group consisting of:

(1-166)

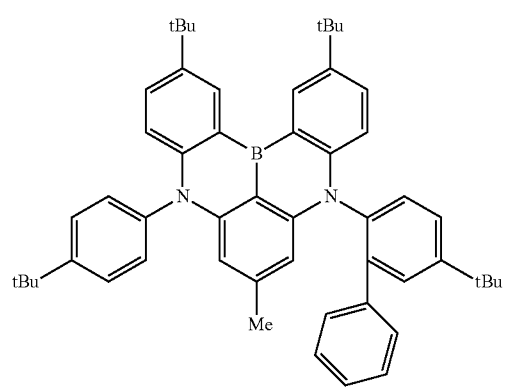

-continued
(1-200)
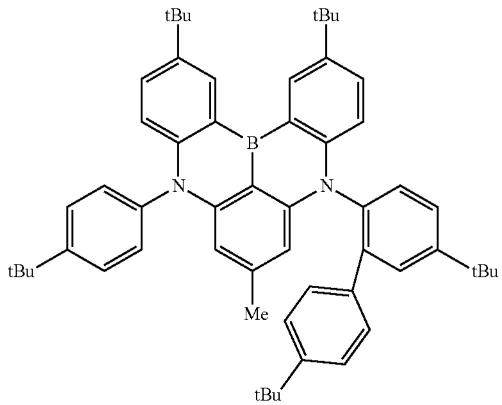
(1-216)
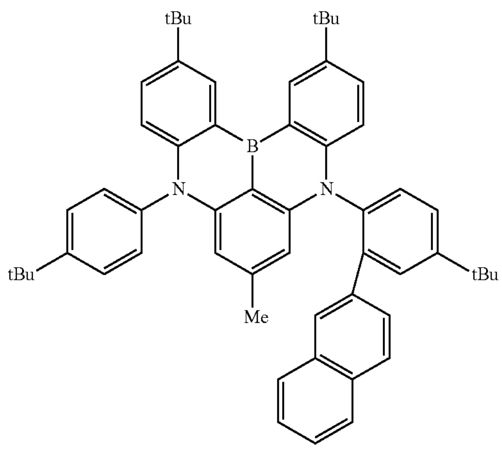
(1-240)
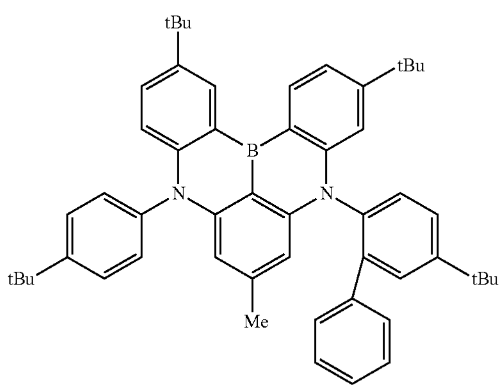
-continued
(1-244)
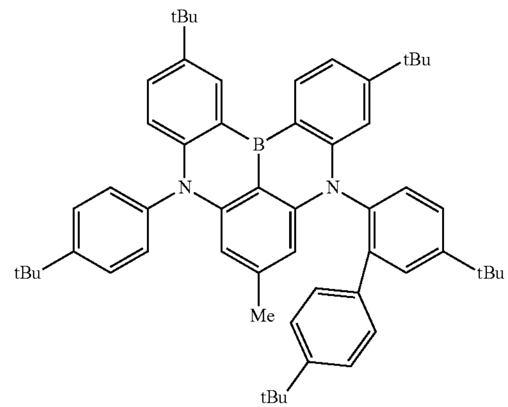
(1-296)
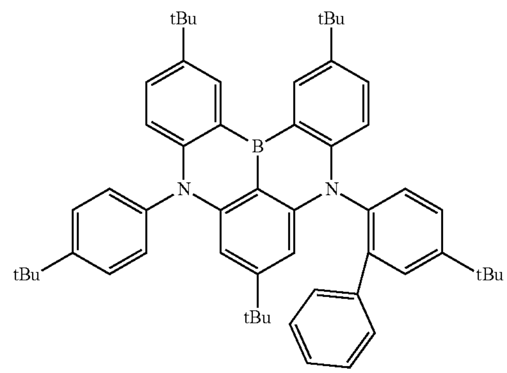
and
(1-300)
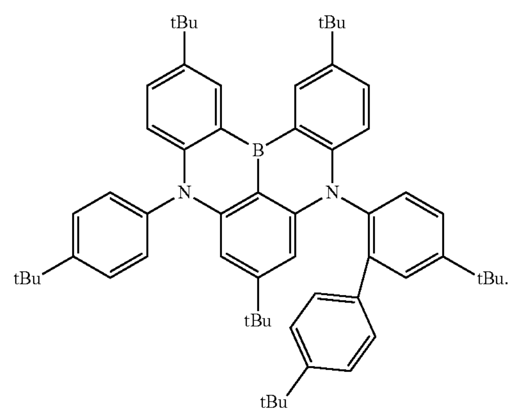
* * * * *